United States Patent [19]

Tokuume et al.

[11] Patent Number: 4,833,471

[45] Date of Patent: May 23, 1989

[54] DATA PROCESSING APPARATUS

[75] Inventors: Yoshihiro Tokuume, Machida; Shigeo Tsujii; Kaoru Kurosawa, both of Tokyo, all of Japan

[73] Assignee: Canon Kabushiki Kaisha, Tokyo, Japan

[21] Appl. No.: 931,015

[22] Filed: Nov. 17, 1986

Related U.S. Application Data

[63] Continuation of Ser. No. 715,967, Mar. 25, 1985.

[30] Foreign Application Priority Data

| | | | |
|---|---|---|---|
| Mar. 26, 1984 | [JP] | Japan | 59-58006 |
| Mar. 26, 1984 | [JP] | Japan | 59-58007 |
| Mar. 26, 1984 | [JP] | Japan | 59-58008 |
| Mar. 26, 1984 | [JP] | Japan | 59-58009 |
| Mar. 26, 1984 | [JP] | Japan | 59-58010 |
| Mar. 26, 1984 | [JP] | Japan | 59-58012 |
| Mar. 26, 1984 | [JP] | Japan | 59-58013 |
| Mar. 26, 1984 | [JP] | Japan | 59-58014 |
| Mar. 26, 1984 | [JP] | Japan | 59-58015 |
| Mar. 26, 1984 | [JP] | Japan | 59-58017 |
| Mar. 26, 1984 | [JP] | Japan | 59-58018 |
| Mar. 26, 1984 | [JP] | Japan | 59-58019 |
| Mar. 26, 1984 | [JP] | Japan | 59-58020 |
| Mar. 26, 1984 | [JP] | Japan | 59-58021 |
| Mar. 26, 1984 | [JP] | Japan | 59-58022 |
| Mar. 26, 1984 | [JP] | Japan | 59-58023 |
| Mar. 26, 1984 | [JP] | Japan | 59-58024 |
| Mar. 26, 1984 | [JP] | Japan | 59-58025 |
| Mar. 26, 1984 | [JP] | Japan | 59-59197 |
| Mar. 27, 1984 | [JP] | Japan | 59-59198 |

[51] Int. Cl.⁴ .............................................. H03M 7/40

[52] U.S. Cl. ........................................ 341/67; 341/55; 341/58; 341/63; 341/95; 341/106

[58] Field of Search ....................... 341/55, 58, 59, 63, 341/67, 95, 106; 360/40

[56] References Cited

U.S. PATENT DOCUMENTS

| | | | |
|---|---|---|---|
| 4,337,458 | 6/1982 | Cohn | 340/347 DD |
| 4,387,364 | 6/1983 | Shirota | 360/40 |
| 4,499,454 | 2/1985 | Shimada | 360/40 |
| 4,520,346 | 3/1985 | Shimada | 360/40 |
| 4,523,181 | 6/1985 | Tazaki | 360/40 |
| 4,577,180 | 3/1986 | Fukuda | 340/347 DD |
| 4,617,552 | 10/1986 | Kojima et al. | 341/58 |

*Primary Examiner*—William M. Shoop, Jr.
*Assistant Examiner*—Gary J. Romano
*Attorney, Agent, or Firm*—Fitzpatrick, Cella, Harper & Scinto

[57] ABSTRACT

There is provided a data processing apparatus for encoding or decoding binary data such as a magnetic disk or an optical disk in which a binary data sequence is converted to a binary code sequence which is suitable for a data processes. This data processing apparatus comprises: a code converter for converting the m-bit data in the binary data sequence to the n-bit code corresponding thereto; output means for outputting the n-bit code sequence corresponding to the binary data sequence; and DC-freeing means for restricting the DC component of the code sequence which is outputted from the output means. The code converter has a ROM table to store the data for code conversion and a register for converting the m-bit serial data to the parallel data and can be easily constituted by a programmable array logic.

15 Claims, 17 Drawing Sheets

FIG. 6

| $C_1$ | $C_2$ | $C_3$ | $C_4$ | $C_5$ | $C_6$ |
|---|---|---|---|---|---|
| 0 | 0 | 0 | 0 | 0 | 0 |
| 0 | 0 | 0 | 0 | 0 | 1 |
| 0 | 0 | 0 | 0 | 1 | 0 |
| 0 | 0 | 0 | 0 | 1 | 1 |
| 0 | 0 | 0 | 1 | 0 | 0 |
| 0 | 0 | 0 | 1 | 0 | 1 |
| 0 | 0 | 0 | 1 | 1 | 0 |
| 0 | 0 | 0 | 1 | 1 | (1) |
| 0 | 0 | 1 | 0 | 0 | 0 |
| 0 | 0 | 1 | 0 | 0 | 1 |
| 0 | 0 | 1 | 0 | 1 | 0 |
| 0 | 0 | 1 | 0 | 1 | 1 |
| 0 | 0 | 1 | 1 | 0 | 0 |
| 0 | 0 | 1 | 1 | 0 | 1 |
| 0 | 0 | 1 | 1 | (1) | 0 |
| 0 | 0 | 1 | 1 | (1) | 1 |
| 0 | 1 | 0 | 0 | 0 | 0 |
| 0 | 1 | 0 | 0 | 0 | 1 |
| ⋮ | | | | | |
| 1 | 1 | 0 | 1 | 0 | 1 |
| 1 | 1 | 0 | 1 | 1 | 0 |

DATA PROCESSING APPARATUS

This is a continuation of application Ser. No. 715,967 filed Mar. 25, 1985.

BACKGROUND OF THE INVENTION

1. Field of the Invention

The present invention relates to a data processing apparatus for coding or decoding or the like of binary data in which binary data sequence is converted to a binary code sequence which is suitable for data processes in an electronic apparatus such as a magnetic disk, optical disk, data transmitting apparatus, or the like.

2. Description of the Prior Art

Hitherto, in electronic apparatuses such as a magnetic disk, optical disk, data transmitting apparatus, or the like, it is necessary to record or transmit a great amount of information. For instance, in recording, it is inevitable to improve recording density upon the recording of binary data on a recording medium.

On one hand, in transmitting, it is inevitable to improve transmission speed. In addition, various kinds of coding and decoding systems have been proposed.

FIG. 1 is a diagram for explaining one example of conventional coding systems. FIG. 1(*a*) shows an example of a bit pattern of an original binary data sequence, in which numerals 0 and 1 denote bit logics "0" and "1" and $T_0$ represents a bit interval. FIGS. 1(*b*) and 1(*d*) respectively show one example of conventional coding systems, in which the system of FIG. 1(*b*) is called an MFM system (Modified FM system) and the system of FIG. 1(*d*) is called a 3PM system (3 Position Modulation system). When the recording technology is described, as an example of the apparatuses to which the foregoing respective systems are applied, the MFM system is used in the magnetic disk apparatuses (models 3330, 3340, 3350, etc.) made by IBM Corporation and the 3PM system is used in the magnetic disk apparatus (Model 8434) made by UNIVAC Corporation. For the algorithm of each system, in case of the MFM system, the original data "1" and "0" are converted to "01" and "X0" in correspondence thereto. However, in the coded sequence after conversion, "X" becomes a plurality of logics (1→0, 0→1) of the code bit immediately before X. On one hand, for the algorithm of the 3PM system, the original data is separated on a 3-bit unit basis and is converted to 6-bit codes as shown in Table 1.

TABLE 1

Coding Algorithm of the 3PM System

| Original data | Conversion code | Condition |
|---|---|---|
| 000 | 000010 | When a pattern "101" is generated in the code sequence after conversion, it is converted to "010". |
| 001 | 000100 | |
| 010 | 010000 | |
| 011 | 010010 | |
| 100 | 001000 | |
| 101 | 100000 | |
| 110 | 100010 | |
| 111 | 100100 | |

For the coded sequence converted by each of the coding systems, a recording current is produced so as to become a signal such that the magnetization inversion occurs for a bit of "1" and the magnetization inversion does not occur for a bit of "0" and is recorded on the foregoing recording medium. FIGS. 1(*c*) and 1(*e*) show waveforms (NRZI signal) of the recording currents of the code systems which were coded by the MFM system of FIG. 1(*b*) and by the 3PM system of FIG. 1(*d*).

Generally, in the recording on the magnetic medium, (a) When the magnetization inversion interval (recording wavelength) becomes short, the magnetic transitions due to the magnetization inversions before and after this interval are mutually interfered, thereby producing a cause for occurrence of errors upon decoding of the reproduction signal.

(b) Even in the case where a demodulation phase margin (TW) (which will be explained later) upon reproduction to the recording wavelength is small, the same errors as mentioned above could be easily caused.

(c) When the recording wavelength is larger as compared with the period of the clock signal for demodulation which is produced from the reproduction signal, the above-mentioned clock cannot be produced accurately from the reproduction signal, so that the same errors as mentioned above could be easily caused.

(d) When a ratio between the maximum value and the minimum value of the magnetization inversion interval becomes large, the waveform interference (called the pattern peak shift) of the reproduction signal increases, so that the same errors as mentioned above could be easily caused.

Thus, in the general coding systems, as the parameters indicative of the capabilities including the foregoing four items (a) to (d), the following variables are given. It is now assumed that in a certain coding system, the m-bit binary data sequence is converted to the binary code sequence of n (n≧m) bits, and the minimum value of the number of codes of "0" between the code "1" selected arbitrarily from among the code sequence after conversion and the next code "1" is d and its maximum value is k. From this assumption, we have $$T_{min} \text{ (minimum magnetization inversion interval)} = \frac{m}{n}(d+1)T_0 \tag{1}$$

$$T_{max} \text{ (maximum magnetization inversion interval)} = \frac{m}{n}(k+1)T_0 \tag{2}$$

$$C_{LK} \text{ (clock period for demodulation)} = \frac{m}{n}T_0 \tag{3}$$

$$T_W \text{ (demodulation phase margin)} = \frac{m}{n}T_0 \tag{4}$$

where, $T_0$ is one original data period.

Therefore, from the above description, it is desirable that the values of equations (1) and (4) are larger (from the explanations in the foregoing items (a) and (b)). On one hand, it is preferable that the value of the demodulation clock period in equation (3), the ratio of the maximum magnetization inversion interval (equation (5)) mentioned below and the ratio between the maximum and minimum magnetization inversion intervals (equation (6)) mentioned below are smaller.

$$\frac{T_{max}}{C_{LK}} = \left\{\left(\frac{m}{n}(K+1)T_0/\frac{m}{n}T_0\right\} = (k+1) \tag{5}$$

$$\frac{T_{max}}{T_{min}} = \frac{m}{n}(k+1)T_0/\frac{m}{n}(j+1) = \frac{k+1}{d+1} \tag{6}$$

The above-mentioned parameters are shown in Table 2 with regard to the foregoing MFM and 3PM coding systems.

TABLE 2

Parameters of Each Coding System

| Coding system | Parameter | | | | |
|---|---|---|---|---|---|
| | $T_{min}$ | $T_W$ | $T_{max}/C_{LK}$ | $T_{max}/T_{min}$ | $T_{max}$ |
| MFM system | $T_0$ | 0.5 $T_0$ | 4 | 2 | 2T |
| 3PM system | 1.5 $T_0$ | 0.5 $T_0$ | 12 | 4 | 6T |
| FM system | 0.5 $T_0$ | 0.5 $T_0$ | 2 | 2 | T |

In addition, as described above, in the general coding systems, original data is converted to the n-bit code for every m bits and is expressed as (m, n, d, k) codes in which the run length of "0" of the code after conversion is restricted to a value which is not smaller than d and not larger than k. However, the handling number m ($m \leq n$) of this data bit affects the hardware of the apparatus. In this case, it is generally desirable that a value of m is small. When the foregoing coding systems are expressed by the (m, n, d, k) parameters, they will become (1, 2, 0, 1) in case of the FM coding system; (1, 2, 1, 3) in case of the MFM coding system; and (3, 6, 2, 11) in case of the 3PM coding system. On one hand, what is called a DC free code of which a variation in DC component of the coded signal is suppressed is also generally desired.

SUMMARY OF THE INVENTION

It is an object of the present invention to provide a data processing apparatus in which: the $T_{min}$ is made as large as possible so as to avoid including the high frequency component and to reduce being subjected to the influence of the band restriction; the $T_W$ is made large so as to permit clear distinction of pulses; the difference between the $T_{min}$ and the $T_{max}$ is made small so that synchronization can be easily obtained; and the $T_{max}$ is made small to reduce the low frequency component in consideration of the foregoing points.

Another object of the invention is to make the magnetization inversion interval long and to prevent mutual interference between the magnetic transitions due to the magnetization inversions before and after that interval and thereby to prevent the occurrence of errors upon reproduction and decoding.

Still another object of the invention is to enlarge the demodulation phase margin ($T_W$) (which will be explained later) upon reproduction, to a recording wavelength and thereby to prevent the occurrence of the foregoing errors.

Still another object of the invention is to make the recording wavelength small as compared with the period of a clock signal for demodulation which is produced from the reproduction signal and thereby to accurately produce a clock signal from the reproduction signal.

Still another object of the invention is to make the ratio between the maximum value and the minimum value of the magnetization inversion interval small and to also make the waveform interference (called the pattern peak shift) of the reproduction signal small and thereby to prevent the occurrence of the foregoing errors.

Still another object of the invention is to provide a data processing apparatus having a code converter which can be easily constituted by a programmable array logic.

Still another object of the invention is to provide a data processing apparatus which produces a DC-freed code.

Still another object of the invention is to provide a data processing apparatus which produces suitable codes due to a change-over of tables upon coupling of codes in consideration of the code before or after those codes.

Still another object of the invention is to provide a data processing apparatus which produces further DC-freed codes using a programmable array logic.

Still another object of the invention is to provide a data processing apparatus which has the codes corresponding to data in a table and codes the data by respectively performing the coordinating processes.

Still another object of the invention is to provide a data processing apparatus which has the codes corresponding to data in a table and codes the data by respectively performing the coordinating processes and thereby producing the further DC-freed codes.

BRIEF DESCRIPTION OF THE DRAWINGS

FIG. 5-1 is an explanatory diagram of the number of codes in which the limitation of k=2 is not broken;

FIG. 5-2 is a state transition diagram in production of codes;

FIG. 5-3 is a generalized state transition diagram in production of codes;

FIG. 6 is a diagram showing a method of producing the 6-bit k-limitation codes of k=2 of FIG. 5-1(*c*);

DETAILED DESCRIPTION OF THE PREFERRED EMBODIMENTS

Figure 1:
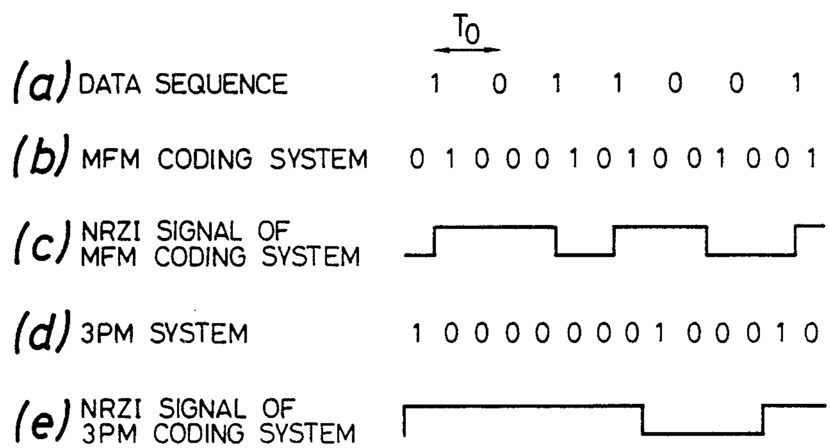
FIG. 1 is an explanatory diagram of one example of conventional coding systems.

As already mentioned before, in general, in the coding systems, the original data of m bits is converted to the n-bit codes in which the number of bits of "0" which are included between the adjacent bits of "1" is restricted by d as the minimum number and k as the maximum number, and these codes are NRZI-converted so as to become a recording waveform pattern. Namely, the recording waveform pattern is constituted by the bits in which the code bit "1" is inverted and the code bit "0" is not inverted. Coding systems are generally expressed by four parameters of (m, n, d, k).

The terms using the above-mentioned parameters will then be explained.

T: Data bit interval $T_{min}$=m/n(d+1)T: Minimum inversion interval $T_{max}$=m/n(k+1)T: Maximum inversion interval $T_W$=m/nT: Detection window width (Demodulation phase margin)

DSV (Digital Sum Variation; variation in accumulated charges): Integrated value with respect to the recording waveform pattern in the case where the high level of the recording waveform pattern of which the code was NRZI-converted is +1 and the low level is −1.

When there is a possibility such that the DSV infinitely becomes large, its code has the DC component. When a variation range of the DSV is limited, its code is DC-free.

CDS (Codeword Digital Sum): DSV from the first to the last of one code.

The foregoing DC-free code will now be explained. This code is the code of which the accumulated charge variation (DSV: Digital Sum Variation) is limited. Assuming that the i-th digit of the recording pattern which appears as the j-th pattern among the recording pattern sequence of which the code sequence was NRZI-converted is $W_{ji}$, the charge $Q_j$ of this recording pattern itself is expressed by $$Q_j \overset{\Delta}{=} 2\sum_{i=1}^{n} W_{ji} - n$$

This equation means that the charge +1 is given when the digit $W_{ji}$ is 1 and the charge −1 is given when the digit $W_{ji}$ is 0. The accumulated charges until the i-th recording pattern are defined by $$DSV \overset{\Delta}{=} \sum_{j=j_0}^{i} Q_j \ (j_0 \text{ is an initial value})$$

When the DSV is limited, it is said that the code is DC-free.

An explanation will be made hereinbelow using the above-mentioned symbols in consideration of the foregoing description.

As the conventional typical coding systems, the following systems can be mentioned.

(1) A. M. Patel, "Encoder and Decoder for a Byte-Oriented (0, 3) 8/9 code", IBM Technical Disclosure Bulletin, Vol. 18, No. 1, June 1975 (p. 248).

(2) A. M. Patel, "Charge-Constrained Byte-Oriented (0, 3) Code", IBM Technical Disclosure Bulletin, Vol. 19, No. 7, December 1976 (p. 2715).

The system (1) is the (8, 9, 0, 3) coding system. In the system (2), after the two (8, 9, 0, 3) codes of the coding system (1) were coupled, two connecting bits are added and thereby producing the DC-free code. As the result, the DC-free (8, 10, 0, 3) code is derived.

According to the system of (1), $$T_{min}=(8/9)T=0.89T$$

$$T_{max}=(8/9)\times 4T=3.56T$$

According to the system of (2), $$T_{min}=(8/10)T=0.8T$$

$$T_{max}=(8/10)\times 4T=3.2T$$

At the same time, they are DC-free. However, in this system, the connecting bits to make the code DC-free can be added only after two codes were coupled, namely, only after eighteen bits. Therefore, the variation range of the DSV (DC component of the signal) becomes large although it is limited. Thus, in the actual apparatuses such as a digital VTR or the like in which a high density recording is performed on the magnetic disk or the like, the DC component is cut out but in case of the optical disk, the DC component of the signal is not cut out. However, the reproducing amplifier uses the AC amplification, so that the DC component is cut out. Therefore, there is a problem such that a distortion is caused in the reproduction signal and this results in an increase in error rate upon decoding.

An important point in the coding systems is that the $T_{min}$ includes no high frequency component and it is better that a value of the $T_{min}$ is larger so as to reduce subjection to the influence of the band limitation. On the other hand, it is preferable that a value of the $T_W$ is larger so as to permit distinguishing pulses. In addition, it is desirable that a value of the $T_{max}$ is as small as possible and the difference between the $T_{min}$ and the $T_{max}$ is made small in order to make it easy to derive synchronization and to reduce the low frequency component.

Figure 2:
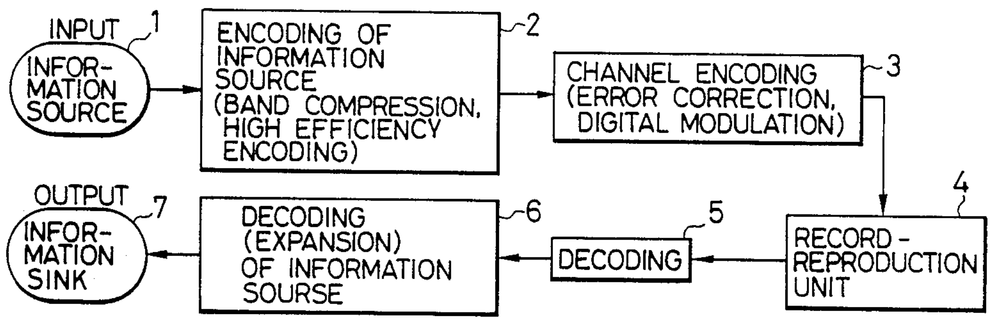
FIG. 2 is an arrangement block diagram of an electronic apparatus such as a magnetic disk, optical disk or the like which performs a digital modulation.

The present invention will now be described in detail hereinbelow with reference to the drawings. FIG. 2 is an arrangement block diagram of an electronic apparatus such as a magnetic disk, optical disk or the like which performs the digital modulation. A reference numeral 1 denotes an information source or its input section, and 2 is an information source encoding section to suppress the redundancy of information in the information source 1. In the band compression, the transmission frequency band is analogly compressed. The high efficiency encoding intends to digitally reduce the average bit number per one pixel (sampled value) and is close to the amplitude compression from its meaning. A numeral 3 is a channel encoding section of communication and transmission lines in which error correction, digital modulation and the like are included; 4 is a record-reproduction system of the foregoing magnetic disk, optical disk or the like; 5 and 6 decoding sections to decode the data encoded by the encoding sections 2 and 3; and 7 an output section to output the information derived due to the above-mentioned processes.

Figure 3:
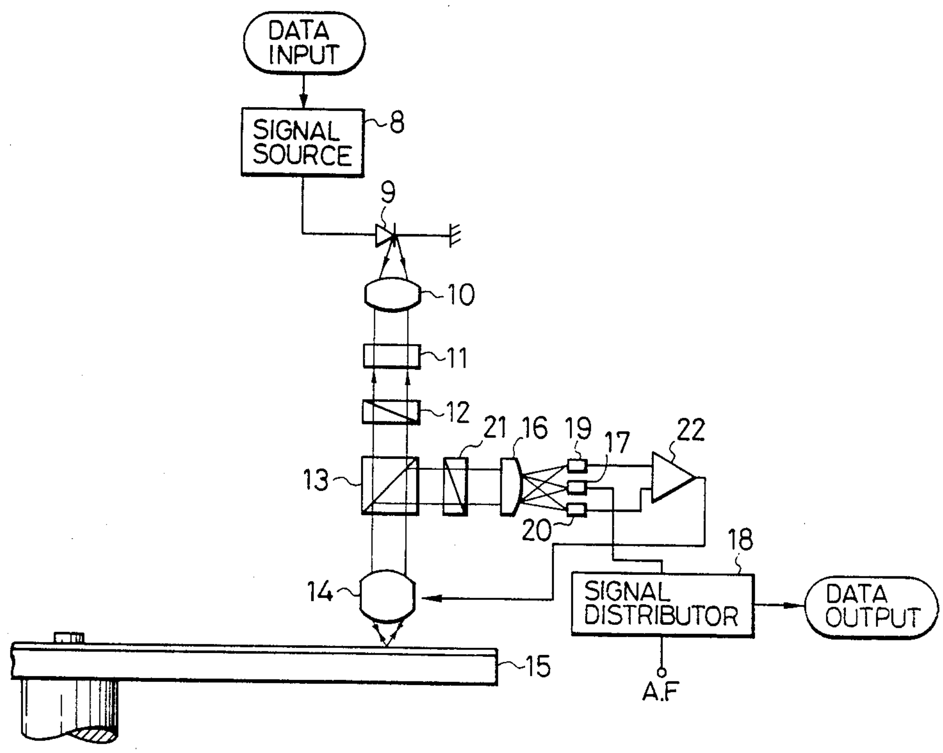
FIG. 3 is an arrangement diagram showing one example of a record-reproduction unit.

FIG. 3 is an arrangement diagram showing one example of the record-reproduction unit 4 and illustrates an example of which the unit 4 is applied to a video disk.

The signal recording unit will be first explained. A light source 9, e.g., a semiconductor laser flickeringly emits a light in response to a drive signal from a signal source 8 on the basis of input data. The signal source 8 includes the encoding sections 2 and 3 in FIG. 2. The light beam emitted from the light source 9 becomes the parallel light beam by a collimator lens 10 and passes through a grating 11, a polarizing plate 12 and an optical device 13 whose transmittance reflectivity has a polarization dependency. Then, a point image is formed on a perpendicular magnetic recording medium 15 through an objective lens 14. The semiconductor laser beam has nearly P polarization to the optical device 13 and the polarizing plate 12 is also arranged so that its polarizing direction is directed in the P direction.

The grating 11 performs the luminous angle separation for allowing a sub-spot for detection of a tracking signal to be formed on the perpendicular magnetic recording medium 15 by the objective lens 14.

In this case, three point images are formed on the recording medium 15 due to the function of the grating 11. Among these three point images, the two point images which are used for detection of a tracking signal upon reproduction are the $\pm 1$ order diffracted lights of the grating 11 and the remaining one point image is the non-diffracted light (zero order light). By setting the diffraction efficiency due to the grating 11, the signal recording can be easily performed by the point image of only the non-diffracted light without performing the signal recording by the former two point images.

A combination of a cylindrical lens 16 and a quarter dividing detector 17 serves to derive an auto-focus (i.e., automatic focusing) signal for adjustment of the position of the objective lens 14 to allow the point image to be accurately formed in focus.

A signal from the quarter dividing detector 17 is divided into the signals of two systems by a signal distributor 18 and one of them is used for an auto-focus signal and the other is used to output and monitor a recording signal. This output includes the decoding sections 5 and 6 and information output section 7 described in FIG. 2.

On one hand, differential signals from detectors 19 and 20 for detection of a tracking signal are set into the OFF state upon recording.

The signal reproducing unit will then be described.

A signal at a constant level is given from the signal source 8, thereby setting the light source 9 into the light emitting state of a constant quantity of light. In addition, as mentioned before, the quantity of light in this case is adjusted to an amount of light of the order such that the magnetic domain pattern which was recorded as mentioned before is not inverted. The light beam transmitted through the collimator 10, grating 11, polarizing plate 12, and optical device 13 passes through the objective lens 14, so that three point images are formed on the recording medium. The light beam from the recording medium 15 has been subjected to the modulation of the polarization surface due to the Kerr effect and enters the detectors 17, 19 and 20 as the beam in the modulated state of brightness due to the system of the light beam splitting optical device 13 and an analyzer 21. The signal from the detector 17 is distributed into the two systems and one of them is used for the auto-focus signal and the other is used for the reproducing signal.

On the other hand, the signals of the detectors 19 and 20 are differentiated by a differential amplifier (AMP) 22. The objective lens is swung to the right and left in response to a signal of the differential AMP 22, thereby performing the tracking.

In the reproducing unit, a brightness pattern with a high contrast can be detected due to the operation of the optical device 13.

As light quantity adjusting means between the recording and reproducing times, a Faraday rotating device may be inserted between the optical device 13 and the recording medium 15.

The Faraday rotating device is formed by, for example, YIG (yttrium, iron, garnet) crystal, glass of which rare earth was doped, or the like. By applying a magnetic field to this rotating device, the polarization surface of the luminous flux can be rotated. This Faraday rotating device is used because of the following reasons.

The polarizing direction of the reflected light from the recording medium 15 upon recording differs from the polarizing direction of the reflected light which was subjected to the Kerr rotation upon reproduction. Therefore, the reflected light beam is separated from the incident light beam by the light splitting optical device 13, so that the quantities of lights which transmit the analyzer 21 differ.

In addition, a quantity of light emission from the light source upon reproduction has to be reduced than that upon recording in order to prevent that the magnetic domain pattern recorded is inverted. Therefore, the quantities of lights which transmit the analyzer 21 upon recording and reproduction also differ due to this reason.

In the case where the quantities of light beams which are led through the cylindrical lens 16 to the quarter dividing detector 17 to detect the recording signal and auto-focus signal remarkably differ, it is necessary to change over the sensitivities of the detector 17 in dependence upon the recording and reproducing modes.

By properly applying a magnetic field to the Faraday rotating device upon recording, the polarization surface of the recording light beam is rotated, thereby adjusting the quantity of light which enters the detector 17 by means of a combination of the optical device 13 and analyzer 21 and thereby solving the foregoing problem.

In the embodiment, the video disk has been described. However, the invention is not limited to this example and can be also applied to the data processes in the network which is constituted by a work station, printer, host computer, disk apparatus, etc.

Next, the coding system (corresponding to the coding systems 1, 2 and 3 in FIG. 2) according to the present invention will be described.

According to D. T. Tang and L. R. Bahl, "Block Codes for a Class of Constrained Noiseless Channels", Information and Control, Vol. 17, 1970, p. 436, it is proved that the number of k-limitation codes having a length of n bits, namely, the number of codes in which d=0 and k is a limited value can be obtained by the following Nk(n).

$$Nk(n) = 2^n \qquad (0 < n \leqq k)$$

$$Nk(n) = \sum_{l=1}^{k+1} Nk(n-l) \qquad (n > k)$$

The results of calculations using these equations are shown in Table 3.

TABLE 3

| k | 1 | 2 | 3 |
|---|---|---|---|
| Nk(1) | 2 | 2 | 2 |
| Nk(2) | 3 | 4 | 4 |
| Nk(3) | 5 | 7 | 8 |
| Nk(4) | 8 | 13 | 15 |
| Nk(5) | 13 | 24 | 29 |
| Nk(6) | 21 | 44 | 56 |
| Nk(7) | 34 | 81 | 108 |
| Nk(8) | 55 | 149 | 208 |
| Nk(9) | 89 | 274 | 401 |
| Nk(10) | 144 | 504 | 773 |
| Nk(11) | 233 | 927 | 1490 |
| Nk(12) | 377 | 1705 | 2872 |
| Nk(13) | 610 | 3136 | 5536 |
| Nk(14) | 987 | 5768 | 10671 |
| Nk(15) | 1597 | 10609 | 20569 |
| Nk(16) | 2584 | 19513 | 39648 |

Figure 4:
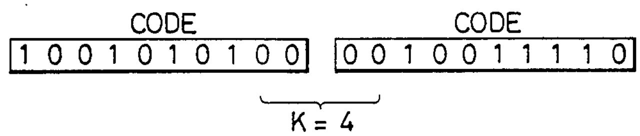
FIG. 4 is an explanatory diagram in the case where the limitation of k=2 is broken when two codes are coupled.

It will be understood from this Table 3 that the number of codes in which k=2 (d=0) when n=10 is 504. However, as shown in FIG. 4, when these codes are coupled, there is a possibility such that the limitation of k=2 is broken in the coupling portion among the codes. Nevertheless, if the 10-bit code can be constituted as shown in FIG. 5-1, the limitation of k=2 is not broken even due to the coupling of the codes.

Figures 1, 5:
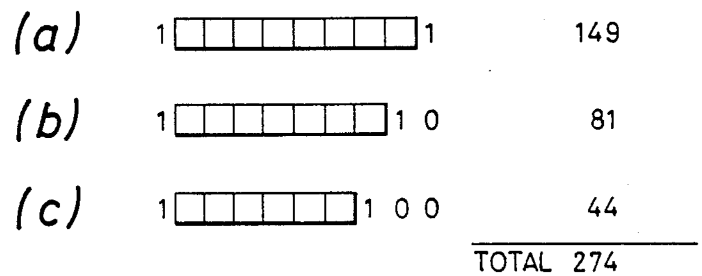
Figures 2, 5:
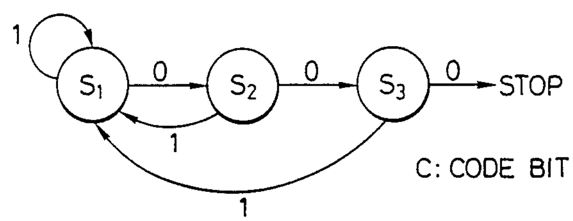
Figures 3, 5:
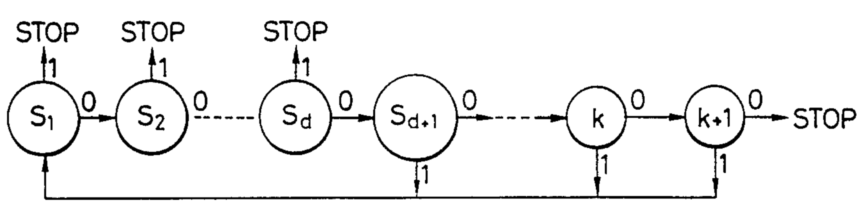

Practically speaking, FIG. 5-1 (*a*) shows the code in which the first bit is certainly "1" and the last bit is "1" and the intermediate eight bits are the k-limitation codes of k=2. The number of such codes which exist is 149 from Table 3. FIG. 5-1 (*b*) shows the code in which the first bit is certainly "1" and the last two bits are "1 0" and the intermediate seven bits are the k-limitation codes of k=2. The number of such codes which exist is 81 from Table 3. FIG. 5-1 (*c*) shows the code in which the first bit is certainly "1" and the last three bits are "1 0 0" and the intermediate six bits are the k-limitation codes of k=2. The number of such codes which exist is 44 from Table 3.

From the above explanation, the number of k-limitation codes constituted as shown in FIG. 5-1 in which the limitation of k=2 is not broken even if the codes are coupled is 274.

Next, the case where data is separated on an 8-bit unit basis and these are converted to the 10-bit codes will be considered. In this case, $2^8=256$ kinds of 8-bit data exist and this number is smaller than the number of 274 of the 10-bit codes in FIG. 5-1. Therefore, it will be understood that by appropriately selecting 256 codes from among the 274 codes and by making these codes correspond to the 256 8-bit data so as to satisfy the one-to-one corresponding relation, the (m, n, d, k)=(8, 10, 0, 2) code can be realized. In case of converting the data each having eight bits into the 10-bit codes, the codes which are arbitrarily selected from the codes shown in Table 4 or 5 may be made correspond to the $2^8=256$ codes when k=2. Such conversion tables may be provided in a ROM.

TABLE 4

| NUMBER | 10-BIT CODE |
|---|---|
| 1 | 1 0 0 1 0 0 1 0 0 1 |
| 2 | 1 0 0 1 0 0 1 0 1 1 |
| 3 | 1 0 0 1 0 0 1 1 0 1 |
| 4 | 1 0 0 1 0 0 1 1 1 1 |
| 5 | 1 0 0 1 0 1 0 0 1 1 |
| 6 | 1 0 0 1 0 1 0 1 0 1 |
| 7 | 1 0 0 1 0 1 0 1 1 1 |
| 8 | 1 0 0 1 0 1 1 0 0 1 |
| 9 | 1 0 0 1 0 1 1 0 1 1 |
| 10 | 1 0 0 1 0 1 1 1 0 1 |
| 11 | 1 0 0 1 0 1 1 1 1 1 |
| 12 | 1 0 0 1 1 0 0 1 0 1 |
| 13 | 1 0 0 1 1 0 0 1 1 1 |
| 14 | 1 0 0 1 1 0 1 0 0 1 |
| 15 | 1 0 0 1 1 0 1 0 1 1 |
| 16 | 1 0 0 1 1 0 1 1 0 1 |
| 17 | 1 0 0 1 1 0 1 1 1 1 |
| 18 | 1 0 0 1 1 1 0 0 1 1 |
| 19 | 1 0 0 1 1 1 0 1 0 1 |
| 20 | 1 0 0 1 1 1 0 1 1 1 |
| 21 | 1 0 0 1 1 1 1 0 0 1 |
| 22 | 1 0 0 1 1 1 1 0 1 1 |
| 23 | 1 0 0 1 1 1 1 1 0 1 |
| 24 | 1 0 0 1 1 1 1 1 1 1 |
| 25 | 1 0 1 0 0 1 0 0 1 1 |
| 26 | 1 0 1 0 0 1 0 1 0 1 |
| 27 | 1 0 1 0 0 1 0 1 1 1 |
| 28 | 1 0 1 0 0 1 1 0 0 1 |
| 29 | 1 0 1 0 0 1 1 0 1 1 |
| 30 | 1 0 1 0 0 1 1 1 0 1 |
| 31 | 1 0 1 0 0 1 1 1 1 1 |
| 32 | 1 0 1 0 1 0 0 1 0 1 |
| 33 | 1 0 1 0 1 0 0 1 1 1 |
| 34 | 1 0 1 0 1 0 1 0 0 1 |
| 35 | 1 0 1 0 1 0 1 0 1 1 |
| 36 | 1 0 1 0 1 0 1 1 0 1 |
| 37 | 1 0 1 0 1 0 1 1 1 1 |
| 38 | 1 0 1 0 1 1 0 0 1 1 |
| 39 | 1 0 1 0 1 1 0 1 0 1 |
| 40 | 1 0 1 0 1 1 0 1 1 1 |
| 41 | 1 0 1 0 1 1 1 0 0 1 |
| 42 | 1 0 1 0 1 1 1 0 1 1 |
| 43 | 1 0 1 0 1 1 1 1 0 1 |
| 44 | 1 0 1 0 1 1 1 1 1 1 |
| 45 | 1 0 1 1 0 0 1 0 0 1 |
| 46 | 1 0 1 1 0 0 1 0 1 1 |
| 47 | 1 0 1 1 0 0 1 1 0 1 |
| 48 | 1 0 1 1 0 0 1 1 1 1 |
| 49 | 1 0 1 1 0 1 0 0 1 1 |
| 50 | 1 0 1 1 0 1 0 1 0 1 |
| 51 | 1 0 1 1 0 1 0 1 1 1 |
| 52 | 1 0 1 1 0 1 1 0 0 1 |
| 53 | 1 0 1 1 0 1 1 0 1 1 |
| 54 | 1 0 1 1 0 1 1 1 0 1 |
| 55 | 1 0 1 1 0 1 1 1 1 1 |
| 56 | 1 0 1 1 1 0 0 1 0 1 |
| 57 | 1 0 1 1 1 0 0 1 1 1 |
| 58 | 1 0 1 1 1 0 1 0 0 1 |
| 59 | 1 0 1 1 1 0 1 0 1 1 |
| 60 | 1 0 1 1 1 0 1 1 0 1 |
| 61 | 1 0 1 1 1 0 1 1 1 1 |
| 62 | 1 0 1 1 1 1 0 0 1 1 |
| 63 | 1 0 1 1 1 1 0 1 0 1 |
| 64 | 1 0 1 1 1 1 0 1 1 1 |
| 65 | 1 0 1 1 1 1 1 0 0 1 |
| 66 | 1 0 1 1 1 1 1 0 1 1 |
| 67 | 1 0 1 1 1 1 1 1 0 1 |
| 68 | 1 0 1 1 1 1 1 1 1 1 |
| 69 | 1 1 0 0 1 0 0 1 0 1 |
| 70 | 1 1 0 0 1 0 0 1 1 1 |
| 71 | 1 1 0 0 1 0 1 0 0 1 |

TABLE 4-continued

| NUMBER | 10-BIT CODE |
| --- | --- |
| 72 | 1100101011 |
| 73 | 1100101101 |
| 74 | 1100101111 |
| 75 | 1100110011 |
| 76 | 1100110101 |
| 77 | 1100110111 |
| 78 | 1100111001 |
| 79 | 1100111011 |
| 80 | 1100111101 |
| 81 | 1100111111 |
| 82 | 1101001001 |
| 83 | 1101001011 |
| 84 | 1101001101 |
| 85 | 1101001111 |
| 86 | 1101010011 |
| 87 | 1101010101 |
| 88 | 1101010111 |
| 89 | 1101011001 |
| 90 | 1101011011 |
| 91 | 1101011101 |
| 92 | 1101011111 |
| 93 | 1101100101 |
| 94 | 1101100111 |
| 95 | 1101101001 |
| 96 | 1101101011 |
| 97 | 1101101101 |
| 98 | 1101101111 |
| 99 | 1101110011 |
| 100 | 1101110101 |
| 101 | 1101110111 |
| 102 | 1101111001 |
| 103 | 1101111011 |
| 104 | 1101111101 |
| 105 | 1101111111 |
| 106 | 1110010011 |
| 107 | 1110010101 |
| 108 | 1110010111 |
| 109 | 1110011001 |
| 110 | 1110011011 |
| 111 | 1110011101 |
| 112 | 1110011111 |
| 113 | 1110100101 |
| 114 | 1110100111 |
| 115 | 1110101001 |
| 116 | 1110101011 |
| 117 | 1110101101 |
| 118 | 1110101111 |
| 119 | 1110110011 |
| 120 | 1110110101 |
| 121 | 1110110111 |
| 122 | 1110111001 |
| 123 | 1110111011 |
| 124 | 1110111101 |
| 125 | 1110111111 |
| 126 | 1111001001 |
| 127 | 1111001011 |
| 128 | 1111001101 |
| 129 | 1111001111 |
| 130 | 1111010011 |
| 131 | 1111010101 |
| 132 | 1111010111 |
| 133 | 1111011001 |
| 134 | 1111011011 |
| 135 | 1111011101 |
| 136 | 1111011111 |
| 137 | 1111100101 |
| 138 | 1111100111 |
| 139 | 1111101001 |
| 140 | 1111101011 |
| 141 | 1111101101 |
| 142 | 1111101111 |
| 143 | 1111110011 |
| 144 | 1111110101 |
| 145 | 1111110111 |
| 146 | 1111111001 |
| 147 | 1111111011 |
| 148 | 1111111101 |
| 149 | 1111111111 |
| 150 | 1001001010 |
| 151 | 1001001110 |
| 152 | 1001010010 |

TABLE 4-continued

| NUMBER | 10-BIT CODE |
| --- | --- |
| 153 | 1001010110 |
| 154 | 1001011010 |
| 155 | 1001011110 |
| 156 | 1001100110 |
| 157 | 1001101010 |
| 158 | 1001101110 |
| 159 | 1001110010 |
| 160 | 1001110110 |
| 161 | 1001111010 |
| 162 | 1001111110 |
| 163 | 1010010010 |
| 164 | 1010010110 |
| 165 | 1010011010 |
| 166 | 1010011110 |
| 167 | 1010100110 |
| 168 | 1010101010 |
| 169 | 1010101110 |
| 170 | 1010110010 |
| 171 | 1010110110 |
| 172 | 1010111010 |
| 173 | 1010111110 |
| 174 | 1011001010 |
| 175 | 1011001110 |
| 176 | 1011010010 |
| 177 | 1011010110 |
| 178 | 1011011010 |
| 179 | 1011011110 |
| 180 | 1011100110 |
| 181 | 1011101010 |
| 182 | 1011101110 |
| 183 | 1011110010 |
| 184 | 1011110110 |
| 185 | 1011111010 |
| 186 | 1011111110 |
| 187 | 1100100110 |
| 188 | 1100101010 |
| 189 | 1100101110 |
| 190 | 1100110010 |
| 191 | 1100110110 |
| 192 | 1100111010 |
| 193 | 1100111110 |
| 194 | 1101001010 |
| 195 | 1101001110 |
| 196 | 1101010010 |
| 197 | 1101010110 |
| 198 | 1101011010 |
| 199 | 1101011110 |
| 200 | 1101100110 |
| 201 | 1101101010 |
| 202 | 1101101110 |
| 203 | 1101110010 |
| 204 | 1101110110 |
| 205 | 1101111010 |
| 206 | 1101111110 |
| 207 | 1110010010 |
| 208 | 1110010110 |
| 209 | 1110011010 |
| 210 | 1110011110 |
| 211 | 1110100110 |
| 212 | 1110101010 |
| 213 | 1110101110 |
| 214 | 1110110010 |
| 215 | 1110110110 |
| 216 | 1110111010 |
| 217 | 1110111110 |
| 218 | 1111001010 |
| 219 | 1111001110 |
| 220 | 1111010010 |
| 221 | 1111010110 |
| 222 | 1111011010 |
| 223 | 1111011110 |
| 224 | 1111100110 |
| 225 | 1111101010 |
| 226 | 1111101110 |
| 227 | 1111110010 |
| 228 | 1111110110 |
| 229 | 1111111010 |
| 230 | 1111111110 |
| 231 | 0100100101 |
| 232 | 0100100111 |
| 233 | 0100101001 |

TABLE 4-continued

| NUMBER | 10-BIT CODE |
|---|---|
| 234 | 0100101011 |
| 235 | 0100101101 |
| 236 | 0100101111 |
| 237 | 0100110011 |
| 238 | 0100110101 |
| 239 | 0100110111 |
| 240 | 0100111001 |
| 241 | 0100111011 |
| 242 | 0100111101 |
| 243 | 0100111111 |
| 244 | 0101001001 |
| 245 | 0101001011 |
| 246 | 0101001101 |
| 247 | 0101001111 |
| 248 | 0101010011 |
| 249 | 0101010101 |
| 250 | 0101010111 |
| 251 | 0101011001 |
| 252 | 0101011011 |
| 253 | 0101011101 |
| 254 | 0101011111 |
| 255 | 0101100101 |
| 256 | 0101100111 |
| 257 | 0101101001 |
| 258 | 0101101011 |
| 259 | 0101101101 |
| 260 | 0101101111 |
| 261 | 0101110011 |
| 262 | 0101110101 |
| 263 | 0101110111 |
| 264 | 0101111001 |
| 265 | 0101111011 |
| 266 | 0101111101 |
| 267 | 0101111111 |
| 268 | 0110010011 |
| 269 | 0110010101 |
| 270 | 0110010111 |
| 271 | 0110011001 |
| 272 | 0110011011 |
| 273 | 0110011101 |
| 274 | 0110011111 |
| 275 | 0110100101 |
| 276 | 0110100111 |
| 277 | 0110101001 |
| 278 | 0110101011 |
| 279 | 0110101101 |
| 280 | 0110101111 |
| 281 | 0110110011 |
| 282 | 0110110101 |
| 283 | 0110110111 |
| 284 | 0110111001 |
| 285 | 0110111011 |
| 286 | 0110111101 |
| 287 | 0110111111 |
| 288 | 0111001001 |
| 289 | 0111001011 |
| 290 | 0111001101 |
| 291 | 0111001111 |
| 292 | 0111010011 |
| 293 | 0111010101 |
| 294 | 0111010111 |
| 295 | 0111011001 |
| 296 | 0111011011 |
| 297 | 0111011101 |
| 298 | 0111011111 |
| 299 | 0111100101 |
| 300 | 0111100111 |
| 301 | 0111101001 |
| 302 | 0111101011 |
| 303 | 0111101101 |
| 304 | 0111101111 |
| 305 | 0111110011 |
| 306 | 0111110101 |
| 307 | 0111110111 |
| 308 | 0111111001 |
| 309 | 0111111011 |
| 310 | 0111111101 |
| 311 | 0111111111 |
| 312 | 0100100110 |
| 313 | 0100101010 |
| 314 | 0100101110 |

TABLE 4-continued

| NUMBER | 10-BIT CODE |
|---|---|
| 315 | 0100110010 |
| 316 | 0100110110 |
| 317 | 0100111010 |
| 318 | 0100111110 |
| 319 | 0101001010 |
| 320 | 0101001110 |
| 321 | 0101010010 |
| 322 | 0101010110 |
| 323 | 0101011010 |
| 324 | 0101011110 |
| 325 | 0101100110 |
| 326 | 0101101010 |
| 327 | 0101101110 |
| 328 | 0101110010 |
| 329 | 0101110110 |
| 330 | 0101111010 |
| 331 | 0101111110 |
| 332 | 0110010010 |
| 333 | 0110010110 |
| 334 | 0110011010 |
| 335 | 0110011110 |
| 336 | 0110100110 |
| 337 | 0110101010 |
| 338 | 0110101110 |
| 339 | 0110110010 |
| 340 | 0110110110 |

TABLE 5

| NUMBER | 10-BIT CODE |
|---|---|
| 1 | 1001001001 |
| 2 | 1001001011 |
| 3 | 1001001101 |
| 4 | 1001001111 |
| 5 | 1001010011 |
| 6 | 1001010101 |
| 7 | 1001010111 |
| 8 | 1001011001 |
| 9 | 1001011011 |
| 10 | 1001011101 |
| 11 | 1001011111 |
| 12 | 1001100101 |
| 13 | 1001100111 |
| 14 | 1001101001 |
| 15 | 1001101011 |
| 16 | 1001101101 |
| 17 | 1001101111 |
| 18 | 1001110011 |
| 19 | 1001110101 |
| 20 | 1001110111 |
| 21 | 1001111001 |
| 22 | 1001111011 |
| 23 | 1001111101 |
| 24 | 1001111111 |
| 25 | 1010010011 |
| 26 | 1010010101 |
| 27 | 1010010111 |
| 28 | 1010011001 |
| 29 | 1010011011 |
| 30 | 1010011101 |
| 31 | 1010011111 |
| 32 | 1010100101 |
| 33 | 1010100111 |
| 34 | 1010101001 |
| 35 | 1010101011 |
| 36 | 1010101101 |
| 37 | 1010101111 |
| 38 | 1010110011 |
| 39 | 1010110101 |
| 40 | 1010110111 |
| 41 | 1010111001 |
| 42 | 1010111011 |
| 43 | 1010111101 |
| 44 | 1010111111 |
| 45 | 1011001001 |
| 46 | 1011001011 |
| 47 | 1011001101 |
| 48 | 1011001111 |
| 49 | 1011010011 |

TABLE 5-continued

| NUMBER | 10-BIT CODE |
|---|---|
| 50 | 1011010101 |
| 51 | 1011010111 |
| 52 | 1011011001 |
| 53 | 1011011011 |
| 54 | 1011011101 |
| 55 | 1011011111 |
| 56 | 1011100101 |
| 57 | 1011100111 |
| 58 | 1011101001 |
| 59 | 1011101011 |
| 60 | 1011101101 |
| 61 | 1011101111 |
| 62 | 1011110011 |
| 63 | 1011110101 |
| 64 | 1011110111 |
| 65 | 1011111001 |
| 66 | 1011111011 |
| 67 | 1011111101 |
| 68 | 1011111111 |
| 69 | 1100100101 |
| 70 | 1100100111 |
| 71 | 1100101001 |
| 72 | 1100101011 |
| 73 | 1100101101 |
| 74 | 1100101111 |
| 75 | 1100110011 |
| 76 | 1100110101 |
| 77 | 1100110111 |
| 78 | 1100111001 |
| 79 | 1100111011 |
| 80 | 1100111101 |
| 81 | 1100111111 |
| 82 | 1101001001 |
| 83 | 1101001011 |
| 84 | 1101001101 |
| 85 | 1101001111 |
| 86 | 1101010011 |
| 87 | 1101010101 |
| 88 | 1101010111 |
| 89 | 1101011001 |
| 90 | 1101011011 |
| 91 | 1101011101 |
| 92 | 1101011111 |
| 93 | 1101100101 |
| 94 | 1101100111 |
| 95 | 1101101001 |
| 96 | 1101101011 |
| 97 | 1101101101 |
| 98 | 1101101111 |
| 99 | 1101110011 |
| 100 | 1101110101 |
| 101 | 1101110111 |
| 102 | 1101111001 |
| 103 | 1101111011 |
| 104 | 1101111101 |
| 105 | 1101111111 |
| 106 | 1110010011 |
| 107 | 1110010101 |
| 108 | 1110010111 |
| 109 | 1110011001 |
| 110 | 1110011011 |
| 111 | 1110011101 |
| 112 | 1110011111 |
| 113 | 1110100101 |
| 114 | 1110100111 |
| 115 | 1110101001 |
| 116 | 1110101011 |
| 117 | 1110101101 |
| 118 | 1110101111 |
| 119 | 1110110011 |
| 120 | 1110110101 |
| 121 | 1110110111 |
| 122 | 1110111001 |
| 123 | 1110111011 |
| 124 | 1110111101 |
| 125 | 1110111111 |
| 126 | 1111001001 |
| 127 | 1111001011 |
| 128 | 1111001101 |
| 129 | 1111001111 |
| 130 | 1111010011 |

TABLE 5-continued

| NUMBER | 10-BIT CODE |
|---|---|
| 131 | 1111010101 |
| 132 | 1111010111 |
| 133 | 1111011001 |
| 134 | 1111011011 |
| 135 | 1111011101 |
| 136 | 1111011111 |
| 137 | 1111100101 |
| 138 | 1111100111 |
| 139 | 1111101001 |
| 140 | 1111101011 |
| 141 | 1111101101 |
| 142 | 1111101111 |
| 143 | 1111110011 |
| 144 | 1111110101 |
| 145 | 1111110111 |
| 146 | 1111111001 |
| 147 | 1111111011 |
| 148 | 1111111101 |
| 149 | 1111111111 |
| 150 | 1001001010 |
| 151 | 1001001110 |
| 152 | 1001010010 |
| 153 | 1001010110 |
| 154 | 1001011010 |
| 155 | 1001011110 |
| 156 | 1001100110 |
| 157 | 1001101010 |
| 158 | 1001101110 |
| 159 | 1001110010 |
| 160 | 1001110110 |
| 161 | 1001111010 |
| 162 | 1001111110 |
| 163 | 1010010010 |
| 164 | 1010010110 |
| 165 | 1010011010 |
| 166 | 1010011110 |
| 167 | 1010100110 |
| 168 | 1010101010 |
| 169 | 1010101110 |
| 170 | 1010110010 |
| 171 | 1010110110 |
| 172 | 1010111010 |
| 173 | 1010111110 |
| 174 | 1011001010 |
| 175 | 1011001110 |
| 176 | 1011010010 |
| 177 | 1011010110 |
| 178 | 1011011010 |
| 179 | 1011011110 |
| 180 | 1011100110 |
| 181 | 1011101010 |
| 182 | 1011101110 |
| 183 | 1011110010 |
| 184 | 1011110110 |
| 185 | 1011111010 |
| 186 | 1011111110 |
| 187 | 1100100110 |
| 188 | 1100101010 |
| 189 | 1100101110 |
| 190 | 1100110010 |
| 191 | 1100110110 |
| 192 | 1100111010 |
| 193 | 1100111110 |
| 194 | 1101001010 |
| 195 | 1101001110 |
| 196 | 1101010010 |
| 197 | 1101010110 |
| 198 | 1101011010 |
| 199 | 1101011110 |
| 200 | 1101100110 |
| 201 | 1101101010 |
| 202 | 1101101110 |
| 203 | 1101110010 |
| 204 | 1101110110 |
| 205 | 1101111010 |
| 206 | 1101111110 |
| 207 | 1110010010 |
| 208 | 1110010110 |
| 209 | 1110011010 |
| 210 | 1110011110 |
| 211 | 1110100110 |

TABLE 5-continued

| NUMBER | 10-BIT CODE |
|---|---|
| 212 | 1 1 1 0 1 0 1 0 1 0 |
| 213 | 1 1 1 0 1 0 1 1 1 0 |
| 214 | 1 1 1 0 1 1 0 0 1 0 |
| 215 | 1 1 1 0 1 1 0 1 1 0 |
| 216 | 1 1 1 0 1 1 1 0 1 0 |
| 217 | 1 1 1 0 1 1 1 1 1 0 |
| 218 | 1 1 1 1 0 0 1 0 1 0 |
| 219 | 1 1 1 1 0 0 1 1 1 0 |
| 220 | 1 1 1 1 0 1 0 0 1 0 |
| 221 | 1 1 1 1 0 1 0 1 1 0 |
| 222 | 1 1 1 1 0 1 1 0 1 0 |
| 223 | 1 1 1 1 0 1 1 1 1 0 |
| 224 | 1 1 1 1 1 0 0 1 1 0 |
| 225 | 1 1 1 1 1 0 1 0 1 0 |
| 226 | 1 1 1 1 1 0 1 1 1 0 |
| 227 | 1 1 1 1 1 1 0 0 1 0 |
| 228 | 1 1 1 1 1 1 0 1 1 0 |
| 229 | 1 1 1 1 1 1 1 0 1 0 |
| 230 | 1 1 1 1 1 1 1 1 1 0 |
| 231 | 1 0 0 1 0 0 1 1 0 0 |
| 232 | 1 0 0 1 0 1 0 1 0 0 |
| 233 | 1 0 0 1 0 1 1 1 0 0 |
| 234 | 1 0 0 1 1 0 0 1 0 0 |
| 235 | 1 0 0 1 1 0 1 1 0 0 |
| 236 | 1 0 0 1 1 1 0 1 0 0 |
| 237 | 1 0 0 1 1 1 1 1 0 0 |
| 238 | 1 0 1 0 0 1 0 1 0 0 |
| 239 | 1 0 1 0 0 1 1 1 0 0 |
| 240 | 1 0 1 0 1 0 0 1 0 0 |
| 241 | 1 0 1 0 1 0 1 1 0 0 |
| 242 | 1 0 1 0 1 1 0 1 0 0 |
| 243 | 1 0 1 0 1 1 1 1 0 0 |
| 244 | 1 0 1 1 0 0 1 1 0 0 |
| 245 | 1 0 1 1 0 1 0 1 0 0 |
| 246 | 1 0 1 1 0 1 1 1 0 0 |
| 247 | 1 0 1 1 1 0 0 1 0 0 |
| 248 | 1 0 1 1 1 0 1 1 0 0 |
| 249 | 1 0 1 1 1 1 0 1 0 0 |
| 250 | 1 0 1 1 1 1 1 1 0 0 |
| 251 | 1 1 0 0 1 0 0 1 0 0 |
| 252 | 1 1 0 0 1 0 1 1 0 0 |
| 253 | 1 1 0 0 1 1 0 1 0 0 |
| 254 | 1 1 0 0 1 1 1 1 0 0 |
| 255 | 1 1 0 1 0 0 1 1 0 0 |
| 256 | 1 1 0 1 0 1 0 1 0 0 |
| 257 | 1 1 0 1 0 1 1 1 0 0 |
| 258 | 1 1 0 1 1 0 0 1 0 0 |
| 259 | 1 1 0 1 1 0 1 1 0 0 |
| 260 | 1 1 0 1 1 1 0 1 0 0 |
| 261 | 1 1 0 1 1 1 1 1 0 0 |
| 262 | 1 1 1 0 0 1 0 1 0 0 |
| 263 | 1 1 1 0 0 1 1 1 0 0 |
| 264 | 1 1 1 0 1 0 0 1 0 0 |
| 265 | 1 1 1 0 1 0 1 1 0 0 |
| 266 | 1 1 1 0 1 1 0 1 0 0 |
| 267 | 1 1 1 0 1 1 1 1 0 0 |
| 268 | 1 1 1 1 0 0 1 1 0 0 |
| 269 | 1 1 1 1 0 1 0 1 0 0 |
| 270 | 1 1 1 1 0 1 1 1 0 0 |
| 271 | 1 1 1 1 1 0 0 1 0 0 |
| 272 | 1 1 1 1 1 0 1 1 0 0 |
| 273 | 1 1 1 1 1 1 0 1 0 0 |
| 274 | 1 1 1 1 1 1 1 1 0 0 |

A method of producing code tables for the code conversion will then be described. Next, practical embodiments to produce the respective codes in FIGS. 5-1 (*a*), (*b*) and (*c*) will be explained with reference to a state transition diagram of FIG. 5-2. $S_1$, $S_2$ and $S_3$ denote three states and $S_1$ is the initial state. C represents a code bit. As one example, FIG. 6 shows a method of producing the 6-bit k-limitation code of k=2 shown in FIG. 5-1 (*c*). This producing method is also similar to the cases with regard to FIGS. 5-1 (*a*) and (*b*). FIG. 6 will now be practically explained.

As shown in FIG. 6, codes $C_1, C_2, \ldots, C_6$ are sequentially increased such that they are 000000, 000001, . . . and a check may be made to see if the state transition diagram of FIG. 5-2 is satisfied (the state does not advance to "STOP" in FIG. 5-2) or not. For example, in case of 000000, the state advances in the sequence of $S_1 \rightarrow S_2 \rightarrow S_3$ and in the third state of "0", it advances to "STOP", so that it is found that this code does not satisfy FIG. 5-1 (*c*). The same shall apply to the other code conversions. FIG. 5-3 shows a state transition diagram for production of codes in the case where there is generally a limitation such that the minimum number of "0" which exists between "1" and "1" of the code is d and the maximum number is k. In other words, k+1 states are provided and in the states from state 1 ($S_1$) to state d+1 ($S_{d+1}$), if there is "1", the state goes out of the transition diagram and becomes "STOP". If the bit is "0", the state sequentially advances to the states $S_1$, $S_2$, . . . . In the states from state d+1 to state k+1, if the bit is "0", the state sequentially advances to the next state and when the bit "1" appears, the state is returned to $S_1$. In the state k+1, if the "0" appears, the state goes out of the transition diagram and becomes "STOP". The code in the case where the state becomes "STOP" is the code which does not satisfy the limitation.

Figure 7:
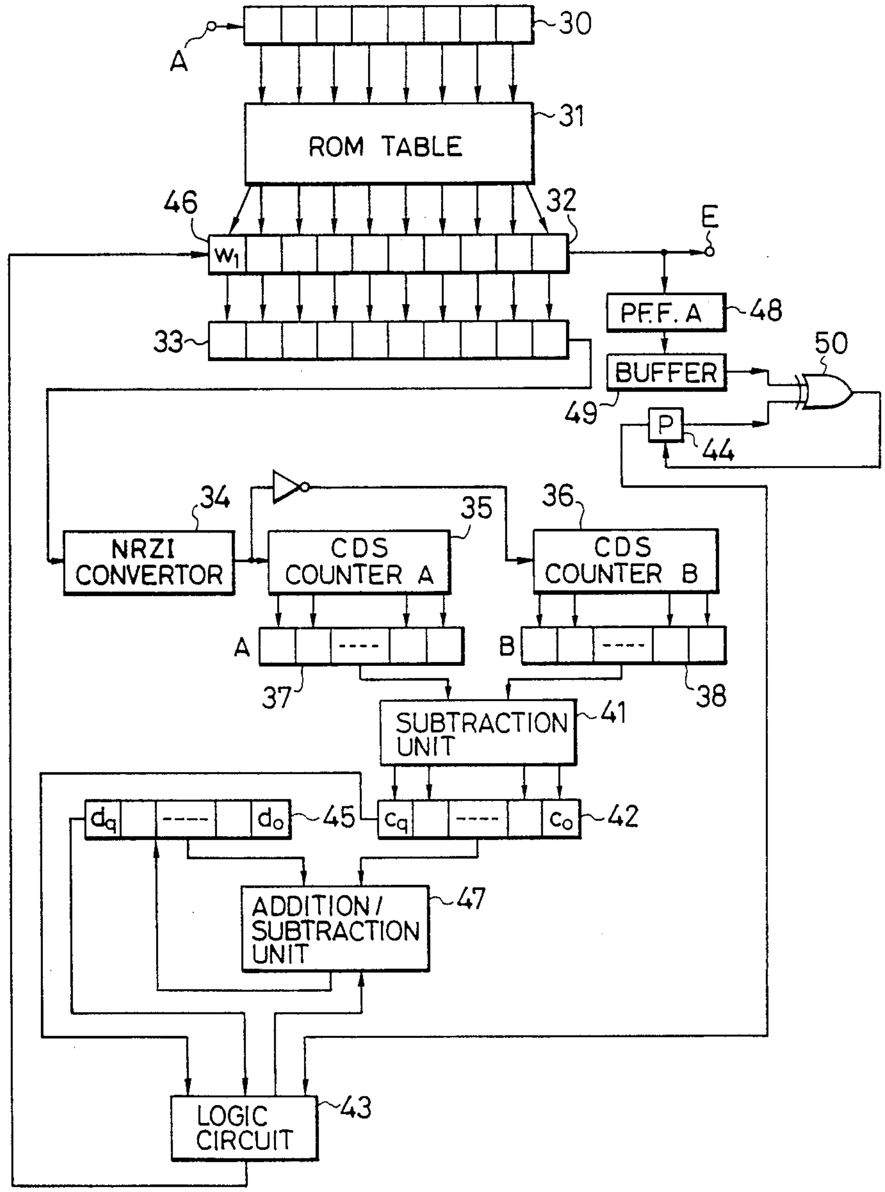
FIG. 7 is an arrangement block diagram for coding.

Next, an explanation will be made with respect to the case where the operation to produce the DC-free codes on one-code unit basis, namely, on a 10-bit unit basis is performed and the variation range of the DSV (Digital Sum Variation) is made small and thereby producing the DC-free codes having a large effect of suppression of the DC variation. FIG. 7 is an arrangement block diagram for encoding and shows the portions corresponding to 1, 2 and 3 in FIG. 2. The algorithm for encoding which is performed in the above block diagram will be first explained hereinbelow.

STEP 1: Set DSV=0 and P=0.

STEP 2: Convert the 8-bit data to the 10-bit codes (named W and the head bit (which is certainly 1) of the W is named $W_1$) by the foregoing coding systems.

STEP 3: Calculate the CDS.

STEP 4:

(i) If P=0 and sign DSV=sign CDS, invert the $W_1$ and set DSV=DSV−CDS.

(ii) If P=0 and sign DSV≠sign CDS, set DSV=DSV+CDS without inverting the $W_1$.

(iii) If P=1 and sign DSV=sign CDS, set DSV=DSV−CDS without inverting the $W_1$.

(iv) If P=1 and sign DSV≠sign CDS, invert the $W_1$ and set DSV=DSV+CDS.

After completion of the operation in STEP 4, name the code W as W'.

P denotes a flag in which it is 0 when the number of "1" is an even number and it is 1 in case of an odd number. On one hand, it is assumed that the high level (1) of the binary signal of which the code W was NRZI-converted is +1 and the low level (0) is −1 and the value of the sum of them is the CDS (Codeword Digital Sum). It is now assumed in this case that the binary signal of which the code W was NRZI-converted starts from the low level. The sign (+ or −) of the polarity of the sign CDS is + when the CDS is 0.

STEP 5: P=P ⊕ (P of W') Where, ⊕ indicates an exclusive OR. The W' is outputted as the code.

STEP 6: Jump to STEP 2 in order to perform the next encoding.

Figure 8:
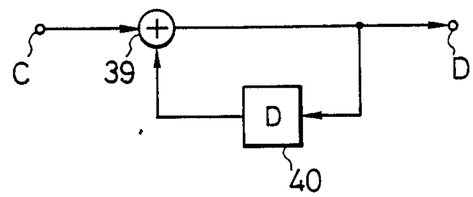
FIG. 8 is an arrangement block diagram of an NRZI converter.

FIG. 7 will then be explained on the basis of the description of the foregoing algorithm. Each 8-bit data inputted from an input terminal of Ⓐ in FIG. 7 is inputted to a shift register 30. Then, the corresponding 10-bit code is read out from a ROM 31 by way of the foregoing look-up table method and is inputted in parallel to a shift register 32 (STEP 3 in the foregoing algorithm). This ten-bit code is also simultaneously inputted to a shift register 33. The 10-bit code loaded into the register 33 is supplied to an NRZI converter 34 and is NRZI-converted. The number of "1" of this NRZI-converted code is counted by a CDS counter A indicated at 35, while the number of "0" is counted by a CDS counter B indicated at 36. Their respective count values are stored in registers A and B indicated at 37 and 38 (STEP 3 in the foregoing algorithm). The NRZI converter 34 is constituted as shown in FIG. 8. In FIG. 8, Ⓒ denotes an input terminal; 39 is an exclusive OR circuit; 40 a 1-bit delay device; and Ⓓ is an output terminal. For the calculation of the CDS, it is derived by subtracting the content of the register B at 38 from the content of the register A at 37 by a subtraction unit 41 in FIG. 7. The result of subtraction is stored in a CDS register 42.

Figure 9:
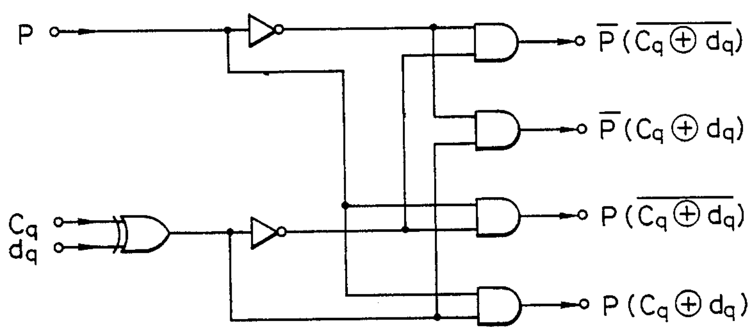
FIG. 9 is a diagram showing an example of a circuit to generate four flag signals.

Next, in STEP 4 of the foregoing algorithm, the classification of the items (i) to (iv) takes the same value as $$\overline{P}(\overline{C_q \oplus d_q}) = 1 \quad \text{(i)}$$

$$\overline{P}(C_q \oplus d_q) = 1 \quad \text{(ii)}$$

$$P(\overline{C_q \oplus d_q}) = 1 \quad \text{(iii)}$$

$$P(C_q \oplus d_q) = 1 \quad \text{(iv)}$$

and its determination is performed by a logic circuit 43. P represents a value of 44 in FIG. 7 and takes a value of 1 or 0. $C_q$ is the MSB of the CDS register 42 and $d_q$ is the MSB of a DSV register 45. Since the content of the register is expressed by a complementary indication of 2, in case of comparing the signs of the DSV and CDS, $c_q$ and $d_q$ may be merely compared in order to indicate the number which becomes negative when the MSB is 1 and becomes positive when it is 0. ⊕ represents the exclusive OR. On the basis of the foregoing four flag signals, when the flag of (i) is set, the logic circuit 43 allows the bit of $W_1$ indicated at 46 to be inverted and permits the operation of DSV=DSV−CDS to be performed by an addition/subtraction unit 47 and stores the result of operation into the DSV register 45. FIG. 9 shows a practical example of the circuit to generate the foregoing four flag signals, but its details are omitted. As described above, STEP 4 is finished. In the next STEP 5, the code W' is outputted from the shift register 32 and is outputted from an output terminal Ⓔ. At the same time, the number of "1" in the W' is checked to see if it is an even or odd number by a P flip flop A indicated at 48. Namely, when the number of "1" is an even number, the value of the flip flop 48 becomes 0 and when it is an odd number, the value becomes 1. This is attained by constituting the flip flop 48 in a manner such that its initial value is preset to 0 and it is inverted whenever "1" is inputted. The content of the flip flop 48 is stored in a buffer 49. In exclusive OR of the content of the buffer 49 and the content of the 44 is obtained by an exclusive OR circuit section 50 and its result is stored in the 44. In this way, STEP 5 is finished and the process routine is returned to STEP 2 and the similar processes are repeated.

As described in detail in the above, according to the (8, 10, 0, 2) code in the system of the invention, $$T_{min} = (8/10)T = 0.8T$$

$$T_{max} = (8/10)(2+1)T = 2.4T$$

$$T_W = (8/10)T = 0.8T$$

According to the typical code (8, 9, 0, 3) in the conventional system, $$T_{min} = 8/9T = 0.89T$$

$$T_{max} = 8/9(3+1)T = 3.56T$$

$$T_W = 8/9T = 0.89T$$

For instance, when the conventional system is compared with the system of the invention, according to the present system, the $T_{max}$ can be remarkably reduced due to a slight decrease in $T_{min}$ or $T_W$, so that there is an effect such that the synchronization can be easily obtained and the low frequency component is less. A similar effect is derived even if the present system is compared with other systems. In addition, the DC-free codes are realized using the (8, 10, 0, 2) code. On the other hand, in selection of 256 codes from among the 274 codes shown in FIG. 3, there is an effect such that by selecting 26 codes from the 194 codes in FIG. 5-1 (*a*), 81 codes in FIG. 5-1 (*b*) and code in FIG. 5-1 (*c*), it is possible to minimize the number of cases where the k-limitation is broken in the coupling portions of the codes, so that the coding can be efficiently performed.

Further, since the present system produces the codes on the basis of the (8, 10, 0, 2) code, there is a possibility such that the limitation of k=2 is broken only in the coupling portion of the 10-bit code. Therefore, there is an effect such that it is possible to produce the DC-free codes in which the low frequency component is fewer and the synchronization can be more easily derived as compared with the conventional systems.

In the present system, the operation to produce the DC-free codes on a one-code unit basis, namely, on a 10-bit unit basis (the operation to invert or non-invert the head bit $W_1$ of the code) is performed; therefore, there is an effect such that it is possible to produce the DC-free codes in which the variation range of the DSV (Digital Sum Variation) is small and an effect of suppression of the DC variation is large. The present invention is not limited to the encoding from 8 bits to 10 bits. But, the invention can be similarly applied to the decoding by using inversely the invention,. Also, the invention is not limited to eight bits but it can be likewise applied to the encoding from four bits to five bits or other encoding, for instance, from three bits to seven bits or the like, or its decoding, respectively. As described above, according to the invention, it is possible to provide an electronic apparatus in which data can be processed very efficiently and with a high degree of accuracy.

Figure 10:
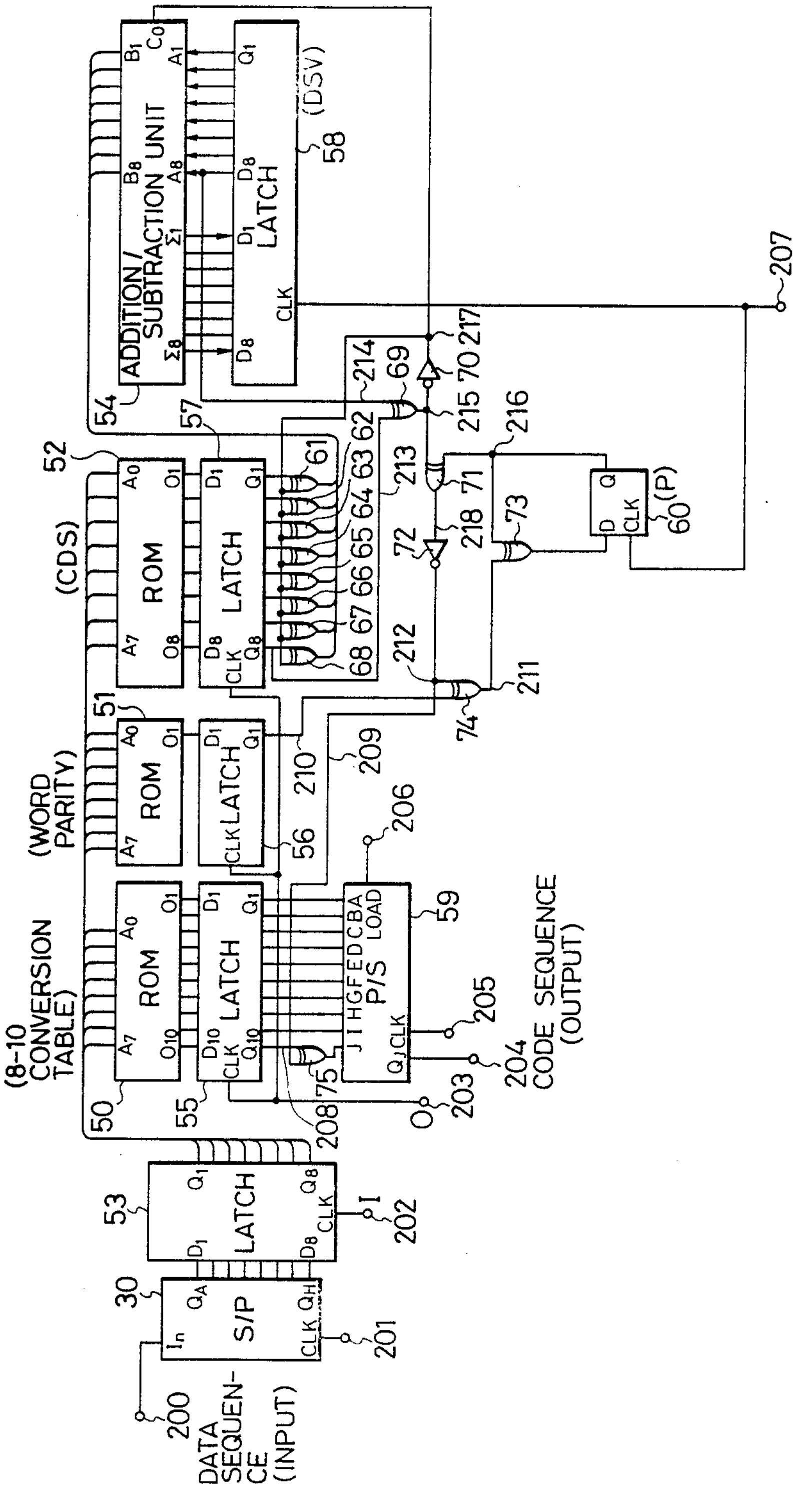
FIG. 10 is a diagram showing another arrangement example of the block diagram shown in FIG. 7.

FIG. 10 shows another arrangement example of the block diagram shown in FIG. 7, in which the hardware constitution to produce DC-free codes shown in FIG. 7 is constituted as a ROM. A numeral 30 similarly denotes the shift register to convert a serial data sequence 200 from the terminal Ⓐ to a parallel data. This shift register is driven by a CLK 201, e.g., 8MbPS. The parallel outputs of the S/P converter 30 are latched by a latch 53 and the parallel outputs of the latch 53 are transferred to a ROM 50 in which the 8–10 conversion table is stored, a ROM 51 to output a word parity, and a ROM 52 to calculate the value of the foregoing CDS.

Numeral 55, 56 and 57 indicate latch circuit sections. The outputs of the ROM 52 and latch section 57 are transferred through EX-OR circuits 61–68 to an addition/subtraction unit 54 to output the foregoing DSV. A numeral 58 is also a latch circuit section. The output code from the ROM 50 is transferred through the latch circuit section 55 to a parallelserial converter 59. However, the MSB of the code is inputted from a port $Q_{10}$ of the latch circuit section 55 through a signal line 208 and an EX-OR circuit 75 to a port J of the P/S converter 59. A numeral 206 denotes a load signal to instruct the taking-in of those parallel signals (code). The serial data converted in response to a clock 205 is outputted at a port $Q_J$ and an output 204 of the P/S converter 59.

A numeral 203 is a clock input to drive the latch circuit sections 55, 56 and 57; 207 is a clock input to drive a flip flop 60 and a latch circuit section 58; and 69, 71, 73, 74, and 75 are EX-OR circuits. The operation of the block diagram will be explained in detail later.

Figure 11:
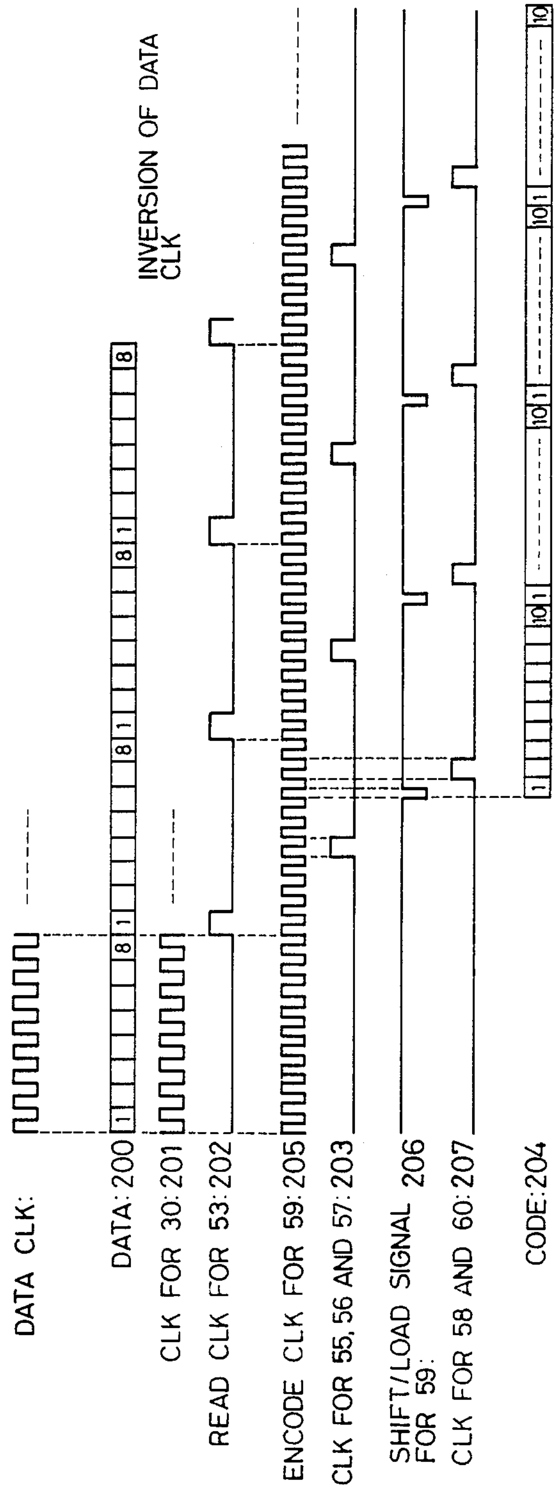
FIG. 11 is a diagram showing the operation timing of the block diagram shown in FIG. 10.

FIG. 11 is an operation timing chart for the block diagram shown in FIG. 10. First, the (serial) data sequence is inputted to the S/P converter 30 as indicated at 200 by the CLK for data to transfer the data. The CLK 201 for the S/P converter 30 is the clock of which the foregoing CLK for data was inverted. On the basis of the CLK 201, the 8-bit serial data is converted to the 8-bit parallel data by the S/P converter 30. Thereafter, this parallel data is taken into the latch circuit section 53 by a read clock Ⓘ of the CLK 53. Then, the data is transferred to the ROMs 50, 51 and 52 and is converted to a predetermined code. This code is latched by the latch circuit sections 55, 56 and 57 on the basis of an input of Ⓞ (out clock) of the CLK 203 and is transferred to the P/S converter 59. Then, after an expiration of a predetermined time (after the elapse of three clocks in FIG. 11), the load signal 206 to output the data of the P/S converter 59 is outputted. The head bit of the code 204 is first outputted from 204 on the basis of the CLK 205 for code. At this time, one pulse of CLK to drive the latch 58 and flip flop 60 is generated and a signal for inversion or the like of the head bit of the code (which will be mentioned later) is outputted. Thereafter, the code of total ten bits is outputted from 204 in response to the CLK 205 for code. The above-mentioned inversion is controlled by inverting or non-inverting the $W_1$ by use of the $W_1$ which is always "1" because the head bit $W_1$ is initially set to "1".

In the above-described arrangement, the code conversion from 8 bits to 10 bits and the foregoing algorithm to produce the DC-free codes will then be explained. First in STEP 1, the output of the DSV, namely, ports $Q_1-Q_8 \rightarrow A_1-A_8$ of the addition/subtraction unit 54 and latch circuit section 58 are set to "0" and the P of the flip flop 60 is set to "0".

In the next STEP 2, the 10-bit code is outputted from the latch 55 due to the 8–10 bit conversion (output from the port $Q_{10}$, and the head bit is set to $W_1$).

In the next STEP 3, the CDS is calculated by the ROM 52 and latch 57.

The process in the next STEP 4 will be described in detail. The condition "(i) If P=0 and sign DSV=sign CDS, invert the $W_1$ and set DSV=DSV−CDS." will now be described. With respect to the signs of the CDS and DSV, a check may be made to see if each output (0 (the sign is +) or 1 (the sign is −)) of the output port $Q_8$ of the latch circuit section 57 and of the output port $Q_8$ of the latch circuit portion 58 coincides or not. This discrimination is performed by the EX-OR circuit 69 to which signal lines 213 and 214 are connected. Namely, an output 215 of the EX-OR 69 becomes "0" when the signs of both of those outputs coincide and becomes "1" when they are not the same. When it is now assumed that the output 215 of the EX-OR circuit 69 is "0" and the parity of the code is an even number and "0", namely, when P=0 and sign DSV=sign CDS, an output of the EX-OR circuit 71 becomes "0" and an output of an inverter 72 becomes "1". Therefore, "1" is inputted to one input of the EX-OR circuit 75 through a signal 209, so that the output bit from the port $Q_{10}$ of the latch 55 is inverted in response to an output of the EX-OR 75.

On one hand, since the output 215 is "0", an output 217 of an inverter 70 becomes "1". The outputs $Q_1$ to $Q_8$ of the latch circuit section 57 are respectively inputted to one input of each of the EX-OR circuits 61 to 68. In order to set all of the other inputs of the EX-OR circuits 61−68 to "1", the outputs of which those outputs $Q_1-Q_8$ were inverted are obtained as the outputs of the EX-OR circuits 61−68 and its code is inputted to the addition/subtraction unit 54. This means that a complementary number of 2 is calculated. For instance, assuming that DSV=00000010 and CDS=00000001, DSV−CDS=00000001. First, all of the respective bits of the CDS are inverted and "1" is further added in response to the output 217 and a carry signal $C_0$. Thus, $\overline{CDS}$=11111111. Now, by adding the DSV and $\overline{CDS}$ by the addition/subtraction unit 54, we have 00000001 and the new DSV becomes DSV−CDS. As will be apparent from the above description, if P=0 and sign DSV=sign CDS, the $W_1$ is inverted and DSV=DSV−CDS.

In a similar manner as above, the condition "(ii) If P=0 and sign DSV≠sign CDS, set DSV=DSV+CDS without inverting the $W_1$." will be explained. In the case where sign DSV≠sign CDS, namely, in the case where the sign of the $Q_8$ of the latch 58 which is the MSB of the DSV differs from the sign of the $Q_8$ of the latch 57 which is the MSB of the CDS, that is, when the output 215 of the EX-OR circuit 69 is "1", an output 218 of the EX-OR circuit 71 becomes "1" since an output 216 of the flip flop 60 is "0" because P=0. Thus, an output of the inverter 72 becomes "0" and "0" is inputted to one input of the EX-OR circuit 75, so that the output of the EX-OR circuit 75 is outputted as it is without inverting the sign of the port $Q_{10}$ of the latch circuit section 55, namely, without inverting the $W_1$. On one hand, since the output 215 is "1" as mentioned above, the output 217 of the inverter 70 becomes "0" and the value of the CDS is inputted as it is to the addition/subtraction unit 54 different from the case of the condition (i). Thus, the new DSV is calculated as DSV=DSV+CDS. As will be obvious from the above description, when P=0 and sign CDS≠sign DSV, the new DSV=DSV+CDS.

Next, the condition "(iii) If P=1 and sign DSV=sign CDS, set DSV=DSV−CDS without inverting the $W_1$." will be explained. Since sign DSV=sign CDS, the output of the EX-OR 69 becomes "0". In addition, since P=1, the output 218 of the EX-OR 71 becomes "1" and the output of the inverter 72 becomes "0", and the $W_1$ is not inverted as described in the foregoing condition (ii). On one hand, since the output of the inverter 70 becomes "1", all of the respective bits of the CDS are inverted and are further increased by +1 due to the carry signal $C_0$ and a complementary number of 2 of the CDS is calculated, so that the new DSV=DSV−CDS.

Next, the condition "(iv) If P=1 and sign DSV≠sign CDS, invert the $W_1$ and set DSV=DSV+CDS." will be explained. Since sign DSV≠sign CDS, the output 215 of the EX-OR 69 becomes "1". In addition, since P=1, the output of the EX-OR 71 is "0" and the output of the inverter 72 is "1", so that the $W_1$ is inverted by the output of the EX-OR 75. On the other hand, since the output 215 is "1", the output of the inverter 70 becomes "0" and the value of the CDS is transferred as it is to the addition/subtraction unit 54, so that the new DSV=DSV+CDS.

The foregoing conditions will now be further described in detail. First, it is presumed that in the case where the DC component CDS of a word unit and the accumulated DC component DSV have the same sign, the DC component further has a tendency to increase, so that the new DSV is set to be equal to DSV−CDS in order to produce the DC-free codes, thereby reducing the DC component. On the other hand, in the case where both of them have the different signs, they are added as they are, namely, the new DSV is set to be equal to DSV+CDS, thereby reducing the DC component. This means that the sign of the CDS is switched by inverting the head bit $W_1$ of the actual code. Namely, in the case where

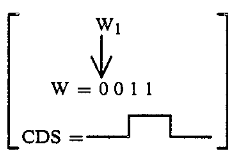

the CDS is obviously −2. However, when the head bit $W_1$ of the W is inverted,

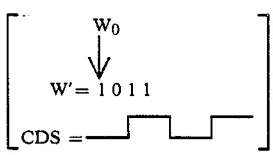

because the $W_1$ becomes "1", so that the value of the CDS becomes apparently +2. Therefore, it will be understood that the sign is inverted. Next, the relation between a parity P and the head bit $W_1$ will be described. In the foregoing description of the $W_1$, discrimination was made on the assumption that the first bit of the code is at a low level. However, there is a case where it is at a high level in dependence upon the one-preceding code. Namely, in case of the same W=0011, if the first bit is at a high level,

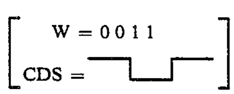

Thus, CDS=+2. The level of this first bit relates to the parity P. In other words, the first level becomes high or low, respectively, in dependence upon whether the parity P before the code of which the value and sign of the CDS is changed over at present is an even or odd number. Namely, when the parity is an even number, the last bit becomes a high level as in the above-mentioned code "0 0 1 1". When it is an odd number, the code becomes, for instance,

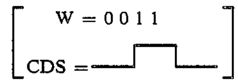

and the last bit becomes a low level.

The foregoing condition (i) will be further explained here. In the condition (i), since sign DSV=sign CDS, the absolute value of the CDS is subtracted from the value of the DSV to reduce the DC component. Now, since P=0, the value of the CDS is the normal value (the first reference level of the CDS is always set to low and the calculation is made), so that the head bit $W_1$ is inverted to reverse the sign so as to become opposite to the sign of the DSV, then this inverted $W_1$ is added to the DSV. The same shall be applied to the condition (iii) as well. However, since P=1, the values of the actual DSV and CDS have the opposite signs, so that the $W_1$ is added as it is without being inverted. In case of the condition (ii), sign DSV≠sign CDS; therefore, if P=0, the CDS and DSV are added as they are and then the absolute value of the CDS is subtracted from the DSV, thereby reducing the DC component. In the condition (iv), signal DSV≠sign CDS similarly to the condition (ii). However, since P=1, the signs of the DSV and CDS are actually the same when the first level is considered, so that the $W_1$ is inverted and added. In FIG. 10, the portion to change over from the previous parity to the next parity corresponds to the inversion/non-inversion of the $W_1$. The output of the value of the next parity is produced when the previous parity output is 216 and the signal output to invert $W_1$. The portion to make an inversion for the next parity corresponds to EX-OR 73. Refer to Table 8 for details.

Table 6 shows the comparison between the sign DSV and sign CDS described above. Table 7 shows the relation between the inversion and non-inversion of the $W_1$. Table 8 shows the relation of the parities between the W and W'.

TABLE 6

| Sign of the CDS (213 in FIG. 10) | Sign of the present DSV (214 in FIG. 10) | Output of comparison between the sign of the CDS and the sign of the present DSV (215 in FIG. 10) | Output of the inverter 70 and instruction to calculate a complementary number of the CDS (217 in FIG. 10) |
|---|---|---|---|
| In case of positive (including 0) →0 | In case of positive (including 0) →0 | When they are equal →0 | When 217 is 1 → Invert all bits of the CDS |
| In case of negative →1 | In case of negative →1 | When they are different →1 | When 217 is 0 → The CDS is not inverted |

TABLE 7

| | Relations between the Inversion and Non-inversion of $W_1$ | | | |
|---|---|---|---|---|
| The value of the output 215 in FIG. 10 | The value of P | The value of the output 218 in FIG. 10 | The value of the output 212 in FIG. 10 | Inversion of the $W_1$ |
| 0 | 0 | 0 | 1 → | Invert |
| 0 | 1 | 1 | 0 | Non-invert |
| 1 | 0 | 1 | 0 | Non-invert |
| 1 | 1 | 0 | 1 → | Invert |

TABLE 8

| | Relation of the Parities between W and W' | | | |
|---|---|---|---|---|
| The value of the output 212 in FIG. 10 | The parity P of the value W of the output 210 in FIG. 10 | The parity of the value W' of the output 211 in FIG. 10 | The parity at the present time of the output 216 in FIG. 10 | The input of D of the flip flop 60 |
| 1 (Invert the head bit $W_1$ of the W) | 0 (The number of bits of "1" is an even number) | 1 | 1 | 0 |
| | | | 0 | 1 |
| | 1 (The number of bits of "1" is an odd number) | 0 | 1 | 1 |
| | | | 0 | 0 |
| 0 (The head bit $W_1$ of the W is not inverted) | 0 | 0 | 1 | 1 |
| | | | 0 | 0 |
| | 1 | 1 | 1 | 0 |
| | | | 0 | 1 |

The arrangement described in FIG. 10 is not limited to 8 bits→10 bits but it is apparent that any other combination may be used.

Next, the code conversion from eight bits to thirteen bits will be described. In this case, the portions of the shift registers 30 and 32 and ROM 31 in FIG. 7 are constituted as shown in FIG. 12 and the conversion from 8 bits to 13 bits is performed.

Figure 12:
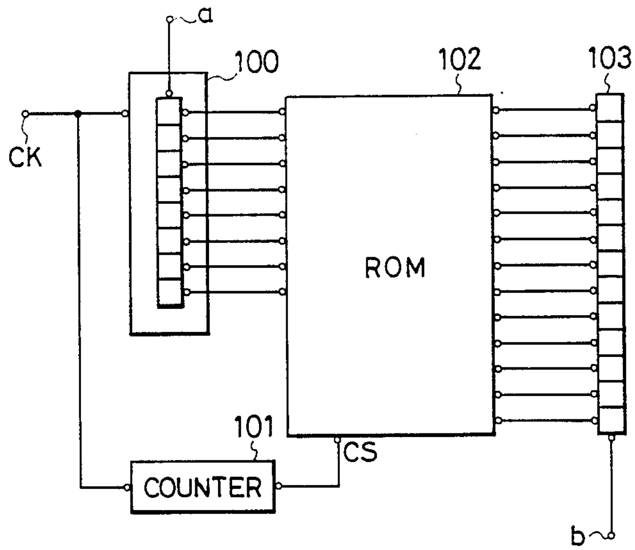
FIG. 12 is an explanatory diagram of the code conversion from 8 bits to 13 bits and corresponds to the portion of a register and ROM table 31 in FIG. 7.

In FIG. 12, a data sequence is inputted from ⓐ. This data sequence is inputted to an 8-bit shift resister 100. CK is an input terminal of a clock to drive the shift register 100. This clock signal is also simultaneously inputted to a counter 101. The counter 101 generates a pulse whenever it counts eight clocks. This pulse is inputted to a chip selecting (CS) terminal.

When the pulse is inputted to the chip selecting (CS) terminal, the data of the shift register 100 is taken in a ROM 102, so that the address in the ROM corresponding to the data is designated. The 256 13-bit codes selected arbitrarily from Table 9 which will be shown later are stored in the 0th to 255th addresses in the ROM. When the address in the ROM corresponding to the data is designated, the 13-bit code stored in this address is inputted to a shift register 103 and is outputted from a code output terminal ⓑ.

The 13-bit codes shown in Table 9 are the codes which are controlled in a manner such that the minimum number of bits "0" which exist between the adjacent bits "1" is one and the maximum number is seven. Arbitrary 13-bit codes which are selected from among the codes shown in Table 10 may be made coordinate with those $2^8=256$ codes. There is also an effect such that this limitation is not broken even by the coupling of the 13-bit codes. Therefore, $$T_{min}=1.23T$$

$$T_{max}=4.92T$$

$$T_W=0.62T$$

Thus, the present system has an effect such that the $T_w$ is larger than that in the conventional FM or 3PM system and the $T_{min}$ is larger and the decoding error rate is smaller than those in the conventional MFM system. In addition, there is also an effect such that the $T_{max}$ is smaller and the synchronization can be more easily obtained as compared with the 3PM system.

TABLE 9

| NUMBER | 13-BIT CODE |
|---|---|
| 1 | 1 0 0 0 0 0 0 0 1 0 0 1 0 |
| 2 | 1 0 0 0 0 0 0 1 0 0 0 1 0 |
| 3 | 1 0 0 0 0 0 0 1 0 1 0 1 0 |
| 4 | 1 0 0 0 0 0 1 0 0 0 0 1 0 |
| 5 | 1 0 0 0 0 0 1 0 0 1 0 1 0 |
| 6 | 1 0 0 0 0 0 1 0 1 0 0 1 0 |
| 7 | 1 0 0 0 0 1 0 0 0 0 0 1 0 |
| 8 | 1 0 0 0 0 1 0 0 0 1 0 1 0 |
| 9 | 1 0 0 0 0 1 0 0 1 0 0 1 0 |
| 10 | 1 0 0 0 0 1 0 1 0 0 0 1 0 |
| 11 | 1 0 0 0 0 1 0 1 0 1 0 1 0 |
| 12 | 1 0 0 0 1 0 0 0 0 0 0 1 0 |
| 13 | 1 0 0 0 1 0 0 0 0 1 0 1 0 |
| 14 | 1 0 0 0 1 0 0 0 1 0 0 1 0 |
| 15 | 1 0 0 0 1 0 0 1 0 0 0 1 0 |
| 16 | 1 0 0 0 1 0 0 1 0 1 0 1 0 |
| 17 | 1 0 0 0 1 0 1 0 0 0 0 1 0 |
| 18 | 1 0 0 0 1 0 1 0 0 1 0 1 0 |
| 19 | 1 0 0 0 1 0 1 0 1 0 0 1 0 |
| 20 | 1 0 0 1 0 0 0 0 0 0 0 1 0 |
| 21 | 1 0 0 1 0 0 0 0 0 1 0 1 0 |
| 22 | 1 0 0 1 0 0 0 0 1 0 0 1 0 |
| 23 | 1 0 0 1 0 0 0 1 0 0 0 1 0 |
| 24 | 1 0 0 1 0 0 0 1 0 1 0 1 0 |
| 25 | 1 0 0 1 0 0 1 0 0 0 0 1 0 |
| 26 | 1 0 0 1 0 0 1 0 0 1 0 1 0 |
| 27 | 1 0 0 1 0 0 1 0 1 0 0 1 0 |
| 28 | 1 0 0 1 0 1 0 0 0 0 0 1 0 |
| 29 | 1 0 0 1 0 1 0 0 0 1 0 1 0 |
| 30 | 1 0 0 1 0 1 0 0 1 0 0 1 0 |
| 31 | 1 0 0 1 0 1 0 1 0 0 0 1 0 |
| 32 | 1 0 0 1 0 1 0 1 0 1 0 1 0 |
| 33 | 1 0 1 0 0 0 0 0 0 1 0 1 0 |
| 34 | 1 0 1 0 0 0 0 0 1 0 0 1 0 |
| 35 | 1 0 1 0 0 0 0 1 0 0 0 1 0 |
| 36 | 1 0 1 0 0 0 0 1 0 1 0 1 0 |
| 37 | 1 0 1 0 0 0 1 0 0 0 0 1 0 |
| 38 | 1 0 1 0 0 0 1 0 0 1 0 1 0 |
| 39 | 1 0 1 0 0 0 1 0 1 0 0 1 0 |
| 40 | 1 0 1 0 0 1 0 0 0 0 0 1 0 |
| 41 | 1 0 1 0 0 1 0 0 0 1 0 1 0 |
| 42 | 1 0 1 0 0 1 0 0 1 0 0 1 0 |
| 43 | 1 0 1 0 0 1 0 1 0 0 0 1 0 |
| 44 | 1 0 1 0 0 1 0 1 0 1 0 1 0 |
| 45 | 1 0 1 0 1 0 0 0 0 0 0 1 0 |
| 46 | 1 0 1 0 1 0 0 0 0 1 0 1 0 |
| 47 | 1 0 1 0 1 0 0 0 1 0 0 1 0 |
| 48 | 1 0 1 0 1 0 0 1 0 0 0 1 0 |
| 49 | 1 0 1 0 1 0 0 1 0 1 0 1 0 |
| 50 | 1 0 1 0 1 0 1 0 0 0 0 1 0 |
| 51 | 1 0 1 0 1 0 1 0 0 1 0 1 0 |
| 52 | 1 0 1 0 1 0 1 0 1 0 0 1 0 |
| 53 | 1 0 0 0 0 0 0 0 1 0 1 0 0 |
| 54 | 1 0 0 0 0 0 0 1 0 0 1 0 0 |
| 55 | 1 0 0 0 0 0 1 0 0 0 1 0 0 |
| 56 | 1 0 0 0 0 0 1 0 1 0 1 0 0 |
| 57 | 1 0 0 0 0 1 0 0 0 0 1 0 0 |
| 58 | 1 0 0 0 0 1 0 0 1 0 1 0 0 |
| 59 | 1 0 0 0 0 1 0 1 0 0 1 0 0 |
| 60 | 1 0 0 0 1 0 0 0 0 0 1 0 0 |
| 61 | 1 0 0 0 1 0 0 0 1 0 1 0 0 |

TABLE 9-continued

| NUMBER | 13-BIT CODE |
|---|---|
| 62 | 1000100100100 |
| 63 | 1000101000100 |
| 64 | 1000101010100 |
| 65 | 1001000000100 |
| 66 | 1001000010100 |
| 67 | 1001000100100 |
| 68 | 1001001000100 |
| 69 | 1001001010100 |
| 70 | 1001010000100 |
| 71 | 1001010010100 |
| 72 | 1001010100100 |
| 73 | 1010000000100 |
| 74 | 1010000010100 |
| 75 | 1010000100100 |
| 76 | 1010001000100 |
| 77 | 1010001010100 |
| 78 | 1010010000100 |
| 79 | 1010010010100 |
| 80 | 1010010100100 |
| 81 | 1010100000100 |
| 82 | 1010100010100 |
| 83 | 1010100100100 |
| 84 | 1010101000100 |
| 85 | 1010101010100 |
| 86 | 1000000101000 |
| 87 | 1000001001000 |
| 88 | 1000010001000 |
| 89 | 1000010101000 |
| 90 | 1000100001000 |
| 91 | 1000100101000 |
| 92 | 1000101001000 |
| 93 | 1001000001000 |
| 94 | 1001000101000 |
| 95 | 1001001001000 |
| 96 | 1001010001000 |
| 97 | 1001010101000 |
| 98 | 1010000001000 |
| 99 | 1010000101000 |
| 100 | 1010001001000 |
| 101 | 1010010001000 |
| 102 | 1010010101000 |
| 103 | 1010100001000 |
| 104 | 1010100101000 |
| 105 | 1010101001000 |
| 106 | 1000000010000 |
| 107 | 1000001010000 |
| 108 | 1000010010000 |
| 109 | 1000100010000 |
| 110 | 1000101010000 |
| 111 | 1001000010000 |
| 112 | 1001001010000 |
| 113 | 1001010010000 |
| 114 | 1010000010000 |
| 115 | 1010001010000 |
| 116 | 1010010010000 |
| 117 | 1010100010000 |
| 118 | 1010101010000 |
| 119 | 0100000001010 |
| 120 | 0100000010010 |
| 121 | 0100000100010 |
| 122 | 0100000101010 |
| 123 | 0100001000010 |
| 124 | 0100001001010 |
| 125 | 0100001010010 |
| 126 | 0100010000010 |
| 127 | 0100010001010 |
| 128 | 0100010010010 |
| 129 | 0100010100010 |
| 130 | 0100010101010 |
| 131 | 0100100000010 |
| 132 | 0100100001010 |
| 133 | 0100100010010 |
| 134 | 0100100100010 |
| 135 | 0100100101010 |
| 136 | 0100101000010 |
| 137 | 0100101001010 |
| 138 | 0100101010010 |
| 139 | 0101000000010 |
| 140 | 0101000001010 |
| 141 | 0101000010010 |
| 142 | 0101000100010 |
| 143 | 0101000101010 |
| 144 | 0101001000010 |
| 145 | 0101001001010 |
| 146 | 0101001010010 |
| 147 | 0101010000010 |
| 148 | 0101010001010 |
| 149 | 0101010010010 |
| 150 | 0101010100010 |
| 151 | 0101010101010 |
| 152 | 0100000010100 |
| 153 | 0100000100100 |
| 154 | 0100001000100 |
| 155 | 0100001010100 |
| 156 | 0100010000100 |
| 157 | 0100010010100 |
| 158 | 0100010100100 |
| 159 | 0100100000100 |
| 160 | 0100100010100 |
| 161 | 0100100100100 |
| 162 | 0100101000100 |
| 163 | 0100101010100 |
| 164 | 0101000000100 |
| 165 | 0101000010100 |
| 166 | 0101000100100 |
| 167 | 0101001000100 |
| 168 | 0101001010100 |
| 169 | 0101010000100 |
| 170 | 0101010010100 |
| 171 | 0101010100100 |
| 172 | 0100000001000 |
| 173 | 0100000101000 |
| 174 | 0100001001000 |
| 175 | 0100010001000 |
| 176 | 0100010101000 |
| 177 | 0100100001000 |
| 178 | 0100100101000 |
| 179 | 0100101001000 |
| 180 | 0101000001000 |
| 181 | 0101000101000 |
| 182 | 0101001001000 |
| 183 | 0101010001000 |
| 184 | 0101010101000 |
| 185 | 0100000010000 |
| 186 | 0100001010000 |
| 187 | 0100010010000 |
| 188 | 0100100010000 |
| 189 | 0100101010000 |
| 190 | 0101000010000 |
| 191 | 0101001010000 |
| 192 | 0101010010000 |
| 193 | 0010000001010 |
| 194 | 0010000010010 |
| 195 | 0010000100010 |
| 196 | 0010000101010 |
| 197 | 0010001000010 |
| 198 | 0010001001010 |
| 199 | 0010001010010 |
| 200 | 0010010000010 |
| 201 | 0010010001010 |
| 202 | 0010010010010 |
| 203 | 0010010100010 |
| 204 | 0010010101010 |
| 205 | 0010100000010 |
| 206 | 0010100001010 |
| 207 | 0010100010010 |
| 208 | 0010100100010 |
| 209 | 0010100101010 |
| 210 | 0010101000010 |
| 211 | 0010101001010 |
| 212 | 0010101010010 |
| 213 | 0010000000100 |
| 214 | 0010000010100 |
| 215 | 0010000100100 |
| 216 | 0010001000100 |
| 217 | 0010001010100 |
| 218 | 0010010000100 |
| 219 | 0010010010100 |
| 220 | 0010010100100 |
| 221 | 0010100000100 |
| 222 | 0010100010100 |
| 223 | 0010100100100 |

TABLE 9-continued

| NUMBER | 13-BIT CODE |
|---|---|
| 224 | 0 0 1 0 1 0 1 0 0 0 1 0 0 |
| 225 | 0 0 1 0 1 0 1 0 1 0 1 0 0 |
| 226 | 0 0 1 0 0 0 0 0 1 0 0 0 |
| 227 | 0 0 1 0 0 0 0 1 0 1 0 0 0 |
| 228 | 0 0 1 0 0 0 1 0 0 1 0 0 0 |
| 229 | 0 0 1 0 0 1 0 0 0 1 0 0 0 |
| 230 | 0 0 1 0 0 1 0 1 0 1 0 0 0 |
| 231 | 0 0 1 0 1 0 0 0 0 1 0 0 0 |
| 232 | 0 0 1 0 1 0 0 1 0 1 0 0 0 |
| 233 | 0 0 1 0 1 0 1 0 0 1 0 0 0 |
| 234 | 0 0 1 0 0 0 0 0 1 0 0 0 0 |
| 235 | 0 0 1 0 0 0 1 0 1 0 0 0 0 |
| 236 | 0 0 1 0 0 1 0 0 1 0 0 0 0 |
| 237 | 0 0 1 0 1 0 0 0 1 0 0 0 0 |
| 238 | 0 0 1 0 1 0 1 0 1 0 0 0 0 |
| 239 | 0 0 0 1 0 0 0 0 0 0 0 1 0 |
| 240 | 0 0 0 1 0 0 0 0 0 1 0 1 0 |
| 241 | 0 0 0 1 0 0 0 0 1 0 0 1 0 |
| 242 | 0 0 0 1 0 0 0 1 0 0 0 1 0 |
| 243 | 0 0 0 1 0 0 0 1 0 1 0 1 0 |
| 244 | 0 0 0 1 0 0 1 0 0 0 0 1 0 |
| 245 | 0 0 0 1 0 0 1 0 0 1 0 1 0 |
| 246 | 0 0 0 1 0 0 1 0 1 0 0 1 0 |
| 247 | 0 0 0 1 0 1 0 0 0 0 0 1 0 |
| 248 | 0 0 0 1 0 1 0 0 0 1 0 1 0 |
| 249 | 0 0 0 1 0 1 0 0 1 0 0 1 0 |
| 250 | 0 0 0 1 0 1 0 1 0 0 0 1 0 |
| 251 | 0 0 0 1 0 1 0 1 0 1 0 1 0 |
| 252 | 0 0 0 1 0 0 0 0 0 0 1 0 0 |
| 253 | 0 0 0 1 0 0 0 0 1 0 1 0 0 |
| 254 | 0 0 0 1 0 0 0 1 0 0 1 0 0 |
| 255 | 0 0 0 1 0 0 1 0 0 0 1 0 0 |
| 256 | 0 0 0 1 0 0 1 0 1 0 1 0 0 |
| 257 | 0 0 0 1 0 1 0 0 0 0 1 0 0 |
| 258 | 0 0 0 1 0 1 0 0 1 0 1 0 0 |
| 259 | 0 0 0 1 0 1 0 1 0 0 1 0 0 |
| 260 | 0 0 0 1 0 0 0 0 0 1 0 0 0 |
| 261 | 0 0 0 1 0 0 0 1 0 1 0 0 0 |
| 262 | 0 0 0 1 0 0 1 0 0 1 0 0 0 |
| 263 | 0 0 0 1 0 1 0 0 0 1 0 0 0 |
| 264 | 0 0 0 1 0 1 0 1 0 1 0 0 0 |
| 265 | 0 0 0 1 0 0 0 0 1 0 0 0 0 |
| 266 | 0 0 0 1 0 0 1 0 1 0 0 0 0 |
| 267 | 0 0 0 1 0 1 0 0 1 0 0 0 0 |

Figure 13:
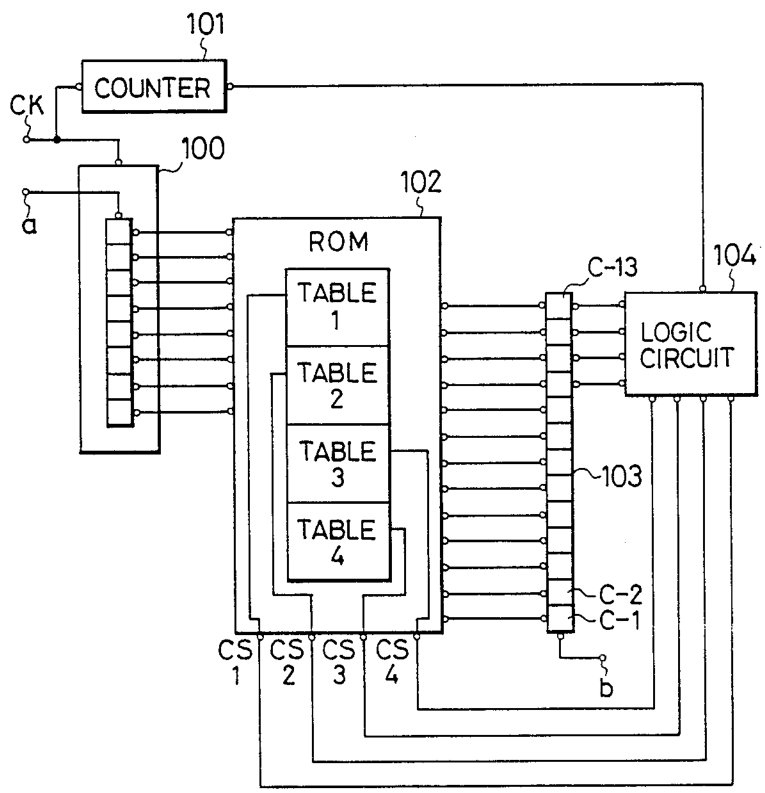
FIG. 13 is a diagram showing another embodiment of the code conversion from 8 bits to 13 bits.

FIG. 13 is an arrangement block diagram showing another embodiment of the code conversion from 8 bits to 13 bits. In FIG. 13, a data sequence is inputted from ⓐ. This data sequence is inputted to the 8-bit shift register 100. CK is the input terminal of the clock to drive the shift register 100. This clock signal is also simultaneously inputted to the counter 101. The counter 101 generates a pulse whenever it counts the eight clocks and this pulse is inputted to a logic circuit 104.

The last four bits of the 13-bit code are observed and when the last one bit C-13 is "1", a chip selecting terminal $CS_1$ to select Table 1 in the ROM 102 is set to ON. When the last two bits C-12 and C-13 are "1 0", a chip selecting terminal $CS_2$ to select Table 2 is set to ON. When the last three bits C-11, C-12 and C-13 are "1 0 0", a chip selecting terminal $CS_3$ to select Table 3 is set to ON. When the last four bits C-10 to C-13 are "1 0 0 0", a chip selecting terminal $CS_4$ to select Table 4 is set to ON. The timing when each chip selecting terminal is set to ON is based on the time when the pulse is inputted from the counter 101 to the logic circuit 104. In other words, the chip selecting terminal is set to ON for the next code conversion. It will be obviously understood from the above description that such a logic circuit 104 can be easily realized.

As described above, either one of Tables 1 to 4 is selected and at this time, the 8-bit data in the 8-bit shift register 100 is taken into the ROM 102. The address in the Table corresponding to the data is designated. In Table 1, 256 13-bit codes which were arbitrarily selected from Table 10 are written. In Table 2, 256 13-bit codes which were arbitrarily selected from Table 11 are written. In Table 3, 256 13-bit codes which were arbitrarily selected from Table 12 are written. In Table 4, 256 13-bit codes which were arbitrarily selected from Table 13 are written.

When the address in the Table corresponding to the data is selected, the 13-bit code stored in that address is inputted to the shift register 103 and is outputted from the code output terminal ⓑ. At this time, the last four bits C-10 to C-13 of the 13-bit code are observed by the logic circuit 104, thereby determining the Table to be selected next. In this way, the conversion from the data to the code, namely, the encoding process is finished. The conversion from the code to the data which is performed on the reproducing side, namely, the decoding may be attained by performing the conversion opposite to the above-mentioned conversion for encoding.

As described above, the coding system of the present invention is the (8, 13, 1, 5) coding system and $$T_{min}=1.23T$$

$$T_{max}=3.69T$$

$$T_W=0.62T$$

Therefore, the present system has effects such that: the $T_W$ is larger than that in the MFM or 3PM system; the $T_{min}$ is larger than that in the MFM system; the $T_{max}$ is smaller than that in the 3PM system; the decoding error rate is small; the low frequency component is few; and the synchronization can be more easily obtained as compared with the 3PM system. Consequently, it is possible to provide an electronic apparatus in which the recording and/or reproduction can be performed with a high density and a high degree of accuracy.

In addition, the case where the 8-bit data is converted to the 13-bit code will be described further in detail. When the last one bit of the code which is preceding by one than the $2^8=256$ 8-bit data is "1", those 256 data are made coordinate with the 256 13-bit codes in Table 10 so as to satisfy the one-to-one corresponding relation. When the last two bits of the one-preceding code are "1 0", those 256 data are made coordinate with arbitrary 256 13-bit codes among the 402 13-bit codes in Table 11 so as to satisfy the one-to-one corresponding relation. When the last three bits of the one-preceding code are "1 0 0", those 256 data are made coordinate with arbitrary 256 13-bit codes among the 375 13-bit codes in Table 12 so as to satisfy the one-to-one corresponding relation. When the last four bits of the one-preceding code are "1 0 0 0", those 256 data are made coordinate with arbitrary 256 13-bit codes among the 333 13-bit codes in Table 13 so as to satisfy the one-to-one corresponding relation. On one hand, in the initial state in that the codes start, the foregoing one-preceding code does not exist. However, in such a case, it is assumed that the encoding is performed by specifying the state to either one of the conditions such that: the last one bit of the one-proceding code is "1", the last two bits are "1 0"; the last three bits are "1 0 0"; and the last four bits are "1 0 0 0".

TABLE 10

| NUMBER | 13-BIT CODE |
|---|---|
| 1 | 0 0 0 0 0 1 0 0 0 0 0 1 0 |

TABLE 10-continued

| NUMBER | 13-BIT CODE |
|---|---|
| 2 | 0000010000100 |
| 3 | 0000010000101 |
| 4 | 0000010001000 |
| 5 | 0000010001001 |
| 6 | 0000010001010 |
| 7 | 0000010010001 |
| 8 | 0000010010010 |
| 9 | 0000010010100 |
| 10 | 0000010010101 |
| 11 | 0000010100001 |
| 12 | 0000010100010 |
| 13 | 0000010100100 |
| 14 | 0000010100101 |
| 15 | 0000010101000 |
| 16 | 0000010101001 |
| 17 | 0000010101010 |
| 18 | 0000100000100 |
| 19 | 0000100000101 |
| 20 | 0000100001000 |
| 21 | 0000100001001 |
| 22 | 0000100001010 |
| 23 | 0000100010001 |
| 24 | 0000100010010 |
| 25 | 0000100010100 |
| 26 | 0000100010101 |
| 27 | 0000100100001 |
| 28 | 0000100100010 |
| 29 | 0000100100100 |
| 30 | 0000100100101 |
| 31 | 0000100101000 |
| 32 | 0000100101001 |
| 33 | 0000100101010 |
| 34 | 0000101000001 |
| 35 | 0000101000010 |
| 36 | 0000101000100 |
| 37 | 0000101000101 |
| 38 | 0000101001000 |
| 39 | 0000101001001 |
| 40 | 0000101001010 |
| 41 | 0000101010001 |
| 42 | 0000101010010 |
| 43 | 0000101010100 |
| 44 | 0000101010101 |
| 45 | 0001000001000 |
| 46 | 0001000001001 |
| 47 | 0001000001010 |
| 48 | 0001000010001 |
| 49 | 0001000010010 |
| 50 | 0001000010100 |
| 51 | 0001000010101 |
| 52 | 0001000100001 |
| 53 | 0001000100010 |
| 54 | 0001000100100 |
| 55 | 0001000100101 |
| 56 | 0001000101000 |
| 57 | 0001000101001 |
| 58 | 0001000101010 |
| 59 | 0001001000001 |
| 60 | 0001001000010 |
| 61 | 0001001000100 |
| 62 | 0001001000101 |
| 63 | 0001001001000 |
| 64 | 0001001001001 |
| 65 | 0001001001010 |
| 66 | 0001001010001 |
| 67 | 0001001010010 |
| 68 | 0001001010100 |
| 69 | 0001001010101 |
| 70 | 0001010000010 |
| 71 | 0001010000100 |
| 72 | 0001010000101 |
| 73 | 0001010001000 |
| 74 | 0001010001001 |
| 75 | 0001010001010 |
| 76 | 0001010010001 |
| 77 | 0001010010010 |
| 78 | 0001010010100 |
| 79 | 0001010010101 |
| 80 | 0001010100001 |
| 81 | 0001010100010 |
| 82 | 0001010100100 |
| 83 | 0001010100101 |
| 84 | 0001010101000 |
| 85 | 0001010101001 |
| 86 | 0001010101010 |
| 87 | 0010000010001 |
| 88 | 0010000010010 |
| 89 | 0010000010100 |
| 90 | 0010000010101 |
| 91 | 0010000100001 |
| 92 | 0010000100010 |
| 93 | 0010000100100 |
| 94 | 0010000100101 |
| 95 | 0010000101000 |
| 96 | 0010000101001 |
| 97 | 0010000101010 |
| 98 | 0010001000001 |
| 99 | 0010001000010 |
| 100 | 0010001000100 |
| 101 | 0010001000101 |
| 102 | 0010001001000 |
| 103 | 0010001001001 |
| 104 | 0010001001010 |
| 105 | 0010001010001 |
| 106 | 0010001010010 |
| 107 | 0010001010100 |
| 108 | 0010001010101 |
| 109 | 0010010000010 |
| 110 | 0010010000100 |
| 111 | 0010010000101 |
| 112 | 0010010001000 |
| 113 | 0010010001001 |
| 114 | 0010010001010 |
| 115 | 0010010010001 |
| 116 | 0010010010010 |
| 117 | 0010010010100 |
| 118 | 0010010010101 |
| 119 | 0010010100001 |
| 120 | 0010010100010 |
| 121 | 0010010100100 |
| 122 | 0010010100101 |
| 123 | 0010010101000 |
| 124 | 0010010101001 |
| 125 | 0010010101010 |
| 126 | 0010100000100 |
| 127 | 0010100000101 |
| 128 | 0010100001000 |
| 129 | 0010100001001 |
| 130 | 0010100001010 |
| 131 | 0010100010001 |
| 132 | 0010100010010 |
| 133 | 0010100010100 |
| 134 | 0010100010101 |
| 135 | 0010100100001 |
| 136 | 0010100100010 |
| 137 | 0010100100100 |
| 138 | 0010100100101 |
| 139 | 0010100101000 |
| 140 | 0010100101001 |
| 141 | 0010100101010 |
| 142 | 0010101000001 |
| 143 | 0010101000010 |
| 144 | 0010101000100 |
| 145 | 0010101000101 |
| 146 | 0010101001000 |
| 147 | 0010101001001 |
| 148 | 0010101001010 |
| 149 | 0010101010001 |
| 150 | 0010101010010 |
| 151 | 0010101010100 |
| 152 | 0010101010101 |
| 153 | 0100000100001 |
| 154 | 0100000100010 |
| 155 | 0100000100100 |
| 156 | 0100000100101 |
| 157 | 0100000101000 |
| 158 | 0100000101001 |
| 159 | 0100000101010 |
| 160 | 0100001000001 |
| 161 | 0100001000010 |
| 162 | 0100001000100 |
| 163 | 0100001000101 |

TABLE 10-continued

| NUMBER | 13-BIT CODE |
|---|---|
| 164 | 0100001001000 |
| 165 | 0100001001001 |
| 166 | 0100001001010 |
| 167 | 0100001010001 |
| 168 | 0100001010010 |
| 169 | 0100001010100 |
| 170 | 0100001010101 |
| 171 | 0100010000010 |
| 172 | 0100010000100 |
| 173 | 0100010000101 |
| 174 | 0100010001000 |
| 175 | 0100010001001 |
| 176 | 0100010001010 |
| 177 | 0100010010001 |
| 178 | 0100010010010 |
| 179 | 0100010010100 |
| 180 | 0100010010101 |
| 181 | 0100010100001 |
| 182 | 0100010100010 |
| 183 | 0100010100100 |
| 184 | 0100010100101 |
| 185 | 0100010101000 |
| 186 | 0100010101001 |
| 187 | 0100010101010 |
| 188 | 0100100000100 |
| 189 | 0100100000101 |
| 190 | 0100100001000 |
| 191 | 0100100001001 |
| 192 | 0100100001010 |
| 193 | 0100100010001 |
| 194 | 0100100010010 |
| 195 | 0100100010100 |
| 196 | 0100100010101 |
| 197 | 0100100100001 |
| 198 | 0100100100010 |
| 199 | 0100100100100 |
| 200 | 0100100100101 |
| 201 | 0100100101000 |
| 202 | 0100100101001 |
| 203 | 0100100101010 |
| 204 | 0100101000001 |
| 205 | 0100101000010 |
| 206 | 0100101000100 |
| 207 | 0100101000101 |
| 208 | 0100101001000 |
| 209 | 0100101001001 |
| 210 | 0100101001010 |
| 211 | 0100101010001 |
| 212 | 0100101010010 |
| 213 | 0100101010100 |
| 214 | 0100101010101 |
| 215 | 0101000001000 |
| 216 | 0101000001001 |
| 217 | 0101000001010 |
| 218 | 0101000010001 |
| 219 | 0101000010010 |
| 220 | 0101000010100 |
| 221 | 0101000010101 |
| 222 | 0101000100001 |
| 223 | 0101000100010 |
| 224 | 0101000100100 |
| 225 | 0101000100101 |
| 226 | 0101000101000 |
| 227 | 0101000101001 |
| 228 | 0101000101010 |
| 229 | 0101001000001 |
| 230 | 0101001000010 |
| 231 | 0101001000100 |
| 232 | 0101001000101 |
| 233 | 0101001001000 |
| 234 | 0101001001001 |
| 235 | 0101001001010 |
| 236 | 0101001010001 |
| 237 | 0101001010010 |
| 238 | 0101001010100 |
| 239 | 0101001010101 |
| 240 | 0101010000010 |
| 241 | 0101010000100 |
| 242 | 0101010000101 |
| 243 | 0101010001000 |
| 244 | 0101010001001 |

TABLE 10-continued

| NUMBER | 13-BIT CODE |
|---|---|
| 245 | 0101010001010 |
| 246 | 0101010010001 |
| 247 | 0101010010010 |
| 248 | 0101010010100 |
| 249 | 0101010010101 |
| 250 | 0101010100001 |
| 251 | 0101010100010 |
| 252 | 0101010100100 |
| 253 | 0101010100101 |
| 254 | 0101010101000 |
| 255 | 0101010101001 |
| 256 | 0101010101010 |

TABLE 11

| NUMBER | 13-BIT CODE |
|---|---|
| 1 | 0000100000100 |
| 2 | 0000100000101 |
| 3 | 0000100001000 |
| 4 | 0000100001001 |
| 5 | 0000100001010 |
| 6 | 0000100010001 |
| 7 | 0000100010010 |
| 8 | 0000100010100 |
| 9 | 0000100010101 |
| 10 | 0000100100001 |
| 11 | 0000100100010 |
| 12 | 0000100100100 |
| 13 | 0000100100101 |
| 14 | 0000100101000 |
| 15 | 0000100101001 |
| 16 | 0000100101010 |
| 17 | 0000101000001 |
| 18 | 0000101000010 |
| 19 | 0000101000100 |
| 20 | 0000101000101 |
| 21 | 0000101001000 |
| 22 | 0000101001001 |
| 23 | 0000101001010 |
| 24 | 0000101010001 |
| 25 | 0000101010010 |
| 26 | 0000101010100 |
| 27 | 0000101010101 |
| 28 | 0001000001000 |
| 29 | 0001000001001 |
| 30 | 0001000001010 |
| 31 | 0001000010001 |
| 32 | 0001000010010 |
| 33 | 0001000010100 |
| 34 | 0001000010101 |
| 35 | 0001000100001 |
| 36 | 0001000100010 |
| 37 | 0001000100100 |
| 38 | 0001000100101 |
| 39 | 0001000101000 |
| 40 | 0001000101001 |
| 41 | 0001000101010 |
| 42 | 0001001000001 |
| 43 | 0001001000010 |
| 44 | 0001001000100 |
| 45 | 0001001000101 |
| 46 | 0001001001000 |
| 47 | 0001001001001 |
| 48 | 0001001001010 |
| 49 | 0001001010001 |
| 50 | 0001001010010 |
| 51 | 0001001010100 |
| 52 | 0001001010101 |
| 53 | 0001010000010 |
| 54 | 0001010000100 |
| 55 | 0001010000101 |
| 56 | 0001010001000 |
| 57 | 0001010001001 |
| 58 | 0001010001010 |
| 59 | 0001010010001 |
| 60 | 0001010010010 |
| 61 | 0001010010100 |
| 62 | 0001010010101 |
| 63 | 0001010100001 |

TABLE 11-continued

| NUMBER | 13-BIT CODE |
|---|---|
| 64 | 0001010100010 |
| 65 | 0001010100100 |
| 66 | 0001010100101 |
| 67 | 0001010101000 |
| 68 | 0001010101001 |
| 69 | 0001010101010 |
| 70 | 0010000010001 |
| 71 | 0010000010010 |
| 72 | 0010000010100 |
| 73 | 0010000010101 |
| 74 | 0010000100001 |
| 75 | 0010000100010 |
| 76 | 0010000100100 |
| 77 | 0010000100101 |
| 78 | 0010000101000 |
| 79 | 0010000101001 |
| 80 | 0010000101010 |
| 81 | 0010001000001 |
| 82 | 0010001000010 |
| 83 | 0010001000100 |
| 84 | 0010001000101 |
| 85 | 0010001001000 |
| 86 | 0010001001001 |
| 87 | 0010001001010 |
| 88 | 0010001010001 |
| 89 | 0010001010010 |
| 90 | 0010001010100 |
| 91 | 0010001010101 |
| 92 | 0010010000010 |
| 93 | 0010010000100 |
| 94 | 0010010000101 |
| 95 | 0010010001000 |
| 96 | 0010010001001 |
| 97 | 0010010001010 |
| 98 | 0010010010001 |
| 99 | 0010010010010 |
| 100 | 0010010010100 |
| 101 | 0010010010101 |
| 102 | 0010010100001 |
| 103 | 0010010100010 |
| 104 | 0010010100100 |
| 105 | 0010010100101 |
| 106 | 0010010101000 |
| 107 | 0010010101001 |
| 108 | 0010010101010 |
| 109 | 0010100000100 |
| 110 | 0010100000101 |
| 111 | 0010100001000 |
| 112 | 0010100001001 |
| 113 | 0010100001010 |
| 114 | 0010100010001 |
| 115 | 0010100010010 |
| 116 | 0010100010100 |
| 117 | 0010100010101 |
| 118 | 0010100100001 |
| 119 | 0010100100010 |
| 120 | 0010100100100 |
| 121 | 0010100100101 |
| 122 | 0010100101000 |
| 123 | 0010100101001 |
| 124 | 0010100101010 |
| 125 | 0010101000001 |
| 126 | 0010101000010 |
| 127 | 0010101000100 |
| 128 | 0010101000101 |
| 129 | 0010101001000 |
| 130 | 0010101001001 |
| 131 | 0010101001010 |
| 132 | 0010101010001 |
| 133 | 0010101010010 |
| 134 | 0010101010100 |
| 135 | 0010101010101 |
| 136 | 0100000100001 |
| 137 | 0100000100010 |
| 138 | 0100000100100 |
| 139 | 0100000100101 |
| 140 | 0100000101000 |
| 141 | 0100000101001 |
| 142 | 0100000101010 |
| 143 | 0100001000001 |
| 144 | 0100001000010 |

TABLE 11-continued

| NUMBER | 13-BIT CODE |
|---|---|
| 145 | 0100001000100 |
| 146 | 0100001000101 |
| 147 | 0100001001000 |
| 148 | 0100001001001 |
| 149 | 0100001001010 |
| 150 | 0100001010001 |
| 151 | 0100001010010 |
| 152 | 0100001010100 |
| 153 | 0100001010101 |
| 154 | 0100010000010 |
| 155 | 0100010000100 |
| 156 | 0100010000101 |
| 157 | 0100010001000 |
| 158 | 0100010001001 |
| 159 | 0100010001010 |
| 160 | 0100010010001 |
| 161 | 0100010010010 |
| 162 | 0100010010100 |
| 163 | 0100010010101 |
| 164 | 0100010100001 |
| 165 | 0100010100010 |
| 166 | 0100010100100 |
| 167 | 0100010100101 |
| 168 | 0100010101000 |
| 169 | 0100010101001 |
| 170 | 0100010101010 |
| 171 | 0100100000100 |
| 172 | 0100100000101 |
| 173 | 0100100001000 |
| 174 | 0100100001001 |
| 175 | 0100100001010 |
| 176 | 0100100010001 |
| 177 | 0100100010010 |
| 178 | 0100100010100 |
| 179 | 0100100010101 |
| 180 | 0100100100001 |
| 181 | 0100100100010 |
| 182 | 0100100100100 |
| 183 | 0100100100101 |
| 184 | 0100100101000 |
| 185 | 0100100101001 |
| 186 | 0100100101010 |
| 187 | 0100101000001 |
| 188 | 0100101000010 |
| 189 | 0100101000100 |
| 190 | 0100101000101 |
| 191 | 0100101001000 |
| 192 | 0100101001001 |
| 193 | 0100101001010 |
| 194 | 0100101010001 |
| 195 | 0100101010010 |
| 196 | 0100101010100 |
| 197 | 0100101010101 |
| 198 | 0101000001000 |
| 199 | 0101000001001 |
| 200 | 0101000001010 |
| 201 | 0101000010001 |
| 202 | 0101000010010 |
| 203 | 0101000010100 |
| 204 | 0101000010101 |
| 205 | 0101000100001 |
| 206 | 0101000100010 |
| 207 | 0101000100100 |
| 208 | 0101000100101 |
| 209 | 0101000101000 |
| 210 | 0101000101001 |
| 211 | 0101000101010 |
| 212 | 0101001000001 |
| 213 | 0101001000010 |
| 214 | 0101001000100 |
| 215 | 0101001000101 |
| 216 | 0101001001000 |
| 217 | 0101001001001 |
| 218 | 0101001001010 |
| 219 | 0101001010001 |
| 220 | 0101001010010 |
| 221 | 0101001010100 |
| 222 | 0101001010101 |
| 223 | 0101010000010 |
| 224 | 0101010000100 |
| 225 | 0101010000101 |

TABLE 11-continued

| NUMBER | 13-BIT CODE |
|---|---|
| 226 | 0101010001000 |
| 227 | 0101010001001 |
| 228 | 0101010001010 |
| 229 | 0101010010001 |
| 230 | 0101010010010 |
| 231 | 0101010010100 |
| 232 | 0101010010101 |
| 233 | 0101010100001 |
| 234 | 0101010100010 |
| 235 | 0101010100100 |
| 236 | 0101010100101 |
| 237 | 0101010101000 |
| 238 | 0101010101001 |
| 239 | 0101010101010 |
| 240 | 1000001000001 |
| 241 | 1000001000010 |
| 242 | 1000001000100 |
| 243 | 1000001000101 |
| 244 | 1000001001000 |
| 245 | 1000001001001 |
| 246 | 1000001001010 |
| 247 | 1000001010001 |
| 248 | 1000001010010 |
| 249 | 1000001010100 |
| 250 | 1000001010101 |
| 251 | 1000010000010 |
| 252 | 1000010000100 |
| 253 | 1000010000101 |
| 254 | 1000010001000 |
| 255 | 1000010001001 |
| 256 | 1000010001010 |
| 257 | 1000010010001 |
| 258 | 1000010010010 |
| 259 | 1000010010100 |
| 260 | 1000010010101 |
| 261 | 1000010100001 |
| 262 | 1000010100010 |
| 263 | 1000010100100 |
| 264 | 1000010100101 |
| 265 | 1000010101000 |
| 266 | 1000010101001 |
| 267 | 1000010101010 |
| 268 | 1000100000100 |
| 269 | 1000100000101 |
| 270 | 1000100001000 |
| 271 | 1000100001001 |
| 272 | 1000100001010 |
| 273 | 1000100010001 |
| 274 | 1000100010010 |
| 275 | 1000100010100 |
| 276 | 1000100010101 |
| 277 | 1000100100001 |
| 278 | 1000100100010 |
| 279 | 1000100100100 |
| 280 | 1000100100101 |
| 281 | 1000100101000 |
| 282 | 1000100101001 |
| 283 | 1000100101010 |
| 284 | 1000101000001 |
| 285 | 1000101000010 |
| 286 | 1000101000100 |
| 287 | 1000101000101 |
| 288 | 1000101001000 |
| 289 | 1000101001001 |
| 290 | 1000101001010 |
| 291 | 1000101010001 |
| 292 | 1000101010010 |
| 293 | 1000101010100 |
| 294 | 1000101010101 |
| 295 | 1001000001000 |
| 296 | 1001000001001 |
| 297 | 1001000001010 |
| 298 | 1001000010001 |
| 299 | 1001000010010 |
| 300 | 1001000010100 |
| 301 | 1001000010101 |
| 302 | 1001000100001 |
| 303 | 1001000100010 |
| 304 | 1001000100100 |
| 305 | 1001000100101 |
| 306 | 1001000101000 |

TABLE 11-continued

| NUMBER | 13-BIT CODE |
|---|---|
| 307 | 1001000101001 |
| 308 | 1001000101010 |
| 309 | 1001001000001 |
| 310 | 1001001000010 |
| 311 | 1001001000100 |
| 312 | 1001001000101 |
| 313 | 1001001001000 |
| 314 | 1001001001001 |
| 315 | 1001001001010 |
| 316 | 1001001010001 |
| 317 | 1001001010010 |
| 318 | 1001001010100 |
| 319 | 1001001010101 |
| 320 | 1001010000010 |
| 321 | 1001010000100 |
| 322 | 1001010000101 |
| 323 | 1001010001000 |
| 324 | 1001010001001 |
| 325 | 1001010001010 |
| 326 | 1001010010001 |
| 327 | 1001010010010 |
| 328 | 1001010010100 |
| 329 | 1001010010101 |
| 330 | 1001010100001 |
| 331 | 1001010100010 |
| 332 | 1001010100100 |
| 333 | 1001010100101 |
| 334 | 1001010101000 |
| 335 | 1001010101001 |
| 336 | 1001010101010 |
| 337 | 1010000010001 |
| 338 | 1010000010010 |
| 339 | 1010000010100 |
| 340 | 1010000010101 |
| 341 | 1010000100001 |
| 342 | 1010000100010 |
| 343 | 1010000100100 |
| 344 | 1010000100101 |
| 345 | 1010000101000 |
| 346 | 1010000101001 |
| 347 | 1010000101010 |
| 348 | 1010001000001 |
| 349 | 1010001000010 |
| 350 | 1010001000100 |
| 351 | 1010001000101 |
| 352 | 1010001001000 |
| 353 | 1010001001001 |
| 354 | 1010001001010 |
| 355 | 1010001010001 |
| 356 | 1010001010010 |
| 357 | 1010001010100 |
| 358 | 1010001010101 |
| 359 | 1010010000010 |
| 360 | 1010010000100 |
| 361 | 1010010000101 |
| 362 | 1010010001000 |
| 363 | 1010010001001 |
| 364 | 1010010001010 |
| 365 | 1010010010001 |
| 366 | 1010010010010 |
| 367 | 1010010010100 |
| 368 | 1010010010101 |
| 369 | 1010010100001 |
| 370 | 1010010100010 |
| 371 | 1010010100100 |
| 372 | 1010010100101 |
| 373 | 1010010101000 |
| 374 | 1010010101001 |
| 375 | 1010010101010 |
| 376 | 1010100000100 |
| 377 | 1010100000101 |
| 378 | 1010100001000 |
| 379 | 1010100001001 |
| 380 | 1010100001010 |
| 381 | 1010100010001 |
| 382 | 1010100010010 |
| 383 | 1010100010100 |
| 384 | 1010100010101 |
| 385 | 1010100100001 |
| 386 | 1010100100010 |
| 387 | 1010100100100 |

TABLE 11-continued

| NUMBER | 13-BIT CODE |
|---|---|
| 388 | 1010100100101 |
| 389 | 1010100101000 |
| 390 | 1010100101001 |
| 391 | 1010100101010 |
| 392 | 1010101000001 |
| 393 | 1010101000010 |
| 394 | 1010101000100 |
| 395 | 1010101000101 |
| 396 | 1010101001000 |
| 397 | 1010101001001 |
| 398 | 1010101001010 |
| 399 | 1010101010001 |
| 400 | 1010101010010 |
| 401 | 1010101010100 |
| 402 | 1010101010101 |

TABLE 12

| NUMBER | 13-BIT CODE |
|---|---|
| 1 | 0001000001000 |
| 2 | 0001000001001 |
| 3 | 0001000001010 |
| 4 | 0001000010001 |
| 5 | 0001000010010 |
| 6 | 0001000010100 |
| 7 | 0001000010101 |
| 8 | 0001000100001 |
| 9 | 0001000100010 |
| 10 | 0001000100100 |
| 11 | 0001000100101 |
| 12 | 0001000101000 |
| 13 | 0001000101001 |
| 14 | 0001000101010 |
| 15 | 0001001000001 |
| 16 | 0001001000010 |
| 17 | 0001001000100 |
| 18 | 0001001000101 |
| 19 | 0001001001000 |
| 20 | 0001001001001 |
| 21 | 0001001001010 |
| 22 | 0001001010001 |
| 23 | 0001001010010 |
| 24 | 0001001010100 |
| 25 | 0001001010101 |
| 26 | 0001010000010 |
| 27 | 0001010000100 |
| 28 | 0001010000101 |
| 29 | 0001010001000 |
| 30 | 0001010001001 |
| 31 | 0001010001010 |
| 32 | 0001010010001 |
| 33 | 0001010010010 |
| 34 | 0001010010100 |
| 35 | 0001010010101 |
| 36 | 0001010100001 |
| 37 | 0001010100010 |
| 38 | 0001010100100 |
| 39 | 0001010100101 |
| 40 | 0001010101000 |
| 41 | 0001010101001 |
| 42 | 0001010101010 |
| 43 | 0010000010001 |
| 44 | 0010000010010 |
| 45 | 0010000010100 |
| 46 | 0010000010101 |
| 47 | 0010000100001 |
| 48 | 0010000100010 |
| 49 | 0010000100100 |
| 50 | 0010000100101 |
| 51 | 0010000101000 |
| 52 | 0010000101001 |
| 53 | 0010000101010 |
| 54 | 0010001000001 |
| 55 | 0010001000010 |
| 56 | 0010001000100 |
| 57 | 0010001000101 |
| 58 | 0010001001000 |
| 59 | 0010001001001 |
| 60 | 0010001001010 |

TABLE 12-continued

| NUMBER | 13-BIT CODE |
|---|---|
| 61 | 0010001010001 |
| 62 | 0010001010010 |
| 63 | 0010001010100 |
| 64 | 0010001010101 |
| 65 | 0010010000010 |
| 66 | 0010010000100 |
| 67 | 0010010000101 |
| 68 | 0010010001000 |
| 69 | 0010010001001 |
| 70 | 0010010001010 |
| 71 | 0010010010001 |
| 72 | 0010010010010 |
| 73 | 0010010010100 |
| 74 | 0010010010101 |
| 75 | 0010010100001 |
| 76 | 0010010100010 |
| 77 | 0010010100100 |
| 78 | 0010010100101 |
| 79 | 0010010101000 |
| 80 | 0010010101001 |
| 81 | 0010010101010 |
| 82 | 0010100000100 |
| 83 | 0010100000101 |
| 84 | 0010100001000 |
| 85 | 0010100001001 |
| 86 | 0010100001010 |
| 87 | 0010100010001 |
| 88 | 0010100010010 |
| 89 | 0010100010100 |
| 90 | 0010100010101 |
| 91 | 0010100100001 |
| 92 | 0010100100010 |
| 93 | 0010100100100 |
| 94 | 0010100100101 |
| 95 | 0010100101000 |
| 96 | 0010100101001 |
| 97 | 0010100101010 |
| 98 | 0010101000001 |
| 99 | 0010101000010 |
| 100 | 0010101000100 |
| 101 | 0010101000101 |
| 102 | 0010101001000 |
| 103 | 0010101001001 |
| 104 | 0010101001010 |
| 105 | 0010101010001 |
| 106 | 0010101010010 |
| 107 | 0010101010100 |
| 108 | 0010101010101 |
| 109 | 0100000100001 |
| 110 | 0100000100010 |
| 111 | 0100000100100 |
| 112 | 0100000100101 |
| 113 | 0100000101000 |
| 114 | 0100000101001 |
| 115 | 0100000101010 |
| 116 | 0100001000001 |
| 117 | 0100001000010 |
| 118 | 0100001000100 |
| 119 | 0100001000101 |
| 120 | 0100001001000 |
| 121 | 0100001001001 |
| 122 | 0100001001010 |
| 123 | 0100001010001 |
| 124 | 0100001010010 |
| 125 | 0100001010100 |
| 126 | 0100001010101 |
| 127 | 0100010000010 |
| 128 | 0100010000100 |
| 129 | 0100010000101 |
| 130 | 0100010001000 |
| 131 | 0100010001001 |
| 132 | 0100010001010 |
| 133 | 0100010010001 |
| 134 | 0100010010010 |
| 135 | 0100010010100 |
| 136 | 0100010010101 |
| 137 | 0100010100001 |
| 138 | 0100010100010 |
| 139 | 0100010100100 |
| 140 | 0100010100101 |
| 141 | 0100010101000 |

TABLE 12-continued

| NUMBER | 13-BIT CODE |
|---|---|
| 142 | 0 1 0 0 0 1 0 1 0 1 0 0 1 |
| 143 | 0 1 0 0 0 1 0 1 0 1 0 1 0 |
| 144 | 0 1 0 0 1 0 0 0 0 0 1 0 0 |
| 145 | 0 1 0 0 1 0 0 0 0 0 1 0 1 |
| 146 | 0 1 0 0 1 0 0 0 0 1 0 0 0 |
| 147 | 0 1 0 0 1 0 0 0 0 1 0 0 1 |
| 148 | 0 1 0 0 1 0 0 0 0 1 0 1 0 |
| 149 | 0 1 0 0 1 0 0 0 1 0 0 0 1 |
| 150 | 0 1 0 0 1 0 0 0 1 0 0 1 0 |
| 151 | 0 1 0 0 1 0 0 0 1 0 1 0 0 |
| 152 | 0 1 0 0 1 0 0 0 1 0 1 0 1 |
| 153 | 0 1 0 0 1 0 0 1 0 0 0 0 1 |
| 154 | 0 1 0 0 1 0 0 1 0 0 0 1 0 |
| 155 | 0 1 0 0 1 0 0 1 0 0 1 0 0 |
| 156 | 0 1 0 0 1 0 0 1 0 0 1 0 1 |
| 157 | 0 1 0 0 1 0 0 1 0 1 0 0 0 |
| 158 | 0 1 0 0 1 0 0 1 0 1 0 0 1 |
| 159 | 0 1 0 0 1 0 0 1 0 1 0 1 0 |
| 160 | 0 1 0 0 1 0 1 0 0 0 0 0 1 |
| 161 | 0 1 0 0 1 0 1 0 0 0 0 1 0 |
| 162 | 0 1 0 0 1 0 1 0 0 0 1 0 0 |
| 163 | 0 1 0 0 1 0 1 0 0 0 1 0 1 |
| 164 | 0 1 0 0 1 0 1 0 0 1 0 0 0 |
| 165 | 0 1 0 0 1 0 1 0 0 1 0 0 1 |
| 166 | 0 1 0 0 1 0 1 0 0 1 0 1 0 |
| 167 | 0 1 0 0 1 0 1 0 1 0 0 0 1 |
| 168 | 0 1 0 0 1 0 1 0 1 0 0 1 0 |
| 169 | 0 1 0 0 1 0 1 0 1 0 1 0 0 |
| 170 | 0 1 0 0 1 0 1 0 1 0 1 0 1 |
| 171 | 0 1 0 1 0 0 0 0 0 1 0 0 0 |
| 172 | 0 1 0 1 0 0 0 0 0 1 0 0 1 |
| 173 | 0 1 0 1 0 0 0 0 0 1 0 1 0 |
| 174 | 0 1 0 1 0 0 0 0 1 0 0 0 1 |
| 175 | 0 1 0 1 0 0 0 0 1 0 0 1 0 |
| 176 | 0 1 0 1 0 0 0 0 1 0 1 0 0 |
| 177 | 0 1 0 1 0 0 0 0 1 0 1 0 1 |
| 178 | 0 1 0 1 0 0 0 1 0 0 0 0 1 |
| 179 | 0 1 0 1 0 0 0 1 0 0 0 1 0 |
| 180 | 0 1 0 1 0 0 0 1 0 0 1 0 0 |
| 181 | 0 1 0 1 0 0 0 1 0 0 1 0 1 |
| 182 | 0 1 0 1 0 0 0 1 0 1 0 0 0 |
| 183 | 0 1 0 1 0 0 0 1 0 1 0 0 1 |
| 184 | 0 1 0 1 0 0 0 1 0 1 0 1 0 |
| 185 | 0 1 0 1 0 0 1 0 0 0 0 0 1 |
| 186 | 0 1 0 1 0 0 1 0 0 0 0 1 0 |
| 187 | 0 1 0 1 0 0 1 0 0 0 1 0 0 |
| 188 | 0 1 0 1 0 0 1 0 0 0 1 0 1 |
| 189 | 0 1 0 1 0 0 1 0 0 1 0 0 0 |
| 190 | 0 1 0 1 0 0 1 0 0 1 0 0 1 |
| 191 | 0 1 0 1 0 0 1 0 0 1 0 1 0 |
| 192 | 0 1 0 1 0 0 1 0 1 0 0 0 1 |
| 193 | 0 1 0 1 0 0 1 0 1 0 0 1 0 |
| 194 | 0 1 0 1 0 0 1 0 1 0 1 0 0 |
| 195 | 0 1 0 1 0 0 1 0 1 0 1 0 1 |
| 196 | 0 1 0 1 0 1 0 0 0 0 0 1 0 |
| 197 | 0 1 0 1 0 1 0 0 0 0 1 0 0 |
| 198 | 0 1 0 1 0 1 0 0 0 0 1 0 1 |
| 199 | 0 1 0 1 0 1 0 0 0 1 0 0 0 |
| 200 | 0 1 0 1 0 1 0 0 0 1 0 0 1 |
| 201 | 0 1 0 1 0 1 0 0 0 1 0 1 0 |
| 202 | 0 1 0 1 0 1 0 0 1 0 0 0 1 |
| 203 | 0 1 0 1 0 1 0 0 1 0 0 1 0 |
| 204 | 0 1 0 1 0 1 0 0 1 0 1 0 0 |
| 205 | 0 1 0 1 0 1 0 0 1 0 1 0 1 |
| 206 | 0 1 0 1 0 1 0 1 0 0 0 0 1 |
| 207 | 0 1 0 1 0 1 0 1 0 0 0 1 0 |
| 208 | 0 1 0 1 0 1 0 1 0 0 1 0 0 |
| 209 | 0 1 0 1 0 1 0 1 0 0 1 0 1 |
| 210 | 0 1 0 1 0 1 0 1 0 1 0 0 0 |
| 211 | 0 1 0 1 0 1 0 1 0 1 0 0 1 |
| 212 | 0 1 0 1 0 1 0 1 0 1 0 1 0 |
| 213 | 1 0 0 0 0 0 1 0 0 0 0 0 1 |
| 214 | 1 0 0 0 0 0 1 0 0 0 0 1 0 |
| 215 | 1 0 0 0 0 0 1 0 0 0 1 0 0 |
| 216 | 1 0 0 0 0 0 1 0 0 0 1 0 1 |
| 217 | 1 0 0 0 0 0 1 0 0 1 0 0 0 |
| 218 | 1 0 0 0 0 0 1 0 0 1 0 0 1 |
| 219 | 1 0 0 0 0 0 1 0 0 1 0 1 0 |
| 220 | 1 0 0 0 0 0 1 0 1 0 0 0 1 |
| 221 | 1 0 0 0 0 0 1 0 1 0 0 1 0 |
| 222 | 1 0 0 0 0 0 1 0 1 0 1 0 0 |

TABLE 12-continued

| NUMBER | 13-BIT CODE |
|---|---|
| 223 | 1 0 0 0 0 0 1 0 1 0 1 0 1 |
| 224 | 1 0 0 0 0 1 0 0 0 0 0 1 0 |
| 225 | 1 0 0 0 0 1 0 0 0 0 1 0 0 |
| 226 | 1 0 0 0 0 1 0 0 0 0 1 0 1 |
| 227 | 1 0 0 0 0 1 0 0 0 1 0 0 0 |
| 228 | 1 0 0 0 0 1 0 0 0 1 0 0 1 |
| 229 | 1 0 0 0 0 1 0 0 0 1 0 1 0 |
| 230 | 1 0 0 0 0 1 0 0 1 0 0 0 1 |
| 231 | 1 0 0 0 0 1 0 0 1 0 0 1 0 |
| 232 | 1 0 0 0 0 1 0 0 1 0 1 0 0 |
| 233 | 1 0 0 0 0 1 0 0 1 0 1 0 1 |
| 234 | 1 0 0 0 0 1 0 1 0 0 0 0 1 |
| 235 | 1 0 0 0 0 1 0 1 0 0 0 1 0 |
| 236 | 1 0 0 0 0 1 0 1 0 0 1 0 0 |
| 237 | 1 0 0 0 0 1 0 1 0 0 1 0 1 |
| 238 | 1 0 0 0 0 1 0 1 0 1 0 0 0 |
| 239 | 1 0 0 0 0 1 0 1 0 1 0 0 1 |
| 240 | 1 0 0 0 0 1 0 1 0 1 0 1 0 |
| 241 | 1 0 0 0 1 0 0 0 0 0 1 0 0 |
| 242 | 1 0 0 0 1 0 0 0 0 0 1 0 1 |
| 243 | 1 0 0 0 1 0 0 0 0 1 0 0 0 |
| 244 | 1 0 0 0 1 0 0 0 0 1 0 0 1 |
| 245 | 1 0 0 0 1 0 0 0 0 1 0 1 0 |
| 246 | 1 0 0 0 1 0 0 0 1 0 0 0 1 |
| 247 | 1 0 0 0 1 0 0 0 1 0 0 1 0 |
| 248 | 1 0 0 0 1 0 0 0 1 0 1 0 0 |
| 249 | 1 0 0 0 1 0 0 0 1 0 1 0 1 |
| 250 | 1 0 0 0 1 0 0 1 0 0 0 0 1 |
| 251 | 1 0 0 0 1 0 0 1 0 0 0 1 0 |
| 252 | 1 0 0 0 1 0 0 1 0 0 1 0 0 |
| 253 | 1 0 0 0 1 0 0 1 0 0 1 0 1 |
| 254 | 1 0 0 0 1 0 0 1 0 1 0 0 0 |
| 255 | 1 0 0 0 1 0 0 1 0 1 0 0 1 |
| 256 | 1 0 0 0 1 0 0 1 0 1 0 1 0 |
| 257 | 1 0 0 0 1 0 1 0 0 0 0 0 1 |
| 258 | 1 0 0 0 1 0 1 0 0 0 0 1 0 |
| 259 | 1 0 0 0 1 0 1 0 0 0 1 0 0 |
| 260 | 1 0 0 0 1 0 1 0 0 0 1 0 1 |
| 261 | 1 0 0 0 1 0 1 0 0 1 0 0 0 |
| 262 | 1 0 0 0 1 0 1 0 0 1 0 0 1 |
| 263 | 1 0 0 0 1 0 1 0 0 1 0 1 0 |
| 264 | 1 0 0 0 1 0 1 0 1 0 0 0 1 |
| 265 | 1 0 0 0 1 0 1 0 1 0 0 1 0 |
| 266 | 1 0 0 0 1 0 1 0 1 0 1 0 0 |
| 267 | 1 0 0 0 1 0 1 0 1 0 1 0 1 |
| 268 | 1 0 0 1 0 0 0 0 0 1 0 0 0 |
| 269 | 1 0 0 1 0 0 0 0 0 1 0 0 1 |
| 270 | 1 0 0 1 0 0 0 0 0 1 0 1 0 |
| 271 | 1 0 0 1 0 0 0 0 1 0 0 0 1 |
| 272 | 1 0 0 1 0 0 0 0 1 0 0 1 0 |
| 273 | 1 0 0 1 0 0 0 0 1 0 1 0 0 |
| 274 | 1 0 0 1 0 0 0 0 1 0 1 0 1 |
| 275 | 1 0 0 1 0 0 0 1 0 0 0 0 1 |
| 276 | 1 0 0 1 0 0 0 1 0 0 0 1 0 |
| 277 | 1 0 0 1 0 0 0 1 0 0 1 0 0 |
| 278 | 1 0 0 1 0 0 0 1 0 0 1 0 1 |
| 279 | 1 0 0 1 0 0 0 1 0 1 0 0 0 |
| 280 | 1 0 0 1 0 0 0 1 0 1 0 0 1 |
| 281 | 1 0 0 1 0 0 0 1 0 1 0 1 0 |
| 282 | 1 0 0 1 0 0 1 0 0 0 0 0 1 |
| 283 | 1 0 0 1 0 0 1 0 0 0 0 1 0 |
| 284 | 1 0 0 1 0 0 1 0 0 0 1 0 0 |
| 285 | 1 0 0 1 0 0 1 0 0 0 1 0 1 |
| 286 | 1 0 0 1 0 0 1 0 0 1 0 0 0 |
| 287 | 1 0 0 1 0 0 1 0 0 1 0 0 1 |
| 288 | 1 0 0 1 0 0 1 0 0 1 0 1 0 |
| 289 | 1 0 0 1 0 0 1 0 1 0 0 0 1 |
| 290 | 1 0 0 1 0 0 1 0 1 0 0 1 0 |
| 291 | 1 0 0 1 0 0 1 0 1 0 1 0 0 |
| 292 | 1 0 0 1 0 0 1 0 1 0 1 0 1 |
| 293 | 1 0 0 1 0 1 0 0 0 0 0 1 0 |
| 294 | 1 0 0 1 0 1 0 0 0 0 1 0 0 |
| 295 | 1 0 0 1 0 1 0 0 0 0 1 0 1 |
| 296 | 1 0 0 1 0 1 0 0 0 1 0 0 0 |
| 297 | 1 0 0 1 0 1 0 0 0 1 0 0 1 |
| 298 | 1 0 0 1 0 1 0 0 0 1 0 1 0 |
| 299 | 1 0 0 1 0 1 0 0 1 0 0 0 1 |
| 300 | 1 0 0 1 0 1 0 0 1 0 0 1 0 |
| 301 | 1 0 0 1 0 1 0 0 1 0 1 0 0 |
| 302 | 1 0 0 1 0 1 0 0 1 0 1 0 1 |
| 303 | 1 0 0 1 0 1 0 1 0 0 0 0 1 |

TABLE 12-continued

| NUMBER | 13-BIT CODE |
|---|---|
| 304 | 1001010100010 |
| 305 | 1001010100100 |
| 306 | 1001010100101 |
| 307 | 1001010101000 |
| 308 | 1001010101001 |
| 309 | 1001010101010 |
| 310 | 1010000010001 |
| 311 | 1010000010010 |
| 312 | 1010000010100 |
| 313 | 1010000010101 |
| 314 | 1010000100001 |
| 315 | 1010000100010 |
| 316 | 1010000100100 |
| 317 | 1010000100101 |
| 318 | 1010000101000 |
| 319 | 1010000101001 |
| 320 | 1010000101010 |
| 321 | 1010001000001 |
| 322 | 1010001000010 |
| 323 | 1010001000100 |
| 324 | 1010001000101 |
| 325 | 1010001001000 |
| 326 | 1010001001001 |
| 327 | 1010001001010 |
| 328 | 1010001010001 |
| 329 | 1010001010010 |
| 330 | 1010001010100 |
| 331 | 1010001010101 |
| 332 | 1010010000010 |
| 333 | 1010010000100 |
| 334 | 1010010000101 |
| 335 | 1010010001000 |
| 336 | 1010010001001 |
| 337 | 1010010001010 |
| 338 | 1010010010001 |
| 339 | 1010010010010 |
| 340 | 1010010010100 |
| 341 | 1010010010101 |
| 342 | 1010010100001 |
| 343 | 1010010100010 |
| 344 | 1010010100100 |
| 345 | 1010010100101 |
| 346 | 1010010101000 |
| 347 | 1010010101001 |
| 348 | 1010010101010 |
| 349 | 1010100000100 |
| 350 | 1010100000101 |
| 351 | 1010100001000 |
| 352 | 1010100001001 |
| 353 | 1010100001010 |
| 354 | 1010100010001 |
| 355 | 1010100010010 |
| 356 | 1010100010100 |
| 357 | 1010100010101 |
| 358 | 1010100100001 |
| 359 | 1010100100010 |
| 360 | 1010100100100 |
| 361 | 1010100100101 |
| 362 | 1010100101000 |
| 363 | 1010100101001 |
| 364 | 1010100101010 |
| 365 | 1010101000001 |
| 366 | 1010101000010 |
| 367 | 1010101000100 |
| 368 | 1010101000101 |
| 369 | 1010101001000 |
| 370 | 1010101001001 |
| 371 | 1010101001010 |
| 372 | 1010101010001 |
| 373 | 1010101010010 |
| 374 | 1010101010100 |
| 375 | 1010101010101 |

TABLE 13

| NUMBER | 13-BIT CODE |
|---|---|
| 1 | 0010000010001 |
| 2 | 0010000010010 |
| 3 | 0010000010100 |
| 4 | 0010000010101 |
| 5 | 0010000100001 |
| 6 | 0010000100010 |
| 7 | 0010000100100 |
| 8 | 0010000100101 |
| 9 | 0010000101000 |
| 10 | 0010000101001 |
| 11 | 0010000101010 |
| 12 | 0010001000001 |
| 13 | 0010001000010 |
| 14 | 0010001000100 |
| 15 | 0010001000101 |
| 16 | 0010001001000 |
| 17 | 0010001001001 |
| 18 | 0010001001010 |
| 19 | 0010001010001 |
| 20 | 0010001010010 |
| 21 | 0010001010100 |
| 22 | 0010001010101 |
| 23 | 0010010000010 |
| 24 | 0010010000100 |
| 25 | 0010010000101 |
| 26 | 0010010001000 |
| 27 | 0010010001001 |
| 28 | 0010010001010 |
| 29 | 0010010010001 |
| 30 | 0010010010010 |
| 31 | 0010010010100 |
| 32 | 0010010010101 |
| 33 | 0010010100001 |
| 34 | 0010010100010 |
| 35 | 0010010100100 |
| 36 | 0010010100101 |
| 37 | 0010010101000 |
| 38 | 0010010101001 |
| 39 | 0010010101010 |
| 40 | 0010100000100 |
| 41 | 0010100000101 |
| 42 | 0010100001000 |
| 43 | 0010100001001 |
| 44 | 0010100001010 |
| 45 | 0010100010001 |
| 46 | 0010100010010 |
| 47 | 0010100010100 |
| 48 | 0010100010101 |
| 49 | 0010100100001 |
| 50 | 0010100100010 |
| 51 | 0010100100100 |
| 52 | 0010100100101 |
| 53 | 0010100101000 |
| 54 | 0010100101001 |
| 55 | 0010100101010 |
| 56 | 0010101000001 |
| 57 | 0010101000010 |
| 58 | 0010101000100 |
| 59 | 0010101000101 |
| 60 | 0010101001000 |
| 61 | 0010101001001 |
| 62 | 0010101001010 |
| 63 | 0010101010001 |
| 64 | 0010101010010 |
| 65 | 0010101010100 |
| 66 | 0010101010101 |
| 67 | 0100000100001 |
| 68 | 0100000100010 |
| 69 | 0100000100100 |
| 70 | 0100000100101 |
| 71 | 0100000101000 |
| 72 | 0100000101001 |
| 73 | 0100000101010 |
| 74 | 0100001000001 |
| 75 | 0100001000010 |
| 76 | 0100001000100 |
| 77 | 0100001000101 |
| 78 | 0100001001000 |
| 79 | 0100001001001 |
| 80 | 0100001001010 |
| 81 | 0100001010001 |
| 82 | 0100001010010 |
| 83 | 0100001010100 |
| 84 | 0100001010101 |

TABLE 13-continued

| NUMBER | 13-BIT CODE |
| --- | --- |
| 85 | 0 1 0 0 0 1 0 0 0 0 0 1 0 |
| 86 | 0 1 0 0 0 1 0 0 0 0 1 0 0 |
| 87 | 0 1 0 0 0 1 0 0 0 0 1 0 1 |
| 88 | 0 1 0 0 0 1 0 0 0 1 0 0 0 |
| 89 | 0 1 0 0 0 1 0 0 0 1 0 0 1 |
| 90 | 0 1 0 0 0 1 0 0 0 1 0 1 0 |
| 91 | 0 1 0 0 0 1 0 0 1 0 0 0 1 |
| 92 | 0 1 0 0 0 1 0 0 1 0 0 1 0 |
| 93 | 0 1 0 0 0 1 0 0 1 0 1 0 0 |
| 94 | 0 1 0 0 0 1 0 0 1 0 1 0 1 |
| 95 | 0 1 0 0 0 1 0 1 0 0 0 0 1 |
| 96 | 0 1 0 0 0 1 0 1 0 0 0 1 0 |
| 97 | 0 1 0 0 0 1 0 1 0 0 1 0 0 |
| 98 | 0 1 0 0 0 1 0 1 0 0 1 0 1 |
| 99 | 0 1 0 0 0 1 0 1 0 1 0 0 0 |
| 100 | 0 1 0 0 0 1 0 1 0 1 0 0 1 |
| 101 | 0 1 0 0 0 1 0 1 0 1 0 1 0 |
| 102 | 0 1 0 0 1 0 0 0 0 0 1 0 0 |
| 103 | 0 1 0 0 1 0 0 0 0 0 1 0 1 |
| 104 | 0 1 0 0 1 0 0 0 0 1 0 0 0 |
| 105 | 0 1 0 0 1 0 0 0 0 1 0 0 1 |
| 106 | 0 1 0 0 1 0 0 0 0 1 0 1 0 |
| 107 | 0 1 0 0 1 0 0 0 1 0 0 0 1 |
| 108 | 0 1 0 0 1 0 0 0 1 0 0 1 0 |
| 109 | 0 1 0 0 1 0 0 0 1 0 1 0 0 |
| 110 | 0 1 0 0 1 0 0 0 1 0 1 0 1 |
| 111 | 0 1 0 0 1 0 0 1 0 0 0 0 1 |
| 112 | 0 1 0 0 1 0 0 1 0 0 0 1 0 |
| 113 | 0 1 0 0 1 0 0 1 0 0 1 0 0 |
| 114 | 0 1 0 0 1 0 0 1 0 0 1 0 1 |
| 115 | 0 1 0 0 1 0 0 1 0 1 0 0 0 |
| 116 | 0 1 0 0 1 0 0 1 0 1 0 0 1 |
| 117 | 0 1 0 0 1 0 0 1 0 1 0 1 0 |
| 118 | 0 1 0 0 1 0 1 0 0 0 0 0 1 |
| 119 | 0 1 0 0 1 0 1 0 0 0 0 1 0 |
| 120 | 0 1 0 0 1 0 1 0 0 0 1 0 0 |
| 121 | 0 1 0 0 1 0 1 0 0 0 1 0 1 |
| 122 | 0 1 0 0 1 0 1 0 0 1 0 0 0 |
| 123 | 0 1 0 0 1 0 1 0 0 1 0 0 1 |
| 124 | 0 1 0 0 1 0 1 0 0 1 0 1 0 |
| 125 | 0 1 0 0 1 0 1 0 1 0 0 0 1 |
| 126 | 0 1 0 0 1 0 1 0 1 0 0 1 0 |
| 127 | 0 1 0 0 1 0 1 0 1 0 1 0 0 |
| 128 | 0 1 0 0 1 0 1 0 1 0 1 0 1 |
| 129 | 0 1 0 1 0 0 0 0 0 1 0 0 0 |
| 130 | 0 1 0 1 0 0 0 0 0 1 0 0 1 |
| 131 | 0 1 0 1 0 0 0 0 0 1 0 1 0 |
| 132 | 0 1 0 1 0 0 0 0 1 0 0 0 1 |
| 133 | 0 1 0 1 0 0 0 0 1 0 0 1 0 |
| 134 | 0 1 0 1 0 0 0 0 1 0 1 0 0 |
| 135 | 0 1 0 1 0 0 0 0 1 0 1 0 1 |
| 136 | 0 1 0 1 0 0 0 1 0 0 0 0 1 |
| 137 | 0 1 0 1 0 0 0 1 0 0 0 1 0 |
| 138 | 0 1 0 1 0 0 0 1 0 0 1 0 0 |
| 139 | 0 1 0 1 0 0 0 1 0 0 1 0 1 |
| 140 | 0 1 0 1 0 0 0 1 0 1 0 0 0 |
| 141 | 0 1 0 1 0 0 0 1 0 1 0 0 1 |
| 142 | 0 1 0 1 0 0 0 1 0 1 0 1 0 |
| 143 | 0 1 0 1 0 0 1 0 0 0 0 0 1 |
| 144 | 0 1 0 1 0 0 1 0 0 0 0 1 0 |
| 145 | 0 1 0 1 0 0 1 0 0 0 1 0 0 |
| 146 | 0 1 0 1 0 0 1 0 0 0 1 0 1 |
| 147 | 0 1 0 1 0 0 1 0 0 1 0 0 0 |
| 148 | 0 1 0 1 0 0 1 0 0 1 0 0 1 |
| 149 | 0 1 0 1 0 0 1 0 0 1 0 1 0 |
| 150 | 0 1 0 1 0 0 1 0 1 0 0 0 1 |
| 151 | 0 1 0 1 0 0 1 0 1 0 0 1 0 |
| 152 | 0 1 0 1 0 0 1 0 1 0 1 0 0 |
| 153 | 0 1 0 1 0 0 1 0 1 0 1 0 1 |
| 154 | 0 1 0 1 0 1 0 0 0 0 0 1 0 |
| 155 | 0 1 0 1 0 1 0 0 0 0 1 0 0 |
| 156 | 0 1 0 1 0 1 0 0 0 0 1 0 1 |
| 157 | 0 1 0 1 0 1 0 0 0 1 0 0 0 |
| 158 | 0 1 0 1 0 1 0 0 0 1 0 0 1 |
| 159 | 0 1 0 1 0 1 0 0 0 1 0 1 0 |
| 160 | 0 1 0 1 0 1 0 0 1 0 0 0 1 |
| 161 | 0 1 0 1 0 1 0 0 1 0 0 1 0 |
| 162 | 0 1 0 1 0 1 0 0 1 0 1 0 0 |
| 163 | 0 1 0 1 0 1 0 0 1 0 1 0 1 |
| 164 | 0 1 0 1 0 1 0 1 0 0 0 0 1 |
| 165 | 0 1 0 1 0 1 0 1 0 0 0 1 0 |

TABLE 13-continued

| NUMBER | 13-BIT CODE |
| --- | --- |
| 166 | 0 1 0 1 0 1 0 1 0 0 1 0 0 |
| 167 | 0 1 0 1 0 1 0 1 0 0 1 0 1 |
| 168 | 0 1 0 1 0 1 0 1 0 1 0 0 0 |
| 169 | 0 1 0 1 0 1 0 1 0 1 0 0 1 |
| 170 | 0 1 0 1 0 1 0 1 0 1 0 1 0 |
| 171 | 1 0 0 0 0 0 1 0 0 0 0 0 1 |
| 172 | 1 0 0 0 0 0 1 0 0 0 0 1 0 |
| 173 | 1 0 0 0 0 0 1 0 0 0 1 0 0 |
| 174 | 1 0 0 0 0 0 1 0 0 0 1 0 1 |
| 175 | 1 0 0 0 0 0 1 0 0 1 0 0 0 |
| 176 | 1 0 0 0 0 0 1 0 0 1 0 0 1 |
| 177 | 1 0 0 0 0 0 1 0 0 1 0 1 0 |
| 178 | 1 0 0 0 0 0 1 0 1 0 0 0 1 |
| 179 | 1 0 0 0 0 0 1 0 1 0 0 1 0 |
| 180 | 1 0 0 0 0 0 1 0 1 0 1 0 0 |
| 181 | 1 0 0 0 0 0 1 0 1 0 1 0 1 |
| 182 | 1 0 0 0 0 1 0 0 0 0 0 1 0 |
| 183 | 1 0 0 0 0 1 0 0 0 0 1 0 0 |
| 184 | 1 0 0 0 0 1 0 0 0 0 1 0 1 |
| 185 | 1 0 0 0 0 1 0 0 0 1 0 0 0 |
| 186 | 1 0 0 0 0 1 0 0 0 1 0 0 1 |
| 187 | 1 0 0 0 0 1 0 0 0 1 0 1 0 |
| 188 | 1 0 0 0 0 1 0 0 1 0 0 0 1 |
| 189 | 1 0 0 0 0 1 0 0 1 0 0 1 0 |
| 190 | 1 0 0 0 0 1 0 0 1 0 1 0 0 |
| 191 | 1 0 0 0 0 1 0 0 1 0 1 0 1 |
| 192 | 1 0 0 0 0 1 0 1 0 0 0 0 1 |
| 193 | 1 0 0 0 0 1 0 1 0 0 0 1 0 |
| 194 | 1 0 0 0 0 1 0 1 0 0 1 0 0 |
| 195 | 1 0 0 0 0 1 0 1 0 0 1 0 1 |
| 196 | 1 0 0 0 0 1 0 1 0 1 0 0 0 |
| 197 | 1 0 0 0 0 1 0 1 0 1 0 0 1 |
| 198 | 1 0 0 0 0 1 0 1 0 1 0 1 0 |
| 199 | 1 0 0 0 1 0 0 0 0 0 1 0 0 |
| 200 | 1 0 0 0 1 0 0 0 0 0 1 0 1 |
| 201 | 1 0 0 0 1 0 0 0 0 1 0 0 0 |
| 202 | 1 0 0 0 1 0 0 0 0 1 0 0 1 |
| 203 | 1 0 0 0 1 0 0 0 0 1 0 1 0 |
| 204 | 1 0 0 0 1 0 0 0 1 0 0 0 1 |
| 205 | 1 0 0 0 1 0 0 0 1 0 0 1 0 |
| 206 | 1 0 0 0 1 0 0 0 1 0 1 0 0 |
| 207 | 1 0 0 0 1 0 0 0 1 0 1 0 1 |
| 208 | 1 0 0 0 1 0 0 1 0 0 0 0 1 |
| 209 | 1 0 0 0 1 0 0 1 0 0 0 1 0 |
| 210 | 1 0 0 0 1 0 0 1 0 0 1 0 0 |
| 211 | 1 0 0 0 1 0 0 1 0 0 1 0 1 |
| 212 | 1 0 0 0 1 0 0 1 0 1 0 0 0 |
| 213 | 1 0 0 0 1 0 0 1 0 1 0 0 1 |
| 214 | 1 0 0 0 1 0 0 1 0 1 0 1 0 |
| 215 | 1 0 0 0 1 0 1 0 0 0 0 0 1 |
| 216 | 1 0 0 0 1 0 1 0 0 0 0 1 0 |
| 217 | 1 0 0 0 1 0 1 0 0 0 1 0 0 |
| 218 | 1 0 0 0 1 0 1 0 0 0 1 0 1 |
| 219 | 1 0 0 0 1 0 1 0 0 1 0 0 0 |
| 220 | 1 0 0 0 1 0 1 0 0 1 0 0 1 |
| 221 | 1 0 0 0 1 0 1 0 0 1 0 1 0 |
| 222 | 1 0 0 0 1 0 1 0 1 0 0 0 1 |
| 223 | 1 0 0 0 1 0 1 0 1 0 0 1 0 |
| 224 | 1 0 0 0 1 0 1 0 1 0 1 0 0 |
| 225 | 1 0 0 0 1 0 1 0 1 0 1 0 1 |
| 226 | 1 0 0 1 0 0 0 0 0 1 0 0 0 |
| 227 | 1 0 0 1 0 0 0 0 0 1 0 0 1 |
| 228 | 1 0 0 1 0 0 0 0 0 1 0 1 0 |
| 229 | 1 0 0 1 0 0 0 0 1 0 0 0 1 |
| 230 | 1 0 0 1 0 0 0 0 1 0 0 1 0 |
| 231 | 1 0 0 1 0 0 0 0 1 0 1 0 0 |
| 232 | 1 0 0 1 0 0 0 0 1 0 1 0 1 |
| 233 | 1 0 0 1 0 0 0 1 0 0 0 0 1 |
| 234 | 1 0 0 1 0 0 0 1 0 0 0 1 0 |
| 235 | 1 0 0 1 0 0 0 1 0 0 1 0 0 |
| 236 | 1 0 0 1 0 0 0 1 0 0 1 0 1 |
| 237 | 1 0 0 1 0 0 0 1 0 1 0 0 0 |
| 238 | 1 0 0 1 0 0 0 1 0 1 0 0 1 |
| 239 | 1 0 0 1 0 0 0 1 0 1 0 1 0 |
| 240 | 1 0 0 1 0 0 1 0 0 0 0 0 1 |
| 241 | 1 0 0 1 0 0 1 0 0 0 0 1 0 |
| 242 | 1 0 0 1 0 0 1 0 0 0 1 0 0 |
| 243 | 1 0 0 1 0 0 1 0 0 0 1 0 1 |
| 244 | 1 0 0 1 0 0 1 0 0 1 0 0 0 |
| 245 | 1 0 0 1 0 0 1 0 0 1 0 0 1 |
| 246 | 1 0 0 1 0 0 1 0 0 1 0 1 0 |

TABLE 13-continued

| NUMBER | 13-BIT CODE |
|---|---|
| 247 | 1001001010001 |
| 248 | 1001001010010 |
| 249 | 1001001010100 |
| 250 | 1001001010101 |
| 251 | 1001010000010 |
| 252 | 1001010000100 |
| 253 | 1001010000101 |
| 254 | 1001010001000 |
| 255 | 1001010001001 |
| 256 | 1001010001010 |
| 257 | 1001010010001 |
| 258 | 1001010010010 |
| 259 | 1001010010100 |
| 260 | 1001010010101 |
| 261 | 1001010100001 |
| 262 | 1001010100010 |
| 263 | 1001010100100 |
| 264 | 1001010100101 |
| 265 | 1001010101000 |
| 266 | 1001010101001 |
| 267 | 1001010101010 |
| 268 | 1010000010001 |
| 269 | 1010000010010 |
| 270 | 1010000010100 |
| 271 | 1010000010101 |
| 272 | 1010000100001 |
| 273 | 1010000100010 |
| 274 | 1010000100100 |
| 275 | 1010000100101 |
| 276 | 1010000101000 |
| 277 | 1010000101001 |
| 278 | 1010000101010 |
| 279 | 1010001000001 |
| 280 | 1010001000010 |
| 281 | 1010001000100 |
| 282 | 1010001000101 |
| 283 | 1010001001000 |
| 284 | 1010001001001 |
| 285 | 1010001001010 |
| 286 | 1010001010001 |
| 287 | 1010001010010 |
| 288 | 1010001010100 |
| 289 | 1010001010101 |
| 290 | 1010010000010 |
| 291 | 1010010000100 |
| 292 | 1010010000101 |
| 293 | 1010010001000 |
| 294 | 1010010001001 |
| 295 | 1010010001010 |
| 296 | 1010010010001 |
| 297 | 1010010010010 |
| 298 | 1010010010100 |
| 299 | 1010010010101 |
| 300 | 1010010100001 |
| 301 | 1010010100010 |
| 302 | 1010010100100 |
| 303 | 1010010100101 |
| 304 | 1010010101000 |
| 305 | 1010010101001 |
| 306 | 1010010101010 |
| 307 | 1010100000100 |
| 308 | 1010100000101 |
| 309 | 1010100001000 |
| 310 | 1010100001001 |
| 311 | 1010100001010 |
| 312 | 1010100010001 |
| 313 | 1010100010010 |
| 314 | 1010100010100 |
| 315 | 1010100010101 |
| 316 | 1010100100001 |
| 317 | 1010100100010 |
| 318 | 1010100100100 |
| 319 | 1010100100101 |
| 320 | 1010100101000 |
| 321 | 1010100101001 |
| 322 | 1010100101010 |
| 323 | 1010101000001 |
| 324 | 1010101000010 |
| 325 | 1010101000100 |
| 326 | 1010101000101 |
| 327 | 1010101001000 |
| 328 | 1010101001001 |
| 329 | 1010101001010 |
| 330 | 1010101010001 |
| 331 | 1010101010010 |
| 332 | 1010101010100 |
| 333 | 1010101010101 |

The case where the 4-bit data is converted to the 5-bit code will then be described.

For instance, in the case where k=2, sixteen codes among the 17b-bit codes shown in Table 14 are made coordinate with the $2^4=16$ 4-bit data.

TABLE 14

| NUMBER | 5-BIT CODE |
|---|---|
| 1 | 10011 |
| 2 | 10101 |
| 3 | 10111 |
| 4 | 11001 |
| 5 | 11011 |
| 6 | 11101 |
| 7 | 11111 |
| 8 | 10010 |
| 9 | 10110 |
| 10 | 11010 |
| 11 | 11110 |
| 12 | 01001 |
| 13 | 01011 |
| 14 | 01101 |
| 15 | 01111 |
| 16 | 01010 |
| 17 | 01110 |

Figure 14:
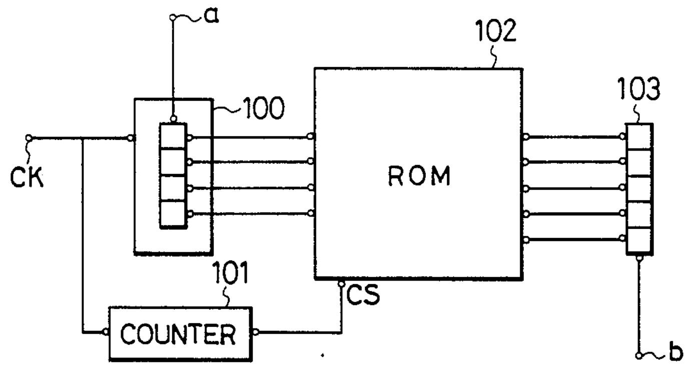
FIG. 14 is an arrangement block diagram with respect to the code conversion from 4 bits to 5 bits.

FIG. 14 is an arrangement block diagram for encoding from 4 bits to 5 bits according to the present invention. In FIG. 14, a data sequence is inputted from ⓐ. This data sequence is inputted to the 4-bit shift resistor 100. CK is the input terminal of the clock to drive the shift register 100. This clock signal is also simultaneously inputted to the counter 101. The counter 101 generates a pulse whenever the four clocks are counted and this pulse is inputted to a chip selecting (CS) terminal. When the pulse is inputted to the chip selecting (CS) terminal, the data in the shift register 100 is taken into the ROM 102 and the address in the ROM corresponding to the data is designated. Sixteen 5-bit codes which were arbitrarily selected from Table 14 are stored in the 0th to 15th addresses in the ROM. When the address in the ROM corresponding to the data is designated, the 5-bit code stored in that address is inputted to the shift register 103 and is outputted from the code output terminal ⓑ.

In this way, the conversion from the data to the code, namely, the encoding is finished. Upon foregoing encoding or the like, a CPU (not shown) may control the registers or the like. The conversion from the code to the data which is performed on the reproducing side, namely, the decoding may be attained by performing the conversion opposite to the above-mentioned conversion for encoding. The same shall be likewise applied to other bits. As described above, the 5-bit codes shown in Table 14 are the codes which are restricted in a manner such that the minimum number of bits "0" which exist between the adjacent bits "1" is zero and the maximum number is two. There is an effect such that this limitation is not broken even by coupling the bit codes. Therefore, $$T_{min}=0.8T$$

$T_{max}=2.4T$ $T_W=0.8T$

Consequently, the present system has effects such that: the $T_{min}$ and $T_W$ are larger and the decoding error rate is small as compared with the conventional FM system; the low frequency component of the recording waveform is few; and the synchronization can be more easily derived as compared with the MFM or 3PM system. Thus, it is possible to provide an electronic apparatus in which the recording and/or reproduction can be performed with a high density and a high degree of accuracy.

Next, still another code conversion from 4 bits to 5 bits will be explained. First, the 4-bit data is expressed by $D_1$, $D_2$, $D_3$, and $D_4$ and the 5-bit code is represented by $P_1$, $P_2$, $P_3$, $P_4$, and $P_5$. Now, assuming that $A=D_1+D_2$ and $B=D_3+D_4$ (+means OR), the code conversion is performed on the basis of the conversion table in Table 15-1 shown below. For example, in case of the condition $AB=1$ (AB denotes AND of A and B).

TABLE 15-1

| CONDITION | CODE | | | | |
|---|---|---|---|---|---|
| | $P_1$ | $P_2$ | $P_3$ | $P_4$ | $P_5$ |
| AB = 1 | 1 | $D_1$ | $D_2$ | $D_3$ | $D_4$ |
| AB = 1 | 0 | 1 | 0 | $D_3$ | $D_4$ |
| AB = 1 | 0 | 1 | 1 | $D_1$ | $D_2$ |
| AB = 1 | 1 | 0 | 0 | 1 | 1 |

Namely, since $(D_1+D_2)\cdot(D_3+D_4)=1$, either $D_1$ or $D_2$ is 1 and either $D_3$ or $D_4$ is 1. As will be obvious from Table 15-1, the conversion code ($P_1$ to $P_5$) becomes 1, $D_1$, $D_2$, $D_3$, and $D_4$. In addition, "$\overline{A}$" denotes a negation of A.

When Table 15-1 is expressed by logical expressions, it will be as shown in Table 15-2.

TABLE 15-2

$$P_1 = AB + \overline{AB}$$
$$P_2 = D_1AB + \overline{A}B + A\overline{B}$$
$$P_3 = D_2AB + AB$$
$$P_4 = D_3AB + D_3\overline{A}B + D_1A\overline{B} + \overline{AB}$$
$$P_5 = D_4AB + D_4\overline{A}B + D_2A\overline{B} + \overline{AB}$$

For instance, the logical expression to determine the $P_2$ is $$P_2=D_1AB+\overline{A}B+A\overline{B}$$

However, when $AB=1$, $A=B=1$, so that $\overline{A}B=A\overline{B}=0$ and $P_2=D_1$. In addition, when $\overline{A}B=1$, $A=0$ and $B=1$, so that $AB=A\overline{B}=0$ and $P_2=1$. In this way, Table 15-2 relates to the operations of only AND, OR and NOT, so that it is apparent that these operations can be constituted by the PAL (Programmable Array Logic) without storing the conversion program into the ROM or the like. On one hand, since either $D_1$ or $D_2$ and either $D_4$ or $D_5$ may be 1, respectively, it will be obviously understood that the $D_2$ and $D_1$ may be substituted for the $P_2$ and $P_3$ and the $D_4$ and $D_3$ may be substituted for the $P_4$ and $P_5$, respectively, in Table 15-1. Similarly, from the condition $\overline{A}B=1$, $\overline{A}=1$ and $B=1$ and either $D_3$ or $D_4$ is 1. Therefore, it is enough that the limitation of $k=2$ is satisfied, so that when $\overline{A}B=1$ in Table 15-1, the $P_3$ may be either 0 or 1. Also, the $P_4$ and $P_5$ may be $D_4$ and $D_3$, respectively. Likewise, in the case where $A\overline{B}=1$, either $D_1$ or $D_2$ may be 1, so that the $P_3$ may be either 0 or 1. The $P_4$ and $P_5$ may be $D_2$ and $D_1$, respectively. In the condition of $\overline{AB}=1$, $A=0$ and $B=0$, so that all of the $D_1$, $D_2$, $D_3$, and $D_4$ are 0. It is enough that the limitation of $k=2$ is satisfied, so that the $P_5$ may be 0. The above description can be summarized as shown in Tables 15-3 to 15-7. In these Tables, the blank portions are the same as those in Table 15-1.

TABLE 15-3

| CONDITION | CODE | | | | |
|---|---|---|---|---|---|
| | $P_1$ | $P_2$ | $P_3$ | $P_4$ | $P_5$ |
| AB = 1 | | | | $D_4$ | $D_3$ |
| $\overline{A}B$ = 1 | | | | | |
| $A\overline{B}$ = 1 | | | | | |
| $\overline{AB}$ = 1 | | | | | |

TABLE 15-4

| CONDITION | CODE | | | | |
|---|---|---|---|---|---|
| | $P_1$ | $P_2$ | $P_3$ | $P_4$ | $P_5$ |
| AB = 1 | | | | | |
| $\overline{A}B$ = 1 | | | | $D_4$ | $D_3$ |
| $A\overline{B}$ = 1 | | | | | |
| $\overline{AB}$ = 1 | | | | | |

TABLE 15-5

| CONDITION | CODE | | | | |
|---|---|---|---|---|---|
| | $P_1$ | $P_2$ | $P_3$ | $P_4$ | $P_5$ |
| AB = 1 | | | | | |
| $\overline{A}B$ = 1 | | | 1 | | |
| $A\overline{B}$ = 1 | | | 0 | | |
| $\overline{AB}$ = 1 | | | | | |

TABLE 15-6

| CONDITION | CODE | | | | |
|---|---|---|---|---|---|
| | $P_1$ | $P_2$ | $P_3$ | $P_4$ | $P_5$ |
| AB = 1 | | | | | |
| $\overline{A}B$ = 1 | | | | | |
| $A\overline{B}$ = 1 | | | | $D_2$ | $D_1$ |
| $\overline{AB}$ = 1 | | | | | |

TABLE 15-7

| CONDITION | CODE | | | | |
|---|---|---|---|---|---|
| | $P_1$ | $P_2$ | $P_3$ | $P_4$ | $P_5$ |
| AB = 1 | | | | | |
| $\overline{A}B$ = 1 | | | | | |
| $A\overline{B}$ = 1 | | | | | |
| $\overline{AB}$ = 1 | | | | 1 | 0 |

Figure 15:
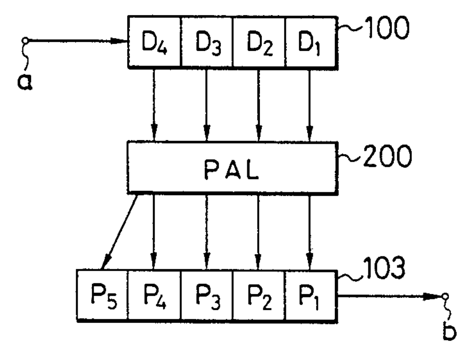
FIG. 15 is an arrangement block diagram of the code conversion from 4 bits to 5 bits using a PAL.

FIG. 15 then shows an example of the encoder to realize the code conversion based on the conversion table shown in FIG. 15-1.

Data is inputted from ⓐ to the 4-bit shift register 100. The four-bit data $D_1$, $D_2$, $D_3$, and $D_4$ inputted to the shift register 100 are subjected to the logic operations shown in Table 15-2 by a PAL circuit 200. Then, the data is inputted in parallel to the 5-bit shift register 103 and is serially outputted as the code from ⓑ.

It is obvious that the code conversions can be also realized with respect to the conversion tables in Tables 15-3 to 15-7 due to the similar idea. Therefore, their descriptions are omitted here.

Next, the decoding system corresponding to the encoding shown in Table 15-1 will be explained. This decoding system can be likewise applied to Tables 15-3 to 15-7. Table 16-1 shows a conversion table for the decoding. Table 16-2 shows logical expressions to execute the conversion table in Table 16-1.

TABLE 16-1

| CONDITION | DATA | | | |
|---|---|---|---|---|
| | $D_1$ | $D_2$ | $D_3$ | $D_4$ |
| $P_1(P_2 + P_3) = 1$ | $P_2$ | $P_3$ | $P_4$ | $P_5$ |
| $\overline{P}_1\overline{P}_3 = 1$ | 0 | 0 | $P_4$ | $P_5$ |
| $\overline{P}_1P_3 = 1$ | $P_4$ | $P_5$ | 0 | 0 |
| $P_1(\overline{P_2 + P_3}) = 1$ | 0 | 0 | 0 | 0 |

TABLE 16-2

$$D_1 = P_2P_1(P_2 + P_3) + P_4\overline{P}_1P_3$$
$$D_2 = P_3P_1(P_2 + P_3) + P_5\overline{P}_1P_3$$
$$D_3 = P_4P_1(P_2 + P_3) + P_4\overline{P}_1\overline{P}_3$$
$$D_4 = P_5P_1(P_2 + P_3) + P_5\overline{P}_1\overline{P}_2$$

For instance, the logical expression to determine the $D_1$ in Table 16-2 is $$D_1=P_2P_1\,(P_2+P_3)+P_4\overline{P}_1P_3$$

Figure 16:
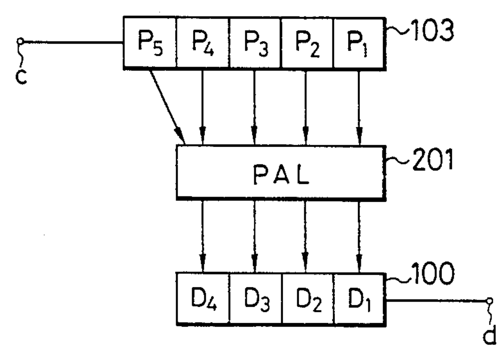
FIG. 16 is an arrangement block diagram for the decoding which corresponds to the conversion of FIG. 15.

When $P_1\,(P_2+P_3)=1$, $P_1=1$, so that $\overline{P}_1P_3=0$ and $D_1=P_2$. On one hand, when $\overline{P}_1\overline{P}_3=1$, $P_1=P_3=0$, so that $P_1(P_2+P_3)=\overline{P}_1P_3=0$ and $D_1=0$. As described above, Table 16-2 shows the operations of only AND, OR and NOT; therefore, it is obvious that those operations can be constituted by the PAL (Programmable Array Logic). FIG. 16 shows an embodiment of Table 16-2. A code is inputted from ⓒ into the 5-bit shift register 103. The 5-bit code $P_1$, $P_2$, $P_3$, $P_4$, and $P_5$ inputted to the shift register is subjected to the logic operations in Table 16-2 by the PAL circuit 201 and is inputted in parallel to the 4-bit shift register 100 and is serially outputted as the decoded data from ⓓ.

Figure 17:
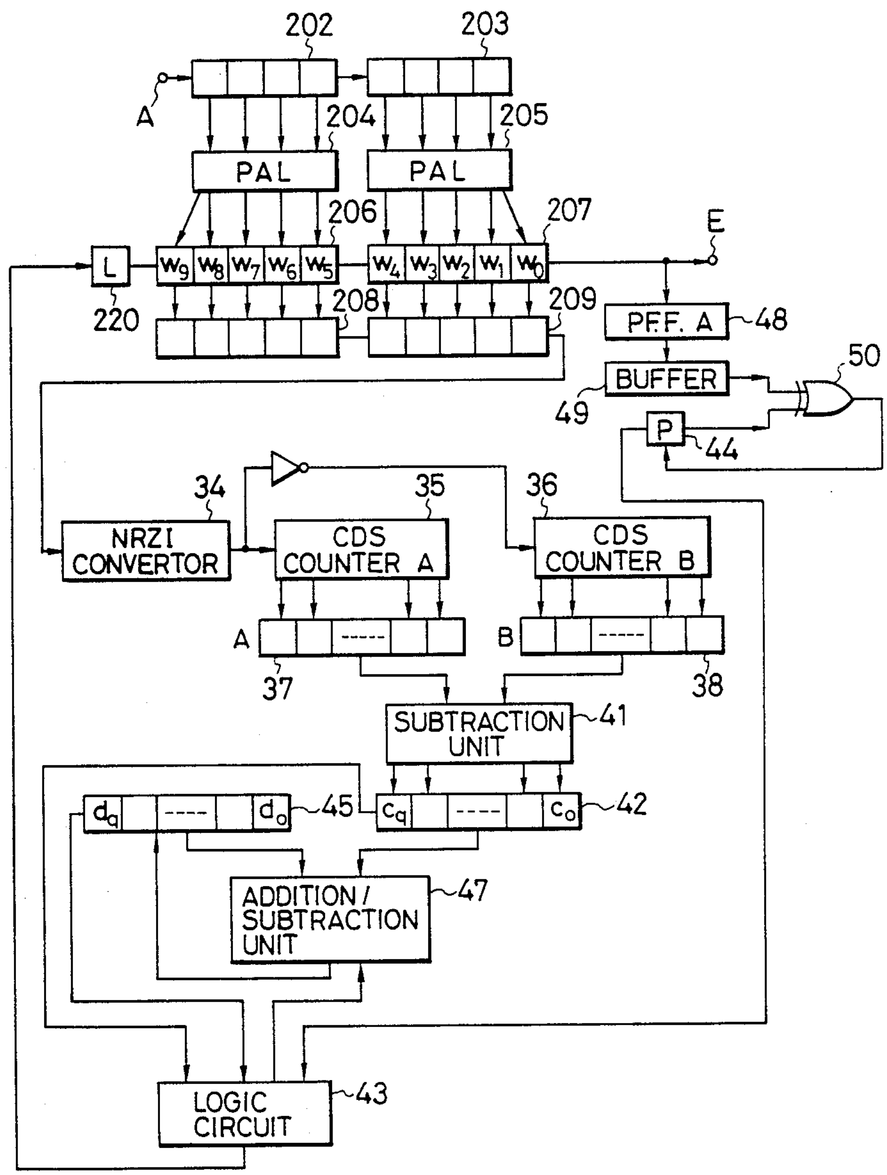
FIG. 17 is an arrangement block diagram of the conversion from 8 bits to 11 bits using the code conversion from 4 bits to 5 bits shown in FIG. 15 mentioned above.

Next, the case where the 8-bit (b bits+4 bits) data is converted to the code of 11 bits (5 bits+5 bits+one coupling bit L indicated at 220) as shown in FIG. 17 by applying the arrangement shown in FIG. 15 will be described.

The data inputted from the input terminal Ⓐ in FIG. 17 is inputted to two 4-bit shift registers 202 and 203 and is converted by PALs 204 and 205 due to any of the coding systems shown in Tables 15-3 to 15-7. This code is then inputted in parallel to two 5-bit shift registers 206 and 207. This 10-bit code is also simultaneously inputted to 5-bit shift registers 208 and 209. In this embodiment, the data of two blocks is considered to be one data and the code conversion was performed. However, the number of blocks is not limited to two but may be apparently set to any number. The 10-bit code loaded in the registers 208 and 209 is supplied to the NRZI converter 34, by which it is NRZI-converted. The number of bits "1" of this NRZI-converted code is counted by the CDS counter A indicated at 35, while the number of bits "0" is counted by the CDS counter B at 36. The respective count values are loaded into the registers A and B indicated at 37 and 38.

The above description is substantially the same as the explanation in conjunction with FIG. 7; therefore, its details are omitted here. Now, the algorithm (Table 17) to produce the DC-free codes relative to the coupling bit L indicated at 220 will be explained. Its details have been already described with reference to FIG. 7; therefore, they are omitted here.

TABLE 17

| | |
|---|---|
| STEP 1: | Set DSV = 0 and P = 0. |

TABLE 17-continued

| | |
|---|---|
| STEP 2: | Generate the converted code only as many as l blocks and couple these l blocks in series and name it as W. Where, l is a natural number and W becomes 51 bits (l = 2 in FIG. 17). |
| STEP 3: | Calculate the CDS. |
| STEP 4: | |
| (i) | If P = 0 and sign DSV = sign CDS, set L = 1 and DSV = DSV = CDS + 1. |
| (ii) | If P = p and sign DSV ≠ sign CDS, set L = 0 and DSV = DSV + CDS − 1. |
| (iii) | If P = 1 and sign DSV = sign CDS, set L = 0 and DSV = DSV − CDS + 1. |
| (iv) | If P = 1 and sign DSV ≠ sign CDS, set L = 1 and DSV = DSV + CDS − 1. |
| STEP 5: | P = P ⊕ (P of LW), where ⊕ denotes the exclusive OR. Output the LW as the code. |
| STEP 6: | Jump to STEP 2. |

A different point from the algorithm relative to FIG. 7 is merely concerned with the $W_1$ and the code switching to produce the DC-free codes is performed by the coupling bit L in place of the $W_1$. In STEP 5, the P is determined by the EX-OR of the 11-bit code LW which is constituted by adding the bit L to the 10-bit code W and the previous P.

As described in detail above, when the examples of the coding systems shown in Tables 15-3 to 15-7 are compared with the encoding by the conventional MFM or 3PM system, they will become as shown in Table 18.

TABLE 18

| CODING SYSTEM | PARAMETER | | | |
|---|---|---|---|---|
| | $T_{min}$ | $T_W$ | $T_{max}$/ CLK | $T_{max}$/ $T_{min}$ |
| MFM SYSTEM | $T_0$ | $0.5T_0$ | 4 | 2 |
| 3PM SYSTEM | $1.5T_0$ | $0.5T_0$ | 12 | 4 |
| SYSTEM OF THE PRESENT INVENTION | $0.8T_0$ | $0.8T_0$ | 3 | 3 |

It will be appreciated from Table 18 that although the $T_W$ is too smaller than the $T_{min}$ in the conventional systems, the present system has an effect such that the $T_W$ is so large to be $0.8T_0$ and the error rate can be reduced as compared with the conventional systems and that the ratios of $T_{max}/C_{LK}$ and $T_{max}/T_{min}$ are together so small to be 3 and the synchronization can be extremely easily obtained. In addition, the conversion from the 4-bit data to the 5-bit code can be realized by a simple logic circuit, so that the present invention has also a large advantage such that it is suitable to realize an LSI. Further, the absolute value of the DSV can be suppressed to a value within a limited range by inserting only one coupling bit L so as to allow the next code W to be coupled in order to reduce an increase in DSV in STEP 4 in the encoding algorithm in Table 17 or to invert its sign, so that there is an effect such that the DC-free codes can be realized. On the other hand, there is an effect such that by setting 1 in STEP 2 to a large value, almost of the parameters (Table 18) of the coding systems shown in Tables 15-3 to 15-7 can be held.

As described above, according to the invention, it is possible to provide a data processing apparatus in which the data processes can be performed very efficiently with a high degree of accuracy.

[3→5]

Next, the case where three-bit data of a binary data sequence is converted to the code consisting of five bits will be described.

In case of converting the 3-bit data to the 5-bit code, for instance, assuming that k=1, eight 5-bit codds may be made coordinate with the $2^3=8$ 3-bit data as shown in Table 19.

TABLE 19

| NUMBER | 5-BIT CODE |
|---|---|
| 1 | 10101 |
| 2 | 10111 |
| 3 | 11011 |
| 4 | 11101 |
| 5 | 11111 |
| 6 | 10110 |
| 7 | 11010 |
| 8 | 11110 |

Figure 18:
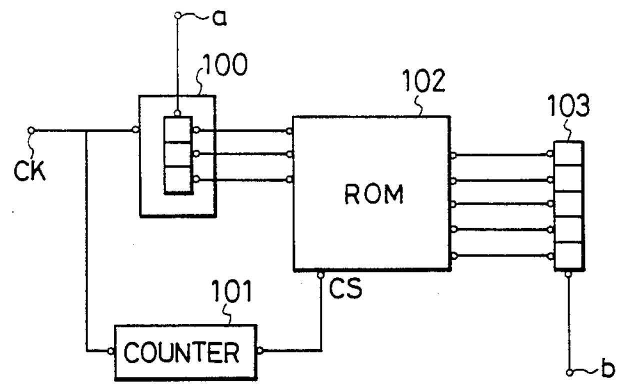
FIG. 18 is an arrangement block diagram of the conversion from 3 bits to 5 bits.

FIG. 18 is an arrangement block diagram for encoding of the present invention.

In the diagram, a data sequence is inputted from a . This data sequence is inputted to the 3-bit shift register 100. CK is the input terminal of the clock to drive the shift register 100. This clock signal is also simultaneously inputted to the counter 101. The counter 101 generates a pulse whenever the three clocks are counted and this pulse is inputted to the chip selecting (CS) terminal.

When the pulse is inputted to the chip selecting (CS) terminal, the data in the shift register 100 is taken in the ROM 102, so that the address in the ROM corresponding to the data is designated. Eight 5-bit codes which were arbitrarily selected from Table 19 are stored in the 0th to 7th addresses in the ROM. When the address in the ROM corresponding to the data is designated, the 5-bit code stored in that address is inputted to the shift register 103 and is outputted from the code output terminal b .

In this way, the conversion from the data to the code, namely, the encoding is finished. Upon the foregoing encoding or the like, a CPU (not shown) may control the registers or the like. In addition, the conversion from the code to the data which is performed on the reproducing side, namely, the decoding may be attained by performing the conversion opposite to the foregoing conversion for encoding.

As described above, the 5-bit codes shown in Table 19 are the codes which were restricted such that the minimum number of bits "0" which exist between the adjacent bits "1" is zero and the maximum number is one. There is an effect such that this limitation is not broken even by coupling the 5-bit codes.

Therefore, $$T_{min}=0.6T$$

$$T_{max}=1.2T$$

$$T_W=0.6T$$

Consequently, the present system has effects such that: The $T_{min}$ and $T_W$ are larger and the decoding error rate is smaller than those in the conventional FM system; the low frequency component of the recording waveform is few; and the synchronization can be more easily obtained as compared with the MFM or 3PM system. Therefore, it is possible to provide a data processing system in which the recording and/or reproduction can be performed with a high density and a high degree of accuracy.

[4→7]

Next, the case of converting the four-bit data of the binary data sequence to the code consisting of seven bits will be described.

In case of converting the 4-bit data to the 7-bit code, when k=1, codes which were arbitrarily selected from the 7-bit codes shown in Table 20 may be made coordinate with the $2^4=16$ data.

TABLE 20

| NUMBER | 7-BIT CODE |
|---|---|
| 1 | 1010101 |
| 2 | 1010111 |
| 3 | 1011011 |
| 4 | 1011101 |
| 5 | 1011111 |
| 6 | 1101011 |
| 7 | 1101101 |
| 8 | 1101111 |
| 9 | 1110101 |
| 10 | 1110111 |
| 11 | 1111011 |
| 12 | 1111101 |
| 13 | 1111111 |
| 14 | 1010110 |
| 15 | 1011010 |
| 16 | 1011110 |
| 17 | 1101010 |
| 18 | 1101110 |
| 19 | 1110110 |
| 20 | 1111010 |
| 21 | 1111110 |

Figure 19:
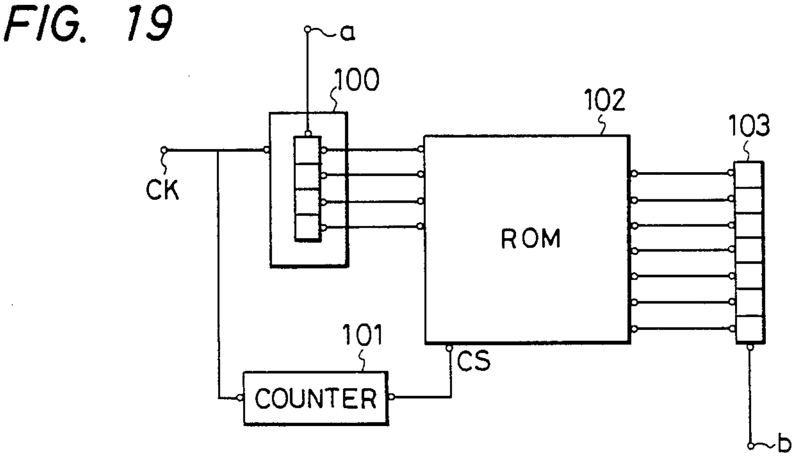
FIG. 19 is an arrangement block diagram of the conversion from 4 bits to 7 bits.

FIG. 19 is an arrangement block diagram for encoding of the present invention. In FIG. 19, a data sequence is inputted from ⓐ. This data sequence is inputted to the 4-bit register 100. CK is the input terminal of the clock to drive the shift register 100. This clock signal is also simultaneously inputted to the counter 101. The counter 101 generates a pulse whenever four clocks are counted and this pulse is inputted to the chip selecting (CS) terminal. When the pulse is inputted to the chip selecting (CS) terminal, the data in the shift register 100 is taken in the ROM 102, so that the address in the ROM corresponding to the data is designated. Sixteen 7-bit codes which were arbitrarily selected from Table 20 are stored in the 0th to 15th addresses in the ROM. When the address in the ROM corresponding to the data is designated, the 7-bit code stored in that address is inputted t the shift register 103 and is outputted from the code output terminal ⓑ.

In this way, the conversion from the data to the code, namely, the encoding is finished.

The conversion from the code to the data which is performed on the reproducing side, namely, the decoding may be attained by performing the conversion opposite to the foregoing conversion for encoding.

As described above, the 7-bit codes shown in Table 20 are the codes which are restricted such that the minimum number of bits "0" which exist between the adjacent bits "1" is zero and the maximum number is one. There is an effect such that this limitation is not broken even by coupling the 7-bit codes.

Therefore, $$T_{min}=0.57T$$

$$T_{max}=1.47T$$

$$T_W=0.57T$$

Consequently, the present system has effects such that: the $T_{min}$ and $T_W$ are larger and the decoding error rate is smaller than those in the conventional FM system; the low frequency component of the recording waveform is few; and the synchronization can be more easily obtained as compared with the MFM or 3PM system. Therefore, it is possible to provide an electronic apparatus in which the recording and/or reproduction can be performed with a high density and a high degree of accuracy.

Figure 20:
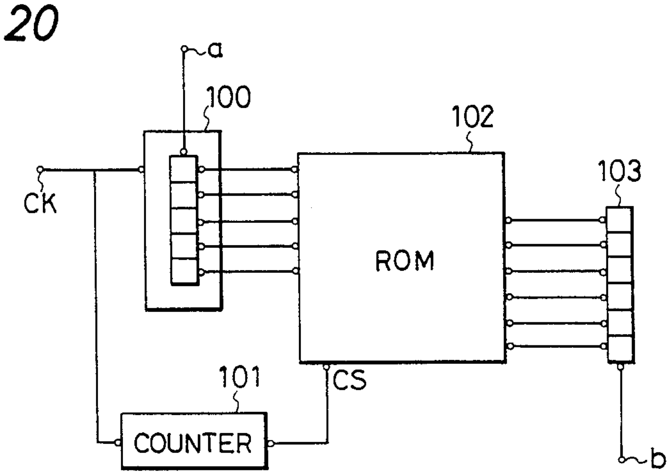
FIG. 20 is an arrangement block diagram of the conversion from 5 bits to 6 bits.

FIG. 20 is an arrangement block diagram for encoding of the present invention. In FIG. 20, a data sequence is inputted from ⓐ. This data sequence is inputted to the 5-bit shift register 100. CK is the input terminal of the clock to drive the shift register 100. This clock signal is also simultaneously inputted to the counter 101. The counter 101 generates a pulse whenever five clocks are counted and this pulse is inputted to the chip selecting (CS) terminal. When the pulse is inputted to the chip selecting (CS) terminal, the data in the shift register 100 is taken in the ROM 102, so that the address in the ROM corresponding to the data is designated. Thirty-two 6-bit codes which are arbitrarily selected from Table 21 are stored in the 0th to 31st addresses in the ROM. When the address in the ROM corresponding to the data is designated, the 6-bit code stored in that address is inputted to the shift register 103 and is outputted from the code output terminal b.

In this way, the conversion from the data to the code, namely, the encoding is finished.

The conversion from the code to the data which is performed on the reproducing side, namely, the decoding may be attained by performing the conversion opposite to the foregoing conversion for encoding.

As described above, the 6-bit codes shown in Table 21 are the codes which are restricted such that the minimum number of bits "0" which exist between the adjacent bits "1" is zero and the maximum number is three. There is an effect such that this limitation is not broken even by coupling the 6-bit codes.

Therefore, $$T_{min}=0.83T$$

$$T_{max}=3.33T$$

$$T_W=0.83T$$

Consequently, the present system has effects such that: the $T_{min}$ and $T_W$ are larger and the decoding error rate is smaller than those in the conventional FM system; the low frequency component of the recording waveform is few; and the synchronization can be more easily obtained as compared with the MFM or 3PM system. Therefore, it is possible to provide an electronic apparatus in which the recording and/or reproduction can be performed with a high density and a high degree of accuracy.

[5→6]

In case of converting the 5-bit data to the 6-bit code, for instance, when k=3, thirty-two codes which are arbitrarily selected from the 41 6-bit codes as shown in Table 21 may be made coordinate with the $2^5=32$ 5-bit data.

TABLE 21

| Number | 5-BIT CODE |
|---|---|
| 1 | 1 0 0 0 1 1 |
| 2 | 1 0 0 1 0 1 |
| 3 | 1 0 0 1 1 1 |
| 4 | 1 0 1 0 0 1 |
| 5 | 1 0 1 0 1 1 |
| 6 | 1 0 1 1 0 1 |
| 7 | 1 0 1 1 1 1 |
| 8 | 1 1 0 0 0 1 |
| 9 | 1 1 0 0 1 1 |
| 10 | 1 1 0 1 0 1 |
| 11 | 1 1 0 1 1 1 |
| 12 | 1 1 1 0 0 1 |
| 13 | 1 1 1 0 1 1 |
| 14 | 1 1 1 1 0 1 |
| 15 | 1 1 1 1 1 1 |
| 16 | 1 0 0 0 1 0 |
| 17 | 1 0 0 1 1 0 |
| 18 | 1 0 1 0 1 0 |
| 19 | 1 0 1 1 1 0 |
| 20 | 1 1 0 0 1 0 |
| 21 | 1 1 0 1 1 0 |
| 22 | 1 1 1 0 1 0 |
| 23 | 1 1 1 1 1 0 |
| 24 | 1 0 0 1 0 0 |
| 25 | 1 0 1 1 0 0 |
| 26 | 1 1 0 1 0 0 |
| 27 | 1 1 1 1 0 0 |
| 28 | 0 1 0 0 0 1 |
| 29 | 0 1 0 0 1 1 |
| 30 | 0 1 0 1 0 1 |
| 31 | 0 1 0 1 1 1 |
| 32 | 0 1 1 0 0 1 |
| 33 | 0 1 1 0 1 1 |
| 34 | 0 1 1 1 0 1 |
| 35 | 0 1 1 1 1 1 |
| 36 | 0 1 0 0 1 0 |
| 37 | 0 1 0 1 1 0 |
| 38 | 0 1 1 0 1 0 |
| 39 | 0 1 1 1 1 0 |
| 40 | 0 1 0 1 0 0 |
| 41 | 0 1 1 1 0 0 |

[5→7]

In case of converting the 5-bit data to the 7-bit code, for instance, when k=2, thirty-two 7-bit codes which are arbitrarily selected from the 7-bit codes shown in Table 22 or 23 may be made coordinate with the $2^5=32$ 5-bit data.

TABLE 22

| Number | 7-BIT CODE |
|---|---|
| 1 | 1 0 0 1 0 0 1 |
| 2 | 1 0 0 1 0 1 1 |
| 3 | 1 0 0 1 1 0 1 |
| 4 | 1 0 0 1 1 1 1 |
| 5 | 1 0 1 0 0 1 1 |
| 6 | 1 0 1 0 1 0 1 |
| 7 | 1 0 1 0 1 1 1 |
| 8 | 1 0 1 1 0 0 1 |
| 9 | 1 0 1 1 0 1 1 |
| 10 | 1 0 1 1 1 0 1 |
| 11 | 1 0 1 1 1 1 1 |
| 12 | 1 1 0 0 1 0 1 |
| 13 | 1 1 0 0 1 1 1 |
| 14 | 1 1 0 1 0 0 1 |
| 15 | 1 1 0 1 0 1 1 |
| 16 | 1 1 0 1 1 0 1 |
| 17 | 1 1 0 1 1 1 1 |
| 18 | 1 1 1 0 0 1 1 |
| 19 | 1 1 1 0 1 0 1 |
| 20 | 1 1 1 0 1 1 1 |
| 21 | 1 1 1 1 0 0 1 |
| 22 | 1 1 1 1 0 1 1 |
| 23 | 1 1 1 1 1 0 1 |
| 24 | 1 1 1 1 1 1 1 |
| 25 | 1 0 0 1 0 1 0 |
| 26 | 1 0 0 1 1 1 0 |
| 27 | 1 0 1 0 0 1 0 |

TABLE 22-continued

| Number | 7-BIT CODE |
|---|---|
| 28 | 1010110 |
| 29 | 1011010 |
| 30 | 1011110 |
| 31 | 1100110 |
| 32 | 1101010 |
| 33 | 1101110 |
| 34 | 1110010 |
| 35 | 1110110 |
| 36 | 1111010 |
| 37 | 1111110 |
| 38 | 1001100 |
| 39 | 1010100 |
| 40 | 1011100 |
| 41 | 1100100 |
| 42 | 1101100 |
| 43 | 1110100 |
| 44 | 1111100 |

TABLE 23

| Number | 7-BIT CODE |
|---|---|
| 1 | 1001001 |
| 2 | 1001011 |
| 3 | 1001101 |
| 4 | 1001111 |
| 5 | 1010011 |
| 6 | 1010101 |
| 7 | 1010111 |
| 8 | 1011001 |
| 9 | 1011011 |
| 10 | 1011101 |
| 11 | 1011111 |
| 12 | 1100101 |
| 13 | 1100111 |
| 14 | 1101001 |
| 15 | 1101011 |
| 16 | 1101101 |
| 17 | 1101111 |
| 18 | 1110011 |
| 19 | 1110101 |
| 20 | 1110111 |
| 21 | 1111001 |
| 22 | 1111011 |
| 23 | 1111101 |
| 24 | 1111111 |
| 25 | 1001010 |
| 26 | 1001110 |
| 27 | 1010010 |
| 28 | 1010110 |
| 29 | 1011010 |
| 30 | 1011110 |
| 31 | 1100110 |
| 32 | 1101010 |
| 33 | 1101110 |
| 34 | 1110010 |
| 35 | 1110110 |
| 36 | 1111010 |
| 37 | 1111110 |
| 38 | 0100101 |
| 39 | 0100111 |
| 40 | 0101001 |
| 41 | 0101011 |
| 42 | 0101101 |
| 43 | 0101111 |
| 44 | 0110011 |
| 45 | 0110101 |
| 46 | 0110111 |
| 47 | 0111001 |
| 48 | 0111011 |
| 49 | 0111101 |
| 50 | 0111111 |
| 51 | 0100110 |
| 52 | 0101010 |
| 53 | 0101110 |
| 54 | 0110010 |
| 55 | 0110110 |
| 56 | 0111010 |
| 57 | 0111110 |

Figure 21:
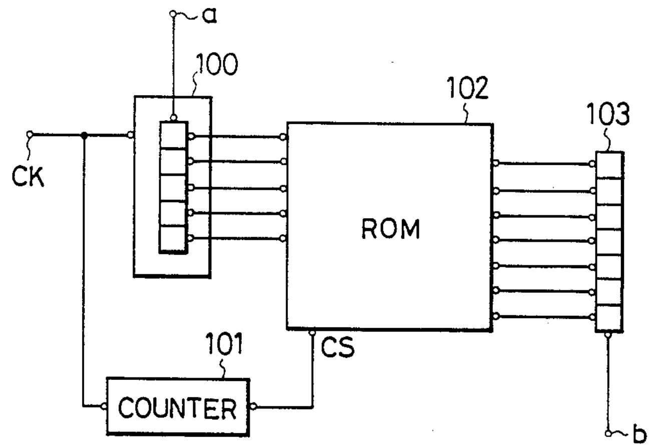
FIG. 21 is an arrangement block diagram of the conversion from 5 bits to 7 bits.

FIG. 21 is an arrangement block diagram for encoding of the present invention. In FIG. 21, a data sequence is inputted from ⓐ. This data sequence is inputted to the 5-bit shift register 100, CK is the input terminal of the clock to drive the shift register 100. This clock signal is also simultaneously inputted to the counter 101. The counter 101 generates a pulse whenever five clocks are counted and this pulse is inputted to the chip selecting (CS) terminal. When the pulse is inputted to the chip selecting (CS) terminal, the data in the shift register 103 is taken in the ROM 102, so that the address in the ROM corresponding to the data is designated. Thirty-two 7-bit codes which were arbitrarily selected from Table 22 or 23 are stored in the 0th to 31st addresses in the ROM. When the address in the ROM corresponding to the data is designated, the 7-bit code stored in that address is inputted to the shift register 103 and is outputted from the code output terminal ⓑ.

In this way, the conversion from the data to the code, namely, the encoding is finished.

The conversion from the code to the data which is performed on the reproducing side, namely, the decoding may be attained by performing the conversion opposite to the foregoing conversion for encoding.

As described above, the 7-bit codes shown in Tables 22 and 23 are the codes which are restricted such that the minimum number of bits "0" which exist between the adjacent bits "1" is zero and the maximum number is two. There is an effect such that this limitation is not broken even by coupling the 7-bit codes.

Therefore, $$T_{min}=0.71T$$

$$T_{max}=2.14T$$

$$T_W=0.71T$$

Consequently, the present system has effects such that: the $T_{min}$ and $T_W$ are larger and the decoding error rate is smaller than those in the conventional FM system; the low frequency component of the recording waveform is few; and the synchronization can be more easily obtained as compared with the MFM or 3PM system. Therefore, it is possible to provide an electronic apparatus in which the recording and/or reproduction can be performed with a high density and a high degree of accuracy.

[6→7]

In case of converting the 6-bit data to the 7-bit code, when k=3, sixty-four 7-bit codes which are arbitrarily selected from the 7-bit codes shown in Table 24 may be made to coordinate with the $2^6=64$ 6-bit data.

TABLE 24

| Number | 7-BIT CODE |
|---|---|
| 1 | 1000101 |
| 2 | 1000111 |
| 3 | 1001001 |
| 4 | 1001011 |
| 5 | 1001101 |
| 6 | 1001111 |
| 7 | 1010001 |
| 8 | 1010011 |
| 9 | 1010101 |
| 10 | 1010111 |
| 11 | 1011001 |
| 12 | 1011011 |
| 13 | 1011101 |
| 14 | 1011111 |
| 15 | 1100011 |

TABLE 24-continued

| Number | 7-BIT CODE |
|---|---|
| 16 | 1 1 0 0 1 0 1 |
| 17 | 1 1 0 0 1 1 1 |
| 18 | 1 1 0 1 0 0 1 |
| 19 | 1 1 0 1 0 1 1 |
| 20 | 1 1 0 1 1 0 1 |
| 21 | 1 1 0 1 1 1 1 |
| 22 | 1 1 1 0 0 0 1 |
| 23 | 1 1 1 0 0 1 1 |
| 24 | 1 1 1 0 1 0 1 |
| 25 | 1 1 1 0 1 1 1 |
| 26 | 1 1 1 1 0 0 1 |
| 27 | 1 1 1 1 0 1 1 |
| 28 | 1 1 1 1 1 0 1 |
| 29 | 1 1 1 1 1 1 1 |
| 30 | 1 0 0 0 1 1 0 |
| 31 | 1 0 0 1 0 1 0 |
| 32 | 1 0 0 1 1 1 0 |
| 33 | 1 0 1 0 0 1 0 |
| 34 | 1 0 1 0 1 1 0 |
| 35 | 1 0 1 1 0 1 0 |
| 36 | 1 0 1 1 1 1 0 |
| 37 | 1 1 0 0 0 1 0 |
| 38 | 1 1 0 0 1 1 0 |
| 39 | 1 1 0 1 0 1 0 |
| 40 | 1 1 0 1 1 1 0 |
| 41 | 1 1 1 0 0 1 0 |
| 42 | 1 1 1 0 1 1 0 |
| 43 | 1 1 1 1 0 1 0 |
| 44 | 1 1 1 1 1 1 0 |
| 45 | 1 0 0 0 1 0 0 |
| 46 | 1 0 0 1 1 0 0 |
| 47 | 1 0 1 0 1 0 0 |
| 48 | 1 0 1 1 1 0 0 |
| 49 | 1 1 0 0 1 0 0 |
| 50 | 1 1 0 1 1 0 0 |
| 51 | 1 1 1 0 1 0 0 |
| 52 | 1 1 1 1 1 0 0 |
| 53 | 0 1 0 0 0 1 1 |
| 54 | 0 1 0 0 1 0 1 |
| 55 | 0 1 0 0 1 1 1 |
| 56 | 0 1 0 1 0 0 1 |
| 57 | 0 1 0 1 0 1 1 |
| 58 | 0 1 0 1 1 0 1 |
| 59 | 0 1 0 1 1 1 1 |
| 60 | 0 1 1 0 0 0 1 |
| 61 | 0 1 1 0 0 1 1 |
| 62 | 0 1 1 0 1 0 1 |
| 63 | 0 1 1 0 1 1 1 |
| 64 | 0 1 1 1 0 0 1 |
| 65 | 0 1 1 1 0 1 1 |
| 66 | 0 1 1 1 1 0 1 |
| 67 | 0 1 1 1 1 1 1 |
| 68 | 0 1 0 0 0 1 0 |
| 69 | 0 1 0 0 1 1 0 |
| 70 | 0 1 0 1 0 1 0 |
| 71 | 0 1 0 1 1 1 0 |
| 72 | 0 1 1 0 0 1 0 |
| 73 | 0 1 1 0 1 1 0 |
| 74 | 0 1 1 1 0 1 0 |
| 75 | 0 1 1 1 1 1 0 |
| 76 | 0 1 0 0 1 0 0 |
| 77 | 0 1 0 1 1 0 0 |
| 78 | 0 1 1 0 1 0 0 |
| 79 | 0 1 1 1 1 0 0 |

Figure 22:
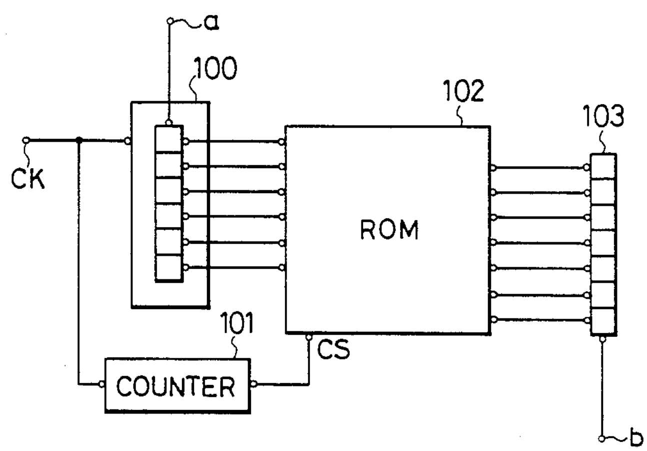
FIG. 22 is an arrangement block diagram of the conversion from 6 bits to 7 bits.

FIG. 22 is an arrangement block diagram for encoding of the present invention.

In FIG. 22, a data sequence is inputted from ⓐ. This data sequence is inputted to the 6-bit shift register 100. CK is the input terminal of the clock to drive the shift register 100. This clock signal is also simultaneously inputted to the counter 101. The counter 101 generates a pulse whenever six clocks are counted and this pulse is inputted to the chip selecting (CS) terminal.

When the pulse is inputted to the chip selecting (CS) terminal, the data in the shift register 100 is taken in the ROM 102, so that the address in the ROM corresponding to the data is designated. Sixty-four 7-bit codes which were arbitrarily selected from Table 24 are stored in the 0th to 63rd addresses in the ROM. When the address in the ROM corresponding to the data is designated, the 7-bit code stored in that address is inputted to the shift register 103 and is outputted from the code output terminal ⓑ.

In this way, the conversion from the data to the code, namely, the encoding is finished.

The conversion from the code to the data which is performed on the reproducing side, namely, the decoding may be attained by performing the conversion opposite to the foregoing conversion for encoding.

As described above, the 7-bit codes shown in Table 24 are the codes which are restricted such that the minimum number of bits "0" which exist between the adjacent bits "1" is zero and the maximum number is three. There is an effect such that this limitation is not broken even by coupling the 7-bit codes.

Therefore, $$T_{min}=0.86T$$

$$T_{max}=3.43T$$

$$T_W=0.86T$$

Consequently, the present system has effects such that: the $T_{min}$ and $T_W$ are larger and the decoding error rate is smaller than those in the conventional FM system; the low frequency component of the recording waveform is few; and the synchronization can be more easily obtained as compared with the MFM or 3PM system. Therefore, it is possible to provide an electronic apparatus in which the recording and/or reproduction can be performed with a high density and a high degree of accuracy.

[6→8]

In case of converting the 6-bit data to the 8-bit code, when k=2, sixty-four 8-bit codes which are arbitrarily selected from the 8-bit codes shown in Table 25 or 26 may be made coordinate with the $2^6=64$ 6-bit data.

TABLE 25

| Number | 8-BIT CODE |
|---|---|
| 1 | 1 0 0 1 0 0 1 1 |
| 2 | 1 0 0 1 0 1 0 1 |
| 3 | 1 0 0 1 0 1 1 1 |
| 4 | 1 0 0 1 1 0 0 1 |
| 5 | 1 0 0 1 1 0 1 1 |
| 6 | 1 0 0 1 1 1 0 1 |
| 7 | 1 0 0 1 1 1 1 1 |
| 8 | 1 0 1 0 0 1 0 1 |
| 9 | 1 0 1 0 0 1 1 1 |
| 10 | 1 0 1 0 1 0 0 1 |
| 11 | 1 0 1 0 1 0 1 1 |
| 12 | 1 0 1 0 1 1 0 1 |
| 13 | 1 0 1 0 1 1 1 1 |
| 14 | 1 0 1 1 0 0 1 1 |
| 15 | 1 0 1 1 0 1 0 1 |
| 16 | 1 0 1 1 0 1 1 1 |
| 17 | 1 0 1 1 1 0 0 1 |
| 18 | 1 0 1 1 1 0 1 1 |
| 19 | 1 0 1 1 1 1 0 1 |
| 20 | 1 0 1 1 1 1 1 1 |
| 21 | 1 1 0 0 1 0 0 1 |
| 22 | 1 1 0 0 1 0 1 1 |
| 23 | 1 1 0 0 1 1 0 1 |
| 24 | 1 1 0 0 1 1 1 1 |
| 25 | 1 1 0 1 0 0 1 1 |
| 26 | 1 1 0 1 0 1 0 1 |
| 27 | 1 1 0 1 0 1 1 1 |
| 28 | 1 1 0 1 1 0 0 1 |
| 29 | 1 1 0 1 1 0 1 1 |

TABLE 25-continued

| Number | 8-BIT CODE |
|---|---|
| 30 | 1 1 0 1 1 1 0 1 |
| 31 | 1 1 0 1 1 1 1 1 |
| 32 | 1 1 1 0 0 1 0 1 |
| 33 | 1 1 1 0 0 1 1 1 |
| 34 | 1 1 1 0 1 0 0 1 |
| 35 | 1 1 1 0 1 0 1 1 |
| 36 | 1 1 1 0 1 1 0 1 |
| 37 | 1 1 1 0 1 1 1 1 |
| 38 | 1 1 1 1 0 0 1 1 |
| 39 | 1 1 1 1 0 1 0 1 |
| 40 | 1 1 1 1 0 1 1 1 |
| 41 | 1 1 1 1 1 0 0 1 |
| 42 | 1 1 1 1 1 0 1 1 |
| 43 | 1 1 1 1 1 1 0 1 |
| 44 | 1 1 1 1 1 1 1 1 |
| 45 | 1 0 0 1 0 0 1 0 |
| 46 | 1 0 0 1 0 1 1 0 |
| 47 | 1 0 0 1 1 0 1 0 |
| 48 | 1 0 0 1 1 1 1 0 |
| 49 | 1 0 1 0 0 1 1 0 |
| 50 | 1 0 1 0 1 0 1 0 |
| 51 | 1 0 1 0 1 1 1 0 |
| 52 | 1 0 1 1 0 0 1 0 |
| 53 | 1 0 1 1 0 1 1 0 |
| 54 | 1 0 1 1 1 0 1 0 |
| 55 | 1 0 1 1 1 1 1 0 |
| 56 | 1 1 0 0 1 0 1 0 |
| 57 | 1 1 0 0 1 1 1 0 |
| 58 | 1 1 0 1 0 0 1 0 |
| 59 | 1 1 0 1 0 1 1 0 |
| 60 | 1 1 0 1 1 0 1 0 |
| 61 | 1 1 0 1 1 1 1 0 |
| 62 | 1 1 1 0 0 1 1 0 |
| 63 | 1 1 1 0 1 0 1 0 |
| 64 | 1 1 1 0 1 1 1 0 |
| 65 | 1 1 1 1 0 0 1 0 |
| 66 | 1 1 1 1 0 1 1 0 |
| 67 | 1 1 1 1 1 0 1 0 |
| 68 | 1 1 1 1 1 1 1 0 |
| 69 | 1 0 0 1 0 1 0 0 |
| 70 | 1 0 0 1 1 1 0 0 |
| 71 | 1 0 1 0 0 1 0 0 |
| 72 | 1 0 1 0 1 1 0 0 |
| 73 | 1 0 1 1 0 1 0 0 |
| 74 | 1 0 1 1 1 1 0 0 |
| 75 | 1 1 0 0 1 1 0 0 |
| 76 | 1 1 0 1 0 1 0 0 |
| 77 | 1 1 0 1 1 1 0 0 |
| 78 | 1 1 1 0 0 1 0 0 |
| 79 | 1 1 1 0 1 1 0 0 |
| 80 | 1 1 1 1 0 1 0 0 |
| 81 | 1 1 1 1 1 1 0 0 |

TABLE 26

| Number | 8-BIT CODE |
|---|---|
| 1 | 1 0 0 1 0 0 1 1 |
| 2 | 1 0 0 1 0 1 0 1 |
| 3 | 1 0 0 1 0 1 1 1 |
| 4 | 1 0 0 1 1 0 0 1 |
| 5 | 1 0 0 1 1 0 1 1 |
| 6 | 1 0 0 1 1 1 0 1 |
| 7 | 1 0 0 1 1 1 1 1 |
| 8 | 1 0 1 0 0 1 0 1 |
| 9 | 1 0 1 0 0 1 1 1 |
| 10 | 1 0 1 0 1 0 0 1 |
| 11 | 1 0 1 0 1 0 1 1 |
| 12 | 1 0 1 0 1 1 0 1 |
| 13 | 1 0 1 0 1 1 1 1 |
| 14 | 1 0 1 1 0 0 1 1 |
| 15 | 1 0 1 1 0 1 0 1 |
| 16 | 1 0 1 1 0 1 1 1 |
| 17 | 1 0 1 1 1 0 0 1 |
| 18 | 1 0 1 1 1 0 1 1 |
| 19 | 1 0 1 1 1 1 0 1 |
| 20 | 1 0 1 1 1 1 1 1 |
| 21 | 1 1 0 0 1 0 0 1 |
| 22 | 1 1 0 0 1 0 1 1 |
| 23 | 1 1 0 0 1 1 0 1 |
| 24 | 1 1 0 0 1 1 1 1 |
| 25 | 1 1 0 1 0 0 1 1 |
| 26 | 1 1 0 1 0 1 0 1 |
| 27 | 1 1 0 1 0 1 1 1 |
| 28 | 1 1 0 1 1 0 0 1 |
| 29 | 1 1 0 1 1 0 1 1 |
| 30 | 1 1 0 1 1 1 0 1 |
| 31 | 1 1 0 1 1 1 1 1 |
| 32 | 1 1 1 0 0 1 0 1 |
| 33 | 1 1 1 0 0 1 1 1 |
| 34 | 1 1 1 0 1 0 0 1 |
| 35 | 1 1 1 0 1 0 1 1 |
| 36 | 1 1 1 0 1 1 0 1 |
| 37 | 1 1 1 0 1 1 1 1 |
| 38 | 1 1 1 1 0 0 1 1 |
| 39 | 1 1 1 1 0 1 0 1 |
| 40 | 1 1 1 1 0 1 1 1 |
| 41 | 1 1 1 1 1 0 0 1 |
| 42 | 1 1 1 1 1 0 1 1 |
| 43 | 1 1 1 1 1 1 0 1 |
| 44 | 1 1 1 1 1 1 1 1 |
| 45 | 1 0 0 1 0 0 1 0 |
| 46 | 1 0 0 1 0 1 1 0 |
| 47 | 1 0 0 1 1 0 1 0 |
| 48 | 1 0 0 1 1 1 1 0 |
| 49 | 1 0 1 0 0 1 1 0 |
| 50 | 1 0 1 0 1 0 1 0 |
| 51 | 1 0 1 0 1 1 1 0 |
| 52 | 1 0 1 1 0 0 1 0 |
| 53 | 1 0 1 1 0 1 1 0 |
| 54 | 1 0 1 1 1 0 1 0 |
| 55 | 1 0 1 1 1 1 1 0 |
| 56 | 1 1 0 0 1 0 1 0 |
| 57 | 1 1 0 0 1 1 1 0 |
| 58 | 1 1 0 1 0 0 1 0 |
| 59 | 1 1 0 1 0 1 1 0 |
| 60 | 1 1 0 1 1 0 1 0 |
| 61 | 1 1 0 1 1 1 1 0 |
| 62 | 1 1 1 0 0 1 1 0 |
| 63 | 1 1 1 0 1 0 1 0 |
| 64 | 1 1 1 0 1 1 1 0 |
| 65 | 1 1 1 1 0 0 1 0 |
| 66 | 1 1 1 1 0 1 1 0 |
| 67 | 1 1 1 1 1 0 1 0 |
| 68 | 1 1 1 1 1 1 1 0 |
| 69 | 0 1 0 0 1 0 0 1 |
| 70 | 0 1 0 0 1 0 1 1 |
| 71 | 0 1 0 0 1 1 0 1 |
| 72 | 0 1 0 0 1 1 1 1 |
| 73 | 0 1 0 1 0 0 1 1 |
| 74 | 0 1 0 1 0 1 0 1 |
| 75 | 0 1 0 1 0 1 1 1 |
| 76 | 0 1 0 1 1 0 0 1 |
| 77 | 0 1 0 1 1 0 1 1 |
| 78 | 0 1 0 1 1 1 0 1 |
| 79 | 0 1 0 1 1 1 1 1 |
| 80 | 0 1 1 0 0 1 0 1 |
| 81 | 0 1 1 0 0 1 1 1 |
| 82 | 0 1 1 0 1 0 0 1 |
| 83 | 0 1 1 0 1 0 1 1 |
| 84 | 0 1 1 0 1 1 0 1 |
| 85 | 0 1 1 0 1 1 1 1 |
| 86 | 0 1 1 1 0 0 1 1 |
| 87 | 0 1 1 1 0 1 0 1 |
| 88 | 0 1 1 1 0 1 1 1 |
| 89 | 0 1 1 1 1 0 0 1 |
| 90 | 0 1 1 1 1 0 1 1 |
| 91 | 0 1 1 1 1 1 0 1 |
| 92 | 0 1 1 1 1 1 1 1 |
| 93 | 0 1 0 0 1 0 1 0 |
| 94 | 0 1 0 0 1 1 1 0 |
| 95 | 0 1 0 1 0 0 1 0 |
| 96 | 0 1 0 1 0 1 1 0 |
| 97 | 0 1 0 1 1 0 1 0 |
| 98 | 0 1 0 1 1 1 1 0 |
| 99 | 0 1 1 0 0 1 1 0 |
| 100 | 0 1 1 0 1 0 1 0 |
| 101 | 0 1 1 0 1 1 1 0 |
| 102 | 0 1 1 1 0 0 1 0 |
| 103 | 0 1 1 1 0 1 1 0 |
| 104 | 0 1 1 1 1 0 1 0 |

TABLE 26-continued

| Number | 8-BIT CODE |
|---|---|
| 105 | 0 1 1 1 1 1 1 0 |

Figure 23:
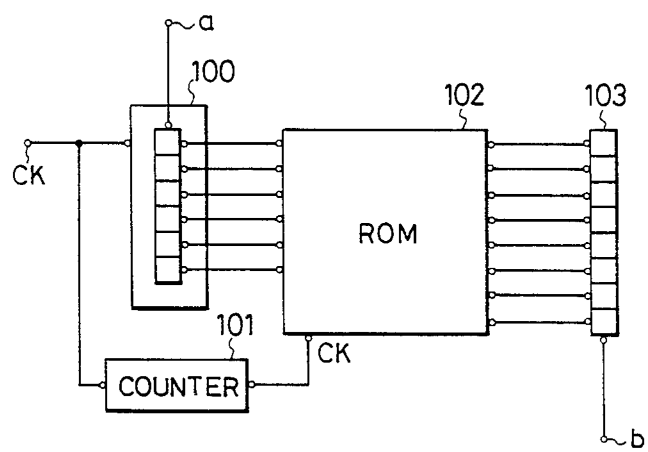
FIG. 23 is an arrangement block diagram of the conversion from 6 bits to 8 bits.

FIG. 23 is an arrangement block diagram for encoding of the present invention. In FIG. 23, a data sequence is inputted from ⓐ. This data sequence is inputted to the 6-bit shift register 100. CK is the input terminal of the clock to drive the shift register 100. This clock signal is also simultaneously inputted to the counter 101. The counter 101 generates a pulse whenever six clocks are counted and this pulse is inputted to the chip selecting (CS) terminal.

When the pulse is inputted to the chip selecting (CS) terminal, the data in the shift register 100 is taken in the ROM 102, so that the address in the ROM corresponding to the data is designated. Thirty-two 8-bit codes which were arbitrarily selected from Table 25 or 26 are stored in the 0th to 63rd addresses in the ROM. When the address in the ROM corresponding to the data is designated, the 8-bit code stored in that address is inputted to the shift register 103 and is outputted from the code output terminal ⓑ.

In this way, the conversion from the data to the code, namely, the encoding is finished.

The conversion from the code to the data which is performed on the reproducing side, namely, the decoding may be attained by performing the conversion opposite to the foregoing conversion for encoding.

As described above, the 8-bit codes shown in Tables 25 and 26 are the codes which are restricted such that the minimum number of bits "0" which exist between the adjacent bits "1" is zero and the maximum number is two. There is an effect such that this limitation is not broken even by coupling the 8-bit codes.

Therefore, $$T_{min}=0.75T$$

$$T_{max}=2.25T$$

$$T_W=0.75T$$

Consequently, the present system has effects such that: the $T_{min}$ and $T_W$ are larger and the decoding error rate is smaller than those in the conventional FM system; the low frequency component of the recording waveform is few; and the synchronization can be more easily obtained as compared with the MFM or 3PM system. Therefore, it is possible to provide an electronic apparatus in which the recording and/or reproduction can be performed with a high density and a high degree of accuracy.

[7→8]

In case of converting the 7-bit data to the 8-bit code, when k=3, 128 8-bit codes which are arbitrarily selected from the 8-bit codes shown in Table 27 may be made coordinate with the $2^7=128$ data.

TABLE 27

| Number | 8-BIT CODE |
|---|---|
| 1 | 1 0 0 0 1 0 0 1 |
| 2 | 1 0 0 0 1 0 1 1 |
| 3 | 1 0 0 0 1 1 0 1 |
| 4 | 1 0 0 0 1 1 1 1 |
| 5 | 1 0 0 1 0 0 0 1 |
| 6 | 1 0 0 1 0 0 1 1 |
| 7 | 1 0 0 1 0 1 0 1 |

TABLE 27-continued

| Number | 8-BIT CODE |
|---|---|
| 8 | 1 0 0 1 0 1 1 1 |
| 9 | 1 0 0 1 1 0 0 1 |
| 10 | 1 0 0 1 1 0 1 1 |
| 11 | 1 0 0 1 1 1 0 1 |
| 12 | 1 0 0 1 1 1 1 1 |
| 13 | 1 0 1 0 0 0 1 1 |
| 14 | 1 0 1 0 0 1 0 1 |
| 15 | 1 0 1 0 0 1 1 1 |
| 16 | 1 0 1 0 1 0 0 1 |
| 17 | 1 0 1 0 1 0 1 1 |
| 18 | 1 0 1 0 1 1 0 1 |
| 19 | 1 0 1 0 1 1 1 1 |
| 20 | 1 0 1 1 0 0 0 1 |
| 21 | 1 0 1 1 0 0 1 1 |
| 22 | 1 0 1 1 0 1 0 1 |
| 23 | 1 0 1 1 0 1 1 1 |
| 24 | 1 0 1 1 1 0 0 1 |
| 25 | 1 0 1 1 1 0 1 1 |
| 26 | 1 0 1 1 1 1 0 1 |
| 27 | 1 0 1 1 1 1 1 1 |
| 28 | 1 1 0 0 0 1 0 1 |
| 29 | 1 1 0 0 0 1 1 1 |
| 30 | 1 1 0 0 1 0 0 1 |
| 31 | 1 1 0 0 1 0 1 1 |
| 32 | 1 1 0 0 1 1 0 1 |
| 33 | 1 1 0 0 1 1 1 1 |
| 34 | 1 1 0 1 0 0 0 1 |
| 35 | 1 1 0 1 0 0 1 1 |
| 36 | 1 1 0 1 0 1 0 1 |
| 37 | 1 1 0 1 0 1 1 1 |
| 38 | 1 1 0 1 1 0 0 1 |
| 39 | 1 1 0 1 1 0 1 1 |
| 40 | 1 1 0 1 1 1 0 1 |
| 41 | 1 1 0 1 1 1 1 1 |
| 42 | 1 1 1 0 0 0 1 1 |
| 43 | 1 1 1 0 0 1 0 1 |
| 44 | 1 1 1 0 0 1 1 1 |
| 45 | 1 1 1 0 1 0 0 1 |
| 46 | 1 1 1 0 1 0 1 1 |
| 47 | 1 1 1 0 1 1 0 1 |
| 48 | 1 1 1 0 1 1 1 1 |
| 49 | 1 1 1 1 0 0 0 1 |
| 50 | 1 1 1 1 0 0 1 1 |
| 51 | 1 1 1 1 0 1 0 1 |
| 52 | 1 1 1 1 0 1 1 1 |
| 53 | 1 1 1 1 1 0 0 1 |
| 54 | 1 1 1 1 1 0 1 1 |
| 55 | 1 1 1 1 1 1 0 1 |
| 56 | 1 1 1 1 1 1 1 1 |
| 57 | 1 0 0 0 1 0 1 0 |
| 58 | 1 0 0 0 1 1 1 0 |
| 59 | 1 0 0 1 0 0 1 0 |
| 60 | 1 0 0 1 0 1 1 0 |
| 61 | 1 0 0 1 1 0 1 0 |
| 62 | 1 0 0 1 1 1 1 0 |
| 63 | 1 0 1 0 0 0 1 0 |
| 64 | 1 0 1 0 0 1 1 0 |
| 65 | 1 0 1 0 1 0 1 0 |
| 66 | 1 0 1 0 1 1 1 0 |
| 67 | 1 0 1 1 0 0 1 0 |
| 68 | 1 0 1 1 0 1 1 0 |
| 69 | 1 0 1 1 1 0 1 0 |
| 70 | 1 0 1 1 1 1 1 0 |
| 71 | 1 1 0 0 0 1 1 0 |
| 72 | 1 1 0 0 1 0 1 0 |
| 73 | 1 1 0 0 1 1 1 0 |
| 74 | 1 1 0 1 0 0 1 0 |
| 75 | 1 1 0 1 0 1 1 0 |
| 76 | 1 1 0 1 1 0 1 0 |
| 77 | 1 1 0 1 1 1 1 0 |
| 78 | 1 1 1 0 0 0 1 0 |
| 79 | 1 1 1 0 0 1 1 0 |
| 80 | 1 1 1 0 1 0 1 0 |
| 81 | 1 1 1 0 1 1 1 0 |
| 82 | 1 1 1 1 0 0 1 0 |
| 83 | 1 1 1 1 0 1 1 0 |
| 84 | 1 1 1 1 1 0 1 0 |
| 85 | 1 1 1 1 1 1 1 0 |
| 86 | 1 0 0 0 1 1 0 0 |
| 87 | 1 0 0 1 0 1 0 0 |
| 88 | 1 0 0 1 1 1 0 0 |

TABLE 27-continued

| Number | 8-BIT CODE |
|---|---|
| 89 | 10100100 |
| 90 | 10101100 |
| 91 | 10110100 |
| 92 | 10111100 |
| 93 | 11000100 |
| 94 | 11001100 |
| 95 | 11010100 |
| 96 | 11011100 |
| 97 | 11100100 |
| 98 | 11101100 |
| 99 | 11110100 |
| 100 | 11111100 |
| 101 | 01000101 |
| 102 | 01000111 |
| 103 | 01001001 |
| 104 | 01001011 |
| 105 | 01001101 |
| 106 | 01001111 |
| 107 | 01010001 |
| 108 | 01010011 |
| 109 | 01010101 |
| 110 | 01010111 |
| 111 | 01011001 |
| 112 | 01011011 |
| 113 | 01011101 |
| 114 | 01011111 |
| 115 | 01100011 |
| 116 | 01100101 |
| 117 | 01100111 |
| 118 | 01101001 |
| 119 | 01101011 |
| 120 | 01101101 |
| 121 | 01101111 |
| 122 | 01110001 |
| 123 | 01110011 |
| 124 | 01110101 |
| 125 | 01110111 |
| 126 | 01111001 |
| 127 | 01111011 |
| 128 | 01111101 |
| 129 | 01111111 |
| 130 | 01000110 |
| 131 | 01001010 |
| 132 | 01001110 |
| 133 | 01010010 |
| 134 | 01010110 |
| 135 | 01011010 |
| 136 | 01011110 |
| 137 | 01100010 |
| 138 | 01100110 |
| 139 | 01101010 |
| 140 | 01101110 |
| 141 | 01110010 |
| 142 | 01110110 |
| 143 | 01111010 |
| 144 | 01111110 |
| 145 | 01000100 |
| 146 | 01001100 |
| 147 | 01010100 |
| 148 | 01011100 |
| 149 | 01100100 |
| 150 | 01101100 |
| 151 | 01110100 |
| 152 | 01111100 |

Figure 24:
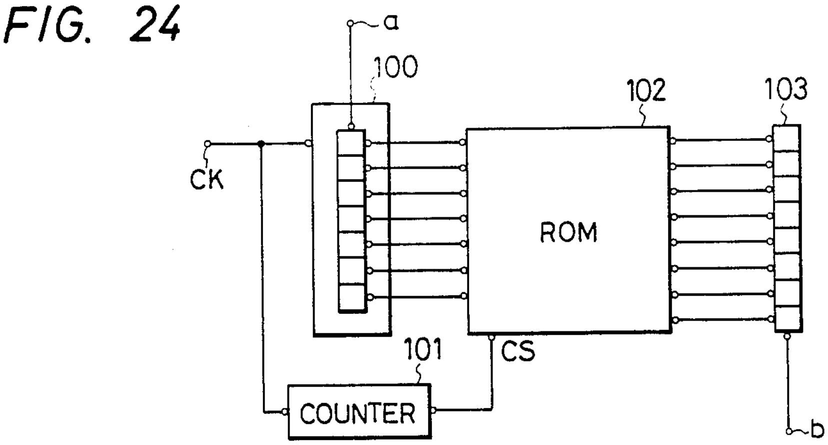
FIG. 24 is an arrangement block diagram of the conversion from 7 bits to 8 bits.

FIG. 24 is an arrangement block diagram for encoding of the present invention.

In FIG. 24, a data sequence is inputted from ⓐ. This data sequence is inputted to the 7-bit shift register 100. CK is the input terminal of the clock to drive the shift register 100. This clock signal is also simultaneously inputted to the counter 101. The counter 101 generates a pulse whenever seven clocks are counted and this pulse is inputted to the chip selecting (CS) terminal.

When the pulse is inputted to the chip selecting (CS) terminal, the data in the shift register 100 is taken in the ROM 102, so that the address in the ROM corresponding to the data is designated. In the 0th to 127th addresses in the ROM, 128 8-bit codes which were arbitrarily selected from Table 27 are stored. When the address in the ROM corresponding to the data is designated, the 8-bit code stored in that address is inputted to the shift register 103 and is outputted from the code output terminal ⓑ.

In this way, the conversion from the data to the code, namely, the encoding is finished.

The conversion from the code to the data which is performed on the reproducing side, namely, the decoding may be attained by performing the conversion opposite to the foregoing conversion for encoding.

As described above, the 8-bit codes shown in Table 27 are the codes which are restricted such that the minimum number of bits "0" which exist between the adjacent bits "1" is zero and the maximum number is three. There is an effect such that this limitation is not broken even by coupling the 8-bit codes.

Therefore, $$T_{min}=0.88T$$

$$T_{max}=2.63T$$

$$T_W=0.88T$$

Consequently, the present system has effects such that: the $T_{min}$ and $T_W$ are larger and the decoding error rate is smaller than those in the conventional FM system; the low frequency component of the recording waveform is few; and the synchronization can be more easily obtained as compared with the MFM or 3PM system. Therefore, it is possible to provide an electronic apparatus in which the recording and/or reproduction can be performed with a high density and a high degree of accuracy.

[7→9]

In case of converting the 7-bit data to the 9-bit code, when k=2, 128 9-bit codes which are arbitrarily selected from the 9-bit codes shown in Table 28 or 29 may be made coordinate with the $2^7=128$ data.

Figure 25:
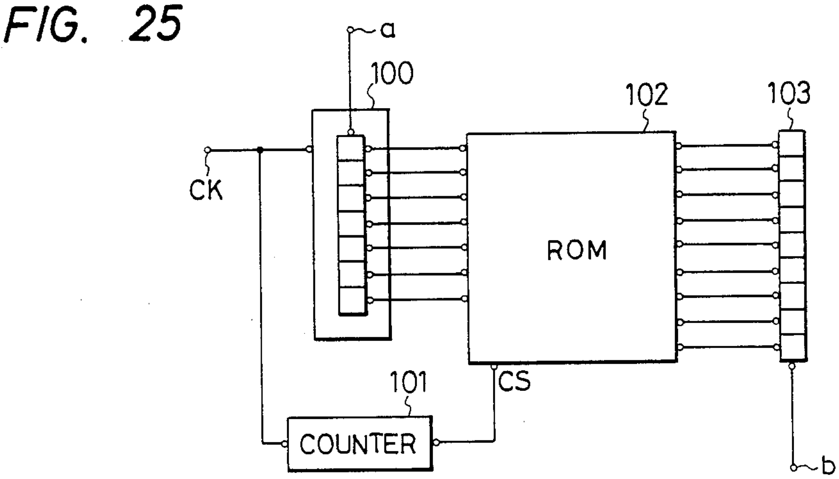
FIG. 25 is an arrangement block diagram of the conversion from 7 bits to 9 bits.

FIG. 25 is an arrangement block diagram for encoding of the present invention. In FIG. 25, a data sequence is inputted from ⓐ. This data sequence is inputted to the 7-bit shift register 100. CK is the input terminal of the clock to drive the shift register 100. This clock signal is also simultaneously inputted to the counter 101. The counter 101 generates a pulse whenever seven clocks are counted and this pulse is inputted to the chip selecting (CS) terminal.

When the pulse is inputted to the chip selecting (CS) terminal, the data in the shift register 100 is taken in the ROM 102, so that the address in the ROM corresponding to the data is designated. In the 0th to 127th addresses in the ROM, 128 9-bit codes which were arbitrarily selected from Table 28 or 29 are stored. When the address in the ROM corresponding to the data is designated, the 9-bit code stored in that address is inputted to the shift register 103 and is outputted from the code output terminal ⓑ.

In this way, the conversion from the data to the code, namely, the encoding is finished.

The conversion from the code to the data which is performed on the reproducing side, namely, the decoding may be attained by performing the conversion opposite to the foregoing conversion for encoding.

As described above, the 9-bit codes shown in Tables 28 and 29 are the codes which are restricted such that the minimum number of bits "0" which exist between the adjacent bits "1" is zero and the maximum number is two. There is an effect such that this limitation is not broken even by coupling the 9-bit codes.

Therefore, $$T_{min}=0.78T$$

$$T_{max}=2.33T$$

$$T_W=0.78T$$

Consequently, the present system has effects such that: the $T_{min}$ and $T_W$ are larger and the decoding error rate is smaller than those in the conventional FM system; the low frequency component of the recording waveform is few; and the synchronization can be more easily obtained as compared with the MFM or 3PM system. Therefore, it is possible to provide an electronic apparatus in which the recording and/or reproduction can be performed with a high density and a high degree of accuracy.

TABLE 28

| NUMBER | 9-BIT CODE |
|---|---|
| 1 | 100100101 |
| 2 | 100100111 |
| 3 | 100101001 |
| 4 | 100101011 |
| 5 | 100101101 |
| 6 | 100101111 |
| 7 | 100110011 |
| 8 | 100110101 |
| 9 | 100110111 |
| 10 | 100111001 |
| 11 | 100111011 |
| 12 | 100111101 |
| 13 | 100111111 |
| 14 | 101001001 |
| 15 | 101001011 |
| 16 | 101001101 |
| 17 | 101001111 |
| 18 | 101010011 |
| 19 | 101010101 |
| 20 | 101010111 |
| 21 | 101011001 |
| 22 | 101011011 |
| 23 | 101011101 |
| 24 | 101011111 |
| 25 | 101100101 |
| 26 | 101100111 |
| 27 | 101101001 |
| 28 | 101101011 |
| 29 | 101101101 |
| 30 | 101101111 |
| 31 | 101110011 |
| 32 | 101110101 |
| 33 | 101110111 |
| 34 | 101111001 |
| 35 | 101111011 |
| 36 | 101111101 |
| 37 | 101111111 |
| 38 | 110010011 |
| 39 | 110010101 |
| 40 | 110010111 |
| 41 | 110011001 |
| 42 | 110011011 |
| 43 | 110011101 |
| 44 | 110011111 |
| 45 | 110100101 |
| 46 | 110100111 |
| 47 | 110101001 |
| 48 | 110101011 |
| 49 | 110101101 |
| 50 | 110101111 |
| 51 | 110110011 |
| 52 | 110110101 |
| 53 | 110110111 |
| 54 | 110111001 |

TABLE 28-continued

| NUMBER | 9-BIT CODE |
|---|---|
| 55 | 110111011 |
| 56 | 110111101 |
| 57 | 110111111 |
| 58 | 111001001 |
| 59 | 111001011 |
| 60 | 111001101 |
| 61 | 111001111 |
| 62 | 111010011 |
| 63 | 111010101 |
| 64 | 111010111 |
| 65 | 111011001 |
| 66 | 111011011 |
| 67 | 111011101 |
| 68 | 111011111 |
| 69 | 111100101 |
| 70 | 111100111 |
| 71 | 111101001 |
| 72 | 111101011 |
| 73 | 111101101 |
| 74 | 111101111 |
| 75 | 111110011 |
| 76 | 111110101 |
| 77 | 111110111 |
| 78 | 111111001 |
| 79 | 111111011 |
| 80 | 111111101 |
| 81 | 111111111 |
| 82 | 100100110 |
| 83 | 100101010 |
| 84 | 100101110 |
| 85 | 100110010 |
| 86 | 100110110 |
| 87 | 100111010 |
| 88 | 100111110 |
| 89 | 101001010 |
| 90 | 101001110 |
| 91 | 101010010 |
| 92 | 101010110 |
| 93 | 101011010 |
| 94 | 101011110 |
| 95 | 101100110 |
| 96 | 101101010 |
| 97 | 101101110 |
| 98 | 101110010 |
| 99 | 101110110 |
| 100 | 101111010 |
| 101 | 101111110 |
| 102 | 110010010 |
| 103 | 110010110 |
| 104 | 110011010 |
| 105 | 110011110 |
| 106 | 110100110 |
| 107 | 110101010 |
| 108 | 110101110 |
| 109 | 110110010 |
| 110 | 110110110 |
| 111 | 110111010 |
| 112 | 110111110 |
| 113 | 111001010 |
| 114 | 111001110 |
| 115 | 111010010 |
| 116 | 111010110 |
| 117 | 111011010 |
| 118 | 111011110 |
| 119 | 111100110 |
| 120 | 111101010 |
| 121 | 111101110 |
| 122 | 111110010 |
| 123 | 111110110 |
| 124 | 111111010 |
| 125 | 111111110 |
| 126 | 100100100 |
| 127 | 100101100 |
| 128 | 100110100 |
| 129 | 100111100 |
| 130 | 101001100 |
| 131 | 101010100 |
| 132 | 101011100 |
| 133 | 101100100 |
| 134 | 101101100 |
| 135 | 101110100 |

TABLE 28-continued

| NUMBER | 9-BIT CODE |
|---|---|
| 136 | 1 0 1 1 1 1 1 0 0 |
| 137 | 1 1 0 0 1 0 1 0 0 |
| 138 | 1 1 0 0 1 1 1 0 0 |
| 139 | 1 1 0 1 0 0 1 0 0 |
| 140 | 1 1 0 1 0 1 1 0 0 |
| 141 | 1 1 0 1 1 0 1 0 0 |
| 142 | 1 1 0 1 1 1 1 0 0 |
| 143 | 1 1 1 0 0 1 1 0 0 |
| 144 | 1 1 1 0 1 0 1 0 0 |
| 145 | 1 1 1 0 1 1 1 0 0 |
| 146 | 1 1 1 1 0 0 1 0 0 |
| 147 | 1 1 1 1 0 1 1 0 0 |
| 148 | 1 1 1 1 1 0 1 0 0 |
| 149 | 1 1 1 1 1 1 1 0 0 |

TABLE 29

| NUMBER | 9-BIT CODE |
|---|---|
| 1 | 1 0 0 1 0 0 1 0 1 |
| 2 | 1 0 0 1 0 0 1 1 1 |
| 3 | 1 0 0 1 0 1 0 0 1 |
| 4 | 1 0 0 1 0 1 0 1 1 |
| 5 | 1 0 0 1 0 1 1 0 1 |
| 6 | 1 0 0 1 0 1 1 1 1 |
| 7 | 1 0 0 1 1 0 0 1 1 |
| 8 | 1 0 0 1 1 0 1 0 1 |
| 9 | 1 0 0 1 1 0 1 1 1 |
| 10 | 1 0 0 1 1 1 0 0 1 |
| 11 | 1 0 0 1 1 1 0 1 1 |
| 12 | 1 0 0 1 1 1 1 0 1 |
| 13 | 1 0 0 1 1 1 1 1 1 |
| 14 | 1 0 1 0 0 1 0 0 1 |
| 15 | 1 0 1 0 0 1 0 1 1 |
| 16 | 1 0 1 0 0 1 1 0 1 |
| 17 | 1 0 1 0 0 1 1 1 1 |
| 18 | 1 0 1 0 1 0 0 1 1 |
| 19 | 1 0 1 0 1 0 1 0 1 |
| 20 | 1 0 1 0 1 0 1 1 1 |
| 21 | 1 0 1 0 1 1 0 0 1 |
| 22 | 1 0 1 0 1 1 0 1 1 |
| 23 | 1 0 1 0 1 1 1 0 1 |
| 24 | 1 0 1 0 1 1 1 1 1 |
| 25 | 1 0 1 1 0 0 1 0 1 |
| 26 | 1 0 1 1 0 0 1 1 1 |
| 27 | 1 0 1 1 0 1 0 0 1 |
| 28 | 1 0 1 1 0 1 0 1 1 |
| 29 | 1 0 1 1 0 1 1 0 1 |
| 30 | 1 0 1 1 0 1 1 1 1 |
| 31 | 1 0 1 1 1 0 0 1 1 |
| 32 | 1 0 1 1 1 0 1 0 1 |
| 33 | 1 0 1 1 1 0 1 1 1 |
| 34 | 1 0 1 1 1 1 0 0 1 |
| 35 | 1 0 1 1 1 1 0 1 1 |
| 36 | 1 0 1 1 1 1 1 0 1 |
| 37 | 1 0 1 1 1 1 1 1 1 |
| 38 | 1 1 0 0 1 0 0 1 1 |
| 39 | 1 1 0 0 1 0 1 0 1 |
| 40 | 1 1 0 0 1 0 1 1 1 |
| 41 | 1 1 0 0 1 1 0 0 1 |
| 42 | 1 1 0 0 1 1 0 1 1 |
| 43 | 1 1 0 0 1 1 1 0 1 |
| 44 | 1 1 0 0 1 1 1 1 1 |
| 45 | 1 1 0 1 0 0 1 0 1 |
| 46 | 1 1 0 1 0 0 1 1 1 |
| 47 | 1 1 0 1 0 1 0 0 1 |
| 48 | 1 1 0 1 0 1 0 1 1 |
| 49 | 1 1 0 1 0 1 1 0 1 |
| 50 | 1 1 0 1 0 1 1 1 1 |
| 51 | 1 1 0 1 1 0 0 1 1 |
| 52 | 1 1 0 1 1 0 1 0 1 |
| 53 | 1 1 0 1 1 0 1 1 1 |
| 54 | 1 1 0 1 1 1 0 0 1 |
| 55 | 1 1 0 1 1 1 0 1 1 |
| 56 | 1 1 0 1 1 1 1 0 1 |
| 57 | 1 1 0 1 1 1 1 1 1 |
| 58 | 1 1 1 0 0 1 0 0 1 |
| 59 | 1 1 1 0 0 1 0 1 1 |
| 60 | 1 1 1 0 0 1 1 0 1 |
| 61 | 1 1 1 0 0 1 1 1 1 |

TABLE 29-continued

| NUMBER | 9-BIT CODE |
|---|---|
| 62 | 1 1 1 0 1 0 0 1 1 |
| 63 | 1 1 1 0 1 0 1 0 1 |
| 64 | 1 1 1 0 1 0 1 1 1 |
| 65 | 1 1 1 0 1 1 0 0 1 |
| 66 | 1 1 1 0 1 1 0 1 1 |
| 67 | 1 1 1 0 1 1 1 0 1 |
| 68 | 1 1 1 0 1 1 1 1 1 |
| 69 | 1 1 1 1 0 0 1 0 1 |
| 70 | 1 1 1 1 0 0 1 1 1 |
| 71 | 1 1 1 1 0 1 0 0 1 |
| 72 | 1 1 1 1 0 1 0 1 1 |
| 73 | 1 1 1 1 0 1 1 0 1 |
| 74 | 1 1 1 1 0 1 1 1 1 |
| 75 | 1 1 1 1 1 0 0 1 1 |
| 76 | 1 1 1 1 1 0 1 0 1 |
| 77 | 1 1 1 1 1 0 1 1 1 |
| 78 | 1 1 1 1 1 1 0 0 1 |
| 79 | 1 1 1 1 1 1 0 1 1 |
| 80 | 1 1 1 1 1 1 1 0 1 |
| 81 | 1 1 1 1 1 1 1 1 1 |
| 82 | 1 0 0 1 0 0 1 1 0 |
| 83 | 1 0 0 1 0 1 0 1 0 |
| 84 | 1 0 0 1 0 1 1 1 0 |
| 85 | 1 0 0 1 1 0 0 1 0 |
| 86 | 1 0 0 1 1 0 1 1 0 |
| 87 | 1 0 0 1 1 1 0 1 0 |
| 88 | 1 0 0 1 1 1 1 1 0 |
| 89 | 1 0 1 0 0 1 0 1 0 |
| 90 | 1 0 1 0 0 1 1 1 0 |
| 91 | 1 0 1 0 1 0 0 1 0 |
| 92 | 1 0 1 0 1 0 1 1 0 |
| 93 | 1 0 1 0 1 1 0 1 0 |
| 94 | 1 0 1 0 1 1 1 1 0 |
| 95 | 1 0 1 1 0 0 1 1 0 |
| 96 | 1 0 1 1 0 1 0 1 0 |
| 97 | 1 0 1 1 0 1 1 1 0 |
| 98 | 1 0 1 1 1 0 0 1 0 |
| 99 | 1 0 1 1 1 0 1 1 0 |
| 100 | 1 0 1 1 1 1 0 1 0 |
| 101 | 1 0 1 1 1 1 1 1 0 |
| 102 | 1 1 0 0 1 0 0 1 0 |
| 103 | 1 1 0 0 1 0 1 1 0 |
| 104 | 1 1 0 0 1 1 0 1 0 |
| 105 | 1 1 0 0 1 1 1 1 0 |
| 106 | 1 1 0 1 0 0 1 1 0 |
| 107 | 1 1 0 1 0 1 0 1 0 |
| 108 | 1 1 0 1 0 1 1 1 0 |
| 109 | 1 1 0 1 1 0 0 1 0 |
| 110 | 1 1 0 1 1 0 1 1 0 |
| 111 | 1 1 0 1 1 1 0 1 0 |
| 112 | 1 1 0 1 1 1 1 1 0 |
| 113 | 1 1 1 0 0 1 0 1 0 |
| 114 | 1 1 1 0 0 1 1 1 0 |
| 115 | 1 1 1 0 1 0 0 1 0 |
| 116 | 1 1 1 0 1 0 1 1 0 |
| 117 | 1 1 1 0 1 1 0 1 0 |
| 118 | 1 1 1 0 1 1 1 1 0 |
| 119 | 1 1 1 1 0 0 1 1 0 |
| 120 | 1 1 1 1 0 1 0 1 0 |
| 121 | 1 1 1 1 0 1 1 1 0 |
| 122 | 1 1 1 1 1 0 0 1 0 |
| 123 | 1 1 1 1 1 0 1 1 0 |
| 124 | 1 1 1 1 1 1 0 1 0 |
| 125 | 1 1 1 1 1 1 1 1 0 |
| 126 | 0 1 0 0 1 0 0 1 1 |
| 127 | 0 1 0 0 1 0 1 0 1 |
| 128 | 0 1 0 0 1 0 1 1 1 |
| 129 | 0 1 0 0 1 1 0 0 1 |
| 130 | 0 1 0 0 1 1 0 1 1 |
| 131 | 0 1 0 0 1 1 1 0 1 |
| 132 | 0 1 0 0 1 1 1 1 1 |
| 133 | 0 1 0 1 0 0 1 0 1 |
| 134 | 0 1 0 1 0 0 1 1 1 |
| 135 | 0 1 0 1 0 1 0 0 1 |
| 136 | 0 1 0 1 0 1 0 1 1 |
| 137 | 0 1 0 1 0 1 1 0 1 |
| 138 | 0 1 0 1 0 1 1 1 1 |
| 139 | 0 1 0 1 1 0 0 1 1 |
| 140 | 0 1 0 1 1 0 1 0 1 |
| 141 | 0 1 0 1 1 0 1 1 1 |
| 142 | 0 1 0 1 1 1 0 0 1 |

TABLE 29-continued

| NUMBER | 9-BIT CODE |
|---|---|
| 143 | 010111011 |
| 144 | 010111101 |
| 145 | 010111111 |
| 146 | 011001001 |
| 147 | 011001011 |
| 148 | 011001101 |
| 149 | 011001111 |
| 150 | 011010011 |
| 151 | 011010101 |
| 152 | 011010111 |
| 153 | 011011001 |
| 154 | 011011011 |
| 155 | 011011101 |
| 156 | 011011111 |
| 157 | 011100101 |
| 158 | 011100111 |
| 159 | 011101001 |
| 160 | 011101011 |
| 161 | 011101101 |
| 162 | 011101111 |
| 163 | 011110011 |
| 164 | 011110101 |
| 165 | 011110111 |
| 166 | 011111001 |
| 167 | 011111011 |
| 168 | 011111101 |
| 169 | 011111111 |
| 170 | 010010010 |
| 171 | 010010110 |
| 172 | 010011010 |
| 173 | 010011110 |
| 174 | 010100110 |
| 175 | 010101010 |
| 176 | 010101110 |
| 177 | 010110010 |
| 178 | 010110110 |
| 179 | 010111010 |
| 180 | 010111110 |
| 181 | 011001010 |
| 182 | 011001110 |
| 183 | 011010010 |
| 184 | 011010110 |
| 185 | 011011010 |
| 186 | 011011110 |
| 187 | 011100110 |
| 188 | 011101010 |
| 189 | 011101110 |
| 190 | 011110010 |
| 191 | 011110110 |
| 192 | 011111010 |
| 193 | 011111110 |

[8→9]

In case of converting the 8-bit data to the 9-bit code, when k=3, 256 9-bit codes which are arbitrarily selected from the 9-bit codes shown in Table 30 may be made coordinate with the $2^8=256$ data.

Figure 26:
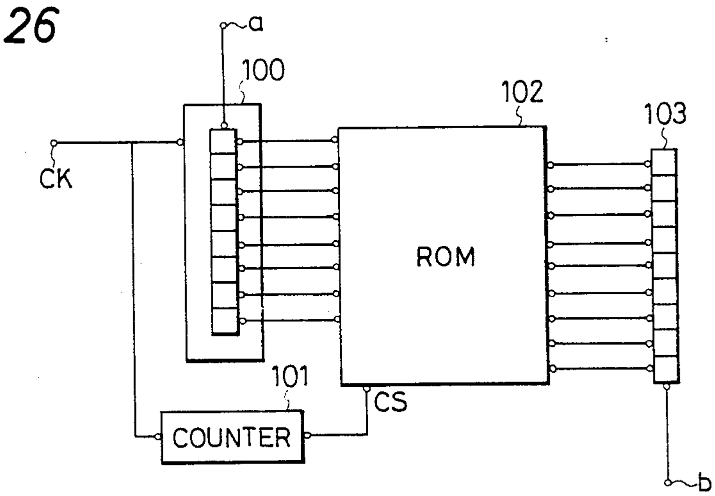
FIG. 26 is an arrangement block diagram of the conversion from 8 bits to 9 bits.

FIG. 26 is an arrangement block diagram for encoding of the present invention. In FIG. 26, a data sequence is inputted from ⓐ. This data sequence is inputted to the 8-bit shift register 100. CK is the input terminal of the clock to drive the shift register 100. This clock signal is also simultaneously inputted to the counter 101. The counter 101 generates a pulse whenever eight clocks are counted and this pulse is inputted to the chip selecting (CS) terminal.

When the pulse is inputted to the chip selecting (CS) terminal, the data in the shift register 100 is taken in the ROM 102, so that the address in the ROM corresponding to the data is designated. In the 0th to 255th addresses in the ROM, 256 9-bit codes which are arbitrarily selected from Table 30 are stored. When the address in the ROM corresponding to the data is designated, the 9-bit code stored in that address is inputted to the shift register 103 and is outputted from the code output terminal ⓑ.

In this way, the conversion from the data to the code, namely, the encoding is finished.

The conversion from the code to the data which is performed on the reproducing side, namely, the decoding may be attained by performing the conversion opposite to the foregoing conversion for encoding.

As described above, the 9-bit codes shown in Table 30 are the codes which are restricted such that the minimum number of bits "0" which exist between the adjacent bits "1" is zero and the maximum number is three. There is an effect such that this limitation is not broken even by coupling the 9-bit codes.

Therefore, $$T_{min}=0.89T$$

$$T_{max}=3.56T$$

$$T_W=0.89T$$

Consequently, the present system has effects such that: the $T_{min}$ and $T_W$ are larger and the decoding error rate is smaller than those in the conventional FM system; the low frequency component of the recording waveform is few; and the synchronization can be more easily obtained as compared with the MFM or 3PM system. Therefore, it is possible to provide an electronic apparatus in which the recording and/or reproduction can be performed with a high density and a high degree of accuracy.

TABLE 30

| NUMBER | 9-BIT CODE |
|---|---|
| 1 | 100010001 |
| 2 | 100010011 |
| 3 | 100010101 |
| 4 | 100010111 |
| 5 | 100011001 |
| 6 | 100011011 |
| 7 | 100011101 |
| 8 | 100011111 |
| 9 | 100100011 |
| 10 | 100100101 |
| 11 | 100100111 |
| 12 | 100101001 |
| 13 | 100101011 |
| 14 | 100101101 |
| 15 | 100101111 |
| 16 | 100110001 |
| 17 | 100110011 |
| 18 | 100110101 |
| 19 | 100110111 |
| 20 | 100111001 |
| 21 | 100111011 |
| 22 | 100111101 |
| 23 | 100111111 |
| 24 | 101000101 |
| 25 | 101000111 |
| 26 | 101001001 |
| 27 | 101001011 |
| 28 | 101001101 |
| 29 | 101001111 |
| 30 | 101010001 |
| 31 | 101010011 |
| 32 | 101010101 |
| 33 | 101010111 |
| 34 | 101011001 |
| 35 | 101011011 |
| 36 | 101011101 |
| 37 | 101011111 |
| 38 | 101100011 |
| 39 | 101100101 |
| 40 | 101100111 |
| 41 | 101101001 |

TABLE 30-continued

| NUMBER | 9-BIT CODE |
|---|---|
| 42 | 101101011 |
| 43 | 101101101 |
| 44 | 101101111 |
| 45 | 101110001 |
| 46 | 101110011 |
| 47 | 101110101 |
| 48 | 101110111 |
| 49 | 101111001 |
| 50 | 101111011 |
| 51 | 101111101 |
| 52 | 101111111 |
| 53 | 110001001 |
| 54 | 110001011 |
| 55 | 110001101 |
| 56 | 110001111 |
| 57 | 110010001 |
| 58 | 110010011 |
| 59 | 110010101 |
| 60 | 110010111 |
| 61 | 110011001 |
| 62 | 110011011 |
| 63 | 110011101 |
| 64 | 110011111 |
| 65 | 110100011 |
| 66 | 110100101 |
| 67 | 110100111 |
| 68 | 110101001 |
| 69 | 110101011 |
| 70 | 110101101 |
| 71 | 110101111 |
| 72 | 110110001 |
| 73 | 110110011 |
| 74 | 110110101 |
| 75 | 110110111 |
| 76 | 110111001 |
| 77 | 110111011 |
| 78 | 110111101 |
| 79 | 110111111 |
| 80 | 111000101 |
| 81 | 111000111 |
| 82 | 111001001 |
| 83 | 111001011 |
| 84 | 111001101 |
| 85 | 111001111 |
| 86 | 111010001 |
| 87 | 111010011 |
| 88 | 111010101 |
| 89 | 111010111 |
| 90 | 111011001 |
| 91 | 111011011 |
| 92 | 111011101 |
| 93 | 111011111 |
| 94 | 111100011 |
| 95 | 111100101 |
| 96 | 111100111 |
| 97 | 111101001 |
| 98 | 111101011 |
| 99 | 111101101 |
| 100 | 111101111 |
| 101 | 111110001 |
| 102 | 111110011 |
| 103 | 111110101 |
| 104 | 111110111 |
| 105 | 111111001 |
| 106 | 111111011 |
| 107 | 111111101 |
| 108 | 111111111 |
| 109 | 100010010 |
| 110 | 100010110 |
| 111 | 100011010 |
| 112 | 100011110 |
| 113 | 100100010 |
| 114 | 100100110 |
| 115 | 100101010 |
| 116 | 100101110 |
| 117 | 100110010 |
| 118 | 100110110 |
| 119 | 100111010 |
| 120 | 100111110 |
| 121 | 101000110 |
| 122 | 101001010 |
| 123 | 101001110 |
| 124 | 101010010 |
| 125 | 101010110 |
| 126 | 101011010 |
| 127 | 101011110 |
| 128 | 101100010 |
| 129 | 101100110 |
| 130 | 101101010 |
| 131 | 101101110 |
| 132 | 101110010 |
| 133 | 101110110 |
| 134 | 101111010 |
| 135 | 101111110 |
| 136 | 110001010 |
| 137 | 110001110 |
| 138 | 110010010 |
| 139 | 110010110 |
| 140 | 110011010 |
| 141 | 110011110 |
| 142 | 110100010 |
| 143 | 110100110 |
| 144 | 110101010 |
| 145 | 110101110 |
| 146 | 110110010 |
| 147 | 110110110 |
| 148 | 110111010 |
| 149 | 110111110 |
| 150 | 111000110 |
| 151 | 111001010 |
| 152 | 111001110 |
| 153 | 111010010 |
| 154 | 111010110 |
| 155 | 111011010 |
| 156 | 111011110 |
| 157 | 111100010 |
| 158 | 111100110 |
| 159 | 111101010 |
| 160 | 111101110 |
| 161 | 111110010 |
| 162 | 111110110 |
| 163 | 111111010 |
| 164 | 111111110 |
| 165 | 100010100 |
| 166 | 100011100 |
| 167 | 100100100 |
| 168 | 100101100 |
| 169 | 100110100 |
| 170 | 100111100 |
| 171 | 101000100 |
| 172 | 101001100 |
| 173 | 101010100 |
| 174 | 101011100 |
| 175 | 101100100 |
| 176 | 101101100 |
| 177 | 101110100 |
| 178 | 101111100 |
| 179 | 110001100 |
| 180 | 110010100 |
| 181 | 110011100 |
| 182 | 110100100 |
| 183 | 110101100 |
| 184 | 110110100 |
| 185 | 110111100 |
| 186 | 111000100 |
| 187 | 111001100 |
| 188 | 111010100 |
| 189 | 111011100 |
| 190 | 111100100 |
| 191 | 111101100 |
| 192 | 111110100 |
| 193 | 111111100 |
| 194 | 010001001 |
| 195 | 010001011 |
| 196 | 010001101 |
| 197 | 010001111 |
| 198 | 010010001 |
| 199 | 010010011 |
| 200 | 010010101 |
| 201 | 010010111 |
| 202 | 010011001 |
| 203 | 010011011 |

TABLE 30-continued

| NUMBER | 9-BIT CODE |
|---|---|
| 204 | 0 1 0 0 1 1 1 0 1 |
| 205 | 0 1 0 0 1 1 1 1 1 |
| 206 | 0 1 0 1 0 0 0 1 1 |
| 207 | 0 1 0 1 0 0 1 0 1 |
| 208 | 0 1 0 1 0 0 1 1 1 |
| 209 | 0 1 0 1 0 1 0 0 1 |
| 210 | 0 1 0 1 0 1 0 1 1 |
| 211 | 0 1 0 1 0 0 0 1 0 |
| 212 | 0 1 0 1 0 1 1 1 1 |
| 213 | 0 1 0 1 1 0 0 0 1 |
| 214 | 0 1 0 1 1 0 0 1 1 |
| 215 | 0 1 0 1 1 0 1 0 1 |
| 216 | 0 1 0 1 1 0 1 1 1 |
| 217 | 0 1 0 1 1 1 0 0 1 |
| 218 | 0 1 0 1 1 1 0 1 1 |
| 219 | 0 1 0 1 1 1 1 0 1 |
| 220 | 0 1 0 1 1 1 1 1 1 |
| 221 | 0 1 1 0 0 0 1 0 1 |
| 222 | 0 1 1 0 0 0 1 1 1 |
| 223 | 0 1 1 0 0 1 0 0 1 |
| 224 | 0 1 1 0 0 1 0 1 1 |
| 225 | 0 1 1 0 0 1 1 0 1 |
| 226 | 0 1 1 0 0 1 1 1 1 |
| 227 | 0 1 1 0 1 0 0 0 1 |
| 227 | 0 1 1 0 1 0 0 1 1 |
| 229 | 0 1 1 0 1 0 1 0 1 |
| 230 | 0 1 1 0 1 0 1 1 1 |
| 231 | 0 1 1 0 1 1 0 0 1 |
| 232 | 0 1 1 0 1 1 0 1 1 |
| 233 | 0 1 1 0 1 1 1 0 1 |
| 234 | 0 1 1 0 1 1 1 1 1 |
| 235 | 0 1 1 1 0 0 0 1 1 |
| 236 | 0 1 1 1 0 0 1 0 1 |
| 237 | 0 1 1 1 0 0 1 1 1 |
| 238 | 0 1 1 1 0 1 0 0 1 |
| 239 | 0 1 1 1 0 1 0 1 1 |
| 240 | 0 1 1 1 0 1 1 0 1 |
| 241 | 0 1 1 1 0 1 1 1 1 |
| 242 | 0 1 1 1 1 0 0 0 1 |
| 243 | 0 1 1 1 1 0 0 1 1 |
| 244 | 0 1 1 1 1 0 1 0 1 |
| 245 | 0 1 1 1 1 0 1 1 1 |
| 246 | 0 1 1 1 1 1 0 0 1 |
| 247 | 0 1 1 1 1 1 0 1 1 |
| 248 | 0 1 1 1 1 1 1 0 1 |
| 249 | 0 1 1 1 1 1 1 1 1 |
| 250 | 0 1 0 0 0 1 0 1 0 |
| 251 | 0 1 0 0 0 1 0 1 0 |
| 252 | 0 1 0 0 1 0 0 1 0 |
| 253 | 0 1 0 0 1 0 1 1 0 |
| 254 | 0 1 0 0 1 1 0 1 0 |
| 255 | 0 1 0 0 1 1 1 1 0 |
| 256 | 0 1 0 1 0 0 0 1 0 |
| 257 | 0 1 0 1 0 0 1 1 0 |
| 258 | 0 1 0 1 0 1 0 1 0 |
| 259 | 0 1 0 1 0 1 1 1 0 |
| 260 | 0 1 0 1 1 0 0 1 0 |
| 261 | 0 1 0 1 1 0 1 1 0 |
| 262 | 0 1 0 1 1 1 0 1 0 |
| 263 | 0 1 0 1 1 1 1 1 0 |
| 264 | 0 1 1 0 0 0 1 1 0 |
| 265 | 0 1 1 0 0 1 0 1 0 |
| 266 | 0 1 1 0 0 1 1 1 0 |
| 267 | 0 1 1 0 1 0 0 1 0 |
| 268 | 0 1 1 0 1 0 1 1 0 |
| 269 | 0 1 1 0 1 1 0 1 0 |
| 270 | 0 1 1 0 1 1 1 1 0 |
| 271 | 0 1 1 1 0 0 0 1 0 |
| 272 | 0 1 1 1 0 0 1 1 0 |
| 273 | 0 1 1 1 0 1 0 1 0 |
| 274 | 0 1 1 1 0 1 1 1 0 |
| 275 | 0 1 1 1 1 0 0 1 0 |
| 276 | 0 1 1 1 1 0 1 1 0 |
| 277 | 0 1 1 1 1 1 0 1 0 |
| 278 | 0 1 1 1 1 1 1 1 0 |
| 279 | 0 1 0 0 0 1 1 0 0 |
| 280 | 0 1 0 0 1 0 1 0 0 |
| 281 | 0 1 0 0 1 1 1 0 0 |
| 282 | 0 1 0 1 0 0 1 0 0 |
| 283 | 0 1 0 1 0 1 1 0 0 |
| 284 | 0 1 0 1 1 0 1 0 0 |
| 285 | 0 1 0 1 1 1 1 0 0 |
| 286 | 0 1 1 0 0 0 1 0 0 |
| 287 | 0 1 1 0 0 1 1 0 0 |
| 288 | 0 1 1 0 1 0 1 0 0 |
| 289 | 0 1 1 0 1 1 1 0 0 |
| 290 | 0 1 1 1 0 0 1 0 0 |
| 291 | 0 1 1 1 0 1 1 0 0 |
| 292 | 0 1 1 1 1 0 1 0 0 |
| 293 | 0 1 1 1 1 1 1 0 0 |

[8→14]

In case of converting the 8-bit data to the 14-bit code, when the last one bit of the code which is preceding by one than the $2^8=256$ 8-bit data is "1", 275 14-bit codes shown in Table 31 are made coordinate with those 256 data so as to satisfy the one-to-one corresponding relation. When the last two bits of the one-preceding code are "1 0", arbitrary 256 14-bit codes among the 426 14-bit codes shown in Table 32 are made coordinate with those 256 data so as to satisfy the one-to-one corresponding relation. When the last three bits of the one-preceding code are "1 0 0", arbitrary 256 14-bit codes among the 376 14-bit codes shown in Table 33 are made coordinate with those 256 data so as to satisfy the one-to-one corresponding relation. On the other hand, in the initial state in that the codes start, the abovementioned one-preceding code does not exist. However, in this case, it is assumed that the encoding is performed by specifying the state to either one of the conditions whereby: the last one bit of the one-preceding code is "1"; the last two bits are "1 0"; and the last three bits are "1 0 0".

TABLE 31

| NUMBER | 14-BIT CODE |
|---|---|
| 1 | 0 0 0 0 1 0 0 0 0 1 0 0 0 1 |
| 2 | 0 0 0 0 1 0 0 0 0 1 0 0 1 0 |
| 3 | 0 0 0 0 1 0 0 0 0 1 0 1 0 0 |
| 4 | 0 0 0 0 1 0 0 0 0 1 0 1 0 1 |
| 5 | 0 0 0 0 1 0 0 0 1 0 0 0 0 1 |
| 6 | 0 0 0 0 1 0 0 0 1 0 0 0 1 0 |
| 7 | 0 0 0 0 1 0 0 0 1 0 0 1 0 0 |
| 8 | 0 0 0 0 1 0 0 0 1 0 0 1 0 1 |
| 9 | 0 0 0 0 1 0 0 0 1 0 1 0 0 1 |
| 10 | 0 0 0 0 1 0 0 0 1 0 1 0 1 0 |
| 11 | 0 0 0 0 1 0 0 1 0 0 0 0 1 0 |
| 12 | 0 0 0 0 1 0 0 1 0 0 0 1 0 0 |
| 13 | 0 0 0 0 1 0 0 1 0 0 0 1 0 1 |
| 14 | 0 0 0 0 1 0 0 1 0 0 1 0 0 1 |
| 15 | 0 0 0 0 1 0 0 1 0 0 1 0 1 0 |
| 16 | 0 0 0 0 1 0 0 1 0 1 0 0 0 1 |
| 17 | 0 0 0 0 1 0 0 1 0 1 0 0 1 0 |
| 18 | 0 0 0 0 1 0 0 1 0 1 0 1 0 0 |
| 19 | 0 0 0 0 1 0 0 1 0 1 0 1 0 1 |
| 20 | 0 0 0 0 1 0 1 0 0 0 0 1 0 0 |
| 21 | 0 0 0 0 1 0 1 0 0 0 0 1 0 1 |
| 22 | 0 0 0 0 1 0 1 0 0 0 1 0 0 1 |
| 23 | 0 0 0 0 1 0 1 0 0 0 1 0 1 0 |
| 24 | 0 0 0 0 1 0 1 0 0 1 0 0 0 1 |
| 25 | 0 0 0 0 1 0 1 0 0 1 0 0 1 0 |
| 26 | 0 0 0 0 1 0 1 0 0 1 0 1 0 0 |
| 27 | 0 0 0 0 1 0 1 0 0 1 0 1 0 1 |
| 28 | 0 0 0 0 1 0 1 0 1 0 0 0 0 1 |
| 29 | 0 0 0 0 1 0 1 0 1 0 0 0 1 0 |
| 30 | 0 0 0 0 1 0 1 0 1 0 0 1 0 0 |
| 31 | 0 0 0 0 1 0 1 0 1 0 0 1 0 1 |
| 32 | 0 0 0 0 1 0 1 0 1 0 1 0 0 1 |
| 33 | 0 0 0 0 1 0 1 0 1 0 1 0 1 0 |
| 34 | 0 0 0 1 0 0 0 0 1 0 0 0 0 1 |
| 35 | 0 0 0 1 0 0 0 0 1 0 0 0 1 0 |
| 36 | 0 0 0 1 0 0 0 0 1 0 0 1 0 0 |
| 37 | 0 0 0 1 0 0 0 0 1 0 0 1 0 1 |
| 38 | 0 0 0 1 0 0 0 0 1 0 1 0 0 1 |
| 39 | 0 0 0 1 0 0 0 0 1 0 1 0 1 0 |

TABLE 31-continued

| NUMBER | 14-BIT CODE |
|---|---|
| 40 | 00010001000010 |
| 41 | 00010001000100 |
| 42 | 00010001000101 |
| 43 | 00010001001001 |
| 44 | 00010001001010 |
| 45 | 00010001010001 |
| 46 | 00010001010010 |
| 47 | 00010001010100 |
| 48 | 00010001010101 |
| 49 | 00010010000100 |
| 50 | 00010010000101 |
| 51 | 00010010001001 |
| 52 | 00010010001010 |
| 53 | 00010010010001 |
| 54 | 00010010010010 |
| 55 | 00010010010100 |
| 56 | 00010010010101 |
| 57 | 00010010100001 |
| 58 | 00010010100010 |
| 59 | 00010010100100 |
| 60 | 00010010100101 |
| 61 | 00010010101001 |
| 62 | 00010010101010 |
| 63 | 00010100001001 |
| 64 | 00010100001010 |
| 65 | 00010100010001 |
| 66 | 00010100010010 |
| 67 | 00010100010100 |
| 68 | 00010100010101 |
| 69 | 00010100100001 |
| 70 | 00010100100010 |
| 71 | 00010100100100 |
| 72 | 00010100100101 |
| 73 | 00010100101001 |
| 74 | 00010100101010 |
| 75 | 00010101000010 |
| 76 | 00010101000100 |
| 77 | 00010101000101 |
| 78 | 00010101001001 |
| 79 | 00010101001010 |
| 80 | 00010101010001 |
| 81 | 00010101010010 |
| 82 | 00010101010100 |
| 83 | 00010101010101 |
| 84 | 00100001000010 |
| 85 | 00100001000100 |
| 86 | 00100001000101 |
| 87 | 00100001001001 |
| 88 | 00100001001010 |
| 89 | 00100001010001 |
| 90 | 00100001010010 |
| 91 | 00100001010100 |
| 92 | 00100001010101 |
| 93 | 00100010000100 |
| 94 | 00100010000101 |
| 95 | 00100010001001 |
| 96 | 00100010001010 |
| 97 | 00100010010001 |
| 98 | 00100010010010 |
| 99 | 00100010010100 |
| 100 | 00100010010101 |
| 101 | 00100010100001 |
| 102 | 00100010100010 |
| 103 | 00100010100100 |
| 104 | 00100010100101 |
| 105 | 00100010101001 |
| 106 | 00100010101010 |
| 107 | 00100100001001 |
| 108 | 00100100001010 |
| 109 | 00100100010001 |
| 110 | 00100100010010 |
| 111 | 00100100010100 |
| 112 | 00100100010101 |
| 113 | 00100100100001 |
| 114 | 00100100100010 |
| 115 | 00100100100100 |
| 116 | 00100100100101 |
| 117 | 00100100101001 |
| 118 | 00100100101010 |
| 119 | 00100101000010 |
| 120 | 00100101000100 |

TABLE 31-continued

| NUMBER | 14-BIT CODE |
|---|---|
| 121 | 00100101000101 |
| 122 | 00100101001001 |
| 123 | 00100101001010 |
| 124 | 00100101010001 |
| 125 | 00100101010010 |
| 126 | 00100101010100 |
| 127 | 00100101010101 |
| 128 | 00101000010001 |
| 129 | 00101000010010 |
| 130 | 00101000010100 |
| 131 | 00101000010101 |
| 132 | 00101000100001 |
| 133 | 00101000100010 |
| 134 | 00101000100100 |
| 135 | 00101000100101 |
| 136 | 00101000101001 |
| 137 | 00101000101010 |
| 138 | 00101001000010 |
| 139 | 00101001000100 |
| 140 | 00101001000101 |
| 141 | 00101001001001 |
| 142 | 00101001001010 |
| 143 | 00101001010001 |
| 144 | 00101001010010 |
| 145 | 00101001010100 |
| 146 | 00101001010101 |
| 147 | 00101010000100 |
| 148 | 00101010000101 |
| 149 | 00101010001001 |
| 150 | 00101010001010 |
| 151 | 00101010010001 |
| 152 | 00101010010010 |
| 153 | 00101010010100 |
| 154 | 00101010010101 |
| 155 | 00101010100001 |
| 156 | 00101010100010 |
| 157 | 00101010100100 |
| 158 | 00101010100101 |
| 159 | 00101010101001 |
| 160 | 00101010101010 |
| 161 | 01000010000100 |
| 162 | 01000010000101 |
| 163 | 01000010001001 |
| 164 | 01000010001010 |
| 165 | 01000010010001 |
| 166 | 01000010010010 |
| 167 | 01000010010100 |
| 168 | 01000010010101 |
| 169 | 01000010100001 |
| 170 | 01000010100010 |
| 171 | 01000010100100 |
| 172 | 01000010100101 |
| 173 | 01000010101001 |
| 174 | 01000010101010 |
| 175 | 01000100001001 |
| 176 | 01000100001010 |
| 177 | 01000100010001 |
| 178 | 01000100010010 |
| 179 | 01000100010100 |
| 180 | 01000100010101 |
| 181 | 01000100100001 |
| 182 | 01000100100010 |
| 183 | 01000100100100 |
| 184 | 01000100100101 |
| 185 | 01000100101001 |
| 186 | 01000100101010 |
| 187 | 01000101000010 |
| 188 | 01000101000100 |
| 189 | 01000101000101 |
| 190 | 01000101001001 |
| 191 | 01000101001010 |
| 192 | 01000101010001 |
| 193 | 01000101010010 |
| 194 | 01000101010100 |
| 195 | 01000101010101 |
| 196 | 01001000010001 |
| 197 | 01001000010010 |
| 198 | 01001000010100 |
| 199 | 01001000010101 |
| 200 | 01001000100001 |
| 201 | 01001000100010 |

TABLE 31-continued

| NUMBER | 14-BIT CODE |
|---|---|
| 202 | 01001000100100 |
| 203 | 01001000100101 |
| 204 | 01001000101001 |
| 205 | 01001000101010 |
| 206 | 01001001000010 |
| 207 | 01001001000100 |
| 208 | 01001001000101 |
| 209 | 01001001001001 |
| 210 | 01001001001010 |
| 211 | 01001001010001 |
| 212 | 01001001010010 |
| 213 | 01001001010100 |
| 214 | 01001001010101 |
| 215 | 01001010000100 |
| 216 | 01001010000101 |
| 217 | 01001010001001 |
| 218 | 01001010001010 |
| 219 | 01001010010001 |
| 220 | 01001010010010 |
| 221 | 01001010010100 |
| 222 | 01001010010101 |
| 223 | 01001010100001 |
| 224 | 01001010100010 |
| 225 | 01001010100100 |
| 226 | 01001010100101 |
| 227 | 01001010101001 |
| 228 | 01001010101010 |
| 229 | 01010000100001 |
| 230 | 01010000100010 |
| 231 | 01010000100100 |
| 232 | 01010000100101 |
| 233 | 01010000101001 |
| 234 | 01010000101010 |
| 235 | 01010001000010 |
| 236 | 01010001000100 |
| 237 | 01010001000101 |
| 238 | 01010001001001 |
| 239 | 01010001001010 |
| 240 | 01010001010001 |
| 241 | 01010001010010 |
| 242 | 01010001010100 |
| 243 | 01010001010101 |
| 244 | 01010010000100 |
| 245 | 01010010000101 |
| 246 | 01010010001001 |
| 247 | 01010010001010 |
| 248 | 01010010010001 |
| 249 | 01010010010010 |
| 250 | 01010010010100 |
| 251 | 01010010010101 |
| 252 | 01010010100001 |
| 253 | 01010010100010 |
| 254 | 01010010100100 |
| 255 | 01010010100101 |
| 256 | 01010010101001 |
| 257 | 01010010101010 |
| 258 | 01010100001001 |
| 259 | 01010100001010 |
| 260 | 01010100010001 |
| 261 | 01010100010010 |
| 262 | 01010100010100 |
| 263 | 01010100010101 |
| 264 | 01010100100001 |
| 265 | 01010100100010 |
| 266 | 01010100100100 |
| 267 | 01010100100101 |
| 268 | 01010100101001 |
| 269 | 01010100101010 |
| 270 | 01010101000010 |
| 271 | 01010101000100 |
| 272 | 01010101000101 |
| 273 | 01010101001001 |
| 274 | 01010101001010 |
| 275 | 01010101010001 |
| 276 | 01010101010010 |
| 277 | 01010101010100 |
| 278 | 01010101010101 |

TABLE 32

| NUMBER | 14-BIT CODE |
|---|---|
| 1 | 00010000100001 |
| 2 | 00010000100010 |
| 3 | 00010000100100 |
| 4 | 00010000100101 |
| 5 | 00010000101001 |
| 6 | 00010000101010 |
| 7 | 00010001000010 |
| 8 | 00010001000100 |
| 9 | 00010001000101 |
| 10 | 00010001001001 |
| 11 | 00010001001010 |
| 12 | 00010001010001 |
| 13 | 00010001010010 |
| 14 | 00010001010100 |
| 15 | 00010001010101 |
| 16 | 00010010000100 |
| 17 | 00010010000101 |
| 18 | 00010010001001 |
| 19 | 00010010001010 |
| 20 | 00010010010001 |
| 21 | 00010010010010 |
| 22 | 00010010010100 |
| 23 | 00010010010101 |
| 24 | 00010010100001 |
| 25 | 00010010100010 |
| 26 | 00010010100100 |
| 27 | 00010010100101 |
| 28 | 00010010101001 |
| 29 | 00010010101010 |
| 30 | 00010100001001 |
| 31 | 00010100001010 |
| 32 | 00010100010001 |
| 33 | 00010100010010 |
| 34 | 00010100010100 |
| 35 | 00010100010101 |
| 36 | 00010100100001 |
| 37 | 00010100100010 |
| 38 | 00010100100100 |
| 39 | 00010100100101 |
| 40 | 00010100101001 |
| 41 | 00010100101010 |
| 42 | 00010101000010 |
| 43 | 00010101000100 |
| 44 | 00010101000101 |
| 45 | 00010101001001 |
| 46 | 00010101001010 |
| 47 | 00010101010001 |
| 48 | 00010101010010 |
| 49 | 00010101010100 |
| 50 | 00010101010101 |
| 51 | 00100001000010 |
| 52 | 00100001000100 |
| 53 | 00100001000101 |
| 54 | 00100001001001 |
| 55 | 00100001001010 |
| 56 | 00100001010001 |
| 57 | 00100001010010 |
| 58 | 00100001010100 |
| 59 | 00100001010101 |
| 60 | 00100010000100 |
| 61 | 00100010000101 |
| 62 | 00100010001001 |
| 63 | 00100010001010 |
| 64 | 00100010010001 |
| 65 | 00100010010010 |
| 66 | 00100010010100 |
| 67 | 00100010010101 |
| 68 | 00100010100001 |
| 69 | 00100010100010 |
| 70 | 00100010100100 |
| 71 | 00100010100101 |
| 72 | 00100010101001 |
| 73 | 00100010101010 |
| 74 | 00100100001001 |
| 75 | 00100100001010 |
| 76 | 00100100010001 |
| 77 | 00100100010010 |
| 78 | 00100100010100 |
| 79 | 00100100010101 |
| 80 | 00100100100001 |
| 81 | 00100100100010 |

TABLE 32-continued

| NUMBER | 14-BIT CODE |
| --- | --- |
| 82 | 0 0 1 0 0 1 0 0 1 0 0 1 0 0 |
| 83 | 0 0 1 0 0 1 0 0 1 0 0 1 0 1 |
| 84 | 0 0 1 0 0 1 0 0 1 0 1 0 0 1 |
| 85 | 0 0 1 0 0 1 0 0 1 0 1 0 1 0 |
| 86 | 0 0 1 0 0 1 0 1 0 0 0 0 1 0 |
| 87 | 0 0 1 0 0 1 0 1 0 0 0 1 0 0 |
| 88 | 0 0 1 0 0 1 0 1 0 0 0 1 0 1 |
| 89 | 0 0 1 0 0 1 0 1 0 0 1 0 0 1 |
| 90 | 0 0 1 0 0 1 0 1 0 0 1 0 1 0 |
| 91 | 0 0 1 0 0 1 0 1 0 1 0 0 0 1 |
| 92 | 0 0 1 0 0 1 0 1 0 1 0 0 1 0 |
| 93 | 0 0 1 0 0 1 0 1 0 1 0 1 0 0 |
| 94 | 0 0 1 0 0 1 0 1 0 1 0 1 0 1 |
| 95 | 0 0 1 0 1 0 0 0 0 1 0 0 0 1 |
| 96 | 0 0 1 0 1 0 0 0 0 1 0 0 1 0 |
| 97 | 0 0 1 0 1 0 0 0 0 1 0 1 0 0 |
| 98 | 0 0 1 0 1 0 0 0 0 1 0 1 0 1 |
| 99 | 0 0 1 0 1 0 0 0 1 0 0 0 0 1 |
| 100 | 0 0 1 0 1 0 0 0 1 0 0 0 1 0 |
| 101 | 0 0 1 0 1 0 0 0 1 0 0 1 0 0 |
| 102 | 0 0 1 0 1 0 0 0 1 0 0 1 0 1 |
| 103 | 0 0 1 0 1 0 0 0 1 0 1 0 0 1 |
| 104 | 0 0 1 0 1 0 0 0 1 0 1 0 1 0 |
| 105 | 0 0 1 0 1 0 0 1 0 0 0 0 1 0 |
| 106 | 0 0 1 0 1 0 0 1 0 0 0 1 0 0 |
| 107 | 0 0 1 0 1 0 0 1 0 0 0 1 0 1 |
| 108 | 0 0 1 0 1 0 0 1 0 0 1 0 0 1 |
| 109 | 0 0 1 0 1 0 0 1 0 0 1 0 1 0 |
| 110 | 0 0 1 0 1 0 0 1 0 1 0 0 0 1 |
| 111 | 0 0 1 0 1 0 0 1 0 1 0 0 1 0 |
| 112 | 0 0 1 0 1 0 0 1 0 1 0 1 0 0 |
| 113 | 0 0 1 0 1 0 0 1 0 1 0 1 0 1 |
| 114 | 0 0 1 0 1 0 1 0 0 0 0 1 0 0 |
| 115 | 0 0 1 0 1 0 1 0 0 0 0 1 0 1 |
| 116 | 0 0 1 0 1 0 1 0 0 0 1 0 0 1 |
| 117 | 0 0 1 0 1 0 1 0 0 0 1 0 1 0 |
| 118 | 0 0 1 0 1 0 1 0 0 1 0 0 0 1 |
| 119 | 0 0 1 0 1 0 1 0 0 1 0 0 1 0 |
| 120 | 0 0 1 0 1 0 1 0 0 1 0 1 0 0 |
| 121 | 0 0 1 0 1 0 1 0 0 1 0 1 0 1 |
| 122 | 0 0 1 0 1 0 1 0 1 0 0 0 0 1 |
| 123 | 0 0 1 0 1 0 1 0 1 0 0 0 1 0 |
| 124 | 0 0 1 0 1 0 1 0 1 0 0 1 0 0 |
| 125 | 0 0 1 0 1 0 1 0 1 0 0 1 0 1 |
| 126 | 0 0 1 0 1 0 1 0 1 0 1 0 0 1 |
| 127 | 0 0 1 0 1 0 1 0 1 0 1 0 1 0 |
| 128 | 0 1 0 0 0 0 1 0 0 0 0 1 0 0 |
| 129 | 0 1 0 0 0 0 1 0 0 0 0 1 0 1 |
| 130 | 0 1 0 0 0 0 1 0 0 0 1 0 0 1 |
| 131 | 0 1 0 0 0 0 1 0 0 0 1 0 1 0 |
| 132 | 0 1 0 0 0 0 1 0 0 1 0 0 0 1 |
| 133 | 0 1 0 0 0 0 1 0 0 1 0 0 1 0 |
| 134 | 0 1 0 0 0 0 1 0 0 1 0 1 0 0 |
| 135 | 0 1 0 0 0 0 1 0 0 1 0 1 0 1 |
| 136 | 0 1 0 0 0 0 1 0 1 0 0 0 0 1 |
| 137 | 0 1 0 0 0 0 1 0 1 0 0 0 1 0 |
| 138 | 0 1 0 0 0 0 1 0 1 0 0 1 0 0 |
| 139 | 0 1 0 0 0 0 1 0 1 0 0 1 0 1 |
| 140 | 0 1 0 0 0 0 1 0 1 0 1 0 0 1 |
| 141 | 0 1 0 0 0 0 1 0 1 0 1 0 1 0 |
| 142 | 0 1 0 0 0 1 0 0 0 0 1 0 0 1 |
| 143 | 0 1 0 0 0 1 0 0 0 0 1 0 1 0 |
| 144 | 0 1 0 0 0 1 0 0 0 1 0 0 0 1 |
| 145 | 0 1 0 0 0 1 0 0 0 1 0 0 1 0 |
| 146 | 0 1 0 0 0 1 0 0 0 1 0 1 0 0 |
| 147 | 0 1 0 0 0 1 0 0 0 1 0 1 0 1 |
| 148 | 0 1 0 0 0 1 0 0 1 0 0 0 0 1 |
| 149 | 0 1 0 0 0 1 0 0 1 0 0 0 1 0 |
| 150 | 0 1 0 0 0 1 0 0 1 0 0 1 0 0 |
| 151 | 0 1 0 0 0 1 0 0 1 0 0 1 0 1 |
| 152 | 0 1 0 0 0 1 0 0 1 0 1 0 0 1 |
| 153 | 0 1 0 0 0 1 0 0 1 0 1 0 1 0 |
| 154 | 0 1 0 0 0 1 0 1 0 0 0 0 1 0 |
| 155 | 0 1 0 0 0 1 0 1 0 0 0 1 0 0 |
| 156 | 0 1 0 0 0 1 0 1 0 0 0 1 0 1 |
| 157 | 0 1 0 0 0 1 0 1 0 0 1 0 0 1 |
| 158 | 0 1 0 0 0 1 0 1 0 0 1 0 1 0 |
| 159 | 0 1 0 0 0 1 0 1 0 1 0 0 0 1 |
| 160 | 0 1 0 0 0 1 0 1 0 1 0 0 1 0 |
| 161 | 0 1 0 0 0 1 0 1 0 1 0 1 0 0 |
| 162 | 0 1 0 0 0 1 0 1 0 1 0 1 0 1 |
| 163 | 0 1 0 0 1 0 0 0 0 1 0 0 0 1 |
| 164 | 0 1 0 0 1 0 0 0 0 1 0 0 1 0 |
| 165 | 0 1 0 0 1 0 0 0 0 1 0 1 0 0 |
| 166 | 0 1 0 0 1 0 0 0 0 1 0 1 0 1 |
| 167 | 0 1 0 0 1 0 0 0 1 0 0 0 0 1 |
| 168 | 0 1 0 0 1 0 0 0 1 0 0 0 1 0 |
| 169 | 0 1 0 0 1 0 0 0 1 0 0 1 0 0 |
| 170 | 0 1 0 0 1 0 0 0 1 0 0 1 0 1 |
| 171 | 0 1 0 0 1 0 0 0 1 0 1 0 0 1 |
| 172 | 0 1 0 0 1 0 0 0 1 0 1 0 1 0 |
| 173 | 0 1 0 0 1 0 0 1 0 0 0 0 1 0 |
| 174 | 0 1 0 0 1 0 0 1 0 0 0 1 0 0 |
| 175 | 0 1 0 0 1 0 0 1 0 0 0 1 0 1 |
| 176 | 0 1 0 0 1 0 0 1 0 0 1 0 0 1 |
| 177 | 0 1 0 0 1 0 0 1 0 0 1 0 1 0 |
| 178 | 0 1 0 0 1 0 0 1 0 1 0 0 0 1 |
| 179 | 0 1 0 0 1 0 0 1 0 1 0 0 1 0 |
| 180 | 0 1 0 0 1 0 0 1 0 1 0 1 0 0 |
| 181 | 0 1 0 0 1 0 0 1 0 1 0 1 0 1 |
| 182 | 0 1 0 0 1 0 1 0 0 0 0 1 0 0 |
| 183 | 0 1 0 0 1 0 1 0 0 0 0 1 0 1 |
| 184 | 0 1 0 0 1 0 1 0 0 0 1 0 0 1 |
| 185 | 0 1 0 0 1 0 1 0 0 0 1 0 1 0 |
| 186 | 0 1 0 0 1 0 1 0 0 1 0 0 0 1 |
| 187 | 0 1 0 0 1 0 1 0 0 1 0 0 1 0 |
| 188 | 0 1 0 0 1 0 1 0 0 1 0 1 0 0 |
| 189 | 0 1 0 0 1 0 1 0 0 1 0 1 0 1 |
| 190 | 0 1 0 0 1 0 1 0 1 0 0 0 0 1 |
| 191 | 0 1 0 0 1 0 1 0 1 0 0 0 1 0 |
| 192 | 0 1 0 0 1 0 1 0 1 0 0 1 0 0 |
| 193 | 0 1 0 0 1 0 1 0 1 0 0 1 0 1 |
| 194 | 0 1 0 0 1 0 1 0 1 0 1 0 0 1 |
| 195 | 0 1 0 0 1 0 1 0 1 0 1 0 1 0 |
| 196 | 0 1 0 1 0 0 0 0 1 0 0 0 0 1 |
| 197 | 0 1 0 1 0 0 0 0 1 0 0 0 1 0 |
| 198 | 0 1 0 1 0 0 0 0 1 0 0 1 0 0 |
| 199 | 0 1 0 1 0 0 0 0 1 0 0 1 0 1 |
| 200 | 0 1 0 1 0 0 0 0 1 0 1 0 0 1 |
| 201 | 0 1 0 1 0 0 0 0 1 0 1 0 1 0 |
| 202 | 0 1 0 1 0 0 0 1 0 0 0 0 1 0 |
| 203 | 0 1 0 1 0 0 0 1 0 0 0 1 0 0 |
| 204 | 0 1 0 1 0 0 0 1 0 0 0 1 0 1 |
| 205 | 0 1 0 1 0 0 0 1 0 0 1 0 0 1 |
| 206 | 0 1 0 1 0 0 0 1 0 0 1 0 1 0 |
| 207 | 0 1 0 1 0 0 0 1 0 1 0 0 0 1 |
| 208 | 0 1 0 1 0 0 0 1 0 1 0 0 1 0 |
| 209 | 0 1 0 1 0 0 0 1 0 1 0 1 0 0 |
| 210 | 0 1 0 1 0 0 0 1 0 1 0 1 0 1 |
| 211 | 0 1 0 1 0 0 1 0 0 0 0 1 0 0 |
| 212 | 0 1 0 1 0 0 1 0 0 0 0 1 0 1 |
| 213 | 0 1 0 1 0 0 1 0 0 0 1 0 0 1 |
| 214 | 0 1 0 1 0 0 1 0 0 0 1 0 1 0 |
| 215 | 0 1 0 1 0 0 1 0 0 1 0 0 0 1 |
| 216 | 0 1 0 1 0 0 1 0 0 1 0 0 1 0 |
| 217 | 0 1 0 1 0 0 1 0 0 1 0 1 0 0 |
| 218 | 0 1 0 1 0 0 1 0 0 1 0 1 0 1 |
| 219 | 0 1 0 1 0 0 1 0 1 0 0 0 0 1 |
| 220 | 0 1 0 1 0 0 1 0 1 0 0 0 1 0 |
| 221 | 0 1 0 1 0 0 1 0 1 0 0 1 0 0 |
| 222 | 0 1 0 1 0 0 1 0 1 0 0 1 0 1 |
| 223 | 0 1 0 1 0 0 1 0 1 0 1 0 0 1 |
| 224 | 0 1 0 1 0 0 1 0 1 0 1 0 1 0 |
| 225 | 0 1 0 1 0 1 0 0 0 0 1 0 0 1 |
| 226 | 0 1 0 1 0 1 0 0 0 0 1 0 1 0 |
| 227 | 0 1 0 1 0 1 0 0 0 1 0 0 0 1 |
| 228 | 0 1 0 1 0 1 0 0 0 1 0 0 1 0 |
| 229 | 0 1 0 1 0 1 0 0 0 1 0 1 0 0 |
| 230 | 0 1 0 1 0 1 0 0 0 1 0 1 0 1 |
| 231 | 0 1 0 1 0 1 0 0 1 0 0 0 0 1 |
| 232 | 0 1 0 1 0 1 0 0 1 0 0 0 1 0 |
| 233 | 0 1 0 1 0 1 0 0 1 0 0 1 0 0 |
| 234 | 0 1 0 1 0 1 0 0 1 0 0 1 0 1 |
| 235 | 0 1 0 1 0 1 0 0 1 0 1 0 0 1 |
| 236 | 0 1 0 1 0 1 0 0 1 0 1 0 1 0 |
| 237 | 0 1 0 1 0 1 0 1 0 0 0 0 1 0 |
| 238 | 0 1 0 1 0 1 0 1 0 0 0 1 0 0 |
| 239 | 0 1 0 1 0 1 0 1 0 0 0 1 0 1 |
| 240 | 0 1 0 1 0 1 0 1 0 0 1 0 0 1 |
| 241 | 0 1 0 1 0 1 0 1 0 0 1 0 1 0 |
| 242 | 0 1 0 1 0 1 0 1 0 1 0 0 0 1 |
| 243 | 0 1 0 1 0 1 0 1 0 1 0 0 1 0 |

TABLE 32-continued

| NUMBER | 14-BIT CODE |
|---|---|
| 244 | 01010101010100 |
| 245 | 01010101010101 |
| 246 | 10000100001001 |
| 247 | 10000100001010 |
| 248 | 10000100010001 |
| 249 | 10000100010010 |
| 250 | 10000100010100 |
| 251 | 10000100010101 |
| 252 | 10000100100001 |
| 253 | 10000100100010 |
| 254 | 10000100100100 |
| 255 | 10000100100101 |
| 256 | 10000100101001 |
| 257 | 10000100101010 |
| 258 | 10000101000010 |
| 259 | 10000101000100 |
| 260 | 10000101000101 |
| 261 | 10000101001001 |
| 262 | 10000101001010 |
| 263 | 10000101010001 |
| 264 | 10000101010010 |
| 265 | 10000101010100 |
| 266 | 10000101010101 |
| 267 | 10001000010001 |
| 268 | 10001000010010 |
| 269 | 10001000010100 |
| 270 | 10001000010101 |
| 271 | 10001000100001 |
| 272 | 10001000100010 |
| 273 | 10001000100100 |
| 274 | 10001000100101 |
| 275 | 10001000101001 |
| 276 | 10001000101010 |
| 277 | 10001001000010 |
| 278 | 10001001000100 |
| 279 | 10001001000101 |
| 280 | 10001001001001 |
| 281 | 10001001001010 |
| 282 | 10001001010001 |
| 283 | 10001001010010 |
| 284 | 10001001010100 |
| 285 | 10001001010101 |
| 286 | 10001010000100 |
| 287 | 10001010000101 |
| 288 | 10001010001001 |
| 289 | 10001010001010 |
| 290 | 10001010010001 |
| 291 | 10001010010010 |
| 292 | 10001010010100 |
| 293 | 10001010010101 |
| 294 | 10001010100001 |
| 295 | 10001010100010 |
| 296 | 10001010100100 |
| 297 | 10001010100101 |
| 298 | 10001010101001 |
| 299 | 10001010101010 |
| 300 | 10010000100001 |
| 301 | 10010000100010 |
| 302 | 10010000100100 |
| 303 | 10010000100101 |
| 304 | 10010000101001 |
| 305 | 10010000101010 |
| 306 | 10010001000010 |
| 307 | 10010001000100 |
| 308 | 10010001000101 |
| 309 | 10010001001001 |
| 310 | 10010001001010 |
| 311 | 10010001010001 |
| 312 | 10010001010010 |
| 313 | 10010001010100 |
| 314 | 10010001010101 |
| 315 | 10010010000100 |
| 316 | 10010010000101 |
| 317 | 10010010001001 |
| 318 | 10010010001010 |
| 319 | 10010010010001 |
| 320 | 10010010010010 |
| 321 | 10010010010100 |
| 322 | 10010010010101 |
| 323 | 10010010100001 |
| 324 | 10010010100010 |

TABLE 32-continued

| NUMBER | 14-BIT CODE |
|---|---|
| 325 | 10010010100100 |
| 326 | 10010010100101 |
| 327 | 10010010101001 |
| 328 | 10010010101010 |
| 329 | 10010100001001 |
| 330 | 10010100001010 |
| 331 | 10010100010001 |
| 332 | 10010100010010 |
| 333 | 10010100010100 |
| 334 | 10010100010101 |
| 335 | 10010100100001 |
| 336 | 10010100100010 |
| 337 | 10010100100100 |
| 338 | 10010100100101 |
| 339 | 10010100101001 |
| 340 | 10010100101010 |
| 341 | 10010101000010 |
| 342 | 10010101000100 |
| 343 | 10010101000101 |
| 344 | 10010101001001 |
| 345 | 10010101001010 |
| 346 | 10010101010001 |
| 347 | 10010101010010 |
| 348 | 10010101010100 |
| 349 | 10010101010101 |
| 350 | 10100001000010 |
| 351 | 10100001000100 |
| 352 | 10100001000101 |
| 353 | 10100001001001 |
| 354 | 10100001001010 |
| 355 | 10100001010001 |
| 356 | 10100001010010 |
| 357 | 10100001010100 |
| 358 | 10100001010101 |
| 359 | 10100010000100 |
| 360 | 10100010000101 |
| 361 | 10100010001001 |
| 362 | 10100010001010 |
| 363 | 10100010010001 |
| 364 | 10100010010010 |
| 365 | 10100010010100 |
| 366 | 10100010010101 |
| 367 | 10100010100001 |
| 368 | 10100010100010 |
| 369 | 10100010100100 |
| 370 | 10100010100101 |
| 371 | 10100010101001 |
| 372 | 10100010101010 |
| 373 | 10100100001001 |
| 374 | 10100100001010 |
| 375 | 10100100010001 |
| 376 | 10100100010010 |
| 377 | 10100100010100 |
| 378 | 10100100010101 |
| 379 | 10100100100001 |
| 380 | 10100100100010 |
| 381 | 10100100100100 |
| 382 | 10100100100101 |
| 383 | 10100100101001 |
| 384 | 10100100101010 |
| 385 | 10100101000010 |
| 386 | 10100101000100 |
| 387 | 10100101000101 |
| 388 | 10100101001001 |
| 389 | 10100101001010 |
| 390 | 10100101010001 |
| 391 | 10100101010010 |
| 392 | 10100101010100 |
| 393 | 10100101010101 |
| 394 | 10101000010001 |
| 395 | 10101000010010 |
| 396 | 10101000010100 |
| 397 | 10101000010101 |
| 398 | 10101000100001 |
| 399 | 10101000100010 |
| 400 | 10101000100100 |
| 401 | 10101000100101 |
| 402 | 10101000101001 |
| 403 | 10101000101010 |
| 404 | 10101001000010 |
| 405 | 10101001000100 |

TABLE 32-continued

| NUMBER | 14-BIT CODE |
|---|---|
| 406 | 10101001000101 |
| 407 | 10101001001001 |
| 408 | 10101001001010 |
| 409 | 10101001010001 |
| 410 | 10101001010010 |
| 411 | 10101001010100 |
| 412 | 10101001010101 |
| 413 | 10101010000100 |
| 414 | 10101010000101 |
| 415 | 10101010001001 |
| 416 | 10101010001010 |
| 417 | 10101010010001 |
| 418 | 10101010010010 |
| 419 | 10101010010100 |
| 420 | 10101010010101 |
| 421 | 10101010100001 |
| 422 | 10101010100010 |
| 423 | 10101010100100 |
| 424 | 10101010100101 |
| 425 | 10101010101001 |
| 426 | 10101010101010 |

TABLE 33

| NUMBER | 14-BIT CODE |
|---|---|
| 1 | 00100001000010 |
| 2 | 00100001000100 |
| 3 | 00100001000101 |
| 4 | 00100001001001 |
| 5 | 00100001001010 |
| 6 | 00100001010001 |
| 7 | 00100001010010 |
| 8 | 00100001010100 |
| 9 | 00100001010101 |
| 10 | 00100010000100 |
| 11 | 00100010000101 |
| 12 | 00100010001001 |
| 13 | 00100010001010 |
| 14 | 00100010010001 |
| 15 | 00100010010010 |
| 16 | 00100010010100 |
| 17 | 00100010010101 |
| 18 | 00100010100001 |
| 19 | 00100010100010 |
| 20 | 00100010100100 |
| 21 | 00100010100101 |
| 22 | 00100010101001 |
| 23 | 00100010101010 |
| 24 | 00100100001001 |
| 25 | 00100100001010 |
| 26 | 00100100010001 |
| 27 | 00100100010010 |
| 28 | 00100100010100 |
| 29 | 00100100010101 |
| 30 | 00100100100001 |
| 31 | 00100100100010 |
| 32 | 00100100100100 |
| 33 | 00100100100101 |
| 34 | 00100100101001 |
| 35 | 00100100101010 |
| 36 | 00100101000010 |
| 37 | 00100101000100 |
| 38 | 00100101000101 |
| 39 | 00100101001001 |
| 40 | 00100101001010 |
| 41 | 00100101010001 |
| 42 | 00100101010010 |
| 43 | 00100101010100 |
| 44 | 00100101010101 |
| 45 | 00101000010001 |
| 46 | 00101000010010 |
| 47 | 00101000010100 |
| 48 | 00101000010101 |
| 49 | 00101000100001 |
| 50 | 00101000100010 |
| 51 | 00101000100100 |
| 52 | 00101000100101 |
| 53 | 00101000101001 |
| 54 | 00101000101010 |

TABLE 33-continued

| NUMBER | 14-BIT CODE |
|---|---|
| 55 | 00101001000010 |
| 56 | 00101001000100 |
| 57 | 00101001000101 |
| 58 | 00101001001001 |
| 59 | 00101001001010 |
| 60 | 00101001010001 |
| 61 | 00101001010010 |
| 62 | 00101001010100 |
| 63 | 00101001010101 |
| 64 | 00101010000100 |
| 65 | 00101010000101 |
| 66 | 00101010001001 |
| 67 | 00101010001010 |
| 68 | 00101010010001 |
| 69 | 00101010010010 |
| 70 | 00101010010100 |
| 71 | 00101010010101 |
| 72 | 00101010100001 |
| 73 | 00101010100010 |
| 74 | 00101010100100 |
| 75 | 00101010100101 |
| 76 | 00101010101001 |
| 77 | 00101010101010 |
| 78 | 01000010000100 |
| 79 | 01000010000101 |
| 80 | 01000010001001 |
| 81 | 01000010001010 |
| 82 | 01000010010001 |
| 83 | 01000010010010 |
| 84 | 01000010010100 |
| 85 | 01000010010101 |
| 86 | 01000010100001 |
| 87 | 01000010100010 |
| 88 | 01000010100100 |
| 89 | 01000010100101 |
| 90 | 01000010101001 |
| 91 | 01000010101010 |
| 92 | 01000100001001 |
| 93 | 01000100001010 |
| 94 | 01000100010001 |
| 95 | 01000100010010 |
| 96 | 01000100010100 |
| 97 | 01000100010101 |
| 98 | 01000100100001 |
| 99 | 01000100100010 |
| 100 | 01000100100100 |
| 101 | 01000100100101 |
| 102 | 01000100101001 |
| 103 | 01000100101010 |
| 104 | 01000101000010 |
| 105 | 01000101000100 |
| 106 | 01000101000101 |
| 107 | 01000101001001 |
| 108 | 01000101001010 |
| 109 | 01000101010001 |
| 110 | 01000101010010 |
| 111 | 01000101010100 |
| 112 | 01000101010101 |
| 113 | 01001000010001 |
| 114 | 01001000010010 |
| 115 | 01001000010100 |
| 116 | 01001000010101 |
| 117 | 01001000100001 |
| 118 | 01001000100010 |
| 119 | 01001000100100 |
| 120 | 01001000100101 |
| 121 | 01001000101001 |
| 122 | 01001000101010 |
| 123 | 01001001000010 |
| 124 | 01001001000100 |
| 125 | 01001001000101 |
| 126 | 01001001001001 |
| 127 | 01001001001010 |
| 128 | 01001001010001 |
| 129 | 01001001010010 |
| 130 | 01001001010100 |
| 131 | 01001001010101 |
| 132 | 01001010000100 |
| 133 | 01001010000101 |
| 134 | 01001010001001 |
| 135 | 01001010001010 |

TABLE 33-continued

| NUMBER | 14-BIT CODE |
|---|---|
| 136 | 0 1 0 0 1 0 1 0 0 1 0 0 0 1 |
| 137 | 0 1 0 0 1 0 1 0 0 1 0 0 1 0 |
| 138 | 0 1 0 0 1 0 1 0 0 1 0 1 0 0 |
| 139 | 0 1 0 0 1 0 1 0 0 1 0 1 0 1 |
| 140 | 0 1 0 0 1 0 1 0 1 0 0 0 0 1 |
| 141 | 0 1 0 0 1 0 1 0 1 0 0 0 1 0 |
| 142 | 0 1 0 0 1 0 1 0 1 0 0 1 0 0 |
| 143 | 0 1 0 0 1 0 1 0 1 0 0 1 0 1 |
| 144 | 0 1 0 0 1 0 1 0 1 0 1 0 0 1 |
| 145 | 0 1 0 0 1 0 1 0 1 0 1 0 1 0 |
| 146 | 0 1 0 1 0 0 0 0 1 0 0 0 0 1 |
| 147 | 0 1 0 1 0 0 0 0 1 0 0 0 1 0 |
| 148 | 0 1 0 1 0 0 0 0 1 0 0 1 0 0 |
| 149 | 0 1 0 1 0 0 0 0 1 0 0 1 0 1 |
| 150 | 0 1 0 1 0 0 0 0 1 0 1 0 0 1 |
| 151 | 0 1 0 1 0 0 0 0 1 0 1 0 1 0 |
| 152 | 0 1 0 1 0 0 0 1 0 0 0 0 1 0 |
| 153 | 0 1 0 1 0 0 0 1 0 0 0 1 0 0 |
| 154 | 0 1 0 1 0 0 0 1 0 0 0 1 0 1 |
| 155 | 0 1 0 1 0 0 0 1 0 0 1 0 0 1 |
| 156 | 0 1 0 1 0 0 0 1 0 0 1 0 1 0 |
| 157 | 0 1 0 1 0 0 0 1 0 1 0 0 0 1 |
| 158 | 0 1 0 1 0 0 0 1 0 1 0 0 1 0 |
| 159 | 0 1 0 1 0 0 0 1 0 1 0 1 0 0 |
| 160 | 0 1 0 1 0 0 0 1 0 1 0 1 0 1 |
| 161 | 0 1 0 1 0 0 1 0 0 0 0 1 0 0 |
| 162 | 0 1 0 1 0 0 1 0 0 0 0 1 0 1 |
| 163 | 0 1 0 1 0 0 1 0 0 0 1 0 0 1 |
| 164 | 0 1 0 1 0 0 1 0 0 0 1 0 1 0 |
| 165 | 0 1 0 1 0 0 1 0 0 1 0 0 0 1 |
| 166 | 0 1 0 1 0 0 1 0 0 1 0 0 1 0 |
| 167 | 0 1 0 1 0 0 1 0 0 1 0 1 0 0 |
| 168 | 0 1 0 1 0 0 1 0 0 1 0 1 0 1 |
| 169 | 0 1 0 1 0 0 1 0 1 0 0 0 0 1 |
| 170 | 0 1 0 1 0 0 1 0 1 0 0 0 1 0 |
| 171 | 0 1 0 1 0 0 1 0 1 0 0 1 0 0 |
| 172 | 0 1 0 1 0 0 1 0 1 0 0 1 0 1 |
| 173 | 0 1 0 1 0 0 1 0 1 0 1 0 0 1 |
| 174 | 0 1 0 1 0 0 1 0 1 0 1 0 1 0 |
| 175 | 0 1 0 1 0 1 0 0 0 0 1 0 0 1 |
| 176 | 0 1 0 1 0 1 0 0 0 0 1 0 1 0 |
| 177 | 0 1 0 1 0 1 0 0 0 1 0 0 0 1 |
| 178 | 0 1 0 1 0 1 0 0 0 1 0 0 1 0 |
| 179 | 0 1 0 1 0 1 0 0 0 1 0 1 0 0 |
| 180 | 0 1 0 1 0 1 0 0 0 1 0 1 0 1 |
| 181 | 0 1 0 1 0 1 0 0 1 0 0 0 0 1 |
| 182 | 0 1 0 1 0 1 0 0 1 0 0 0 1 0 |
| 183 | 0 1 0 1 0 1 0 0 1 0 0 1 0 0 |
| 184 | 0 1 0 1 0 1 0 0 1 0 0 1 0 1 |
| 185 | 0 1 0 1 0 1 0 0 1 0 1 0 0 1 |
| 186 | 0 1 0 1 0 1 0 0 1 0 1 0 1 0 |
| 187 | 0 1 0 1 0 1 0 1 0 0 0 0 1 0 |
| 188 | 0 1 0 1 0 1 0 1 0 0 0 1 0 0 |
| 189 | 0 1 0 1 0 1 0 1 0 0 0 1 0 1 |
| 190 | 0 1 0 1 0 1 0 1 0 0 1 0 0 1 |
| 191 | 0 1 0 1 0 1 0 1 0 0 1 0 1 0 |
| 192 | 0 1 0 1 0 1 0 1 0 1 0 0 0 1 |
| 193 | 0 1 0 1 0 1 0 1 0 1 0 0 1 0 |
| 194 | 0 1 0 1 0 1 0 1 0 1 0 1 0 0 |
| 195 | 0 1 0 1 0 1 0 1 0 1 0 1 0 1 |
| 196 | 1 0 0 0 0 1 0 0 0 0 1 0 0 1 |
| 197 | 1 0 0 0 0 1 0 0 0 0 1 0 1 0 |
| 198 | 1 0 0 0 0 1 0 0 0 1 0 0 0 1 |
| 199 | 1 0 0 0 0 1 0 0 0 1 0 0 1 0 |
| 200 | 1 0 0 0 0 1 0 0 0 1 0 1 0 0 |
| 201 | 1 0 0 0 0 1 0 0 0 1 0 1 0 1 |
| 202 | 1 0 0 0 0 1 0 0 1 0 0 0 0 1 |
| 203 | 1 0 0 0 0 1 0 0 1 0 0 0 1 0 |
| 204 | 1 0 0 0 0 1 0 0 1 0 0 1 0 0 |
| 205 | 1 0 0 0 0 1 0 0 1 0 0 1 0 1 |
| 206 | 1 0 0 0 0 1 0 0 1 0 1 0 0 1 |
| 207 | 1 0 0 0 0 1 0 0 1 0 1 0 1 0 |
| 208 | 1 0 0 0 0 1 0 1 0 0 0 0 1 0 |
| 209 | 1 0 0 0 0 1 0 1 0 0 0 1 0 0 |
| 210 | 1 0 0 0 0 1 0 1 0 0 0 1 0 1 |
| 211 | 1 0 0 0 0 1 0 1 0 0 1 0 0 1 |
| 212 | 1 0 0 0 0 1 0 1 0 0 1 0 1 0 |
| 213 | 1 0 0 0 0 1 0 1 0 1 0 0 0 1 |
| 214 | 1 0 0 0 0 1 0 1 0 1 0 0 1 0 |
| 215 | 1 0 0 0 0 1 0 1 0 1 0 1 0 0 |
| 216 | 1 0 0 0 0 1 0 1 0 1 0 1 0 1 |

TABLE 33-continued

| NUMBER | 14-BIT CODE |
|---|---|
| 217 | 1 0 0 0 1 0 0 0 0 1 0 0 0 1 |
| 218 | 1 0 0 0 1 0 0 0 0 1 0 0 1 0 |
| 219 | 1 0 0 0 1 0 0 0 0 1 0 1 0 0 |
| 220 | 1 0 0 0 1 0 0 0 0 1 0 1 0 1 |
| 221 | 1 0 0 0 1 0 0 0 1 0 0 0 0 1 |
| 222 | 1 0 0 0 1 0 0 0 1 0 0 0 1 0 |
| 223 | 1 0 0 0 1 0 0 0 1 0 0 1 0 0 |
| 224 | 1 0 0 0 1 0 0 0 1 0 0 1 0 1 |
| 225 | 1 0 0 0 1 0 0 0 1 0 1 0 0 1 |
| 226 | 1 0 0 0 1 0 0 0 1 0 1 0 1 0 |
| 227 | 1 0 0 0 1 0 0 1 0 0 0 0 1 0 |
| 228 | 1 0 0 0 1 0 0 1 0 0 0 1 0 0 |
| 229 | 1 0 0 0 1 0 0 1 0 0 0 1 0 1 |
| 230 | 1 0 0 0 1 0 0 1 0 0 1 0 0 1 |
| 231 | 1 0 0 0 1 0 0 1 0 0 1 0 1 0 |
| 232 | 1 0 0 0 1 0 0 1 0 1 0 0 0 1 |
| 233 | 1 0 0 0 1 0 0 1 0 1 0 0 1 0 |
| 234 | 1 0 0 0 1 0 0 1 0 1 0 1 0 0 |
| 235 | 1 0 0 0 1 0 0 1 0 1 0 1 0 1 |
| 236 | 1 0 0 0 1 0 1 0 0 0 0 1 0 0 |
| 237 | 1 0 0 0 1 0 1 0 0 0 0 1 0 1 |
| 238 | 1 0 0 0 1 0 1 0 0 0 1 0 0 1 |
| 239 | 1 0 0 0 1 0 1 0 0 0 1 0 1 0 |
| 240 | 1 0 0 0 1 0 1 0 0 1 0 0 0 1 |
| 241 | 1 0 0 0 1 0 1 0 0 1 0 0 1 0 |
| 242 | 1 0 0 0 1 0 1 0 0 1 0 1 0 0 |
| 243 | 1 0 0 0 1 0 1 0 0 1 0 1 0 1 |
| 244 | 1 0 0 0 1 0 1 0 1 0 0 0 0 1 |
| 245 | 1 0 0 0 1 0 1 0 1 0 0 0 1 0 |
| 246 | 1 0 0 0 1 0 1 0 1 0 0 1 0 0 |
| 247 | 1 0 0 0 1 0 1 0 1 0 0 1 0 1 |
| 248 | 1 0 0 0 1 0 1 0 1 0 1 0 0 1 |
| 249 | 1 0 0 0 1 0 1 0 1 0 1 0 1 0 |
| 250 | 1 0 0 1 0 0 0 0 1 0 0 0 0 1 |
| 251 | 1 0 0 1 0 0 0 0 1 0 0 0 1 0 |
| 252 | 1 0 0 1 0 0 0 0 1 0 0 1 0 0 |
| 253 | 1 0 0 1 0 0 0 0 1 0 0 1 0 1 |
| 254 | 1 0 0 1 0 0 0 0 1 0 1 0 0 1 |
| 255 | 1 0 0 1 0 0 0 0 1 0 1 0 1 0 |
| 256 | 1 0 0 1 0 0 0 1 0 0 0 0 1 0 |
| 257 | 1 0 0 1 0 0 0 1 0 0 0 1 0 0 |
| 258 | 1 0 0 1 0 0 0 1 0 0 0 1 0 1 |
| 259 | 1 0 0 1 0 0 0 1 0 0 1 0 0 1 |
| 260 | 1 0 0 1 0 0 0 1 0 0 1 0 1 0 |
| 261 | 1 0 0 1 0 0 0 1 0 1 0 0 0 1 |
| 262 | 1 0 0 1 0 0 0 1 0 1 0 0 1 0 |
| 263 | 1 0 0 1 0 0 0 1 0 1 0 1 0 0 |
| 264 | 1 0 0 1 0 0 0 1 0 1 0 1 0 1 |
| 265 | 1 0 0 1 0 0 1 0 0 0 0 1 0 0 |
| 266 | 1 0 0 1 0 0 1 0 0 0 0 1 0 1 |
| 267 | 1 0 0 1 0 0 1 0 0 0 1 0 0 1 |
| 268 | 1 0 0 1 0 0 1 0 0 0 1 0 1 0 |
| 269 | 1 0 0 1 0 0 1 0 0 1 0 0 0 1 |
| 270 | 1 0 0 1 0 0 1 0 0 1 0 0 1 0 |
| 271 | 1 0 0 1 0 0 1 0 0 1 0 1 0 0 |
| 272 | 1 0 0 1 0 0 1 0 0 1 0 1 0 1 |
| 273 | 1 0 0 1 0 0 1 0 1 0 0 0 0 1 |
| 274 | 1 0 0 1 0 0 1 0 1 0 0 0 1 0 |
| 275 | 1 0 0 1 0 0 1 0 1 0 0 1 0 0 |
| 276 | 1 0 0 1 0 0 1 0 1 0 0 1 0 1 |
| 277 | 1 0 0 1 0 0 1 0 1 0 1 0 0 1 |
| 278 | 1 0 0 1 0 0 1 0 1 0 1 0 1 0 |
| 279 | 1 0 0 1 0 1 0 0 0 0 1 0 0 1 |
| 280 | 1 0 0 1 0 1 0 0 0 0 1 0 1 0 |
| 281 | 1 0 0 1 0 1 0 0 0 1 0 0 0 1 |
| 282 | 1 0 0 1 0 1 0 0 0 1 0 0 1 0 |
| 283 | 1 0 0 1 0 1 0 0 0 1 0 1 0 0 |
| 284 | 1 0 0 1 0 1 0 0 0 1 0 1 0 1 |
| 285 | 1 0 0 1 0 1 0 0 1 0 0 0 0 1 |
| 286 | 1 0 0 1 0 1 0 0 1 0 0 0 1 0 |
| 287 | 1 0 0 1 0 1 0 0 1 0 0 1 0 0 |
| 288 | 1 0 0 1 0 1 0 0 1 0 0 1 0 1 |
| 289 | 1 0 0 1 0 1 0 0 1 0 1 0 0 1 |
| 290 | 1 0 0 1 0 1 0 0 1 0 1 0 1 0 |
| 291 | 1 0 0 1 0 1 0 1 0 0 0 0 1 0 |
| 292 | 1 0 0 1 0 1 0 1 0 0 0 1 0 0 |
| 293 | 1 0 0 1 0 1 0 1 0 0 0 1 0 1 |
| 294 | 1 0 0 1 0 1 0 1 0 0 1 0 0 1 |
| 295 | 1 0 0 1 0 1 0 1 0 0 1 0 1 0 |
| 296 | 1 0 0 1 0 1 0 1 0 1 0 0 0 1 |
| 297 | 1 0 0 1 0 1 0 1 0 1 0 0 1 0 |

TABLE 33-continued

| NUMBER | 14-BIT CODE |
|---|---|
| 298 | 1 0 0 1 0 1 0 1 0 1 0 1 0 0 |
| 299 | 1 0 0 1 0 1 0 1 0 1 0 1 0 1 |
| 300 | 1 0 1 0 0 0 0 1 0 0 0 0 1 0 |
| 301 | 1 0 1 0 0 0 0 1 0 0 0 1 0 0 |
| 302 | 1 0 1 0 0 0 0 1 0 0 0 1 0 1 |
| 303 | 1 0 1 0 0 0 0 1 0 0 1 0 0 1 |
| 304 | 1 0 1 0 0 0 0 1 0 0 1 0 1 0 |
| 305 | 1 0 1 0 0 0 0 1 0 1 0 0 0 1 |
| 306 | 1 0 1 0 0 0 0 1 0 1 0 0 1 0 |
| 307 | 1 0 1 0 0 0 0 1 0 1 0 1 0 0 |
| 308 | 1 0 1 0 0 0 0 1 0 1 0 1 0 1 |
| 309 | 1 0 1 0 0 0 1 0 0 0 0 1 0 0 |
| 310 | 1 0 1 0 0 0 1 0 0 0 0 1 0 1 |
| 311 | 1 0 1 0 0 0 1 0 0 0 1 0 0 1 |
| 312 | 1 0 1 0 0 0 1 0 0 0 1 0 1 0 |
| 313 | 1 0 1 0 0 0 1 0 0 1 0 0 0 1 |
| 314 | 1 0 1 0 0 0 1 0 0 1 0 0 1 0 |
| 315 | 1 0 1 0 0 0 1 0 0 1 0 1 0 0 |
| 316 | 1 0 1 0 0 0 1 0 0 1 0 1 0 1 |
| 317 | 1 0 1 0 0 0 1 0 1 0 0 0 0 1 |
| 318 | 1 0 1 0 0 0 1 0 1 0 0 0 1 0 |
| 319 | 1 0 1 0 0 0 1 0 1 0 0 1 0 0 |
| 320 | 1 0 1 0 0 0 1 0 1 0 0 1 0 1 |
| 321 | 1 0 1 0 0 0 1 0 1 0 1 0 0 1 |
| 322 | 1 0 1 0 0 0 1 0 1 0 1 0 1 0 |
| 323 | 1 0 1 0 0 1 0 0 0 0 1 0 0 1 |
| 324 | 1 0 1 0 0 1 0 0 0 0 1 0 1 0 |
| 325 | 1 0 1 0 0 1 0 0 0 1 0 0 0 1 |
| 326 | 1 0 1 0 0 1 0 0 0 1 0 0 1 0 |
| 327 | 1 0 1 0 0 1 0 0 0 1 0 1 0 0 |
| 328 | 1 0 1 0 0 1 0 0 0 1 0 1 0 1 |
| 329 | 1 0 1 0 0 1 0 0 1 0 0 0 0 1 |
| 330 | 1 0 1 0 0 1 0 0 1 0 0 0 1 0 |
| 331 | 1 0 1 0 0 1 0 0 1 0 0 1 0 0 |
| 332 | 1 0 1 0 0 1 0 0 1 0 0 1 0 1 |
| 333 | 1 0 1 0 0 1 0 0 1 0 1 0 0 1 |
| 334 | 1 0 1 0 0 1 0 0 1 0 1 0 1 0 |
| 335 | 1 0 1 0 0 1 0 1 0 0 0 0 1 0 |
| 336 | 1 0 1 0 0 1 0 1 0 0 0 1 0 0 |
| 337 | 1 0 1 0 0 1 0 1 0 0 0 1 0 1 |
| 338 | 1 0 1 0 0 1 0 1 0 0 1 0 0 1 |
| 339 | 1 0 1 0 0 1 0 1 0 0 1 0 1 0 |
| 340 | 1 0 1 0 0 1 0 1 0 1 0 0 0 1 |
| 341 | 1 0 1 0 0 1 0 1 0 1 0 0 1 0 |
| 342 | 1 0 1 0 0 1 0 1 0 1 0 1 0 0 |
| 343 | 1 0 1 0 0 1 0 1 0 1 0 1 0 1 |
| 344 | 1 0 1 0 1 0 0 0 0 1 0 0 0 1 |
| 345 | 1 0 1 0 1 0 0 0 0 1 0 0 1 0 |
| 346 | 1 0 1 0 1 0 0 0 0 1 0 1 0 0 |
| 347 | 1 0 1 0 1 0 0 0 0 1 0 1 0 1 |
| 348 | 1 0 1 0 1 0 0 0 1 0 0 0 0 1 |
| 349 | 1 0 1 0 1 0 0 0 1 0 0 0 1 0 |
| 350 | 1 0 1 0 1 0 0 0 1 0 0 1 0 0 |
| 351 | 1 0 1 0 1 0 0 0 1 0 0 1 0 1 |
| 352 | 1 0 1 0 1 0 0 0 1 0 1 0 0 1 |
| 353 | 1 0 1 0 1 0 0 0 1 0 1 0 1 0 |
| 354 | 1 0 1 0 1 0 0 1 0 0 0 0 1 0 |
| 355 | 1 0 1 0 1 0 0 1 0 0 0 1 0 0 |
| 356 | 1 0 1 0 1 0 0 1 0 0 0 1 0 1 |
| 357 | 1 0 1 0 1 0 0 1 0 0 1 0 0 1 |
| 358 | 1 0 1 0 1 0 0 1 0 0 1 0 1 0 |
| 359 | 1 0 1 0 1 0 0 1 0 1 0 0 0 1 |
| 360 | 1 0 1 0 1 0 0 1 0 1 0 0 1 0 |
| 361 | 1 0 1 0 1 0 0 1 0 1 0 1 0 0 |
| 362 | 1 0 1 0 1 0 0 1 0 1 0 1 0 1 |
| 363 | 1 0 1 0 1 0 1 0 0 0 0 1 0 0 |
| 364 | 1 0 1 0 1 0 1 0 0 0 0 1 0 1 |
| 365 | 1 0 1 0 1 0 1 0 0 0 1 0 0 1 |
| 366 | 1 0 1 0 1 0 1 0 0 0 1 0 1 0 |
| 367 | 1 0 1 0 1 0 1 0 0 1 0 0 0 1 |
| 368 | 1 0 1 0 1 0 1 0 0 1 0 0 1 0 |
| 369 | 1 0 1 0 1 0 1 0 0 1 0 1 0 0 |
| 370 | 1 0 1 0 1 0 1 0 0 1 0 1 0 1 |
| 371 | 1 0 1 0 1 0 1 0 1 0 0 0 0 1 |
| 372 | 1 0 1 0 1 0 1 0 1 0 0 0 1 0 |
| 373 | 1 0 1 0 1 0 1 0 1 0 0 1 0 0 |
| 374 | 1 0 1 0 1 0 1 0 1 0 0 1 0 1 |
| 375 | 1 0 1 0 1 0 1 0 1 0 1 0 0 1 |
| 376 | 1 0 1 0 1 0 1 0 1 0 1 0 1 0 |

Figure 27:
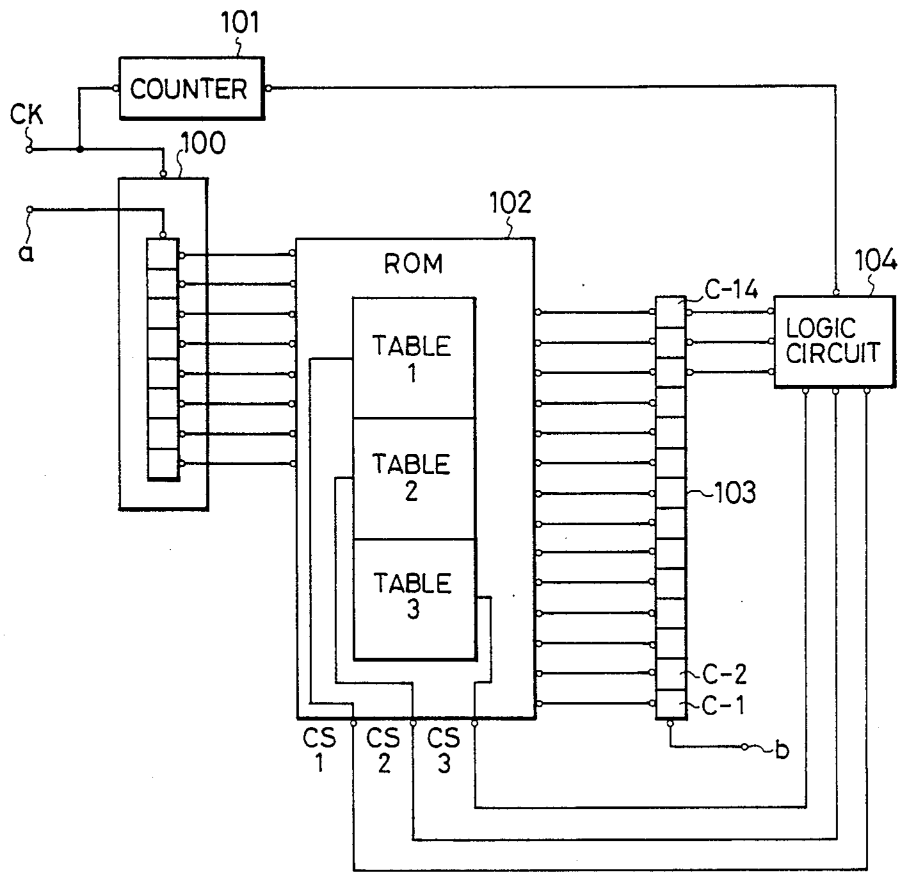
FIG. 27 is an arrangement block diagram of the conversion from 8 bits to 14 bits.

FIG. 27 is an arrangement block diagram for encoding of the present invention. In FIG. 27, a data sequence is inputted from ⓐ. This data sequence is inputted to the 8-bit shift register 100. CK is the input terminal of the clock to drive the shift register 100. This clock signal is also simultaneously inputted to the counter 101. The counter 101 generates a pulse whenever eight clocks are counted and this pulse is inputted (CS) to the logic circuit 104. The last three bits of the 14-bit code are observed. When the last one bit C-14 is "1", the chip selecting terminal $CS_1$ to select Table 1 in the ROM 102 is set to ON. When the last two bits C-13 and C-14 are "1 0", the chip selecting terminal $CS_2$ to select Table 2 is set to ON. When the last three bits C-12, C-13 and C-14 are "1 0 0", the chip selecting terminal $CS_3$ to select Table 3 is set to ON. The timing when each chip selecting terminal is set to ON is based on the time when the pulse is inputted from the counter 101 to the logic circuit 104. It is obvious that such a logic circuit 104 can be easily realized.

As described above, either one of Table 1 to 3 is selected and at this time, the 8-bit data in the 8-bit shift register 100 is taken in the ROM 102. The address in the table corresponding to the data is designated. In Table 1, 256 14-bit codes which were arbitrarily selected from Table 31 are stored. In Table 2, 256 14-bit codes which were arbitrarily selected from Table 32 are stored. In Table 3, 256 14-bit codes which were arbitrarily selected from Table 33 are stored. When the address in the table corresponding to the data is designated, the 14-bit code stored in that address is inputted to the shift register 103 and is outputted from the code output terminal b . In this case, the last three bits, i.e., C-12, C-13 and C-14 of the 14-bit code are observed by the logic circuit 104, thereby determining the table to be selected next. In this way, the conversion from the data to the code, namely, the encoding is finished. The conversion from the code to the data which is performed on the reproducing side, namely, the decoding may be attained by performing the conversion opposite to the foregoing conversion for encoding.

As described above, the coding system of the invention is the (8, 14, 14) coding system and $$T_{min}=1.14T$$

$$T_{max}=2.86T$$

$$T_W=0.57T$$

Consequently, the present system has effects such that: the $T_W$ is larger than that of the MFM or 3PM system; the $T_{max}$ is smaller and the decoding error rate is smaller than those in the 3PM system; the low frequency component is small; and the synchronization can be more easily obtained as compared with the 3PM system. Therefore, it is possible to provide an electronic apparatus in which the recording and/or reproduction can be performed with a high density and a high degree of accuracy.

[8→16]

In case of converting the 8-bit data to the 16-bit code, when the last one bit of the one-preceding code is "1", 256 16-bit codes shown in Table 34 are made coordinate with the $2^8=256$ 8-bit data so as to satisfy the one-to-one corresponding relation. When the last two bits of the one-preceding code are "1 0", arbitrary 256 16-bit codes among the 375 16-bit codes shown in Table 35 are made coordinate with those 256 data so as to satisfy the one-to one corresponding relation. When the last three bits of the one-preceding code are "1 0 0", arbitrary 256 16-bit codes among the 546 16-bit codes shown in Table 36 are made coordinate with those 256 data so as to satisfy the one-to-one corresponding relation. When the last four bits of the one-preceding code are "1 0 0 0", arbitrary 256 16-bit among the 537 16-bit codes shown in Table 37 are made coordinate with those 256 data so as to satisfy the one-to-one corresponding relation. On one hand, when the last five bits of the one-preceding code are "1 0 0 0 0 0", arbitrary 256 16-bit codes among the 524 16-bit codes shown in Table 38 are made coordinate with those 256 data so as to satisfy the one-to-one corresponding relation. When the last six bits are "1 0 0 0 0 0", arbitrary 256 16-bit codes among the 506 16-bit codes shown in Table 39 are made coordinate with those 256 data so as to satisfy the one-to-one corresponding relation. When the last seven bits are "1 0 0 0 0 0 0", arbitrary 256 16-bit codes among the 479 16-bit codes shown in Table 40 are made coordinate with those 256 data so as to satisfy the one-to-one corresponding relation. Further, when the last eight bits of the one-preceding code are "1 0 0 0 0 0 0 0", arbitrary 256 16-bit codes among the 439 16-bit codes shown in Table 41 are made coordinate with those 256 data so as to satisfy the one-to-one corresponding relation. When the last nine bits are "1 0 0 0 0 0 0 0 0", arbitrary 256 16-bit codes among the 382 16-bit codes shown in Table 42 are made coordinate with those 256 data so as to satisfy the one-to-one corresponding relation.

in the initial state in that the codes start, the above-mentioned one-preceding code does not exist. However, in this case, it is assumed that the encoding is performed by specifying the state to either one of the conditions whereby: the last one bit of the one-preceding code is "1"; the last two bits are "1 0"; the last three bits are "1 0 0"; the last four bits are "1 0 0 0"; the last five bits are "1 0 0 0 0 "; the last six bits are "1 0 0 0 0 0: the last seven bits are "1 0 0 0 0 0 0"; the last eight bits are "1 0 0 0 0 0 0 0"; and the last nine bits are "1 0 0 0 0 0 0 0 0".

TABLE 34

| NUMBER | 16-BIT CODE |
|---|---|
| 1 | 0 0 0 0 0 0 0 0 0 0 1 0 0 0 0 0 |
| 2 | 0 0 0 0 0 0 0 0 0 0 1 0 0 0 0 1 |
| 3 | 0 0 0 0 0 0 0 0 0 0 1 0 0 0 1 0 |
| 4 | 0 0 0 0 0 0 0 0 0 0 1 0 0 1 0 0 |
| 5 | 0 0 0 0 0 0 0 0 0 1 0 0 0 0 0 0 |
| 6 | 0 0 0 0 0 0 0 0 0 1 0 0 0 0 0 1 |
| 7 | 0 0 0 0 0 0 0 0 0 1 0 0 0 0 1 0 |
| 8 | 0 0 0 0 0 0 0 0 0 1 0 0 0 1 0 0 |
| 9 | 0 0 0 0 0 0 0 0 0 1 0 0 1 0 0 0 |
| 10 | 0 0 0 0 0 0 0 0 0 1 0 0 1 0 0 1 |
| 11 | 0 0 0 0 0 0 0 0 1 0 0 0 0 0 0 0 |
| 12 | 0 0 0 0 0 0 0 0 1 0 0 0 0 0 0 1 |
| 13 | 0 0 0 0 0 0 0 0 1 0 0 0 0 0 1 0 |
| 14 | 0 0 0 0 0 0 0 0 1 0 0 0 0 1 0 0 |
| 15 | 0 0 0 0 0 0 0 0 1 0 0 0 1 0 0 0 |
| 16 | 0 0 0 0 0 0 0 0 1 0 0 0 1 0 0 1 |
| 17 | 0 0 0 0 0 0 0 0 1 0 0 1 0 0 0 0 |
| 18 | 0 0 0 0 0 0 0 0 1 0 0 1 0 0 0 1 |
| 19 | 0 0 0 0 0 0 0 0 1 0 0 1 0 0 1 0 |
| 20 | 0 0 0 0 0 0 0 1 0 0 0 0 0 0 0 0 |
| 21 | 0 0 0 0 0 0 0 1 0 0 0 0 0 0 0 1 |
| 22 | 0 0 0 0 0 0 0 1 0 0 0 0 0 0 1 0 |
| 23 | 0 0 0 0 0 0 0 1 0 0 0 0 0 1 0 0 |
| 24 | 0 0 0 0 0 0 0 1 0 0 0 0 1 0 0 0 |
| 25 | 0 0 0 0 0 0 0 1 0 0 0 0 1 0 0 1 |
| 26 | 0 0 0 0 0 0 0 1 0 0 0 1 0 0 0 0 |
| 27 | 0 0 0 0 0 0 0 1 0 0 0 1 0 0 0 1 |
| 28 | 0 0 0 0 0 0 0 1 0 0 0 1 0 0 1 0 |
| 29 | 0 0 0 0 0 0 0 1 0 0 1 0 0 0 0 0 |
| 30 | 0 0 0 0 0 0 0 1 0 0 1 0 0 0 0 1 |
| 31 | 0 0 0 0 0 0 0 1 0 0 1 0 0 0 1 0 |
| 32 | 0 0 0 0 0 0 0 1 0 0 1 0 0 1 0 0 |
| 33 | 0 0 0 0 0 0 1 0 0 0 0 0 0 0 0 1 |
| 34 | 0 0 0 0 0 0 1 0 0 0 0 0 0 0 1 0 |
| 35 | 0 0 0 0 0 0 1 0 0 0 0 0 0 1 0 0 |
| 36 | 0 0 0 0 0 0 1 0 0 0 0 0 1 0 0 0 |
| 37 | 0 0 0 0 0 0 1 0 0 0 0 0 1 0 0 1 |
| 38 | 0 0 0 0 0 0 1 0 0 0 0 1 0 0 0 0 |
| 39 | 0 0 0 0 0 0 1 0 0 0 0 1 0 0 0 1 |
| 40 | 0 0 0 0 0 0 1 0 0 0 0 1 0 0 1 0 |
| 41 | 0 0 0 0 0 0 1 0 0 0 1 0 0 0 0 0 |
| 42 | 0 0 0 0 0 0 1 0 0 0 1 0 0 0 0 1 |
| 43 | 0 0 0 0 0 0 1 0 0 0 1 0 0 0 1 0 |
| 44 | 0 0 0 0 0 0 1 0 0 0 1 0 0 1 0 0 |
| 45 | 0 0 0 0 0 0 1 0 0 1 0 0 0 0 0 0 |
| 46 | 0 0 0 0 0 0 1 0 0 1 0 0 0 0 0 1 |
| 47 | 0 0 0 0 0 0 1 0 0 1 0 0 0 0 1 0 |
| 48 | 0 0 0 0 0 0 1 0 0 1 0 0 0 1 0 0 |
| 49 | 0 0 0 0 0 0 1 0 0 1 0 0 1 0 0 0 |
| 50 | 0 0 0 0 0 0 1 0 0 1 0 0 1 0 0 1 |
| 51 | 0 0 0 0 0 1 0 0 0 0 0 0 0 0 0 1 |
| 52 | 0 0 0 0 0 1 0 0 0 0 0 0 0 0 1 0 |
| 53 | 0 0 0 0 0 1 0 0 0 0 0 0 0 1 0 0 |
| 54 | 0 0 0 0 0 1 0 0 0 0 0 1 0 0 0 0 |
| 55 | 0 0 0 0 0 1 0 0 0 0 0 1 0 0 0 1 |
| 56 | 0 0 0 0 0 1 0 0 0 0 0 1 0 0 0 0 |
| 57 | 0 0 0 0 0 1 0 0 0 0 0 1 0 0 0 1 |
| 58 | 0 0 0 0 0 1 0 0 0 0 0 1 0 0 1 0 |
| 59 | 0 0 0 0 0 1 0 0 0 0 1 0 0 0 0 0 |
| 60 | 0 0 0 0 0 1 0 0 0 0 1 0 0 0 0 1 |
| 61 | 0 0 0 0 0 1 0 0 0 0 1 0 0 0 1 0 |
| 62 | 0 0 0 0 0 1 0 0 0 0 1 0 0 1 0 0 |
| 63 | 0 0 0 0 0 1 0 0 0 1 0 0 0 0 0 0 |
| 64 | 0 0 0 0 0 1 0 0 0 1 0 0 0 0 0 1 |
| 65 | 0 0 0 0 0 1 0 0 0 1 0 0 0 0 1 0 |
| 66 | 0 0 0 0 0 1 0 0 0 1 0 0 0 1 0 0 |
| 67 | 0 0 0 0 0 1 0 0 0 1 0 0 1 0 0 0 |
| 68 | 0 0 0 0 0 1 0 0 0 1 0 0 1 0 0 1 |
| 69 | 0 0 0 0 0 1 0 0 1 0 0 0 0 0 0 0 |
| 70 | 0 0 0 0 0 1 0 0 1 0 0 0 0 0 0 1 |
| 71 | 0 0 0 0 0 1 0 0 1 0 0 0 0 0 1 0 |
| 72 | 0 0 0 0 0 1 0 0 1 0 0 0 0 1 0 0 |
| 73 | 0 0 0 0 0 1 0 0 1 0 0 0 1 0 0 0 |
| 74 | 0 0 0 0 0 1 0 0 1 0 0 0 1 0 0 1 |
| 75 | 0 0 0 0 0 1 0 0 1 0 0 1 0 0 0 0 |
| 76 | 0 0 0 0 0 1 0 0 1 0 0 1 0 0 0 1 |
| 77 | 0 0 0 0 0 1 0 0 1 0 0 1 0 0 1 0 |
| 78 | 0 0 0 0 1 0 0 0 0 0 0 0 0 0 0 1 |
| 79 | 0 0 0 0 1 0 0 0 0 0 0 0 0 0 1 0 |
| 80 | 0 0 0 0 1 0 0 0 0 0 0 0 0 1 0 0 |
| 81 | 0 0 0 0 1 0 0 0 0 0 0 0 1 0 0 0 |
| 82 | 0 0 0 0 1 0 0 0 0 0 0 0 1 0 0 1 |
| 83 | 0 0 0 0 1 0 0 0 0 0 0 1 0 0 0 0 |
| 84 | 0 0 0 0 1 0 0 0 0 0 0 1 0 0 0 1 |
| 85 | 0 0 0 0 1 0 0 0 0 0 0 1 0 0 1 0 |
| 86 | 0 0 0 0 1 0 0 0 0 0 1 0 0 0 0 0 |
| 87 | 0 0 0 0 1 0 0 0 0 0 1 0 0 0 0 1 |
| 88 | 0 0 0 0 1 0 0 0 0 0 1 0 0 0 1 0 |
| 89 | 0 0 0 0 1 0 0 0 0 0 1 0 0 1 0 0 |
| 90 | 0 0 0 0 1 0 0 0 0 1 0 0 0 0 0 0 |
| 91 | 0 0 0 0 1 0 0 0 0 1 0 0 0 0 0 1 |
| 92 | 0 0 0 0 1 0 0 0 0 1 0 0 0 0 1 0 |
| 93 | 0 0 0 0 1 0 0 0 0 1 0 0 0 1 0 0 |
| 94 | 0 0 0 0 1 0 0 0 0 1 0 0 1 0 0 0 |
| 95 | 0 0 0 0 1 0 0 0 0 1 0 0 1 0 0 1 |
| 96 | 0 0 0 0 1 0 0 0 1 0 0 0 0 0 0 0 |
| 97 | 0 0 0 0 1 0 0 0 1 0 0 0 0 0 0 1 |
| 98 | 0 0 0 0 1 0 0 0 1 0 0 0 0 0 1 0 |
| 99 | 0 0 0 0 1 0 0 0 1 0 0 0 0 1 0 0 |
| 100 | 0 0 0 0 1 0 0 0 1 0 0 0 1 0 0 0 |
| 101 | 0 0 0 0 1 0 0 0 1 0 0 0 1 0 0 1 |
| 102 | 0 0 0 0 1 0 0 0 1 0 0 1 0 0 0 0 |
| 103 | 0 0 0 0 1 0 0 0 1 0 0 1 0 0 0 1 |
| 104 | 0 0 0 0 1 0 0 0 1 0 0 1 0 0 1 0 |
| 105 | 0 0 0 0 1 0 0 1 0 0 0 0 0 0 0 0 |
| 106 | 0 0 0 0 1 0 0 1 0 0 0 0 0 0 0 1 |
| 107 | 0 0 0 0 1 0 0 1 0 0 0 0 0 0 1 0 |
| 108 | 0 0 0 0 1 0 0 1 0 0 0 0 0 1 0 0 |
| 109 | 0 0 0 0 1 0 0 1 0 0 0 0 1 0 0 0 |

TABLE 34-continued

| NUMBER | 16-BIT CODE |
|---|---|
| 110 | 0000100100001001 |
| 111 | 0000100100010000 |
| 112 | 0000100100010001 |
| 113 | 0000100100010010 |
| 114 | 0000100100100000 |
| 115 | 0000100100100001 |
| 116 | 0000100100100010 |
| 117 | 0000100100100100 |
| 118 | 0001000000000010 |
| 119 | 0001000000000100 |
| 120 | 0001000000001000 |
| 121 | 0001000000001001 |
| 122 | 0001000000010000 |
| 123 | 0001000000010001 |
| 124 | 0001000000010010 |
| 125 | 0001000000100000 |
| 126 | 0001000000100001 |
| 127 | 0001000000100010 |
| 128 | 0001000000100100 |
| 129 | 0001000001000000 |
| 130 | 0001000001000001 |
| 131 | 0001000001000010 |
| 132 | 0001000001000100 |
| 133 | 0001000001001000 |
| 134 | 0001000001001001 |
| 135 | 0001000010000000 |
| 136 | 0001000010000001 |
| 137 | 0001000010000010 |
| 138 | 0001000010000100 |
| 139 | 0001000010001000 |
| 140 | 0001000010001001 |
| 141 | 0001000010010000 |
| 142 | 0001000010010001 |
| 143 | 0001000010010010 |
| 144 | 0001000100000000 |
| 145 | 0001000100000001 |
| 146 | 0001000100000010 |
| 147 | 0001000100000100 |
| 148 | 0001000100001000 |
| 149 | 0001000100001001 |
| 150 | 0001000100010000 |
| 151 | 0001000100010001 |
| 152 | 0001000100010010 |
| 153 | 0001000100100000 |
| 154 | 0001000100100001 |
| 155 | 0001000100100010 |
| 156 | 0001000100100100 |
| 157 | 0001001000000001 |
| 158 | 0001001000000010 |
| 159 | 0001001000000100 |
| 160 | 0001001000001000 |
| 161 | 0001001000001001 |
| 162 | 0001001000010000 |
| 163 | 0001001000010001 |
| 164 | 0001001000010010 |
| 165 | 0001001000100000 |
| 166 | 0001001000100001 |
| 167 | 0001001000100010 |
| 168 | 0001001000100100 |
| 169 | 0001001001000000 |
| 170 | 0001001001000001 |
| 171 | 0001001001000010 |
| 172 | 0001001001000100 |
| 173 | 0001001001001000 |
| 174 | 0001001001001001 |
| 175 | 0010000000000100 |
| 176 | 0010000000001000 |
| 177 | 0010000000001001 |
| 178 | 0010000000010000 |
| 179 | 0010000000010001 |
| 180 | 0010000000010010 |
| 181 | 0010000000100000 |
| 182 | 0010000000100001 |
| 183 | 0010000000100010 |
| 184 | 0010000000100100 |
| 185 | 0010000001000000 |
| 186 | 0010000001000001 |
| 187 | 0010000001000010 |
| 188 | 0010000001000100 |
| 189 | 0010000001001000 |
| 190 | 0010000001001001 |

TABLE 34-continued

| NUMBER | 16-BIT CODE |
|---|---|
| 191 | 0010000010000000 |
| 192 | 0010000010000001 |
| 193 | 0010000010000010 |
| 194 | 0010000010000100 |
| 195 | 0010000010001000 |
| 196 | 0010000010001001 |
| 197 | 0010000010010000 |
| 198 | 0010000010010001 |
| 199 | 0010000010010010 |
| 200 | 0010000100000000 |
| 201 | 0010000100000001 |
| 202 | 0010000100000010 |
| 203 | 0010000100000100 |
| 204 | 0010000100001000 |
| 205 | 0010000100001001 |
| 206 | 0010000100010000 |
| 207 | 0010000100010001 |
| 208 | 0010000100010010 |
| 209 | 0010000100100000 |
| 210 | 0010000100100001 |
| 211 | 0010000100100010 |
| 212 | 0010000100100100 |
| 213 | 0010001000000001 |
| 214 | 0010001000000010 |
| 215 | 0010001000000100 |
| 216 | 0010001000001000 |
| 217 | 0010001000001001 |
| 218 | 0010001000010000 |
| 219 | 0010001000010001 |
| 220 | 0010001000010010 |
| 221 | 0010001000100000 |
| 222 | 0010001000100001 |
| 223 | 0010001000100010 |
| 224 | 0010001000100100 |
| 225 | 0010001001000000 |
| 226 | 0010001001000001 |
| 227 | 0010001001000010 |
| 228 | 0010001001000100 |
| 229 | 0010001001001000 |
| 230 | 0010001001001001 |
| 231 | 0010010000000001 |
| 232 | 0010010000000010 |
| 233 | 0010010000000100 |
| 234 | 0010010000001000 |
| 235 | 0010010000001001 |
| 236 | 0010010000010000 |
| 237 | 0010010000010001 |
| 238 | 0010010000010010 |
| 239 | 0010010000100000 |
| 240 | 0010010000100001 |
| 241 | 0010010000100010 |
| 242 | 0010010000100100 |
| 243 | 0010010001000000 |
| 244 | 0010010001000001 |
| 245 | 0010010001000010 |
| 246 | 0010010001000100 |
| 247 | 0010010001001000 |
| 248 | 0010010001001001 |
| 249 | 0010010010000000 |
| 250 | 0010010010000001 |
| 251 | 0010010010000010 |
| 252 | 0010010010000100 |
| 253 | 0010010010001000 |
| 254 | 0010010010001001 |
| 255 | 0010010010010000 |
| 256 | 0010010010010001 |
| 257 | 0010010010010010 |

TABLE 35

| NUMBER | 16-BIT CODE |
|---|---|
| 1 | 0000000001000000 |
| 2 | 0000000001000001 |
| 3 | 0000000001000010 |
| 4 | 0000000001000100 |
| 5 | 0000000001001000 |
| 6 | 0000000001001001 |
| 7 | 0000000010000000 |
| 8 | 0000000010000001 |

TABLE 35-continued

| NUMBER | 16-BIT CODE |
|---|---|
| 9 | 0 0 0 0 0 0 0 0 1 0 0 0 0 0 1 0 |
| 10 | 0 0 0 0 0 0 0 0 1 0 0 0 0 1 0 0 |
| 11 | 0 0 0 0 0 0 0 0 1 0 0 0 1 0 0 0 |
| 12 | 0 0 0 0 0 0 0 0 1 0 0 0 1 0 0 1 |
| 13 | 0 0 0 0 0 0 0 0 1 0 0 1 0 0 0 0 |
| 14 | 0 0 0 0 0 0 0 0 1 0 0 1 0 0 0 1 |
| 15 | 0 0 0 0 0 0 0 0 1 0 0 1 0 0 1 0 |
| 16 | 0 0 0 0 0 0 0 1 0 0 0 0 0 0 0 0 |
| 17 | 0 0 0 0 0 0 0 1 0 0 0 0 0 0 0 1 |
| 18 | 0 0 0 0 0 0 0 1 0 0 0 0 0 0 1 0 |
| 19 | 0 0 0 0 0 0 0 1 0 0 0 0 0 1 0 0 |
| 20 | 0 0 0 0 0 0 0 1 0 0 0 0 1 0 0 0 |
| 21 | 0 0 0 0 0 0 0 1 0 0 0 0 1 0 0 1 |
| 22 | 0 0 0 0 0 0 0 1 0 0 0 1 0 0 0 0 |
| 23 | 0 0 0 0 0 0 0 1 0 0 0 1 0 0 0 1 |
| 24 | 0 0 0 0 0 0 0 1 0 0 0 1 0 0 1 0 |
| 25 | 0 0 0 0 0 0 0 1 0 0 1 0 0 0 0 0 |
| 26 | 0 0 0 0 0 0 0 1 0 0 1 0 0 0 0 1 |
| 27 | 0 0 0 0 0 0 0 1 0 0 1 0 0 0 1 0 |
| 28 | 0 0 0 0 0 0 0 1 0 0 1 0 0 1 0 0 |
| 29 | 0 0 0 0 0 0 1 0 0 0 0 0 0 0 0 1 |
| 30 | 0 0 0 0 0 0 1 0 0 0 0 0 0 0 1 0 |
| 31 | 0 0 0 0 0 0 1 0 0 0 0 0 0 1 0 0 |
| 32 | 0 0 0 0 0 0 1 0 0 0 0 0 1 0 0 0 |
| 33 | 0 0 0 0 0 0 1 0 0 0 0 0 1 0 0 1 |
| 34 | 0 0 0 0 0 0 1 0 0 0 0 1 0 0 0 0 |
| 35 | 0 0 0 0 0 0 1 0 0 0 0 1 0 0 0 1 |
| 36 | 0 0 0 0 0 0 1 0 0 0 0 1 0 0 1 0 |
| 37 | 0 0 0 0 0 0 1 0 0 0 1 0 0 0 0 0 |
| 38 | 0 0 0 0 0 0 1 0 0 0 1 0 0 0 0 1 |
| 39 | 0 0 0 0 0 0 1 0 0 0 1 0 0 0 1 0 |
| 40 | 0 0 0 0 0 0 1 0 0 0 1 0 0 1 0 0 |
| 41 | 0 0 0 0 0 0 1 0 0 1 0 0 0 0 0 0 |
| 42 | 0 0 0 0 0 0 1 0 0 1 0 0 0 0 0 1 |
| 43 | 0 0 0 0 0 0 1 0 0 1 0 0 0 0 1 0 |
| 44 | 0 0 0 0 0 0 1 0 0 1 0 0 0 1 0 0 |
| 45 | 0 0 0 0 0 0 1 0 0 1 0 0 1 0 0 0 |
| 46 | 0 0 0 0 0 0 1 0 0 1 0 0 1 0 0 1 |
| 47 | 0 0 0 0 0 1 0 0 0 0 0 0 0 0 0 1 |
| 48 | 0 0 0 0 0 1 0 0 0 0 0 0 0 0 1 0 |
| 49 | 0 0 0 0 0 1 0 0 0 0 0 0 0 1 0 0 |
| 50 | 0 0 0 0 0 1 0 0 0 0 0 0 1 0 0 0 |
| 51 | 0 0 0 0 0 1 0 0 0 0 0 0 1 0 0 1 |
| 52 | 0 0 0 0 0 1 0 0 0 0 0 1 0 0 0 0 |
| 53 | 0 0 0 0 0 1 0 0 0 0 0 1 0 0 0 1 |
| 54 | 0 0 0 0 0 1 0 0 0 0 0 1 0 0 1 0 |
| 55 | 0 0 0 0 0 1 0 0 0 0 1 0 0 0 0 0 |
| 56 | 0 0 0 0 0 1 0 0 0 0 1 0 0 0 0 1 |
| 57 | 0 0 0 0 0 1 0 0 0 0 1 0 0 0 1 0 |
| 58 | 0 0 0 0 0 1 0 0 0 0 1 0 0 1 0 0 |
| 59 | 0 0 0 0 0 1 0 0 0 1 0 0 0 0 0 0 |
| 60 | 0 0 0 0 0 1 0 0 0 1 0 0 0 0 0 1 |
| 61 | 0 0 0 0 0 1 0 0 0 1 0 0 0 0 1 0 |
| 62 | 0 0 0 0 0 1 0 0 0 1 0 0 0 1 0 0 |
| 63 | 0 0 0 0 0 1 0 0 0 1 0 0 1 0 0 0 |
| 64 | 0 0 0 0 0 1 0 0 0 1 0 0 1 0 0 1 |
| 65 | 0 0 0 0 0 1 0 0 1 0 0 0 0 0 0 0 |
| 66 | 0 0 0 0 0 1 0 0 1 0 0 0 0 0 0 1 |
| 67 | 0 0 0 0 0 1 0 0 1 0 0 0 0 0 1 0 |
| 68 | 0 0 0 0 0 1 0 0 1 0 0 0 0 1 0 0 |
| 69 | 0 0 0 0 0 1 0 0 1 0 0 0 1 0 0 0 |
| 70 | 0 0 0 0 0 1 0 0 1 0 0 0 1 0 0 1 |
| 71 | 0 0 0 0 0 1 0 0 1 0 0 1 0 0 0 0 |
| 72 | 0 0 0 0 0 1 0 0 1 0 0 1 0 0 0 1 |
| 73 | 0 0 0 0 0 1 0 0 1 0 0 1 0 0 1 0 |
| 74 | 0 0 0 0 1 0 0 0 0 0 0 0 0 0 0 1 |
| 75 | 0 0 0 0 1 0 0 0 0 0 0 0 0 0 1 0 |
| 76 | 0 0 0 0 1 0 0 0 0 0 0 0 0 1 0 0 |
| 77 | 0 0 0 0 1 0 0 0 0 0 0 0 1 0 0 0 |
| 78 | 0 0 0 0 1 0 0 0 0 0 0 0 1 0 0 1 |
| 79 | 0 0 0 0 1 0 0 0 0 0 0 1 0 0 0 0 |
| 80 | 0 0 0 0 1 0 0 0 0 0 0 1 0 0 0 1 |
| 81 | 0 0 0 0 1 0 0 0 0 0 0 1 0 0 1 0 |
| 82 | 0 0 0 0 1 0 0 0 0 0 1 0 0 0 0 0 |
| 83 | 0 0 0 0 1 0 0 0 0 0 1 0 0 0 0 1 |
| 84 | 0 0 0 0 1 0 0 0 0 0 1 0 0 0 1 0 |
| 85 | 0 0 0 0 1 0 0 0 0 0 1 0 0 1 0 0 |
| 86 | 0 0 0 0 1 0 0 0 0 1 0 0 0 0 0 0 |
| 87 | 0 0 0 0 1 0 0 0 0 1 0 0 0 0 0 1 |
| 88 | 0 0 0 0 1 0 0 0 0 1 0 0 0 0 1 0 |
| 89 | 0 0 0 0 1 0 0 0 0 1 0 0 0 1 0 0 |

TABLE 35-continued

| NUMBER | 16-BIT CODE |
|---|---|
| 90 | 0 0 0 0 1 0 0 0 0 1 0 0 1 0 0 0 |
| 91 | 0 0 0 0 1 0 0 0 0 1 0 0 1 0 0 1 |
| 92 | 0 0 0 0 1 0 0 0 1 0 0 0 0 0 0 0 |
| 93 | 0 0 0 0 1 0 0 0 1 0 0 0 0 0 0 1 |
| 94 | 0 0 0 0 1 0 0 0 1 0 0 0 0 0 1 0 |
| 95 | 0 0 0 0 1 0 0 0 1 0 0 0 0 1 0 0 |
| 96 | 0 0 0 0 1 0 0 0 1 0 0 0 1 0 0 0 |
| 97 | 0 0 0 0 1 0 0 0 1 0 0 0 1 0 0 1 |
| 98 | 0 0 0 0 1 0 0 0 1 0 0 1 0 0 0 0 |
| 99 | 0 0 0 0 1 0 0 0 1 0 0 1 0 0 0 1 |
| 100 | 0 0 0 0 1 0 0 0 1 0 0 1 0 0 1 0 |
| 101 | 0 0 0 0 1 0 0 1 0 0 0 0 0 0 0 0 |
| 102 | 0 0 0 0 1 0 0 1 0 0 0 0 0 0 0 1 |
| 103 | 0 0 0 0 1 0 0 1 0 0 0 0 0 0 1 0 |
| 104 | 0 0 0 0 1 0 0 1 0 0 0 0 0 1 0 0 |
| 105 | 0 0 0 0 1 0 0 1 0 0 0 0 1 0 0 0 |
| 106 | 0 0 0 0 1 0 0 1 0 0 0 0 1 0 0 1 |
| 107 | 0 0 0 0 1 0 0 1 0 0 0 1 0 0 0 0 |
| 108 | 0 0 0 0 1 0 0 1 0 0 0 1 0 0 0 1 |
| 109 | 0 0 0 0 1 0 0 1 0 0 0 1 0 0 1 0 |
| 110 | 0 0 0 0 1 0 0 1 0 0 1 0 0 0 0 0 |
| 111 | 0 0 0 0 1 0 0 1 0 0 1 0 0 0 0 1 |
| 112 | 0 0 0 0 1 0 0 1 0 0 1 0 0 0 1 0 |
| 113 | 0 0 0 0 1 0 0 1 0 0 1 0 0 1 0 0 |
| 114 | 0 0 0 1 0 0 0 0 0 0 0 0 0 0 1 0 |
| 115 | 0 0 0 1 0 0 0 0 0 0 0 0 0 1 0 0 |
| 116 | 0 0 0 1 0 0 0 0 0 0 0 0 1 0 0 0 |
| 117 | 0 0 0 1 0 0 0 0 0 0 0 0 1 0 0 1 |
| 118 | 0 0 0 1 0 0 0 0 0 0 0 1 0 0 0 0 |
| 119 | 0 0 0 1 0 0 0 0 0 0 0 1 0 0 0 1 |
| 120 | 0 0 0 1 0 0 0 0 0 0 0 1 0 0 1 0 |
| 121 | 0 0 0 1 0 0 0 0 0 0 1 0 0 0 0 0 |
| 122 | 0 0 0 1 0 0 0 0 0 0 1 0 0 0 0 1 |
| 123 | 0 0 0 1 0 0 0 0 0 0 1 0 0 0 1 0 |
| 124 | 0 0 0 1 0 0 0 0 0 0 1 0 0 1 0 0 |
| 125 | 0 0 0 1 0 0 0 0 0 0 1 0 0 0 0 0 |
| 126 | 0 0 0 1 0 0 0 0 0 1 0 0 0 0 0 1 |
| 127 | 0 0 0 1 0 0 0 0 0 1 0 0 0 0 1 0 |
| 128 | 0 0 0 1 0 0 0 0 0 1 0 0 0 1 0 0 |
| 129 | 0 0 0 1 0 0 0 0 0 1 0 0 1 0 0 0 |
| 130 | 0 0 0 1 0 0 0 0 0 1 0 0 1 0 0 1 |
| 131 | 0 0 0 1 0 0 0 0 1 0 0 0 0 0 0 0 |
| 132 | 0 0 0 1 0 0 0 0 1 0 0 0 0 0 0 1 |
| 133 | 0 0 0 1 0 0 0 0 1 0 0 0 0 0 1 0 |
| 134 | 0 0 0 1 0 0 0 0 1 0 0 0 0 1 0 0 |
| 135 | 0 0 0 1 0 0 0 0 1 0 0 0 1 0 0 0 |
| 136 | 0 0 0 1 0 0 0 0 1 0 0 0 1 0 0 1 |
| 137 | 0 0 0 1 0 0 0 0 1 0 0 1 0 0 0 0 |
| 138 | 0 0 0 1 0 0 0 0 1 0 0 1 0 0 0 1 |
| 139 | 0 0 0 1 0 0 0 0 1 0 0 1 0 0 1 0 |
| 140 | 0 0 0 1 0 0 0 1 0 0 0 0 0 0 0 0 |
| 141 | 0 0 0 1 0 0 0 1 0 0 0 0 0 0 0 1 |
| 142 | 0 0 0 1 0 0 0 1 0 0 0 0 0 0 1 0 |
| 143 | 0 0 0 1 0 0 0 1 0 0 0 0 0 1 0 0 |
| 144 | 0 0 0 1 0 0 0 1 0 0 0 0 1 0 0 0 |
| 145 | 0 0 0 1 0 0 0 1 0 0 0 0 1 0 0 1 |
| 146 | 0 0 0 1 0 0 0 1 0 0 0 1 0 0 0 0 |
| 147 | 0 0 0 1 0 0 0 1 0 0 0 1 0 0 0 1 |
| 148 | 0 0 0 1 0 0 0 1 0 0 0 1 0 0 1 0 |
| 149 | 0 0 0 1 0 0 0 1 0 0 1 0 0 0 0 0 |
| 150 | 0 0 0 1 0 0 0 1 0 0 1 0 0 0 0 1 |
| 151 | 0 0 0 1 0 0 0 1 0 0 1 0 0 0 1 0 |
| 152 | 0 0 0 1 0 0 0 1 0 0 1 0 0 1 0 0 |
| 153 | 0 0 0 1 0 0 1 0 0 0 0 0 0 0 0 1 |
| 154 | 0 0 0 1 0 0 1 0 0 0 0 0 0 0 1 0 |
| 155 | 0 0 0 1 0 0 1 0 0 0 0 0 0 1 0 0 |
| 156 | 0 0 0 1 0 0 1 0 0 0 0 0 1 0 0 0 |
| 157 | 0 0 0 1 0 0 1 0 0 0 0 0 1 0 0 1 |
| 158 | 0 0 0 1 0 0 1 0 0 0 0 1 0 0 0 0 |
| 159 | 0 0 0 1 0 0 1 0 0 0 0 1 0 0 0 1 |
| 160 | 0 0 0 1 0 0 1 0 0 0 0 1 0 0 1 0 |
| 161 | 0 0 0 1 0 0 1 0 0 0 1 0 0 0 0 0 |
| 162 | 0 0 0 1 0 0 1 0 0 0 1 0 0 0 0 1 |
| 163 | 0 0 0 1 0 0 1 0 0 0 1 0 0 0 1 0 |
| 164 | 0 0 0 1 0 0 1 0 0 0 1 0 0 1 0 0 |
| 165 | 0 0 0 1 0 0 1 0 0 1 0 0 0 0 0 0 |
| 166 | 0 0 0 1 0 0 1 0 0 1 0 0 0 0 0 1 |
| 167 | 0 0 0 1 0 0 1 0 0 1 0 0 0 0 1 0 |
| 168 | 0 0 0 1 0 0 1 0 0 1 0 0 0 1 0 0 |
| 169 | 0 0 0 1 0 0 1 0 0 1 0 0 1 0 0 0 |
| 170 | 0 0 0 1 0 0 1 0 0 1 0 0 1 0 0 1 |

TABLE 35-continued

| NUMBER | 16-BIT CODE |
|---|---|
| 171 | 0 0 1 0 0 0 0 0 0 0 0 0 0 1 0 0 |
| 172 | 0 0 1 0 0 0 0 0 0 0 0 0 1 0 0 0 |
| 173 | 0 0 1 0 0 0 0 0 0 0 0 0 1 0 0 1 |
| 174 | 0 0 1 0 0 0 0 0 0 0 0 1 0 0 0 0 |
| 175 | 0 0 1 0 0 0 0 0 0 0 0 1 0 0 0 1 |
| 176 | 0 0 1 0 0 0 0 0 0 0 0 1 0 0 1 0 |
| 177 | 0 0 1 0 0 0 0 0 0 0 1 0 0 0 0 0 |
| 178 | 0 0 1 0 0 0 0 0 0 0 1 0 0 0 0 1 |
| 179 | 0 0 1 0 0 0 0 0 0 0 1 0 0 0 1 0 |
| 180 | 0 0 1 0 0 0 0 0 0 0 1 0 0 1 0 0 |
| 181 | 0 0 1 0 0 0 0 0 0 1 0 0 0 0 0 0 |
| 182 | 0 0 1 0 0 0 0 0 0 1 0 0 0 0 0 1 |
| 183 | 0 0 1 0 0 0 0 0 0 1 0 0 0 0 1 0 |
| 184 | 0 0 1 0 0 0 0 0 0 1 0 0 0 1 0 0 |
| 185 | 0 0 1 0 0 0 0 0 0 1 0 0 1 0 0 0 |
| 186 | 0 0 1 0 0 0 0 0 0 1 0 0 1 0 0 1 |
| 187 | 0 0 1 0 0 0 0 0 1 0 0 0 0 0 0 0 |
| 188 | 0 0 1 0 0 0 0 0 1 0 0 0 0 0 0 1 |
| 189 | 0 0 1 0 0 0 0 0 1 0 0 0 0 0 1 0 |
| 190 | 0 0 1 0 0 0 0 0 1 0 0 0 0 1 0 0 |
| 191 | 0 0 1 0 0 0 0 0 1 0 0 0 1 0 0 0 |
| 192 | 0 0 1 0 0 0 0 0 1 0 0 0 1 0 0 1 |
| 193 | 0 0 1 0 0 0 0 0 1 0 0 1 0 0 0 0 |
| 194 | 0 0 1 0 0 0 0 0 1 0 0 1 0 0 0 1 |
| 195 | 0 0 1 0 0 0 0 0 1 0 0 1 0 0 1 0 |
| 196 | 0 0 1 0 0 0 0 1 0 0 0 0 0 0 0 0 |
| 197 | 0 0 1 0 0 0 0 1 0 0 0 0 0 0 0 1 |
| 198 | 0 0 1 0 0 0 0 1 0 0 0 0 0 0 1 0 |
| 199 | 0 0 1 0 0 0 0 1 0 0 0 0 0 1 0 0 |
| 200 | 0 0 1 0 0 0 0 1 0 0 0 0 1 0 0 0 |
| 201 | 0 0 1 0 0 0 0 1 0 0 0 0 1 0 0 1 |
| 202 | 0 0 1 0 0 0 0 1 0 0 0 1 0 0 0 0 |
| 203 | 0 0 1 0 0 0 0 1 0 0 0 1 0 0 0 1 |
| 204 | 0 0 1 0 0 0 0 1 0 0 0 1 0 0 1 0 |
| 205 | 0 0 1 0 0 0 0 1 0 0 1 0 0 0 0 0 |
| 206 | 0 0 1 0 0 0 0 1 0 0 1 0 0 0 0 1 |
| 207 | 0 0 1 0 0 0 0 1 0 0 1 0 0 0 1 0 |
| 208 | 0 0 1 0 0 0 0 1 0 0 1 0 0 1 0 0 |
| 209 | 0 0 1 0 0 0 1 0 0 0 0 0 0 0 0 1 |
| 210 | 0 0 1 0 0 0 1 0 0 0 0 0 0 0 1 0 |
| 211 | 0 0 1 0 0 0 1 0 0 0 0 0 0 1 0 0 |
| 212 | 0 0 1 0 0 0 1 0 0 0 0 0 1 0 0 0 |
| 213 | 0 0 1 0 0 0 1 0 0 0 0 0 1 0 0 1 |
| 214 | 0 0 1 0 0 0 1 0 0 0 0 1 0 0 0 0 |
| 215 | 0 0 1 0 0 0 1 0 0 0 0 1 0 0 0 1 |
| 216 | 0 0 1 0 0 0 1 0 0 0 0 1 0 0 1 0 |
| 217 | 0 0 1 0 0 0 1 0 0 0 1 0 0 0 0 0 |
| 218 | 0 0 1 0 0 0 1 0 0 0 1 0 0 0 0 1 |
| 219 | 0 0 1 0 0 0 1 0 0 0 1 0 0 0 1 0 |
| 220 | 0 0 1 0 0 0 1 0 0 0 1 0 0 1 0 0 |
| 221 | 0 0 1 0 0 0 1 0 0 1 0 0 0 0 0 0 |
| 222 | 0 0 1 0 0 0 1 0 0 1 0 0 0 0 0 1 |
| 223 | 0 0 1 0 0 0 1 0 0 1 0 0 0 0 1 0 |
| 224 | 0 0 1 0 0 0 1 0 0 1 0 0 0 1 0 0 |
| 225 | 0 0 1 0 0 0 1 0 0 1 0 0 1 0 0 0 |
| 226 | 0 0 1 0 0 0 1 0 0 1 0 0 1 0 0 1 |
| 227 | 0 0 1 0 0 1 0 0 0 0 0 0 0 0 0 1 |
| 228 | 0 0 1 0 0 1 0 0 0 0 0 0 0 0 1 0 |
| 229 | 0 0 1 0 0 1 0 0 0 0 0 0 0 1 0 0 |
| 230 | 0 0 1 0 0 1 0 0 0 0 0 0 1 0 0 0 |
| 231 | 0 0 1 0 0 1 0 0 0 0 0 0 1 0 0 1 |
| 232 | 0 0 1 0 0 1 0 0 0 0 0 1 0 0 0 0 |
| 233 | 0 0 1 0 0 1 0 0 0 0 0 1 0 0 0 1 |
| 234 | 0 0 1 0 0 1 0 0 0 0 0 1 0 0 1 0 |
| 235 | 0 0 1 0 0 1 0 0 0 0 1 0 0 0 0 0 |
| 236 | 0 0 1 0 0 1 0 0 0 0 1 0 0 0 0 1 |
| 237 | 0 0 1 0 0 1 0 0 0 0 1 0 0 0 1 0 |
| 238 | 0 0 1 0 0 1 0 0 0 0 1 0 0 1 0 0 |
| 239 | 0 0 1 0 0 1 0 0 0 1 0 0 0 0 0 0 |
| 240 | 0 0 1 0 0 1 0 0 0 1 0 0 0 0 0 1 |
| 241 | 0 0 1 0 0 1 0 0 0 1 0 0 0 0 1 0 |
| 242 | 0 0 1 0 0 1 0 0 0 1 0 0 0 1 0 0 |
| 243 | 0 0 1 0 0 1 0 0 0 1 0 0 1 0 0 0 |
| 244 | 0 0 1 0 0 1 0 0 0 1 0 0 1 0 0 1 |
| 245 | 0 0 1 0 0 1 0 0 1 0 0 0 0 0 0 0 |
| 246 | 0 0 1 0 0 1 0 0 1 0 0 0 0 0 0 1 |
| 247 | 0 0 1 0 0 1 0 0 1 0 0 0 0 0 1 0 |
| 248 | 0 0 1 0 0 1 0 0 1 0 0 0 0 1 0 0 |
| 249 | 0 0 1 0 0 1 0 0 1 0 0 0 1 0 0 0 |
| 250 | 0 0 1 0 0 1 0 0 1 0 0 0 1 0 0 1 |
| 251 | 0 0 1 0 0 1 0 0 1 0 0 1 0 0 0 0 |

TABLE 35-continued

| NUMBER | 16-BIT CODE |
|---|---|
| 252 | 0 0 1 0 0 1 0 0 1 0 0 1 0 0 0 1 |
| 253 | 0 0 1 0 0 1 0 0 1 0 0 1 0 0 1 0 |
| 254 | 0 1 0 0 0 0 0 0 0 0 0 0 1 0 0 0 |
| 255 | 0 1 0 0 0 0 0 0 0 0 0 0 1 0 0 1 |
| 256 | 0 1 0 0 0 0 0 0 0 0 0 1 0 0 0 0 |
| 257 | 0 1 0 0 0 0 0 0 0 0 0 1 0 0 0 1 |
| 258 | 0 1 0 0 0 0 0 0 0 0 0 1 0 0 1 0 |
| 259 | 0 1 0 0 0 0 0 0 0 0 1 0 0 0 0 0 |
| 260 | 0 1 0 0 0 0 0 0 0 0 1 0 0 0 0 1 |
| 261 | 0 1 0 0 0 0 0 0 0 0 1 0 0 0 1 0 |
| 262 | 0 1 0 0 0 0 0 0 0 0 1 0 0 1 0 0 |
| 263 | 0 1 0 0 0 0 0 0 0 1 0 0 0 0 0 0 |
| 264 | 0 1 0 0 0 0 0 0 0 1 0 0 0 0 0 1 |
| 265 | 0 1 0 0 0 0 0 0 0 1 0 0 0 0 1 0 |
| 266 | 0 1 0 0 0 0 0 0 0 1 0 0 0 1 0 0 |
| 267 | 0 1 0 0 0 0 0 0 0 1 0 0 1 0 0 0 |
| 268 | 0 1 0 0 0 0 0 0 0 1 0 0 1 0 0 1 |
| 269 | 0 1 0 0 0 0 0 0 1 0 0 0 0 0 0 0 |
| 270 | 0 1 0 0 0 0 0 0 1 0 0 0 0 0 0 1 |
| 271 | 0 1 0 0 0 0 0 0 1 0 0 0 0 0 1 0 |
| 272 | 0 1 0 0 0 0 0 0 1 0 0 0 0 1 0 0 |
| 273 | 0 1 0 0 0 0 0 0 1 0 0 0 1 0 0 0 |
| 274 | 0 1 0 0 0 0 0 0 1 0 0 0 1 0 0 1 |
| 275 | 0 1 0 0 0 0 0 0 1 0 0 1 0 0 0 0 |
| 276 | 0 1 0 0 0 0 0 0 1 0 0 1 0 0 0 1 |
| 277 | 0 1 0 0 0 0 0 0 1 0 0 1 0 0 1 0 |
| 278 | 0 1 0 0 0 0 0 1 0 0 0 0 0 0 0 0 |
| 279 | 0 1 0 0 0 0 0 1 0 0 0 0 0 0 0 1 |
| 280 | 0 1 0 0 0 0 0 1 0 0 0 0 0 0 1 0 |
| 281 | 0 1 0 0 0 0 0 1 0 0 0 0 0 1 0 0 |
| 282 | 0 1 0 0 0 0 0 1 0 0 0 0 1 0 0 0 |
| 283 | 0 1 0 0 0 0 0 1 0 0 0 0 1 0 0 1 |
| 284 | 0 1 0 0 0 0 0 1 0 0 0 1 0 0 0 0 |
| 285 | 0 1 0 0 0 0 0 1 0 0 0 1 0 0 0 1 |
| 286 | 0 1 0 0 0 0 0 1 0 0 0 1 0 0 1 0 |
| 287 | 0 1 0 0 0 0 0 1 0 0 1 0 0 0 0 0 |
| 288 | 0 1 0 0 0 0 0 1 0 0 1 0 0 0 0 1 |
| 289 | 0 1 0 0 0 0 0 1 0 0 1 0 0 0 1 0 |
| 290 | 0 1 0 0 0 0 0 1 0 0 1 0 0 1 0 0 |
| 291 | 0 1 0 0 0 0 1 0 0 0 0 0 0 0 0 1 |
| 292 | 0 1 0 0 0 0 1 0 0 0 0 0 0 0 1 0 |
| 293 | 0 1 0 0 0 0 1 0 0 0 0 0 0 1 0 0 |
| 294 | 0 1 0 0 0 0 1 0 0 0 0 0 1 0 0 0 |
| 295 | 0 1 0 0 0 0 1 0 0 0 0 0 1 0 0 1 |
| 296 | 0 1 0 0 0 0 1 0 0 0 0 1 0 0 0 0 |
| 297 | 0 1 0 0 0 0 1 0 0 0 0 1 0 0 0 1 |
| 298 | 0 1 0 0 0 0 1 0 0 0 0 1 0 0 1 0 |
| 299 | 0 1 0 0 0 0 1 0 0 0 1 0 0 0 0 0 |
| 300 | 0 1 0 0 0 0 1 0 0 0 1 0 0 0 0 1 |
| 301 | 0 1 0 0 0 0 1 0 0 0 1 0 0 0 1 0 |
| 302 | 0 1 0 0 0 0 1 0 0 0 1 0 0 1 0 0 |
| 303 | 0 1 0 0 0 0 1 0 0 1 0 0 0 0 0 0 |
| 304 | 0 1 0 0 0 0 1 0 0 1 0 0 0 0 0 1 |
| 305 | 0 1 0 0 0 0 1 0 0 1 0 0 0 0 1 0 |
| 306 | 0 1 0 0 0 0 1 0 0 1 0 0 0 1 0 0 |
| 307 | 0 1 0 0 0 0 1 0 0 1 0 0 1 0 0 0 |
| 308 | 0 1 0 0 0 0 1 0 0 1 0 0 1 0 0 1 |
| 309 | 0 1 0 0 0 1 0 0 0 0 0 0 0 0 0 1 |
| 310 | 0 1 0 0 0 1 0 0 0 0 0 0 0 0 1 0 |
| 311 | 0 1 0 0 0 1 0 0 0 0 0 0 0 1 0 0 |
| 312 | 0 1 0 0 0 1 0 0 0 0 0 0 1 0 0 0 |
| 313 | 0 1 0 0 0 1 0 0 0 0 0 0 1 0 0 1 |
| 314 | 0 1 0 0 0 1 0 0 0 0 0 1 0 0 0 0 |
| 315 | 0 1 0 0 0 1 0 0 0 0 0 1 0 0 0 1 |
| 316 | 0 1 0 0 0 1 0 0 0 0 0 1 0 0 1 0 |
| 317 | 0 1 0 0 0 1 0 0 0 0 1 0 0 0 0 0 |
| 318 | 0 1 0 0 0 1 0 0 0 0 1 0 0 0 0 1 |
| 319 | 0 1 0 0 0 1 0 0 0 0 1 0 0 0 1 0 |
| 320 | 0 1 0 0 0 1 0 0 0 0 1 0 0 1 0 0 |
| 321 | 0 1 0 0 0 1 0 0 0 1 0 0 0 0 0 0 |
| 322 | 0 1 0 0 0 1 0 0 0 1 0 0 0 0 0 1 |
| 323 | 0 1 0 0 0 1 0 0 0 1 0 0 0 0 1 0 |
| 324 | 0 1 0 0 0 1 0 0 0 1 0 0 0 1 0 0 |
| 325 | 0 1 0 0 0 1 0 0 0 1 0 0 1 0 0 0 |
| 326 | 0 1 0 0 0 1 0 0 0 1 0 0 1 0 0 1 |
| 327 | 0 1 0 0 0 1 0 0 1 0 0 0 0 0 0 0 |
| 328 | 0 1 0 0 0 1 0 0 1 0 0 0 0 0 0 1 |
| 329 | 0 1 0 0 0 1 0 0 1 0 0 0 0 0 1 0 |
| 330 | 0 1 0 0 0 1 0 0 1 0 0 0 0 1 0 0 |
| 331 | 0 1 0 0 0 1 0 0 1 0 0 0 1 0 0 0 |
| 332 | 0 1 0 0 0 1 0 0 1 0 0 0 1 0 0 1 |

TABLE 35-continued

| NUMBER | 16-BIT CODE |
|---|---|
| 333 | 0100010010010000 |
| 334 | 0100010010010001 |
| 335 | 0100010010010010 |
| 336 | 0100100000000001 |
| 337 | 0100100000000010 |
| 338 | 0100100000000100 |
| 339 | 0100100000001000 |
| 340 | 0100100000001001 |
| 341 | 0100100000010000 |
| 342 | 0100100000010001 |
| 343 | 0100100000010010 |
| 344 | 0100100000100000 |
| 345 | 0100100000100001 |
| 346 | 0100100000100010 |
| 347 | 0100100000100100 |
| 348 | 0100100001000000 |
| 349 | 0100100001000001 |
| 350 | 0100100001000010 |
| 351 | 0100100001000100 |
| 352 | 0100100001001000 |
| 353 | 0100100001001001 |
| 354 | 0100100010000000 |
| 355 | 0100100010000001 |
| 356 | 0100100010000010 |
| 357 | 0100100010000100 |
| 358 | 0100100010001000 |
| 359 | 0100100010001001 |
| 360 | 0100100010010000 |
| 361 | 0100100010010001 |
| 362 | 0100100010010010 |
| 363 | 0100100100000000 |
| 364 | 0100100100000001 |
| 365 | 0100100100000010 |
| 366 | 0100100100000100 |
| 367 | 0100100100001000 |
| 368 | 0100100100001001 |
| 369 | 0100100100010000 |
| 370 | 0100100100010001 |
| 371 | 0100100100010010 |
| 372 | 0100100100100000 |
| 373 | 0100100100100001 |
| 374 | 0100100100100010 |
| 375 | 0100100100100100 |

TABLE 36

| NUMBER | 16-BIT CODE |
|---|---|
| 1 | 0000000010000000 |
| 2 | 0000000010000001 |
| 3 | 0000000010000010 |
| 4 | 0000000010000100 |
| 5 | 0000000010001000 |
| 6 | 0000000010001001 |
| 7 | 0000000010010000 |
| 8 | 0000000010010001 |
| 9 | 0000000010010010 |
| 10 | 0000000100000000 |
| 11 | 0000000100000001 |
| 12 | 0000000100000010 |
| 13 | 0000000100000100 |
| 14 | 0000000100001000 |
| 15 | 0000000100001001 |
| 16 | 0000000100010000 |
| 17 | 0000000100010001 |
| 18 | 0000000100010010 |
| 19 | 0000000100100000 |
| 20 | 0000000100100001 |
| 21 | 0000000100100010 |
| 22 | 0000000100100100 |
| 23 | 0000001000000001 |
| 24 | 0000001000000010 |
| 25 | 0000001000000100 |
| 26 | 0000001000001000 |
| 27 | 0000001000001001 |
| 28 | 0000001000010000 |
| 29 | 0000001000010001 |
| 30 | 0000001000010010 |
| 31 | 0000001000100000 |
| 32 | 0000001000100001 |

TABLE 36-continued

| NUMBER | 16-BIT CODE |
|---|---|
| 33 | 0000001000100010 |
| 34 | 0000001000100100 |
| 35 | 0000001001000000 |
| 36 | 0000001001000001 |
| 37 | 0000001001000010 |
| 38 | 0000001001000100 |
| 39 | 0000001001001000 |
| 40 | 0000001001001001 |
| 41 | 0000010000000001 |
| 42 | 0000010000000010 |
| 43 | 0000010000000100 |
| 44 | 0000010000001000 |
| 45 | 0000010000001001 |
| 46 | 0000010000010000 |
| 47 | 0000010000010001 |
| 48 | 0000010000010010 |
| 49 | 0000010000100000 |
| 50 | 0000010000100001 |
| 51 | 0000010000100010 |
| 52 | 0000010000100100 |
| 53 | 0000010001000000 |
| 54 | 0000010001000001 |
| 55 | 0000010001000010 |
| 56 | 0000010001000100 |
| 57 | 0000010001001000 |
| 58 | 0000010001001001 |
| 59 | 0000010010000000 |
| 60 | 0000010010000001 |
| 61 | 0000010010000010 |
| 62 | 0000010010000100 |
| 63 | 0000010010001000 |
| 64 | 0000010010001001 |
| 65 | 0000010010010000 |
| 66 | 0000010010010001 |
| 67 | 0000010010010010 |
| 68 | 0001000000000001 |
| 69 | 0001000000000010 |
| 70 | 0001000000000100 |
| 71 | 0001000000001000 |
| 72 | 0001000000001001 |
| 73 | 0001000000010000 |
| 74 | 0001000000010001 |
| 75 | 0001000000010010 |
| 76 | 0001000000100000 |
| 77 | 0001000000100001 |
| 78 | 0001000000100010 |
| 79 | 0001000000100100 |
| 80 | 0001000001000000 |
| 81 | 0001000001000001 |
| 82 | 0001000001000010 |
| 83 | 0001000001000100 |
| 84 | 0001000001001000 |
| 85 | 0001000001001001 |
| 86 | 0001000010000000 |
| 87 | 0001000010000001 |
| 88 | 0001000010000010 |
| 89 | 0001000010000100 |
| 90 | 0001000010001000 |
| 91 | 0001000010001001 |
| 92 | 0001000010010000 |
| 93 | 0001000010010001 |
| 94 | 0001000010010010 |
| 95 | 0001001000000000 |
| 96 | 0001001000000001 |
| 97 | 0001001000000010 |
| 98 | 0001001000000100 |
| 99 | 0001001000001000 |
| 100 | 0001001000001001 |
| 101 | 0001001000010000 |
| 102 | 0001001000010001 |
| 103 | 0001001000010010 |
| 104 | 0001001000100000 |
| 105 | 0001001000100001 |
| 106 | 0001001000100010 |
| 107 | 0001001000100100 |
| 108 | 0010000000000010 |
| 109 | 0010000000000100 |
| 110 | 0010000000001000 |
| 111 | 0010000000001001 |
| 112 | 0010000000010000 |
| 113 | 0010000000010001 |

TABLE 36-continued

| NUMBER | 16-BIT CODE |
|---|---|
| 114 | 0001000000010010 |
| 115 | 0001000000100000 |
| 116 | 0001000000100001 |
| 117 | 0001000000100010 |
| 118 | 0001000000100100 |
| 119 | 0001000001000000 |
| 120 | 0001000001000001 |
| 121 | 0001000001000010 |
| 122 | 0001000001000100 |
| 123 | 0001000001001000 |
| 124 | 0001000001001001 |
| 125 | 0001000010000000 |
| 126 | 0001000010000001 |
| 127 | 0001000010000010 |
| 128 | 0001000010000100 |
| 129 | 0001000010001000 |
| 130 | 0001000010001001 |
| 131 | 0001000010010000 |
| 132 | 0001000010010001 |
| 133 | 0001000010010010 |
| 134 | 0001000100000000 |
| 135 | 0001000100000001 |
| 136 | 0001000100000010 |
| 137 | 0001000100000100 |
| 138 | 0001000100001000 |
| 139 | 0001000100001001 |
| 140 | 0001000100010000 |
| 141 | 0001000100010001 |
| 142 | 0001000100010010 |
| 143 | 0001000100100000 |
| 144 | 0001000100100001 |
| 145 | 0001000100100010 |
| 146 | 0001000100100100 |
| 147 | 0001001000000001 |
| 148 | 0001001000000010 |
| 149 | 0001001000000100 |
| 150 | 0001001000001000 |
| 151 | 0001001000001001 |
| 152 | 0001001000010000 |
| 153 | 0001001000010001 |
| 154 | 0001001000010010 |
| 155 | 0001001000100000 |
| 156 | 0001001000100001 |
| 157 | 0001001000100010 |
| 158 | 0001001000100100 |
| 159 | 0001001001000000 |
| 160 | 0001001001000001 |
| 161 | 0001001001000010 |
| 162 | 0001001001000100 |
| 163 | 0001001001001000 |
| 164 | 0001001001001001 |
| 165 | 0010000000000100 |
| 166 | 0010000000001000 |
| 167 | 0010000000001001 |
| 168 | 0010000000010000 |
| 169 | 0010000000010001 |
| 170 | 0010000000010010 |
| 171 | 0010000000100000 |
| 172 | 0010000000100001 |
| 173 | 0010000000100010 |
| 174 | 0010000000100100 |
| 175 | 0010000001000000 |
| 176 | 0010000001000001 |
| 177 | 0010000001000010 |
| 178 | 0010000001000100 |
| 179 | 0010000001001000 |
| 180 | 0010000001001001 |
| 181 | 0010000010000000 |
| 182 | 0010000010000001 |
| 183 | 0010000010000010 |
| 184 | 0010000010000100 |
| 185 | 0010000010001000 |
| 186 | 0010000010001001 |
| 187 | 0010000010010000 |
| 188 | 0010000010010001 |
| 189 | 0010000010010010 |
| 190 | 0010000100000000 |
| 191 | 0010000100000001 |
| 192 | 0010000100000010 |
| 193 | 0010000100000100 |
| 194 | 0010000100001000 |
| 195 | 0010000100001001 |
| 196 | 0010000100010000 |
| 197 | 0010000100010001 |
| 198 | 0010000100010010 |
| 199 | 0010000100100000 |
| 200 | 0010000100100001 |
| 201 | 0010000100100010 |
| 202 | 0010000100100100 |
| 203 | 0010001000000001 |
| 204 | 0010001000000010 |
| 205 | 0010001000000100 |
| 206 | 0010001000001000 |
| 207 | 0010001000001001 |
| 208 | 0010001000010000 |
| 209 | 0010001000010001 |
| 210 | 0010001000010010 |
| 211 | 0010001000100000 |
| 212 | 0010001000100001 |
| 213 | 0010001000100010 |
| 214 | 0010001000100100 |
| 215 | 0010001001000000 |
| 216 | 0010001001000001 |
| 217 | 0010001001000010 |
| 218 | 0010001001000100 |
| 219 | 0010001001001000 |
| 220 | 0010001001001001 |
| 221 | 0010010000000001 |
| 222 | 0010010000000010 |
| 223 | 0010010000000100 |
| 224 | 0010010000001000 |
| 225 | 0010010000001001 |
| 226 | 0010010000010000 |
| 227 | 0010010000010001 |
| 228 | 0010010000010010 |
| 229 | 0010010000100000 |
| 230 | 0010010000100001 |
| 231 | 0010010000100010 |
| 232 | 0010010000100100 |
| 233 | 0010010001000000 |
| 234 | 0010010001000001 |
| 235 | 0010010001000010 |
| 236 | 0010010001000100 |
| 237 | 0010010001001000 |
| 238 | 0010010001001001 |
| 239 | 0010010010000000 |
| 240 | 0010010010000001 |
| 241 | 0010010010000010 |
| 242 | 0010010010000100 |
| 243 | 0010010010001000 |
| 244 | 0010010010001001 |
| 245 | 0010010010010000 |
| 246 | 0010010010010001 |
| 247 | 0010010010010010 |
| 248 | 0100000000001000 |
| 249 | 0100000000001001 |
| 250 | 0100000000010000 |
| 251 | 0100000000010001 |
| 252 | 0100000000010010 |
| 253 | 0100000000100000 |
| 254 | 0100000000100001 |
| 255 | 0100000000100010 |
| 256 | 0100000000100100 |
| 257 | 0100000001000000 |
| 258 | 0100000001000001 |
| 259 | 0100000001000010 |
| 260 | 0100000001000100 |
| 261 | 0100000001001000 |
| 262 | 0100000001001001 |
| 263 | 0100000010000000 |
| 264 | 0100000010000001 |
| 265 | 0100000010000010 |
| 266 | 0100000010000100 |
| 267 | 0100000010001000 |
| 268 | 0100000010001001 |
| 269 | 0100000010010000 |
| 270 | 0100000010010001 |
| 271 | 0100000010010010 |
| 272 | 0100000100000000 |
| 273 | 0100000100000001 |
| 274 | 0100000100000010 |
| 275 | 0100000100000100 |

TABLE 36-continued

| NUMBER | 16-BIT CODE |
|---|---|
| 276 | 0100000100001000 |
| 277 | 0100000100001001 |
| 278 | 0100000100010000 |
| 279 | 0100000100010001 |
| 280 | 0100000100010010 |
| 281 | 0100000100100000 |
| 282 | 0100000100100001 |
| 283 | 0100000100100010 |
| 284 | 0100000100100100 |
| 285 | 0100001000000001 |
| 286 | 0100001000000010 |
| 287 | 0100001000000100 |
| 288 | 0100001000001000 |
| 289 | 0100001000001001 |
| 290 | 0100001000010000 |
| 291 | 0100001000010001 |
| 292 | 0100001000010010 |
| 293 | 0100001000100000 |
| 294 | 0100001000100001 |
| 295 | 0100001000100010 |
| 296 | 0100001000100100 |
| 297 | 0100001001000000 |
| 298 | 0100001001000001 |
| 299 | 0100001001000010 |
| 300 | 0100001001000100 |
| 301 | 0100001001001000 |
| 302 | 0100001001001001 |
| 303 | 0100010000000001 |
| 304 | 0100010000000010 |
| 305 | 0100010000000100 |
| 306 | 0100010000001000 |
| 307 | 0100010000001001 |
| 308 | 0100010000010000 |
| 309 | 0100010000010001 |
| 310 | 0100010000010010 |
| 311 | 0100010000100000 |
| 312 | 0100010000100001 |
| 313 | 0100010000100010 |
| 314 | 0100010000100100 |
| 315 | 0100010001000000 |
| 316 | 0100010001000001 |
| 317 | 0100010001000010 |
| 318 | 0100010001000100 |
| 319 | 0100010001001000 |
| 320 | 0100010001001001 |
| 321 | 0100010010000000 |
| 322 | 0100010010000001 |
| 323 | 0100010010000010 |
| 324 | 0100010010000100 |
| 325 | 0100010010001000 |
| 326 | 0100010010001001 |
| 327 | 0100010010010000 |
| 328 | 0100010010010001 |
| 329 | 0100010010010010 |
| 330 | 0100100000000001 |
| 331 | 0100100000000010 |
| 332 | 0100100000000100 |
| 333 | 0100100000001000 |
| 334 | 0100100000001001 |
| 335 | 0100100000010000 |
| 336 | 0100100000010001 |
| 337 | 0100100000010010 |
| 338 | 0100100000100000 |
| 339 | 0100100000100001 |
| 340 | 0100100000100010 |
| 341 | 0100100000100100 |
| 342 | 0100100001000000 |
| 343 | 0100100001000001 |
| 344 | 0100100001000010 |
| 345 | 0100100001000100 |
| 346 | 0100100001001000 |
| 347 | 0100100001001001 |
| 348 | 0100100010000000 |
| 349 | 0100100010000001 |
| 350 | 0100100010000010 |
| 351 | 0100100010000100 |
| 352 | 0100100010001000 |
| 353 | 0100100010001001 |
| 354 | 0100100010010000 |
| 355 | 0100100010010001 |
| 356 | 0100100010010010 |
| 357 | 0100100100000000 |
| 358 | 0100100100000001 |
| 359 | 0100100100000010 |
| 360 | 0100100100000100 |
| 361 | 0100100100001000 |
| 362 | 0100100100001001 |
| 363 | 0100100100010000 |
| 364 | 0100100100010001 |
| 365 | 0100100100010010 |
| 366 | 0100100100100000 |
| 367 | 0100100100100001 |
| 368 | 0100100100100010 |
| 369 | 0100100100100100 |
| 370 | 1000000000010000 |
| 371 | 1000000000010001 |
| 372 | 1000000000010010 |
| 373 | 1000000000100000 |
| 374 | 1000000000100001 |
| 375 | 1000000000100010 |
| 376 | 1000000000100100 |
| 377 | 1000000001000000 |
| 378 | 1000000001000001 |
| 379 | 1000000001000010 |
| 380 | 1000000001000100 |
| 381 | 1000000001001000 |
| 382 | 1000000001001001 |
| 383 | 1000000010000000 |
| 384 | 1000000010000001 |
| 385 | 1000000010000010 |
| 386 | 1000000010000100 |
| 387 | 1000000010001000 |
| 388 | 1000000010001001 |
| 389 | 1000000010010000 |
| 390 | 1000000010010001 |
| 391 | 1000000010010010 |
| 392 | 1000000100000000 |
| 393 | 1000000100000001 |
| 394 | 1000000100000010 |
| 395 | 1000000100000100 |
| 396 | 1000000100001000 |
| 397 | 1000000100001001 |
| 398 | 1000000100010000 |
| 399 | 1000000100010001 |
| 400 | 1000000100010010 |
| 401 | 1000000100100000 |
| 402 | 1000000100100001 |
| 403 | 1000000100100010 |
| 404 | 1000000100100100 |
| 405 | 1000001000000001 |
| 406 | 1000001000000010 |
| 407 | 1000001000000100 |
| 408 | 1000001000001000 |
| 409 | 1000001000001001 |
| 410 | 1000001000010000 |
| 411 | 1000001000010001 |
| 412 | 1000001000010010 |
| 413 | 1000001000100000 |
| 414 | 1000001000100001 |
| 415 | 1000001000100010 |
| 416 | 1000001000100100 |
| 417 | 1000001001000000 |
| 418 | 1000001001000001 |
| 419 | 1000001001000010 |
| 420 | 1000001001000100 |
| 421 | 1000001001001000 |
| 422 | 1000001001001001 |
| 423 | 1000010000000001 |
| 424 | 1000010000000010 |
| 425 | 1000010000000100 |
| 426 | 1000010000001000 |
| 427 | 1000010000001001 |
| 428 | 1000010000010000 |
| 429 | 1000010000010001 |
| 430 | 1000010000010010 |
| 431 | 1000010000100000 |
| 432 | 1000010000100001 |
| 433 | 1000010000100010 |
| 434 | 1000010000100100 |
| 435 | 1000010001000000 |
| 436 | 1000010001000001 |
| 437 | 1000010001000010 |

TABLE 36-continued

| NUMBER | 16-BIT CODE |
| --- | --- |
| 438 | 1000010001000100 |
| 439 | 1000010001001000 |
| 440 | 1000010001001001 |
| 441 | 1000010010000000 |
| 442 | 1000010010000001 |
| 443 | 1000010010000010 |
| 444 | 1000010010000100 |
| 445 | 1000010010001000 |
| 446 | 1000010010001001 |
| 447 | 1000010010010000 |
| 448 | 1000010010010001 |
| 449 | 1000010010010010 |
| 450 | 1000100000000001 |
| 451 | 1000100000000010 |
| 452 | 1000100000000100 |
| 453 | 1000100000001000 |
| 454 | 1000100000001001 |
| 455 | 1000100000010000 |
| 456 | 1000100000010001 |
| 457 | 1000100000010010 |
| 458 | 1000100000100000 |
| 459 | 1000100000100001 |
| 460 | 1000100000100010 |
| 461 | 1000100000100100 |
| 462 | 1000100001000000 |
| 463 | 1000100001000001 |
| 464 | 1000100001000010 |
| 465 | 1000100001000100 |
| 466 | 1000100001001000 |
| 467 | 1000100001001001 |
| 468 | 1000100010000000 |
| 469 | 1000100010000001 |
| 470 | 1000100010000010 |
| 471 | 1000100010000100 |
| 472 | 1000100010001000 |
| 473 | 1000100010001001 |
| 474 | 1000100010010000 |
| 475 | 1000100010010001 |
| 476 | 1000100010010010 |
| 477 | 1000100100000000 |
| 478 | 1000100100000001 |
| 479 | 1000100100000010 |
| 480 | 1000100100000100 |
| 481 | 1000100100001000 |
| 482 | 1000100100001001 |
| 483 | 1000100100010000 |
| 484 | 1000100100010001 |
| 485 | 1000100100010010 |
| 486 | 1000100100100000 |
| 487 | 1000100100100001 |
| 488 | 1000100100100010 |
| 489 | 1000100100100100 |
| 490 | 1001000000000010 |
| 491 | 1001000000000100 |
| 492 | 1001000000001000 |
| 493 | 1001000000001001 |
| 494 | 1001000000010000 |
| 495 | 1001000000010001 |
| 496 | 1001000000010010 |
| 497 | 1001000000100000 |
| 498 | 1001000000100001 |
| 499 | 1001000000100010 |
| 500 | 1001000000100100 |
| 501 | 1001000001000000 |
| 502 | 1001000001000001 |
| 503 | 1001000001000010 |
| 504 | 1001000001000100 |
| 505 | 1001000001001000 |
| 506 | 1001000001001001 |
| 507 | 1001000010000000 |
| 508 | 1001000010000001 |
| 509 | 1001000010000010 |
| 510 | 1001000010000100 |
| 511 | 1001000010001000 |
| 512 | 1001000010001001 |
| 513 | 1001000010010000 |
| 514 | 1001000010010001 |
| 515 | 1001000010010010 |
| 516 | 1001000100000000 |
| 517 | 1001000100000001 |
| 518 | 1001000100000010 |

TABLE 36-continued

| NUMBER | 16-BIT CODE |
| --- | --- |
| 519 | 1001000100000100 |
| 520 | 1001000100001000 |
| 521 | 1001000100001001 |
| 522 | 1001000100010000 |
| 523 | 1001000100010001 |
| 524 | 1001000100010010 |
| 525 | 1001000100100000 |
| 526 | 1001000100100001 |
| 527 | 1001000100100010 |
| 528 | 1001000100100100 |
| 529 | 1001001000000001 |
| 530 | 1001001000000010 |
| 531 | 1001001000000100 |
| 532 | 1001001000001000 |
| 533 | 1001001000001001 |
| 534 | 1001001000010000 |
| 535 | 1001001000010001 |
| 536 | 1001001000010010 |
| 537 | 1001001000100000 |
| 538 | 1001001000100001 |
| 539 | 1001001000100010 |
| 540 | 1001001000100100 |
| 541 | 1001001001000000 |
| 542 | 1001001001000001 |
| 543 | 1001001001000010 |
| 544 | 1001001001000100 |
| 545 | 1001001001001000 |
| 546 | 1001001001001001 |

TABLE 37

| NUMBER | 16-BIT CODE |
| --- | --- |
| 1 | 0000000100000000 |
| 2 | 0000000100000001 |
| 3 | 0000000100000010 |
| 4 | 0000000100000100 |
| 5 | 0000000110001000 |
| 6 | 0000000100001001 |
| 7 | 0000000100010000 |
| 8 | 0000000100010001 |
| 9 | 0000000100010010 |
| 10 | 0000000100100000 |
| 11 | 0000000100100001 |
| 12 | 0000000100100010 |
| 13 | 0000000100100100 |
| 14 | 0000001000000001 |
| 15 | 0000001000000010 |
| 16 | 0000001000000100 |
| 17 | 0000001000001000 |
| 18 | 0000001000001001 |
| 19 | 0000001000010000 |
| 20 | 0000001000010001 |
| 21 | 0000001000010010 |
| 22 | 0000001000100000 |
| 23 | 0000001000100001 |
| 24 | 0000001000100010 |
| 25 | 0000001000100100 |
| 26 | 0000001001000000 |
| 27 | 0000001001000001 |
| 28 | 0000001001000010 |
| 29 | 0000001001000100 |
| 30 | 0000001001001000 |
| 31 | 0000001001001001 |
| 32 | 0000010000000001 |
| 33 | 0000010000000010 |
| 34 | 0000010000000100 |
| 35 | 0000010000001000 |
| 36 | 0000010000001001 |
| 37 | 0000010000010000 |
| 38 | 0000010000010001 |
| 39 | 0000010000010010 |
| 40 | 0000010000100000 |
| 41 | 0000010000100001 |
| 42 | 0000010000100010 |
| 43 | 0000010000100100 |
| 44 | 0000010001000000 |
| 45 | 0000010001000001 |
| 46 | 0000010001000010 |
| 47 | 0000010001000100 |

TABLE 37-continued

| NUMBER | 16-BIT CODE |
|---|---|
| 48 | 0000010001001000 |
| 49 | .0000010001001001 |
| 50 | 0000010010000000 |
| 51 | 0000010010000001 |
| 52 | 0000010010000010 |
| 53 | 0000010010000100 |
| 54 | 0000010010001000 |
| 55 | 0000010010001001 |
| 56 | 0000010010010000 |
| 57 | 0000010010010001 |
| 58 | 0000010010010010 |
| 59 | 0000100000000001 |
| 60 | 0000100000000010 |
| 61 | 0000100000000100 |
| 62 | 0000100000000100 |
| 62 | 0000100000001000 |
| 63 | 0000100000001001 |
| 64 | 0000100000010000 |
| 65 | 0000100000010001 |
| 66 | 0000100000010010 |
| 67 | 0000100000100000 |
| 68 | 0000100000100001 |
| 69 | 0000100000100010 |
| 70 | 0000100000100100 |
| 71 | 0000100001000000 |
| 72 | 0000100001000001 |
| 73 | 0000100001000010 |
| 74 | 0000100001000100 |
| 75 | 0000100001001000 |
| 76 | 0000100001001001 |
| 77 | 0000100010000000 |
| 78 | 0000100010000001 |
| 79 | 0000100010000010 |
| 80 | 0000100010000100 |
| 81 | 0000100010001000 |
| 82 | 0000100010001001 |
| 83 | 0000100010010000 |
| 84 | 0000100010010001 |
| 85 | 0000100010010010 |
| 86 | 0000100100000000 |
| 87 | 0000100100000001 |
| 88 | 0000100100000010 |
| 89 | 0000100100000100 |
| 90 | 0000100100001000 |
| 91 | 0000100100001001 |
| 92 | 0000100100010000 |
| 93 | 0000100100010001 |
| 94 | 0000100100010010 |
| 95 | 0000100100100000 |
| 96 | 0000100100100001 |
| 97 | 0000100100100010 |
| 98 | 0000100100100100 |
| 99 | 0001000000000010 |
| 100 | 0001000000000100 |
| 101 | 0001000000001000 |
| 102 | 0001000000001001 |
| 103 | 0010000000010000 |
| 104 | 0001000000010001 |
| 105 | 0001000000010010 |
| 106 | 0001000000100000 |
| 107 | 0001000000100001 |
| 108 | 0001000000100010 |
| 109 | 0001000000100100 |
| 110 | 0001000001000000 |
| 111 | 0001000001000001 |
| 112 | 0001000001000010 |
| 113 | 0001000001000100 |
| 114 | 0001000001001000 |
| 115 | 0001000001001001 |
| 116 | 0001000010000000 |
| 117 | 0001000010000001 |
| 118 | 0001000010000010 |
| 119 | 0001000010000100 |
| 120 | 0001000010001000 |
| 121 | 0001000010001001 |
| 122 | 0001000010010000 |
| 123 | 0001000010010001 |
| 124 | 0001000010010010 |
| 125 | 0001000100000000 |
| 126 | 0001000100000001 |
| 127 | 0001000100000010 |

TABLE 37-continued

| NUMBER | 16-BIT CODE |
|---|---|
| 128 | 0001000100000100 |
| 129 | 0001000100001000 |
| 130 | 0001000100001001 |
| 131 | 0001000100010000 |
| 132 | 0001000100010001 |
| 133 | 0001000100010010 |
| 134 | 0001000100100000 |
| 135 | 0001000100100001 |
| 136 | 0001000100100010 |
| 137 | 0001000100100100 |
| 138 | 0001001000000001 |
| 139 | 0001001000000010 |
| 140 | 0001001000000100 |
| 141 | 0001001000001000 |
| 142 | 0001001000001001 |
| 143 | 0001001000010000 |
| 144 | 0001001000010001 |
| 145 | 0001001000010010 |
| 146 | 0001001000100000 |
| 147 | 0001001000100001 |
| 148 | 0001001000100010 |
| 149 | 0001001000100100 |
| 150 | 0001001001000000 |
| 151 | 0001001001000001 |
| 152 | 0001001001000010 |
| 153 | 0001001001000100 |
| 154 | 0001001001001000 |
| 155 | 0001001001001001 |
| 156 | 0010000000000100 |
| 157 | 0010000000001000 |
| 158 | 0010000000001001 |
| 159 | 0010000000010000 |
| 160 | 0010000000010001 |
| 161 | 0010000000010010 |
| 162 | 0010000000100000 |
| 163 | 0010000000100001 |
| 164 | 0010000000100010 |
| 165 | 0010000000100100 |
| 166 | 0010000001000000 |
| 167 | 0010000001000001 |
| 168 | 0010000001000010 |
| 169 | 0010000001000100 |
| 170 | 0010000001001000 |
| 171 | 0010000001001001 |
| 172 | 0010000010000000 |
| 173 | 0010000010000001 |
| 174 | 0010000010000010 |
| 175 | 0010000010000100 |
| 176 | 0010000010001000 |
| 177 | 0010000010001001 |
| 178 | 0010000010010000 |
| 179 | 0010000010010001 |
| 180 | 0010000010010010 |
| 181 | 0010000100000000 |
| 182 | 0010000100000001 |
| 183 | 0010000100000010 |
| 184 | 0010000100000100 |
| 185 | 0010000100001000 |
| 186 | 0010000100001001 |
| 187 | 0010000100010000 |
| 188 | 0010000100010001 |
| 189 | 0010000100010010 |
| 190 | 0010000100100000 |
| 191 | 0010000100100001 |
| 192 | 0010000100100010 |
| 193 | 0010000100100100 |
| 194 | 0010001000000001 |
| 195 | 0010001000000010 |
| 196 | 0010001000000100 |
| 197 | 0010001000001000 |
| 198 | 0010001000001001 |
| 199 | 0010001000010000 |
| 200 | 0010001000010001 |
| 201 | 0010001000010010 |
| 202 | 0010001000100000 |
| 203 | 0010001000100001 |
| 204 | 0010001000100010 |
| 205 | 0010001000100100 |
| 206 | 0010001001000000 |
| 207 | 0010001001000001 |
| 208 | 0010001001000010 |

TABLE 37-continued

| NUMBER | 16-BIT CODE |
|---|---|
| 209 | 0010001001000100 |
| 210 | 0010001001001000 |
| 211 | 0010001001001001 |
| 212 | 0010010000000001 |
| 213 | 0010010000000010 |
| 214 | 0010010000000100 |
| 215 | 0010010000001000 |
| 216 | 0010010000001001 |
| 217 | 0010010000010000 |
| 218 | 0010010000010001 |
| 219 | 0010010000010010 |
| 220 | 0010010000100000 |
| 221 | 0010010000100001 |
| 222 | 0010010000100010 |
| 223 | 0010010000100100 |
| 224 | 0010010001000000 |
| 225 | 0010010001000001 |
| 226 | 0010010001000010 |
| 227 | 0010010001000100 |
| 228 | 0010010001001000 |
| 229 | 0010010001001001 |
| 230 | 0010010010000000 |
| 231 | 0010010010000001 |
| 232 | 0010010010000010 |
| 233 | 0010010010000100 |
| 234 | 0010010010001000 |
| 235 | 0010010010001001 |
| 236 | 0010010010010000 |
| 237 | 0010010010010001 |
| 238 | 0010010010010010 |
| 239 | 0100000000001000 |
| 240 | 0100000000001001 |
| 241 | 0100000000010000 |
| 242 | 0100000000010001 |
| 243 | 0100000000010010 |
| 244 | 0100000000100000 |
| 245 | 0100000000100001 |
| 246 | 0100000000100010 |
| 247 | 0100000000100100 |
| 248 | 0100000001000000 |
| 249 | 0100000001000001 |
| 250 | 0100000001000010 |
| 251 | 0100000001000100 |
| 252 | 0100000001001000 |
| 253 | 0100000001001001 |
| 254 | 0100000010000000 |
| 255 | 0100000010000001 |
| 256 | 0100000010000010 |
| 257 | 0100000010000100 |
| 258 | 0100000010001000 |
| 259 | 0100000010001001 |
| 260 | 0100000010010000 |
| 261 | 0100000010010001 |
| 262 | 0100000010010010 |
| 263 | 0100000100000000 |
| 264 | 0100000100000001 |
| 265 | 0100000100000010 |
| 266 | 0100000100000100 |
| 267 | 0100000100001000 |
| 268 | 0100000100001001 |
| 269 | 0100000100010000 |
| 270 | 0100000100010001 |
| 271 | 0100000100010010 |
| 272 | 0100000100100000 |
| 273 | 0100000100100001 |
| 274 | 0100000100100010 |
| 275 | 0100000100100100 |
| 276 | 0100001000000001 |
| 277 | 0100001000000010 |
| 278 | 0100001000000100 |
| 279 | 0100001000001000 |
| 280 | 0100001000001001 |
| 281 | 0100001000010000 |
| 282 | 0100001000010001 |
| 283 | 0100001000010010 |
| 284 | 0100001000100000 |
| 285 | 0100001000100001 |
| 286 | 0100001000100010 |
| 287 | 0100001000100100 |
| 288 | 0100001001000000 |
| 289 | 0100001001000001 |

TABLE 37-continued

| NUMBER | 16-BIT CODE |
|---|---|
| 290 | 0100001001000010 |
| 291 | 0100001001000100 |
| 292 | 0100001001001000 |
| 293 | 0100001001001001 |
| 294 | 0100010000000001 |
| 295 | 0100010000000010 |
| 296 | 0100010000000100 |
| 297 | 0100010000001000 |
| 298 | 0100010000001001 |
| 299 | 0100010000010000 |
| 300 | 0100010000010001 |
| 301 | 0100010000010010 |
| 302 | 0100010000100000 |
| 303 | 0100010000100001 |
| 304 | 0100010000100010 |
| 305 | 0100010000100100 |
| 306 | 0100010001000000 |
| 307 | 0100010001000001 |
| 308 | 0100010001000010 |
| 309 | 0100010001000100 |
| 310 | 0100010001001000 |
| 311 | 0100010001001001 |
| 312 | 0100010010000000 |
| 313 | 0100010010000001 |
| 314 | 0100010010000010 |
| 315 | 0100010010000100 |
| 316 | 0100010010001000 |
| 317 | 0100010010001001 |
| 318 | 0100010010010000 |
| 319 | 0100010010010001 |
| 320 | 0100010010010010 |
| 321 | 0100100000000001 |
| 322 | 0100100000000010 |
| 323 | 0100100000000100 |
| 324 | 0100100000001000 |
| 325 | 0100100000001001 |
| 326 | 0100100000010000 |
| 327 | 0100100000010001 |
| 328 | 0100100000010010 |
| 329 | 0100100000100000 |
| 330 | 0100100000100001 |
| 331 | 0100100000100010 |
| 332 | 0100100000100100 |
| 333 | 0100100001000000 |
| 334 | 0100100001000001 |
| 335 | 0100100001000010 |
| 336 | 0100100001000100 |
| 337 | 0100100001001000 |
| 338 | 0100100001001001 |
| 339 | 0100100010000000 |
| 340 | 0100100010000001 |
| 341 | 0100100010000010 |
| 342 | 0100100010000100 |
| 343 | 0100100010001000 |
| 344 | 0100100010001001 |
| 345 | 0100100010010000 |
| 346 | 0100100010010001 |
| 347 | 0100100010010010 |
| 348 | 0100100100000000 |
| 349 | 0100100100000001 |
| 350 | 0100100100000010 |
| 351 | 0100100100000100 |
| 352 | 0100100100001000 |
| 353 | 0100100100001001 |
| 354 | 0100100100010000 |
| 355 | 0100100100010001 |
| 356 | 0100100100010010 |
| 357 | 0100100100100000 |
| 358 | 0100100100100001 |
| 359 | 0100100100100010 |
| 360 | 0100100100100100 |
| 361 | 1000000000010000 |
| 362 | 1000000000010001 |
| 363 | 1000000000010010 |
| 364 | 1000000000100000 |
| 365 | 1000000000100001 |
| 366 | 1000000000100010 |
| 367 | 1000000000100100 |
| 368 | 1000000001000000 |
| 369 | 1000000001000001 |
| 370 | 1000000001000010 |

TABLE 37-continued

| NUMBER | 16-BIT CODE |
|---|---|
| 371 | 1000000001000100 |
| 372 | 1000000001001000 |
| 373 | 1000000001001001 |
| 374 | 1000000010000000 |
| 375 | 1000000010000001 |
| 376 | 1000000010000010 |
| 377 | 1000000010000100 |
| 378 | 1000000010001000 |
| 379 | 1000000010001001 |
| 380 | 1000000010010000 |
| 381 | 1000000010010001 |
| 382 | 1000000010010010 |
| 383 | 1000000100000000 |
| 384 | 1000000100000001 |
| 385 | 1000000100000010 |
| 386 | 1000000100000100 |
| 387 | 1000000100001000 |
| 388 | 1000000100001001 |
| 389 | 1000000100010000 |
| 390 | 1000000100010001 |
| 391 | 1000000100010010 |
| 392 | 1000000100100000 |
| 393 | 1000000100100001 |
| 394 | 1000000100100010 |
| 395 | 1000000100100100 |
| 396 | 1000001000000001 |
| 397 | 1000001000000010 |
| 398 | 1000001000000100 |
| 399 | 1000001000001000 |
| 400 | 1000001000001001 |
| 401 | 1000001000010000 |
| 402 | 1000001000010001 |
| 403 | 1000001000010010 |
| 404 | 1000001000100000 |
| 405 | 1000001000100001 |
| 406 | 1000001000100010 |
| 407 | 1000001000100100 |
| 408 | 1000001001000000 |
| 409 | 1000001001000001 |
| 410 | 1000001001000010 |
| 411 | 1000001001000100 |
| 412 | 1000001001001000 |
| 413 | 1000001001001001 |
| 414 | 1000010000000001 |
| 415 | 1000010000000010 |
| 416 | 1000010000000100 |
| 417 | 1000010000001000 |
| 418 | 1000010000001001 |
| 419 | 1000010000010000 |
| 420 | 1000010000010001 |
| 421 | 1000010000010010 |
| 422 | 1000010000100000 |
| 423 | 1000010000100001 |
| 424 | 1000010000100010 |
| 425 | 1000010000100100 |
| 426 | 1000010001000000 |
| 427 | 1000010001000001 |
| 428 | 1000010001000010 |
| 429 | 1000010001000100 |
| 430 | 1000010001001000 |
| 431 | 1000010001001001 |
| 432 | 1000010010000000 |
| 433 | 1000010010000001 |
| 434 | 1000010010000010 |
| 435 | 1000010010000100 |
| 436 | 1000010010001000 |
| 437 | 1000010010001001 |
| 438 | 1000010010010000 |
| 439 | 1000010010010001 |
| 440 | 1000010010010010 |
| 441 | 1000100000000001 |
| 442 | 1000100000000010 |
| 443 | 1000100000000100 |
| 444 | 1000100000001000 |
| 445 | 1000100000001001 |
| 446 | 1000100000010000 |
| 447 | 1000100000010001 |
| 448 | 1000100000010010 |
| 449 | 1000100000100000 |
| 450 | 1000100000100001 |
| 451 | 1000100000100010 |

TABLE 37-continued

| NUMBER | 16-BIT CODE |
|---|---|
| 452 | 1000100000100100 |
| 453 | 1000100001000000 |
| 454 | 1000100001000001 |
| 455 | 1000100001000010 |
| 456 | 1000100001000100 |
| 457 | 1000100001001000 |
| 458 | 1000100001001001 |
| 459 | 1000100010000000 |
| 460 | 1000100010000001 |
| 461 | 1000100010000010 |
| 462 | 1000100010000100 |
| 463 | 1000100010001000 |
| 464 | 1000100010001001 |
| 465 | 1000100010010000 |
| 466 | 1000100010010001 |
| 467 | 1000100010010010 |
| 468 | 1000100100000000 |
| 469 | 1000100100000001 |
| 470 | 1000100100000010 |
| 471 | 1000100100000100 |
| 472 | 1000100100001000 |
| 473 | 1000100100001001 |
| 474 | 1000100100010000 |
| 475 | 1000100100010001 |
| 476 | 1000100100010010 |
| 477 | 1000100100100000 |
| 478 | 1000100100100001 |
| 479 | 1000100100100010 |
| 480 | 1000100100100100 |
| 481 | 1001000000000010 |
| 482 | 1001000000000100 |
| 483 | 1001000000001000 |
| 484 | 1001000000001001 |
| 485 | 1001000000010000 |
| 486 | 1001000000010001 |
| 487 | 1001000000010010 |
| 488 | 1001000000100000 |
| 489 | 1001000000100001 |
| 490 | 1001000000100010 |
| 491 | 1001000000100100 |
| 492 | 1001000001000000 |
| 493 | 1001000001000001 |
| 494 | 1001000001000010 |
| 495 | 1001000001000100 |
| 496 | 1001000001001000 |
| 497 | 1001000001001001 |
| 498 | 1001000010000000 |
| 499 | 1001000010000001 |
| 500 | 1001000010000010 |
| 501 | 1001000010000100 |
| 502 | 1001000010001000 |
| 503 | 1001000010001001 |
| 504 | 1001000010010000 |
| 505 | 1001000010010001 |
| 506 | 1001000010010010 |
| 507 | 1001000100000000 |
| 508 | 1001000100000001 |
| 509 | 1001000100000010 |
| 510 | 1001000100000100 |
| 511 | 1001000100001000 |
| 512 | 1001000100001001 |
| 513 | 1001000100010000 |
| 514 | 1001000100010001 |
| 515 | 1001000100010010 |
| 516 | 1001000100100000 |
| 517 | 1001000100100001 |
| 518 | 1001000100100010 |
| 519 | 1001000100100100 |
| 520 | 1001001000000001 |
| 521 | 1001001000000010 |
| 522 | 1001001000000100 |
| 523 | 1001001000001000 |
| 524 | 1001001000001001 |
| 525 | 1001001000010000 |
| 526 | 1001001000010001 |
| 527 | 1001001000010010 |
| 528 | 1001001000100000 |
| 529 | 1001001000100001 |
| 530 | 1001001000100010 |
| 531 | 1001001000100100 |
| 532 | 1001001001000000 |

TABLE 37-continued

| NUMBER | 16-BIT CODE |
|---|---|
| 533 | 1001001001000001 |
| 534 | 1001001001000010 |
| 535 | 1001001001000100 |
| 536 | 1001001001001000 |
| 537 | 1001001001001001 |

TABLE 38

| NUMBER | 16-BIT CODE |
|---|---|
| 1 | 0000001000000001 |
| 2 | 0000001000000010 |
| 3 | 0000001000000100 |
| 4 | 0000001000001000 |
| 5 | 0000001000001001 |
| 6 | 0000001000010000 |
| 7 | 0000001000010001 |
| 8 | 0000001000010010 |
| 9 | 0000001000100000 |
| 10 | 0000001000100001 |
| 11 | 0000001000100010 |
| 12 | 0000001000100100 |
| 13 | 0000001001000000 |
| 14 | 0000001001000001 |
| 15 | 0000001001000010 |
| 16 | 0000001001000100 |
| 17 | 0000001001001000 |
| 18 | 0000001001001001 |
| 19 | 0000010000000001 |
| 20 | 0000010000000010 |
| 21 | 0000010000000100 |
| 22 | 0000010000001000 |
| 23 | 0000010000001001 |
| 24 | 0000010000010000 |
| 25 | 0000010000010001 |
| 26 | 0000010000010010 |
| 27 | 0000010000100000 |
| 28 | 0000010000100001 |
| 29 | 0000010000100010 |
| 30 | 0000010000100100 |
| 31 | 0000010001000000 |
| 32 | 0000010001000001 |
| 33 | 0000010001000010 |
| 34 | 0000010001000100 |
| 35 | 0000010001001000 |
| 36 | 0000010001001001 |
| 37 | 0000010010000000 |
| 38 | 0000010010000001 |
| 39 | 0000010010000010 |
| 40 | 0000010010000100 |
| 41 | 0000010010001000 |
| 42 | 0000010010001001 |
| 43 | 0000010010010000 |
| 44 | 0000010010010001 |
| 45 | 0000010010010010 |
| 46 | 0000100000000001 |
| 47 | 0000100000000010 |
| 48 | 0000100000000100 |
| 49 | 0000100000001000 |
| 50 | 0000100000001001 |
| 51 | 0000100000010000 |
| 52 | 0000100000010001 |
| 53 | 0000100000010010 |
| 54 | 0000100000100000 |
| 55 | 0000100000100001 |
| 56 | 0000100000100010 |
| 57 | 0000100000100100 |
| 58 | 0000100001000000 |
| 59 | 0000100001000001 |
| 60 | 0000100001000010 |
| 61 | 0000100001000100 |
| 62 | 0000100001001000 |
| 63 | 0000100001001001 |
| 64 | 0000100010000000 |
| 65 | 0000100010000001 |
| 66 | 0000100010000010 |
| 67 | 0000100010000100 |
| 68 | 0000100010001000 |
| 69 | 0000100010001001 |
| 70 | 0000100010010000 |
| 71 | 0000100010010001 |
| 72 | 0000100010010010 |
| 73 | 0000100100000000 |
| 74 | 0000100100000001 |
| 75 | 0000100100000010 |
| 76 | 0000100100000100 |
| 77 | 0000100100001000 |
| 78 | 0000100100001001 |
| 79 | 0000100100010000 |
| 80 | 0000100100010001 |
| 81 | 0000100100010010 |
| 82 | 0000100100100000 |
| 83 | 0000100100100001 |
| 84 | 0000100100100010 |
| 85 | 0000100100100100 |
| 86 | 0001000000000010 |
| 87 | 0001000000000100 |
| 88 | 0001000000001000 |
| 89 | 0001000000001001 |
| 90 | 0001000000010000 |
| 91 | 0001000000010001 |
| 92 | 0001000000010010 |
| 93 | 0001000000100000 |
| 94 | 0001000000100001 |
| 95 | 0001000000100010 |
| 96 | 0001000000100100 |
| 97 | 0001000001000000 |
| 98 | 0001000001000001 |
| 99 | 0001000001000010 |
| 100 | 0001000001000100 |
| 101 | 0001000001001000 |
| 102 | 0001000001001001 |
| 103 | 0001000010000000 |
| 104 | 0001000010000001 |
| 105 | 0001000010000010 |
| 106 | 0001000010000100 |
| 107 | 0001000010001000 |
| 108 | 0001000010001001 |
| 109 | 0001000010010000 |
| 110 | 0001000010010001 |
| 111 | 0001000010010010 |
| 112 | 0001000100000000 |
| 113 | 0001000100000001 |
| 114 | 0001000100000010 |
| 115 | 0001000100000100 |
| 116 | 0001000100001000 |
| 117 | 0001000100001001 |
| 118 | 0001000100010000 |
| 119 | 0001000100010001 |
| 120 | 0001000100010010 |
| 121 | 0001000100100000 |
| 122 | 0001000100100001 |
| 123 | 0001000100100010 |
| 124 | 0001000100100100 |
| 125 | 0001001000000001 |
| 126 | 0001001000000010 |
| 127 | 0001001000000100 |
| 128 | 0001001000001000 |
| 129 | 0001001000001001 |
| 130 | 0001001000010000 |
| 131 | 0001001000010001 |
| 132 | 0001001000010010 |
| 133 | 0001001000100000 |
| 134 | 0001001000100001 |
| 135 | 0001001000100010 |
| 136 | 0001001000100100 |
| 137 | 0001001001000000 |
| 138 | 0001001001000001 |
| 139 | 0001001001000010 |
| 140 | 0001001001000100 |
| 141 | 0001001001001000 |
| 142 | 0001001001001001 |
| 143 | 0010000000000100 |
| 144 | 0010000000001000 |
| 145 | 0010000000001001 |
| 146 | 0010000000010000 |
| 147 | 0010000000010001 |
| 148 | 0010000000010010 |
| 149 | 0010000000100000 |
| 150 | 0010000000100001 |
| 151 | 0010000000100010 |

TABLE 38-continued

| NUMBER | 16-BIT CODE |
|---|---|
| 152 | 0010000000100100 |
| 153 | 0010000001000000 |
| 154 | 0010000001000001 |
| 155 | 0010000001000010 |
| 156 | 0010000001000100 |
| 157 | 0010000001001000 |
| 158 | 0010000001001001 |
| 159 | 0010000010000000 |
| 160 | 0010000010000001 |
| 161 | 0010000010000010 |
| 162 | 0010000010000100 |
| 163 | 0010000010001000 |
| 164 | 0010000010001001 |
| 165 | 0010000010010000 |
| 166 | 0010000010010001 |
| 167 | 0010000010010010 |
| 168 | 0010000100000000 |
| 169 | 0010000100000001 |
| 170 | 0010000100000010 |
| 171 | 0010000100000100 |
| 172 | 0010000100001000 |
| 173 | 0010000100001001 |
| 174 | 0010000100010000 |
| 175 | 0010000100010001 |
| 176 | 0010000100010010 |
| 177 | 0010000100100000 |
| 178 | 0010000100100001 |
| 179 | 0010000100100010 |
| 180 | 0010000100100100 |
| 181 | 0010001000000001 |
| 182 | 0010001000000010 |
| 183 | 0010001000000100 |
| 184 | 0010001000001000 |
| 185 | 0010001000001001 |
| 186 | 0010001000010000 |
| 187 | 0010001000010001 |
| 188 | 0010001000010010 |
| 189 | 0010001000100000 |
| 190 | 0010001000100001 |
| 191 | 0010001000100010 |
| 192 | 0010001000100100 |
| 193 | 0010001001000000 |
| 194 | 0010001001000001 |
| 195 | 0010001001000010 |
| 196 | 0010001001000100 |
| 197 | 0010001001001000 |
| 198 | 0010001001001001 |
| 199 | 0010010000000001 |
| 200 | 0010010000000010 |
| 201 | 0010010000000100 |
| 202 | 0010010000001000 |
| 203 | 0010010000001001 |
| 204 | 0010010000010000 |
| 205 | 0010010000010001 |
| 206 | 0010010000010010 |
| 207 | 0010010000100000 |
| 208 | 0010010000100001 |
| 209 | 0010010000100010 |
| 210 | 0010010000100100 |
| 211 | 0010010001000000 |
| 212 | 0010010001000001 |
| 213 | 0010010001000010 |
| 214 | 0010010001000100 |
| 215 | 0010010001001000 |
| 216 | 0010010001001001 |
| 217 | 0010010010000000 |
| 218 | 0010010010000001 |
| 219 | 0010010010000010 |
| 220 | 0010010010000100 |
| 221 | 0010010010001000 |
| 222 | 0010010010001001 |
| 223 | 0010010010010000 |
| 224 | 0010010010010001 |
| 225 | 0010010010010010 |
| 226 | 0100000000001000 |
| 227 | 0100000000001001 |
| 228 | 0100000000010000 |
| 229 | 0100000000010001 |
| 230 | 0100000000010010 |
| 231 | 0100000000100000 |
| 232 | 0100000000100001 |

TABLE 38-continued

| NUMBER | 16-BIT CODE |
|---|---|
| 233 | 0100000000100010 |
| 234 | 0100000000100100 |
| 235 | 0100000001000000 |
| 236 | 0100000001000001 |
| 237 | 0100000001000010 |
| 238 | 0100000001000100 |
| 239 | 0100000001001000 |
| 240 | 0100000001001001 |
| 241 | 0100000010000000 |
| 242 | 0100000010000001 |
| 243 | 0100000010000010 |
| 244 | 0100000010000100 |
| 245 | 0100000010001000 |
| 246 | 0100000010001001 |
| 247 | 0100000010010000 |
| 248 | 0100000010010001 |
| 249 | 0100000010010010 |
| 250 | 0100000100000000 |
| 251 | 0100000100000001 |
| 252 | 0100000100000010 |
| 253 | 0100000100000100 |
| 254 | 0100000100001000 |
| 255 | 0100000100001001 |
| 256 | 0100000100010000 |
| 257 | 0100000100010001 |
| 258 | 0100000100010010 |
| 259 | 0100000100100000 |
| 260 | 0100000100100001 |
| 261 | 0100000100100010 |
| 262 | 0100000100100100 |
| 263 | 0100001000000001 |
| 264 | 0100001000000010 |
| 265 | 0100001000000100 |
| 266 | 0100001000001000 |
| 267 | 0100001000001001 |
| 268 | 0100001000010000 |
| 269 | 0100001000010001 |
| 270 | 0100001000010010 |
| 271 | 0100001000100000 |
| 272 | 0100001000100001 |
| 273 | 0100001000100010 |
| 274 | 0100001000100100 |
| 275 | 0100001001000000 |
| 276 | 0100001001000001 |
| 277 | 0100001001000010 |
| 278 | 0100001001000100 |
| 279 | 0100001001001000 |
| 280 | 0100001001001001 |
| 281 | 0100010000000001 |
| 282 | 0100010000000010 |
| 283 | 0100010000000100 |
| 284 | 0100010000001000 |
| 285 | 0100010000001001 |
| 286 | 0100010000010000 |
| 287 | 0100010000010001 |
| 288 | 0100010000010010 |
| 289 | 0100010000100000 |
| 290 | 0100010000100001 |
| 291 | 0100010000100010 |
| 292 | 0100010000100100 |
| 293 | 0100010001000000 |
| 294 | 0100010001000001 |
| 295 | 0100010001000010 |
| 296 | 0100010001000100 |
| 297 | 0100010001001000 |
| 298 | 0100010001001001 |
| 299 | 0100010010000000 |
| 300 | 0100010010000001 |
| 301 | 0100010010000010 |
| 302 | 0100010010000100 |
| 303 | 0100010010001000 |
| 304 | 0100010010001001 |
| 305 | 0100010010010000 |
| 306 | 0100010010010001 |
| 307 | 0100010010010010 |
| 308 | 0100100000000001 |
| 309 | 0100100000000010 |
| 310 | 0100100000000100 |
| 311 | 0100100000001000 |
| 312 | 0100100000001001 |
| 313 | 0100100000010000 |

TABLE 38-continued

| NUMBER | 16-BIT CODE |
|---|---|
| 314 | 0100100000010001 |
| 315 | 0100100000010010 |
| 316 | 0100100000100000 |
| 317 | 0100100000100001 |
| 318 | 0100100000100010 |
| 319 | 0100100000100100 |
| 320 | 0100100001000000 |
| 321 | 0100100001000001 |
| 322 | 0100100001000010 |
| 323 | 0100100001000100 |
| 324 | 0100100001001000 |
| 325 | 0100100001001001 |
| 326 | 0100100010000000 |
| 327 | 0100100010000001 |
| 328 | 0100100010000010 |
| 329 | 0100100010000100 |
| 330 | 0100100010001000 |
| 331 | 0100100010001001 |
| 332 | 0100100010010000 |
| 333 | 0100100010010001 |
| 334 | 0100100010010010 |
| 335 | 0100100100000000 |
| 336 | 0100100100000001 |
| 337 | 0100100100000010 |
| 338 | 0100100100000100 |
| 339 | 0100100100001000 |
| 340 | 0100100100001001 |
| 341 | 0100100100010000 |
| 342 | 0100100100010001 |
| 343 | 0100100100010010 |
| 344 | 0100100100100000 |
| 345 | 0100100100100001 |
| 346 | 0100100100100010 |
| 347 | 0100100100100100 |
| 348 | 1000000000010000 |
| 349 | 1000000000010001 |
| 350 | 1000000000010010 |
| 351 | 1000000000100000 |
| 352 | 1000000000100001 |
| 353 | 1000000000100010 |
| 354 | 1000000000100100 |
| 355 | 1000000001000000 |
| 356 | 1000000001000001 |
| 357 | 1000000001000010 |
| 358 | 1000000001000100 |
| 359 | 1000000001001000 |
| 360 | 1000000001001001 |
| 361 | 1000000010000000 |
| 362 | 1000000010000001 |
| 363 | 1000000010000010 |
| 364 | 1000000010000100 |
| 365 | 1000000010001000 |
| 366 | 1000000010001001 |
| 367 | 1000000010010000 |
| 368 | 1000000010010001 |
| 369 | 1000000010010010 |
| 370 | 1000000100000000 |
| 371 | 1000000100000001 |
| 372 | 1000000100000010 |
| 373 | 1000000100000100 |
| 374 | 1000000100001000 |
| 375 | 1000000100001001 |
| 376 | 1000000100010000 |
| 377 | 1000000100010001 |
| 378 | 1000000100010010 |
| 379 | 1000000100100000 |
| 380 | 1000000100100001 |
| 381 | 1000000100100010 |
| 382 | 1000000100100100 |
| 383 | 1000001000000001 |
| 384 | 1000001000000010 |
| 385 | 1000001000000100 |
| 386 | 1000001000001000 |
| 387 | 1000001000001001 |
| 388 | 1000001000010000 |
| 389 | 1000001000010001 |
| 390 | 1000001000010010 |
| 391 | 1000001000100000 |
| 392 | 1000001000100001 |
| 393 | 1000001000100010 |
| 394 | 1000001000100100 |

TABLE 38-continued

| NUMBER | 16-BIT CODE |
|---|---|
| 395 | 1000001001000000 |
| 396 | 1000001001000001 |
| 397 | 1000001001000010 |
| 398 | 1000001001000100 |
| 399 | 1000001001001000 |
| 400 | 1000001001001001 |
| 401 | 1000010000000001 |
| 402 | 1000010000000010 |
| 403 | 1000010000000100 |
| 404 | 1000010000001000 |
| 405 | 1000010000001001 |
| 406 | 1000010000010000 |
| 407 | 1000010000010001 |
| 408 | 1000010000010010 |
| 409 | 1000010000100000 |
| 410 | 1000010000100001 |
| 411 | 1000010000100010 |
| 412 | 1000010000100100 |
| 413 | 1000010001000000 |
| 414 | 1000010001000001 |
| 415 | 1000010001000010 |
| 416 | 1000010001000100 |
| 417 | 1000010001001000 |
| 418 | 1000010001001001 |
| 419 | 1000010010000000 |
| 420 | 1000010010000001 |
| 421 | 1000010010000010 |
| 422 | 1000010010000100 |
| 423 | 1000010010001000 |
| 424 | 1000010010001001 |
| 425 | 1000010010010000 |
| 426 | 1000010010010001 |
| 427 | 1000010010010010 |
| 428 | 1000100000000001 |
| 429 | 1000100000000010 |
| 430 | 1000100000000100 |
| 431 | 1000100000001000 |
| 432 | 1000100000001001 |
| 433 | 1000100000010000 |
| 434 | 1000100000010001 |
| 435 | 1000100000010010 |
| 436 | 1000100000100000 |
| 437 | 1000100000100001 |
| 438 | 1000100000100010 |
| 439 | 1000100000100100 |
| 440 | 1000100001000000 |
| 441 | 1000100001000001 |
| 442 | 1000100001000010 |
| 443 | 1000100001000100 |
| 444 | 1000100001001000 |
| 445 | 1000100001001001 |
| 446 | 1000100010000000 |
| 447 | 1000100010000001 |
| 448 | 1000100010000010 |
| 449 | 1000100010000100 |
| 450 | 1000100010001000 |
| 451 | 1000100010001001 |
| 452 | 1000100010010000 |
| 453 | 1000100010010001 |
| 454 | 1000100010010010 |
| 455 | 1000100100000000 |
| 456 | 1000100100000001 |
| 457 | 1000100100000010 |
| 458 | 1000100100000100 |
| 459 | 1000100100001000 |
| 460 | 1000100100001001 |
| 461 | 1000100100010000 |
| 462 | 1000100100010001 |
| 463 | 1000100100010010 |
| 464 | 1000100100100000 |
| 465 | 1000100100100001 |
| 466 | 1000100100100010 |
| 467 | 1000100100100100 |
| 468 | 1001000000000010 |
| 469 | 1001000000000100 |
| 470 | 1001000000001000 |
| 471 | 1001000000001001 |
| 472 | 1001000000010000 |
| 473 | 1001000000010001 |
| 474 | 1001000000010010 |
| 475 | 1001000000100000 |

TABLE 38-continued

| NUMBER | 16-BIT CODE |
|---|---|
| 476 | 1001000000100001 |
| 477 | 1001000000100010 |
| 478 | 1001000000100100 |
| 479 | 1001000001000000 |
| 480 | 1001000001000001 |
| 481 | 1001000001000010 |
| 482 | 1001000001000100 |
| 483 | 1001000001001000 |
| 484 | 1001000001001001 |
| 485 | 1001000010000000 |
| 486 | 1001000010000001 |
| 487 | 1001000010000010 |
| 488 | 1001000010000100 |
| 489 | 1001000010001000 |
| 490 | 1001000010001001 |
| 491 | 1001000010010000 |
| 492 | 1001000010010001 |
| 493 | 1001000010010010 |
| 494 | 1001000100000000 |
| 495 | 1001000100000001 |
| 496 | 1001000100000010 |
| 497 | 1001000100000100 |
| 498 | 1001000100001000 |
| 499 | 1001000100001001 |
| 500 | 1001000100010000 |
| 501 | 1001000100010001 |
| 502 | 1001000100010010 |
| 503 | 1001000100100000 |
| 504 | 1001000100100001 |
| 505 | 1001000100100010 |
| 506 | 1001000100100100 |
| 507 | 1001001000000001 |
| 508 | 1001001000000010 |
| 509 | 1001001000000100 |
| 510 | 1001001000001000 |
| 511 | 1001001000001001 |
| 512 | 1001001000010000 |
| 513 | 1001001000010001 |
| 514 | 1001001000010010 |
| 515 | 1001001000100000 |
| 516 | 1001001000100001 |
| 517 | 1001001000100010 |
| 518 | 1001001000100100 |
| 519 | 1001001001000000 |
| 520 | 1001001001000001 |
| 521 | 1001001001000010 |
| 522 | 1001001001000100 |
| 523 | 1001001001001000 |
| 524 | 1001001001001001 |

TABLE 39

| NUMBER | 16-BIT CODE |
|---|---|
| 1 | 0000010000000001 |
| 2 | 0000010000000010 |
| 3 | 0000010000000100 |
| 4 | 0000010000001000 |
| 5 | 0000010000001001 |
| 6 | 0000010000010000 |
| 7 | 0000010000010001 |
| 8 | 0000010000010010 |
| 9 | 0000010000100000 |
| 10 | 0000010000100001 |
| 11 | 0000010000100010 |
| 12 | 0000010000100100 |
| 13 | 0000010001000000 |
| 14 | 0000010001000001 |
| 15 | 0000010001000010 |
| 16 | 0000010001000100 |
| 17 | 0000010001001000 |
| 18 | 0000010001001001 |
| 19 | 0000010010000000 |
| 20 | 0000010010000001 |
| 21 | 0000010010000010 |
| 22 | 0000010010000100 |
| 23 | 0000010010001000 |
| 24 | 0000010010001001 |
| 25 | 0000010010010000 |
| 26 | 0000010010010001 |

TABLE 39-continued

| NUMBER | 16-BIT CODE |
|---|---|
| 27 | 0000010010010010 |
| 28 | 0000100000000001 |
| 29 | 0000100000000010 |
| 30 | 0000100000000100 |
| 31 | 0000100000001000 |
| 32 | 0000100000001001 |
| 33 | 0000100000010000 |
| 34 | 0000100000010001 |
| 35 | 0000100000010010 |
| 36 | 0000100000100000 |
| 37 | 0000100000100001 |
| 38 | 0000100000100010 |
| 39 | 0000100000100100 |
| 40 | 0000100001000000 |
| 41 | 0000100001000001 |
| 42 | 0000100001000010 |
| 43 | 0000100001000100 |
| 44 | 0000100001001000 |
| 45 | 0000100001001001 |
| 46 | 0000100010000000 |
| 47 | 0000100010000001 |
| 48 | 0000100010000010 |
| 49 | 0000100010000100 |
| 50 | 0000100010001000 |
| 51 | 0000100010001001 |
| 52 | 0000100010010000 |
| 53 | 0000100010010001 |
| 54 | 0000100010010010 |
| 55 | 0000100100000000 |
| 56 | 0000100100000001 |
| 57 | 0000100100000010 |
| 58 | 0000100100000100 |
| 59 | 0000100100001000 |
| 60 | 0000100100001001 |
| 61 | 0000100100010000 |
| 62 | 0000100100010001 |
| 63 | 0000100100010010 |
| 64 | 0000100100100000 |
| 65 | 0000100100100001 |
| 66 | 0000100100100010 |
| 67 | 0000100100100100 |
| 68 | 0001000000000010 |
| 69 | 0001000000000100 |
| 70 | 0001000000001000 |
| 71 | 0001000000001001 |
| 72 | 0001000000010000 |
| 73 | 0001000000010001 |
| 74 | 0001000000010010 |
| 75 | 0001000000100000 |
| 76 | 0001000000100001 |
| 77 | 0001000000100010 |
| 78 | 0001000000100100 |
| 79 | 0001000001000000 |
| 80 | 0001000001000001 |
| 81 | 0001000001000010 |
| 82 | 0001000001000100 |
| 83 | 0001000001001000 |
| 84 | 0001000001001001 |
| 85 | 0001000010000000 |
| 86 | 0001000010000001 |
| 87 | 0001000010000010 |
| 88 | 0001000010000100 |
| 89 | 0001000010001000 |
| 90 | 0001000010001001 |
| 91 | 0001000010010000 |
| 92 | 0001000010010001 |
| 93 | 0001000010010010 |
| 94 | 0001000100000000 |
| 95 | 0001000100000001 |
| 96 | 0001000100000010 |
| 97 | 0001000100000100 |
| 98 | 0001000100001000 |
| 99 | 0001000100001001 |
| 100 | 0001000100010000 |
| 101 | 0001000100010001 |
| 102 | 0001000100010010 |
| 103 | 0001000100100000 |
| 104 | 0001000100100001 |
| 105 | 0001000100100010 |
| 106 | 0001000100100100 |
| 107 | 0001001000000001 |

TABLE 39-continued

| NUMBER | 16-BIT CODE |
|---|---|
| 108 | 0001001000000010 |
| 109 | 0001001000000100 |
| 110 | 0001001000001000 |
| 111 | 0001001000001001 |
| 112 | 0001001000010000 |
| 113 | 0001001000010001 |
| 114 | 0001001000010010 |
| 115 | 0001001000100000 |
| 116 | 0001001000100001 |
| 117 | 0001001000100010 |
| 118 | 0001001000100100 |
| 119 | 0001001001000000 |
| 120 | 0001001001000001 |
| 121 | 0001001001000010 |
| 122 | 0001001001000100 |
| 123 | 0001001001001000 |
| 124 | 0001001001001001 |
| 125 | 0010000000000100 |
| 126 | 0010000000001000 |
| 127 | 0010000000001001 |
| 128 | 0010000000010000 |
| 129 | 0010000000010001 |
| 130 | 0010000000010010 |
| 131 | 0010000000100000 |
| 132 | 0010000000100001 |
| 133 | 0010000000100010 |
| 134 | 0010000000100100 |
| 135 | 0010000001000000 |
| 136 | 0010000001000001 |
| 137 | 0010000001000010 |
| 138 | 0010000001000100 |
| 139 | 0010000001001000 |
| 140 | 0010000001001001 |
| 141 | 0010000010000000 |
| 142 | 0010000010000001 |
| 143 | 0010000010000010 |
| 144 | 0010000010000100 |
| 145 | 0010000010001000 |
| 146 | 0010000010001001 |
| 147 | 0010000010010000 |
| 148 | 0010000010010001 |
| 149 | 0010000010010010 |
| 150 | 0010000100000000 |
| 151 | 0010000100000001 |
| 152 | 0010000100000010 |
| 153 | 0010000100000100 |
| 154 | 0010000100001000 |
| 155 | 0010000100001001 |
| 156 | 0010000100010000 |
| 157 | 0010000100010001 |
| 158 | 0010000100010010 |
| 159 | 0010000100100000 |
| 160 | 0010000100100001 |
| 161 | 0010000100100010 |
| 162 | 0010000100100100 |
| 163 | 0010001000000001 |
| 164 | 0010001000000010 |
| 165 | 0010001000000100 |
| 166 | 0010001000001000 |
| 167 | 0010001000001001 |
| 168 | 0010001000010000 |
| 169 | 0010001000010001 |
| 170 | 0010001000010010 |
| 171 | 0010001000100000 |
| 172 | 0010001000100001 |
| 173 | 0010001000100010 |
| 174 | 0010001000100100 |
| 175 | 0010001001000000 |
| 176 | 0010001001000001 |
| 177 | 0010001001000010 |
| 178 | 0010001001000100 |
| 179 | 0010001001001000 |
| 180 | 0010001001001001 |
| 181 | 0010010000000001 |
| 182 | 0010010000000010 |
| 183 | 0010010000000100 |
| 184 | 0010010000001000 |
| 185 | 0010010000001001 |
| 186 | 0010010000010000 |
| 187 | 0010010000010001 |
| 188 | 0010010000010010 |
| 189 | 0010010000100000 |
| 190 | 0010010000100001 |
| 191 | 0010010000100010 |
| 192 | 0010010000100100 |
| 193 | 0010010001000000 |
| 194 | 0010010001000001 |
| 195 | 0010010001000010 |
| 196 | 0010010001000100 |
| 197 | 0010010001001000 |
| 198 | 0010010001001001 |
| 199 | 0010010010000000 |
| 200 | 0010010010000001 |
| 201 | 0010010010000010 |
| 202 | 0010010010000100 |
| 203 | 0010010010001000 |
| 204 | 0010010010001001 |
| 205 | 0010010010010000 |
| 206 | 0010010010010001 |
| 207 | 0010010010010010 |
| 208 | 0100000000001000 |
| 209 | 0100000000001001 |
| 210 | 0100000000010000 |
| 211 | 0100000000010001 |
| 212 | 0100000000010010 |
| 213 | 0100000000100000 |
| 214 | 0100000000100001 |
| 215 | 0100000000100010 |
| 216 | 0100000000100100 |
| 217 | 0100000001000000 |
| 218 | 0100000001000001 |
| 219 | 0100000001000010 |
| 220 | 0100000001000100 |
| 221 | 0100000001001000 |
| 222 | 0100000001001001 |
| 223 | 0100000010000000 |
| 224 | 0100000010000001 |
| 225 | 0100000010000010 |
| 226 | 0100000010000100 |
| 227 | 0100000010001000 |
| 228 | 0100000010001001 |
| 229 | 0100000010010000 |
| 230 | 0100000010010001 |
| 231 | 0100000010010010 |
| 232 | 0100000100000000 |
| 233 | 0100000100000001 |
| 234 | 0100000100000010 |
| 235 | 0100000100000100 |
| 236 | 0100000100001000 |
| 237 | 0100000100001001 |
| 238 | 0100000100010000 |
| 239 | 0100000100010001 |
| 240 | 0100000100010010 |
| 241 | 0100000100100000 |
| 242 | 0100000100100001 |
| 243 | 0100000100100010 |
| 244 | 0100000100100100 |
| 245 | 0100001000000001 |
| 246 | 0100001000000010 |
| 247 | 0100001000000100 |
| 248 | 0100001000001000 |
| 249 | 0100001000001001 |
| 250 | 0100001000010000 |
| 251 | 0100001000010001 |
| 252 | 0100001000010010 |
| 253 | 0100001000100000 |
| 254 | 0100001000100001 |
| 255 | 0100001000100010 |
| 256 | 0100001000100100 |
| 257 | 0100001001000000 |
| 258 | 0100001001000001 |
| 259 | 0100001001000010 |
| 260 | 0100001001000100 |
| 261 | 0100001001001000 |
| 262 | 0100001001001001 |
| 263 | 0100010000000001 |
| 264 | 0100010000000010 |
| 265 | 0100010000000100 |
| 266 | 0100010000001000 |
| 267 | 0100010000001001 |
| 268 | 0100010000010000 |
| 269 | 0100010000010001 |

TABLE 39-continued

| NUMBER | 16-BIT CODE |
|---|---|
| 270 | 0100010000010010 |
| 271 | 0100010000100000 |
| 272 | 0100010000100001 |
| 273 | 0100010000100010 |
| 274 | 0100010000100100 |
| 275 | 0100010001000000 |
| 276 | 0100010001000001 |
| 277 | 0100010001000010 |
| 278 | 0100010001000100 |
| 279 | 0100010001001000 |
| 280 | 0100010001001001 |
| 281 | 0100010010000000 |
| 282 | 0100010010000001 |
| 283 | 0100010010000010 |
| 284 | 0100010010000100 |
| 285 | 0100010010001000 |
| 286 | 0100010010001001 |
| 287 | 0100010010010000 |
| 288 | 0100010010010001 |
| 289 | 0100010010010010 |
| 290 | 0100100000000001 |
| 291 | 0100100000000010 |
| 292 | 0100100000000100 |
| 293 | 0100100000001000 |
| 294 | 0100100000001001 |
| 295 | 0100100000010000 |
| 296 | 0100100000010001 |
| 297 | 0100100000010010 |
| 298 | 0100100000100000 |
| 299 | 0100100000100001 |
| 300 | 0100100000100010 |
| 301 | 0100100000100100 |
| 302 | 0100100001000000 |
| 303 | 0100100001000001 |
| 304 | 0100100001000010 |
| 305 | 0100100001000100 |
| 306 | 0100100001001000 |
| 307 | 0100100001001001 |
| 308 | 0100100010000000 |
| 309 | 0100100010000001 |
| 310 | 0100100010000010 |
| 311 | 0100100010000100 |
| 312 | 0100100010001000 |
| 313 | 0100100010001001 |
| 314 | 0100100010010000 |
| 315 | 0100100010010001 |
| 316 | 0100100010010010 |
| 317 | 0100100100000000 |
| 318 | 0100100100000001 |
| 319 | 0100100100000010 |
| 320 | 0100100100000100 |
| 321 | 0100100100001000 |
| 322 | 0100100100001001 |
| 323 | 0100100100010000 |
| 324 | 0100100100010001 |
| 325 | 0100100100010010 |
| 326 | 0100100100100000 |
| 327 | 0100100100100001 |
| 328 | 0100100100100010 |
| 329 | 0100100100100100 |
| 330 | 1000000000010000 |
| 331 | 1000000000010001 |
| 332 | 1000000000010010 |
| 333 | 1000000000100000 |
| 334 | 1000000000100001 |
| 335 | 1000000000100010 |
| 336 | 1000000000100100 |
| 337 | 1000000001000000 |
| 338 | 1000000001000001 |
| 339 | 1000000001000010 |
| 340 | 1000000001000100 |
| 341 | 1000000001001000 |
| 342 | 1000000001001001 |
| 343 | 1000000010000000 |
| 344 | 1000000010000001 |
| 345 | 1000000010000010 |
| 346 | 1000000010000100 |
| 347 | 1000000010001000 |
| 348 | 1000000010001001 |
| 349 | 1000000010010000 |
| 350 | 1000000010010001 |
| 351 | 1000000010010010 |
| 352 | 1000000100000000 |
| 353 | 1000000100000001 |
| 354 | 1000000100000010 |
| 355 | 1000000100000100 |
| 356 | 1000000100001000 |
| 357 | 1000000100001001 |
| 358 | 1000000100010000 |
| 359 | 1000000100010001 |
| 360 | 1000000100010010 |
| 361 | 1000000100100000 |
| 362 | 1000000100100001 |
| 363 | 1000000100100010 |
| 364 | 1000000100100100 |
| 365 | 1000001000000001 |
| 366 | 1000001000000010 |
| 367 | 1000001000000100 |
| 368 | 1000001000001000 |
| 369 | 1000001000001001 |
| 370 | 1000001000010000 |
| 371 | 1000001000010001 |
| 372 | 1000001000010010 |
| 373 | 1000001000100000 |
| 374 | 1000001000100001 |
| 375 | 1000001000100010 |
| 376 | 1000001000100100 |
| 377 | 1000001001000000 |
| 378 | 1000001001000001 |
| 379 | 1000001001000010 |
| 380 | 1000001001000100 |
| 381 | 1000001001001000 |
| 382 | 1000001001001001 |
| 383 | 1000010000000001 |
| 384 | 1000010000000010 |
| 385 | 1000010000000100 |
| 386 | 1000010000001000 |
| 387 | 1000010000001001 |
| 388 | 1000010000010000 |
| 389 | 1000010000010001 |
| 390 | 1000010000010010 |
| 391 | 1000010000100000 |
| 392 | 1000010000100001 |
| 393 | 1000010000100010 |
| 394 | 1000010000100100 |
| 395 | 1000010001000000 |
| 396 | 1000010001000001 |
| 397 | 1000010001000010 |
| 398 | 1000010001000100 |
| 399 | 1000010001001000 |
| 400 | 1000010001001001 |
| 401 | 1000010010000000 |
| 402 | 1000010010000001 |
| 403 | 1000010010000010 |
| 404 | 1000010010000100 |
| 405 | 1000010010001000 |
| 406 | 1000010010001001 |
| 407 | 1000010010010000 |
| 408 | 1000010010010001 |
| 409 | 1000010010010010 |
| 410 | 1000100000000001 |
| 411 | 1000100000000010 |
| 412 | 1000100000000100 |
| 413 | 1000100000001000 |
| 414 | 1000100000001001 |
| 415 | 1000100000010000 |
| 416 | 1000100000010001 |
| 417 | 1000100000010010 |
| 418 | 1000100000100000 |
| 419 | 1000100000100001 |
| 420 | 1000100000100010 |
| 421 | 1000100000100100 |
| 422 | 1000100001000000 |
| 423 | 1000100001000001 |
| 424 | 1000100001000010 |
| 425 | 1000100001000100 |
| 426 | 1000100001001000 |
| 427 | 1000100001001001 |
| 428 | 1000100010000000 |
| 429 | 1000100010000001 |
| 430 | 1000100010000010 |
| 431 | 1000100010000100 |

TABLE 39-continued

| NUMBER | 16-BIT CODE |
|---|---|
| 432 | 1000100010001000 |
| 433 | 1000100010001001 |
| 434 | 1000100010010000 |
| 435 | 1000100010010001 |
| 436 | 1000100010010010 |
| 437 | 1000100100000000 |
| 438 | 1000100100000001 |
| 439 | 1000100100000010 |
| 440 | 1000100100000100 |
| 441 | 1000100100001000 |
| 442 | 1000100100001001 |
| 443 | 1000100100010000 |
| 444 | 1000100100010001 |
| 445 | 1000100100010010 |
| 446 | 1000100100100000 |
| 447 | 1000100100100001 |
| 448 | 1000100100100010 |
| 449 | 1000100100100100 |
| 450 | 1001000000000010 |
| 451 | 1001000000000100 |
| 452 | 1001000000001000 |
| 453 | 1001000000001001 |
| 454 | 1001000000010000 |
| 455 | 1001000000010001 |
| 456 | 1001000000010010 |
| 457 | 1001000000100000 |
| 458 | 1001000000100001 |
| 459 | 1001000000100010 |
| 460 | 1001000000100100 |
| 461 | 1001000001000000 |
| 462 | 1001000001000001 |
| 463 | 1001000001000010 |
| 464 | 1001000001000100 |
| 465 | 1001000001001000 |
| 466 | 1001000001001001 |
| 467 | 1001000010000000 |
| 468 | 1001000010000001 |
| 469 | 1001000010000010 |
| 470 | 1001000010000100 |
| 471 | 1001000010001000 |
| 472 | 1001000010001001 |
| 473 | 1001000010010000 |
| 474 | 1001000010010001 |
| 475 | 1001000010010010 |
| 476 | 1001000100000000 |
| 477 | 1001000100000001 |
| 478 | 1001000100000010 |
| 479 | 1001000100000100 |
| 480 | 1001000100001000 |
| 481 | 1001000100001001 |
| 482 | 1001000100010000 |
| 483 | 1001000100010001 |
| 484 | 1001000100010010 |
| 485 | 1001000100100000 |
| 486 | 1001000100100001 |
| 487 | 1001000100100010 |
| 488 | 1001000100100100 |
| 489 | 1001001000000001 |
| 490 | 1001001000000010 |
| 491 | 1001001000000100 |
| 492 | 1001001000001000 |
| 493 | 1001001000001001 |
| 494 | 1001001000010000 |
| 495 | 1001001000010001 |
| 496 | 1001001000010010 |
| 497 | 1001001000100000 |
| 498 | 1001001000100001 |
| 499 | 1001001000100010 |
| 500 | 1001001000100100 |
| 501 | 1001001001000000 |
| 502 | 1001001001000001 |
| 503 | 1001001001000010 |
| 504 | 1001001001000100 |
| 505 | 1001001001001000 |
| 506 | 1001001001001001 |

TABLE 40

| NUMBER | 16-BIT CODE |
|---|---|
| 1 | 0000100000000001 |
| 2 | 0000100000000010 |
| 3 | 0000100000000100 |
| 4 | 0000100000001000 |
| 5 | 0000100000001001 |
| 6 | 0000100000010000 |
| 7 | 0000100000010001 |
| 8 | 0000100000010010 |
| 9 | 0000100000100000 |
| 10 | 0000100000100001 |
| 11 | 0000100000100010 |
| 12 | 0000100000100100 |
| 13 | 0000100001000000 |
| 14 | 0000100001000001 |
| 15 | 0000100001000010 |
| 16 | 0000100001000100 |
| 17 | 0000100001001000 |
| 18 | 0000100001001001 |
| 19 | 0000100010000000 |
| 20 | 0000100010000001 |
| 21 | 0000100010000010 |
| 22 | 0000100010000100 |
| 23 | 0000100010001000 |
| 24 | 0000100010001001 |
| 25 | 0000100010010000 |
| 26 | 0000100010010001 |
| 27 | 0000100010010010 |
| 28 | 0000100100000000 |
| 29 | 0000100100000001 |
| 30 | 0000100100000010 |
| 31 | 0000100100000100 |
| 32 | 0000100100001000 |
| 33 | 0000100100001001 |
| 34 | 0000100100010000 |
| 35 | 0000100100010001 |
| 36 | 0000100100010010 |
| 37 | 0000100100100000 |
| 38 | 0000100100100001 |
| 39 | 0000100100100010 |
| 40 | 0000100100100100 |
| 41 | 0001000000000010 |
| 42 | 0001000000000100 |
| 43 | 0001000000001000 |
| 44 | 0001000000001001 |
| 45 | 0001000000010000 |
| 46 | 0001000000010001 |
| 47 | 0001000000010010 |
| 48 | 0001000000100000 |
| 49 | 0001000000100001 |
| 50 | 0001000000100010 |
| 51 | 0001000000100100 |
| 52 | 0001000001000000 |
| 53 | 0001000001000001 |
| 54 | 0001000001000010 |
| 55 | 0001000001000100 |
| 56 | 0001000001001000 |
| 57 | 0001000001001001 |
| 58 | 0001000010000000 |
| 59 | 0001000010000001 |
| 60 | 0001000010000010 |
| 61 | 0001000010000100 |
| 62 | 0001000010001000 |
| 63 | 0001000010001001 |
| 64 | 0001000010010000 |
| 65 | 0001000010010001 |
| 66 | 0001000010010010 |
| 67 | 0001000100000000 |
| 68 | 0001000100000001 |
| 69 | 0001000100000010 |
| 70 | 0001000100000100 |
| 71 | 0001000100001000 |
| 72 | 0001000100001001 |
| 73 | 0001000100010000 |
| 74 | 0001000100010001 |
| 75 | 0001000100010010 |
| 76 | 0001000100100000 |
| 77 | 0001000100100001 |
| 78 | 0001000100100010 |
| 79 | 0001000100100100 |
| 80 | 0001001000000001 |
| 81 | 0001001000000010 |

TABLE 40-continued

| NUMBER | 16-BIT CODE |
|---|---|
| 82 | 0 0 0 1 0 0 1 0 0 0 0 0 0 1 0 0 |
| 83 | 0 0 0 1 0 0 1 0 0 0 0 0 1 0 0 0 |
| 84 | 0 0 0 1 0 0 1 0 0 0 0 0 1 0 0 1 |
| 85 | 0 0 0 1 0 0 1 0 0 0 0 1 0 0 0 0 |
| 86 | 0 0 0 1 0 0 1 0 0 0 0 1 0 0 0 1 |
| 87 | 0 0 0 1 0 0 1 0 0 0 0 1 0 0 1 0 |
| 88 | 0 0 0 1 0 0 1 0 0 0 1 0 0 0 0 0 |
| 89 | 0 0 0 1 0 0 1 0 0 0 1 0 0 0 0 1 |
| 90 | 0 0 0 1 0 0 1 0 0 0 1 0 0 0 1 0 |
| 91 | 0 0 0 1 0 0 1 0 0 0 1 0 0 1 0 0 |
| 92 | 0 0 0 1 0 0 1 0 0 1 0 0 0 0 0 0 |
| 93 | 0 0 0 1 0 0 1 0 0 1 0 0 0 0 0 1 |
| 94 | 0 0 0 1 0 0 1 0 0 1 0 0 0 0 1 0 |
| 95 | 0 0 0 1 0 0 1 0 0 1 0 0 0 1 0 0 |
| 96 | 0 0 0 1 0 0 1 0 0 1 0 0 1 0 0 0 |
| 97 | 0 0 0 1 0 0 1 0 0 1 0 0 1 0 0 1 |
| 98 | 0 0 1 0 0 0 0 0 0 0 0 0 0 1 0 0 |
| 99 | 0 0 1 0 0 0 0 0 0 0 0 0 1 0 0 0 |
| 100 | 0 0 1 0 0 0 0 0 0 0 0 0 1 0 0 1 |
| 101 | 0 0 1 0 0 0 0 0 0 0 0 1 0 0 0 0 |
| 102 | 0 0 1 0 0 0 0 0 0 0 0 1 0 0 0 1 |
| 103 | 0 0 1 0 0 0 0 0 0 0 0 1 0 0 1 0 |
| 104 | 0 0 1 0 0 0 0 0 0 0 1 0 0 0 0 0 |
| 105 | 0 0 1 0 0 0 0 0 0 0 1 0 0 0 0 1 |
| 106 | 0 0 1 0 0 0 0 0 0 0 1 0 0 0 1 0 |
| 107 | 0 0 1 0 0 0 0 0 0 0 1 0 0 1 0 0 |
| 108 | 0 0 1 0 0 0 0 0 0 1 0 0 0 0 0 0 |
| 109 | 0 0 1 0 0 0 0 0 0 1 0 0 0 0 0 1 |
| 110 | 0 0 1 0 0 0 0 0 0 1 0 0 0 0 1 0 |
| 111 | 0 0 1 0 0 0 0 0 0 1 0 0 0 1 0 0 |
| 112 | 0 0 1 0 0 0 0 0 0 1 0 0 1 0 0 0 |
| 113 | 0 0 1 0 0 0 0 0 0 1 0 0 1 0 0 1 |
| 114 | 0 0 1 0 0 0 0 0 1 0 0 0 0 0 0 0 |
| 115 | 0 0 1 0 0 0 0 0 1 0 0 0 0 0 0 1 |
| 116 | 0 0 1 0 0 0 0 0 1 0 0 0 0 0 1 0 |
| 117 | 0 0 1 0 0 0 0 0 1 0 0 0 0 1 0 0 |
| 118 | 0 0 1 0 0 0 0 0 1 0 0 0 1 0 0 0 |
| 119 | 0 0 1 0 0 0 0 0 1 0 0 0 1 0 0 1 |
| 120 | 0 0 1 0 0 0 0 0 1 0 0 1 0 0 0 0 |
| 121 | 0 0 1 0 0 0 0 0 1 0 0 1 0 0 0 1 |
| 122 | 0 0 1 0 0 0 0 0 1 0 0 1 0 0 1 0 |
| 123 | 0 0 1 0 0 0 0 1 0 0 0 0 0 0 0 0 |
| 124 | 0 0 1 0 0 0 0 1 0 0 0 0 0 0 0 1 |
| 125 | 0 0 1 0 0 0 0 1 0 0 0 0 0 0 1 0 |
| 126 | 0 0 1 0 0 0 0 1 0 0 0 0 0 1 0 0 |
| 127 | 0 0 1 0 0 0 0 1 0 0 0 0 1 0 0 0 |
| 128 | 0 0 1 0 0 0 0 1 0 0 0 0 1 0 0 1 |
| 129 | 0 0 1 0 0 0 0 1 0 0 0 1 0 0 0 0 |
| 130 | 0 0 1 0 0 0 0 1 0 0 0 1 0 0 0 1 |
| 131 | 0 0 1 0 0 0 0 1 0 0 0 1 0 0 1 0 |
| 132 | 0 0 1 0 0 0 0 1 0 0 1 0 0 0 0 0 |
| 133 | 0 0 1 0 0 0 0 1 0 0 1 0 0 0 0 1 |
| 134 | 0 0 1 0 0 0 0 1 0 0 1 0 0 0 1 0 |
| 135 | 0 0 1 0 0 0 0 1 0 0 1 0 0 1 0 0 |
| 136 | 0 0 1 0 0 0 1 0 0 0 0 0 0 0 0 1 |
| 137 | 0 0 1 0 0 0 1 0 0 0 0 0 0 0 1 0 |
| 138 | 0 0 1 0 0 0 1 0 0 0 0 0 0 1 0 0 |
| 139 | 0 0 1 0 0 0 1 0 0 0 0 0 1 0 0 0 |
| 140 | 0 0 1 0 0 0 1 0 0 0 0 0 1 0 0 1 |
| 141 | 0 0 1 0 0 0 1 0 0 0 0 1 0 0 0 0 |
| 142 | 0 0 1 0 0 0 1 0 0 0 0 1 0 0 0 1 |
| 143 | 0 0 1 0 0 0 1 0 0 0 0 1 0 0 1 0 |
| 144 | 0 0 1 0 0 0 1 0 0 0 1 0 0 0 0 0 |
| 145 | 0 0 1 0 0 0 1 0 0 0 1 0 0 0 0 1 |
| 146 | 0 0 1 0 0 0 1 0 0 0 1 0 0 0 1 0 |
| 147 | 0 0 1 0 0 0 1 0 0 0 1 0 0 1 0 0 |
| 148 | 0 0 1 0 0 0 1 0 0 1 0 0 0 0 0 0 |
| 149 | 0 0 1 0 0 0 1 0 0 1 0 0 0 0 0 1 |
| 150 | 0 0 1 0 0 0 1 0 0 1 0 0 0 0 1 0 |
| 151 | 0 0 1 0 0 0 1 0 0 1 0 0 0 1 0 0 |
| 152 | 0 0 1 0 0 0 1 0 0 1 0 0 1 0 0 0 |
| 153 | 0 0 1 0 0 0 1 0 0 1 0 0 1 0 0 1 |
| 154 | 0 0 1 0 0 1 0 0 0 0 0 0 0 0 0 1 |
| 155 | 0 0 1 0 0 1 0 0 0 0 0 0 0 0 1 0 |
| 156 | 0 0 1 0 0 1 0 0 0 0 0 0 0 1 0 0 |
| 157 | 0 0 1 0 0 1 0 0 0 0 0 0 1 0 0 0 |
| 158 | 0 0 1 0 0 1 0 0 0 0 0 0 1 0 0 1 |
| 159 | 0 0 1 0 0 1 0 0 0 0 0 1 0 0 0 0 |
| 160 | 0 0 1 0 0 1 0 0 0 0 0 1 0 0 0 1 |
| 161 | 0 0 1 0 0 1 0 0 0 0 0 1 0 0 1 0 |
| 162 | 0 0 1 0 0 1 0 0 0 0 1 0 0 0 0 0 |
| 163 | 0 0 1 0 0 1 0 0 0 0 1 0 0 0 0 1 |
| 164 | 0 0 1 0 0 1 0 0 0 0 1 0 0 0 1 0 |
| 165 | 0 0 1 0 0 1 0 0 0 0 1 0 0 1 0 0 |
| 166 | 0 0 1 0 0 1 0 0 0 1 0 0 0 0 0 0 |
| 167 | 0 0 1 0 0 1 0 0 0 1 0 0 0 0 0 1 |
| 168 | 0 0 1 0 0 1 0 0 0 1 0 0 0 0 1 0 |
| 169 | 0 0 1 0 0 1 0 0 0 1 0 0 0 1 0 0 |
| 170 | 0 0 1 0 0 1 0 0 0 1 0 0 1 0 0 0 |
| 171 | 0 0 1 0 0 1 0 0 0 1 0 0 1 0 0 1 |
| 172 | 0 0 1 0 0 1 0 0 1 0 0 0 0 0 0 0 |
| 173 | 0 0 1 0 0 1 0 0 1 0 0 0 0 0 0 1 |
| 174 | 0 0 1 0 0 1 0 0 1 0 0 0 0 0 1 0 |
| 175 | 0 0 1 0 0 1 0 0 1 0 0 0 0 1 0 0 |
| 176 | 0 0 1 0 0 1 0 0 1 0 0 0 1 0 0 0 |
| 177 | 0 0 1 0 0 1 0 0 1 0 0 0 1 0 0 1 |
| 178 | 0 0 1 0 0 1 0 0 1 0 0 1 0 0 0 0 |
| 179 | 0 0 1 0 0 1 0 0 1 0 0 1 0 0 0 1 |
| 180 | 0 0 1 0 0 1 0 0 1 0 0 1 0 0 1 0 |
| 181 | 0 1 0 0 0 0 0 0 0 0 0 0 1 0 0 0 |
| 182 | 0 1 0 0 0 0 0 0 0 0 0 0 1 0 0 1 |
| 183 | 0 1 0 0 0 0 0 0 0 0 0 1 0 0 0 0 |
| 184 | 0 1 0 0 0 0 0 0 0 0 0 1 0 0 0 1 |
| 185 | 0 1 0 0 0 0 0 0 0 0 0 1 0 0 1 0 |
| 186 | 0 1 0 0 0 0 0 0 0 0 1 0 0 0 0 0 |
| 187 | 0 1 0 0 0 0 0 0 0 0 1 0 0 0 0 1 |
| 188 | 0 1 0 0 0 0 0 0 0 0 1 0 0 0 1 0 |
| 189 | 0 1 0 0 0 0 0 0 0 0 1 0 0 1 0 0 |
| 190 | 0 1 0 0 0 0 0 0 0 1 0 0 0 0 0 0 |
| 191 | 0 1 0 0 0 0 0 0 0 1 0 0 0 0 0 1 |
| 192 | 0 1 0 0 0 0 0 0 0 1 0 0 0 0 1 0 |
| 193 | 0 1 0 0 0 0 0 0 0 1 0 0 0 1 0 0 |
| 194 | 0 1 0 0 0 0 0 0 0 1 0 0 1 0 0 0 |
| 195 | 0 1 0 0 0 0 0 0 0 1 0 0 1 0 0 1 |
| 196 | 0 1 0 0 0 0 0 0 1 0 0 0 0 0 0 0 |
| 197 | 0 1 0 0 0 0 0 0 1 0 0 0 0 0 0 1 |
| 198 | 0 1 0 0 0 0 0 0 1 0 0 0 0 0 1 0 |
| 199 | 0 1 0 0 0 0 0 0 1 0 0 0 0 1 0 0 |
| 200 | 0 1 0 0 0 0 0 0 1 0 0 0 1 0 0 0 |
| 201 | 0 1 0 0 0 0 0 0 1 0 0 0 1 0 0 1 |
| 202 | 0 1 0 0 0 0 0 0 1 0 0 1 0 0 0 0 |
| 203 | 0 1 0 0 0 0 0 0 1 0 0 1 0 0 0 1 |
| 204 | 0 1 0 0 0 0 0 0 1 0 0 1 0 0 1 0 |
| 205 | 0 1 0 0 0 0 0 1 0 0 0 0 0 0 0 0 |
| 206 | 0 1 0 0 0 0 0 1 0 0 0 0 0 0 0 1 |
| 207 | 0 1 0 0 0 0 0 1 0 0 0 0 0 0 1 0 |
| 208 | 0 1 0 0 0 0 0 1 0 0 0 0 0 1 0 0 |
| 209 | 0 1 0 0 0 0 0 1 0 0 0 0 1 0 0 0 |
| 210 | 0 1 0 0 0 0 0 1 0 0 0 0 1 0 0 1 |
| 211 | 0 1 0 0 0 0 0 1 0 0 0 1 0 0 0 0 |
| 212 | 0 1 0 0 0 0 0 1 0 0 0 1 0 0 0 1 |
| 213 | 0 1 0 0 0 0 0 1 0 0 0 1 0 0 1 0 |
| 214 | 0 1 0 0 0 0 0 1 0 0 1 0 0 0 0 0 |
| 215 | 0 1 0 0 0 0 0 1 0 0 1 0 0 0 0 1 |
| 216 | 0 1 0 0 0 0 0 1 0 0 1 0 0 0 1 0 |
| 217 | 0 1 0 0 0 0 0 1 0 0 1 0 0 1 0 0 |
| 218 | 0 1 0 0 0 0 1 0 0 0 0 0 0 0 0 1 |
| 219 | 0 1 0 0 0 0 1 0 0 0 0 0 0 0 1 0 |
| 220 | 0 1 0 0 0 0 1 0 0 0 0 0 0 1 0 0 |
| 221 | 0 1 0 0 0 0 1 0 0 0 0 0 1 0 0 0 |
| 222 | 0 1 0 0 0 0 1 0 0 0 0 0 1 0 0 1 |
| 223 | 0 1 0 0 0 0 1 0 0 0 0 1 0 0 0 0 |
| 224 | 0 1 0 0 0 0 1 0 0 0 0 1 0 0 0 1 |
| 225 | 0 1 0 0 0 0 1 0 0 0 0 1 0 0 1 0 |
| 226 | 0 1 0 0 0 0 1 0 0 0 1 0 0 0 0 0 |
| 227 | 0 1 0 0 0 0 1 0 0 0 1 0 0 0 0 1 |
| 228 | 0 1 0 0 0 0 1 0 0 0 1 0 0 0 1 0 |
| 229 | 0 1 0 0 0 0 1 0 0 0 1 0 0 1 0 0 |
| 230 | 0 1 0 0 0 0 1 0 0 1 0 0 0 0 0 0 |
| 231 | 0 1 0 0 0 0 1 0 0 1 0 0 0 0 0 1 |
| 232 | 0 1 0 0 0 0 1 0 0 1 0 0 0 0 1 0 |
| 233 | 0 1 0 0 0 0 1 0 0 1 0 0 0 1 0 0 |
| 234 | 0 1 0 0 0 0 1 0 0 1 0 0 1 0 0 0 |
| 235 | 0 1 0 0 0 0 1 0 0 1 0 0 1 0 0 1 |
| 236 | 0 1 0 0 0 1 0 0 0 0 0 0 0 0 0 1 |
| 237 | 0 1 0 0 0 1 0 0 0 0 0 0 0 0 1 0 |
| 238 | 0 1 0 0 0 1 0 0 0 0 0 0 0 1 0 0 |
| 239 | 0 1 0 0 0 1 0 0 0 0 0 0 1 0 0 0 |
| 240 | 0 1 0 0 0 1 0 0 0 0 0 0 1 0 0 1 |
| 241 | 0 1 0 0 0 1 0 0 0 0 0 1 0 0 0 0 |
| 242 | 0 1 0 0 0 1 0 0 0 0 0 1 0 0 0 1 |
| 243 | 0 1 0 0 0 1 0 0 0 0 0 1 0 0 1 0 |

TABLE 40-continued

| NUMBER | 16-BIT CODE |
|---|---|
| 244 | 0 1 0 0 0 1 0 0 0 0 1 0 0 0 0 0 |
| 245 | 0 1 0 0 0 1 0 0 0 0 1 0 0 0 0 1 |
| 246 | 0 1 0 0 0 1 0 0 0 0 1 0 0 0 1 0 |
| 247 | 0 1 0 0 0 1 0 0 0 0 1 0 0 1 0 0 |
| 248 | 0 1 0 0 0 1 0 0 0 1 0 0 0 0 0 0 |
| 249 | 0 1 0 0 0 1 0 0 0 1 0 0 0 0 0 1 |
| 250 | 0 1 0 0 0 1 0 0 0 1 0 0 0 0 1 0 |
| 251 | 0 1 0 0 0 1 0 0 0 1 0 0 0 1 0 0 |
| 252 | 0 1 0 0 0 1 0 0 0 1 0 0 1 0 0 0 |
| 253 | 0 1 0 0 0 1 0 0 0 1 0 0 1 0 0 1 |
| 254 | 0 1 0 0 0 1 0 0 1 0 0 0 0 0 0 0 |
| 255 | 0 1 0 0 0 1 0 0 1 0 0 0 0 0 0 1 |
| 256 | 0 1 0 0 0 1 0 0 1 0 0 0 0 0 1 0 |
| 257 | 0 1 0 0 0 1 0 0 1 0 0 0 0 1 0 0 |
| 258 | 0 1 0 0 0 1 0 0 1 0 0 0 1 0 0 0 |
| 259 | 0 1 0 0 0 1 0 0 1 0 0 0 1 0 0 1 |
| 260 | 0 1 0 0 0 1 0 0 1 0 0 1 0 0 0 0 |
| 261 | 0 1 0 0 0 1 0 0 1 0 0 1 0 0 0 1 |
| 262 | 0 1 0 0 0 1 0 0 1 0 0 1 0 0 1 0 |
| 263 | 0 1 0 0 1 0 0 0 0 0 0 0 0 0 0 1 |
| 264 | 0 1 0 0 1 0 0 0 0 0 0 0 0 0 1 0 |
| 265 | 0 1 0 0 1 0 0 0 0 0 0 0 0 1 0 0 |
| 266 | 0 1 0 0 1 0 0 0 0 0 0 0 1 0 0 0 |
| 267 | 0 1 0 0 1 0 0 0 0 0 0 0 1 0 0 1 |
| 268 | 0 1 0 0 1 0 0 0 0 0 0 1 0 0 0 0 |
| 269 | 0 1 0 0 1 0 0 0 0 0 0 1 0 0 0 1 |
| 270 | 0 1 0 0 1 0 0 0 0 0 0 1 0 0 1 0 |
| 271 | 0 1 0 0 1 0 0 0 0 0 1 0 0 0 0 0 |
| 272 | 0 1 0 0 1 0 0 0 0 0 1 0 0 0 0 1 |
| 273 | 0 1 0 0 1 0 0 0 0 0 1 0 0 0 1 0 |
| 274 | 0 1 0 0 1 0 0 0 0 0 1 0 0 1 0 0 |
| 275 | 0 1 0 0 1 0 0 0 0 1 0 0 0 0 0 0 |
| 276 | 0 1 0 0 1 0 0 0 0 1 0 0 0 0 0 1 |
| 277 | 0 1 0 0 1 0 0 0 0 1 0 0 0 0 1 0 |
| 278 | 0 1 0 0 1 0 0 0 0 1 0 0 0 1 0 0 |
| 279 | 0 1 0 0 1 0 0 0 0 1 0 0 1 0 0 0 |
| 280 | 0 1 0 0 1 0 0 0 0 1 0 0 1 0 0 1 |
| 281 | 0 1 0 0 1 0 0 0 1 0 0 0 0 0 0 0 |
| 282 | 0 1 0 0 1 0 0 0 1 0 0 0 0 0 0 1 |
| 283 | 0 1 0 0 1 0 0 0 1 0 0 0 0 0 1 0 |
| 284 | 0 1 0 0 1 0 0 0 1 0 0 0 0 1 0 0 |
| 285 | 0 1 0 0 1 0 0 0 1 0 0 0 1 0 0 0 |
| 286 | 0 1 0 0 1 0 0 0 1 0 0 0 1 0 0 1 |
| 287 | 0 1 0 0 1 0 0 0 1 0 0 1 0 0 0 0 |
| 288 | 0 1 0 0 1 0 0 0 1 0 0 1 0 0 0 1 |
| 289 | 0 1 0 0 1 0 0 0 1 0 0 1 0 0 1 0 |
| 290 | 0 1 0 0 1 0 0 1 0 0 0 0 0 0 0 0 |
| 291 | 0 1 0 0 1 0 0 1 0 0 0 0 0 0 0 1 |
| 292 | 0 1 0 0 1 0 0 1 0 0 0 0 0 0 1 0 |
| 293 | 0 1 0 0 1 0 0 1 0 0 0 0 0 1 0 0 |
| 294 | 0 1 0 0 1 0 0 1 0 0 0 0 1 0 0 0 |
| 295 | 0 1 0 0 1 0 0 1 0 0 0 0 1 0 0 1 |
| 296 | 0 1 0 0 1 0 0 1 0 0 0 1 0 0 0 0 |
| 297 | 0 1 0 0 1 0 0 1 0 0 0 1 0 0 0 1 |
| 298 | 0 1 0 0 1 0 0 1 0 0 0 1 0 0 1 0 |
| 299 | 0 1 0 0 1 0 0 1 0 0 1 0 0 0 0 0 |
| 300 | 0 1 0 0 1 0 0 1 0 0 1 0 0 0 0 1 |
| 301 | 0 1 0 0 1 0 0 1 0 0 1 0 0 0 1 0 |
| 302 | 0 1 0 0 1 0 0 1 0 0 1 0 0 1 0 0 |
| 303 | 1 0 0 0 0 0 0 0 0 0 0 1 0 0 0 0 |
| 304 | 1 0 0 0 0 0 0 0 0 0 0 1 0 0 0 1 |
| 305 | 1 0 0 0 0 0 0 0 0 0 0 1 0 0 1 0 |
| 306 | 1 0 0 0 0 0 0 0 0 0 1 0 0 0 0 0 |
| 307 | 1 0 0 0 0 0 0 0 0 0 1 0 0 0 0 1 |
| 308 | 1 0 0 0 0 0 0 0 0 0 1 0 0 0 1 0 |
| 309 | 1 0 0 0 0 0 0 0 0 0 1 0 0 1 0 0 |
| 310 | 1 0 0 0 0 0 0 0 0 1 0 0 0 0 0 0 |
| 311 | 1 0 0 0 0 0 0 0 0 1 0 0 0 0 0 1 |
| 312 | 1 0 0 0 0 0 0 0 0 1 0 0 0 0 1 0 |
| 313 | 1 0 0 0 0 0 0 0 0 1 0 0 0 1 0 0 |
| 314 | 1 0 0 0 0 0 0 0 0 1 0 0 1 0 0 0 |
| 315 | 1 0 0 0 0 0 0 0 0 1 0 0 1 0 0 1 |
| 316 | 1 0 0 0 0 0 0 0 1 0 0 0 0 0 0 0 |
| 317 | 1 0 0 0 0 0 0 0 1 0 0 0 0 0 0 1 |
| 318 | 1 0 0 0 0 0 0 0 1 0 0 0 0 0 1 0 |
| 319 | 1 0 0 0 0 0 0 0 1 0 0 0 0 1 0 0 |
| 320 | 1 0 0 0 0 0 0 0 1 0 0 0 1 0 0 0 |
| 321 | 1 0 0 0 0 0 0 0 1 0 0 0 1 0 0 1 |
| 322 | 1 0 0 0 0 0 0 0 1 0 0 1 0 0 0 0 |
| 323 | 1 0 0 0 0 0 0 0 1 0 0 1 0 0 0 1 |
| 324 | 1 0 0 0 0 0 0 0 1 0 0 1 0 0 1 0 |
| 325 | 1 0 0 0 0 0 0 1 0 0 0 0 0 0 0 0 |
| 326 | 1 0 0 0 0 0 0 1 0 0 0 0 0 0 0 1 |
| 327 | 1 0 0 0 0 0 0 1 0 0 0 0 0 0 1 0 |
| 328 | 1 0 0 0 0 0 0 1 0 0 0 0 0 1 0 0 |
| 329 | 1 0 0 0 0 0 0 1 0 0 0 0 1 0 0 0 |
| 330 | 1 0 0 0 0 0 0 1 0 0 0 0 1 0 0 1 |
| 331 | 1 0 0 0 0 0 0 1 0 0 0 1 0 0 0 0 |
| 332 | 1 0 0 0 0 0 0 1 0 0 0 1 0 0 0 1 |
| 333 | 1 0 0 0 0 0 0 1 0 0 0 1 0 0 1 0 |
| 334 | 1 0 0 0 0 0 0 1 0 0 1 0 0 0 0 0 |
| 335 | 1 0 0 0 0 0 0 1 0 0 1 0 0 0 0 1 |
| 336 | 1 0 0 0 0 0 0 1 0 0 1 0 0 0 1 0 |
| 337 | 1 0 0 0 0 0 0 1 0 0 1 0 0 1 0 0 |
| 338 | 1 0 0 0 0 0 1 0 0 0 0 0 0 0 0 1 |
| 339 | 1 0 0 0 0 0 1 0 0 0 0 0 0 0 1 0 |
| 340 | 1 0 0 0 0 0 1 0 0 0 0 0 0 1 0 0 |
| 341 | 1 0 0 0 0 0 1 0 0 0 0 0 1 0 0 0 |
| 342 | 1 0 0 0 0 0 1 0 0 0 0 0 1 0 0 1 |
| 343 | 1 0 0 0 0 0 1 0 0 0 0 1 0 0 0 0 |
| 344 | 1 0 0 0 0 0 1 0 0 0 0 1 0 0 0 1 |
| 345 | 1 0 0 0 0 0 1 0 0 0 0 1 0 0 1 0 |
| 346 | 1 0 0 0 0 0 1 0 0 0 1 0 0 0 0 0 |
| 347 | 1 0 0 0 0 0 1 0 0 0 1 0 0 0 0 1 |
| 348 | 1 0 0 0 0 0 1 0 0 0 1 0 0 0 1 0 |
| 349 | 1 0 0 0 0 0 1 0 0 0 1 0 0 1 0 0 |
| 350 | 1 0 0 0 0 0 1 0 0 1 0 0 0 0 0 0 |
| 351 | 1 0 0 0 0 0 1 0 0 1 0 0 0 0 0 1 |
| 352 | 1 0 0 0 0 0 1 0 0 1 0 0 0 0 1 0 |
| 353 | 1 0 0 0 0 0 1 0 0 1 0 0 0 1 0 0 |
| 354 | 1 0 0 0 0 0 1 0 0 1 0 0 1 0 0 0 |
| 355 | 1 0 0 0 0 0 1 0 0 1 0 0 1 0 0 1 |
| 356 | 1 0 0 0 0 1 0 0 0 0 0 0 0 0 0 1 |
| 357 | 1 0 0 0 0 1 0 0 0 0 0 0 0 0 1 0 |
| 358 | 1 0 0 0 0 1 0 0 0 0 0 0 0 1 0 0 |
| 359 | 1 0 0 0 0 1 0 0 0 0 0 0 1 0 0 0 |
| 360 | 1 0 0 0 0 1 0 0 0 0 0 0 1 0 0 1 |
| 361 | 1 0 0 0 0 1 0 0 0 0 0 1 0 0 0 0 |
| 362 | 1 0 0 0 0 1 0 0 0 0 0 1 0 0 0 1 |
| 363 | 1 0 0 0 0 1 0 0 0 0 0 1 0 0 1 0 |
| 364 | 1 0 0 0 0 1 0 0 0 0 1 0 0 0 0 0 |
| 365 | 1 0 0 0 0 1 0 0 0 0 1 0 0 0 0 1 |
| 366 | 1 0 0 0 0 1 0 0 0 0 1 0 0 0 1 0 |
| 367 | 1 0 0 0 0 1 0 0 0 0 1 0 0 1 0 0 |
| 368 | 1 0 0 0 0 1 0 0 0 1 0 0 0 0 0 0 |
| 369 | 1 0 0 0 0 1 0 0 0 1 0 0 0 0 0 1 |
| 370 | 1 0 0 0 0 1 0 0 0 1 0 0 0 0 1 0 |
| 371 | 1 0 0 0 0 1 0 0 0 1 0 0 0 1 0 0 |
| 372 | 1 0 0 0 0 1 0 0 0 1 0 0 1 0 0 0 |
| 373 | 1 0 0 0 0 1 0 0 0 1 0 0 1 0 0 1 |
| 374 | 1 0 0 0 0 1 0 0 1 0 0 0 0 0 0 0 |
| 375 | 1 0 0 0 0 1 0 0 1 0 0 0 0 0 0 1 |
| 376 | 1 0 0 0 0 1 0 0 1 0 0 0 0 0 1 0 |
| 377 | 1 0 0 0 0 1 0 0 1 0 0 0 0 1 0 0 |
| 378 | 1 0 0 0 0 1 0 0 1 0 0 0 1 0 0 0 |
| 379 | 1 0 0 0 0 1 0 0 1 0 0 0 1 0 0 1 |
| 380 | 1 0 0 0 0 1 0 0 1 0 0 1 0 0 0 0 |
| 381 | 1 0 0 0 0 1 0 0 1 0 0 1 0 0 0 1 |
| 382 | 1 0 0 0 0 1 0 0 1 0 0 1 0 0 1 0 |
| 383 | 1 0 0 0 1 0 0 0 0 0 0 0 0 0 0 1 |
| 384 | 1 0 0 0 1 0 0 0 0 0 0 0 0 0 1 0 |
| 385 | 1 0 0 0 1 0 0 0 0 0 0 0 0 1 0 0 |
| 386 | 1 0 0 0 1 0 0 0 0 0 0 0 1 0 0 0 |
| 387 | 1 0 0 0 1 0 0 0 0 0 0 0 1 0 0 1 |
| 388 | 1 0 0 0 1 0 0 0 0 0 0 1 0 0 0 0 |
| 389 | 1 0 0 0 1 0 0 0 0 0 0 1 0 0 0 1 |
| 390 | 1 0 0 0 1 0 0 0 0 0 0 1 0 0 1 0 |
| 391 | 1 0 0 0 1 0 0 0 0 0 1 0 0 0 0 0 |
| 392 | 1 0 0 0 1 0 0 0 0 0 1 0 0 0 0 1 |
| 393 | 1 0 0 0 1 0 0 0 0 0 1 0 0 0 1 0 |
| 394 | 1 0 0 0 1 0 0 0 0 0 1 0 0 1 0 0 |
| 395 | 1 0 0 0 1 0 0 0 0 1 0 0 0 0 0 0 |
| 396 | 1 0 0 0 1 0 0 0 0 1 0 0 0 0 0 1 |
| 397 | 1 0 0 0 1 0 0 0 0 1 0 0 0 0 1 0 |
| 398 | 1 0 0 0 1 0 0 0 0 1 0 0 0 1 0 0 |
| 399 | 1 0 0 0 1 0 0 0 0 1 0 0 1 0 0 0 |
| 400 | 1 0 0 0 1 0 0 0 0 1 0 0 1 0 0 1 |
| 401 | 1 0 0 0 1 0 0 0 1 0 0 0 0 0 0 0 |
| 402 | 1 0 0 0 1 0 0 0 1 0 0 0 0 0 0 1 |
| 403 | 1 0 0 0 1 0 0 0 1 0 0 0 0 0 1 0 |
| 404 | 1 0 0 0 1 0 0 0 1 0 0 0 0 1 0 0 |
| 405 | 1 0 0 0 1 0 0 0 1 0 0 0 1 0 0 0 |

TABLE 40-continued

| NUMBER | 16-BIT CODE |
|---|---|
| 406 | 1000100010001001 |
| 407 | 1000100010010000 |
| 408 | 1000100010010001 |
| 409 | 1000100010010010 |
| 410 | 1000100100000000 |
| 411 | 1000100100000001 |
| 412 | 1000100100000010 |
| 413 | 1000100100000100 |
| 414 | 1000100100001000 |
| 415 | 1000100100001001 |
| 416 | 1000100100010000 |
| 417 | 1000100100010001 |
| 418 | 1000100100010010 |
| 419 | 1000100100100000 |
| 420 | 1000100100100001 |
| 421 | 1000100100100010 |
| 422 | 1000100100100100 |
| 423 | 1001000000000010 |
| 424 | 1001000000000100 |
| 425 | 1001000000001000 |
| 426 | 1001000000001001 |
| 427 | 1001000000010000 |
| 428 | 1001000000010001 |
| 429 | 1001000000010010 |
| 430 | 1001000000100000 |
| 431 | 1001000000100001 |
| 432 | 1001000000100010 |
| 433 | 1001000000100100 |
| 434 | 1001000001000000 |
| 435 | 1001000001000001 |
| 436 | 1001000001000010 |
| 437 | 1001000001000100 |
| 438 | 1001000001001000 |
| 439 | 1001000001001001 |
| 440 | 1001000010000000 |
| 441 | 1001000010000001 |
| 442 | 1001000010000010 |
| 443 | 1001000010000100 |
| 444 | 1001000010001000 |
| 445 | 1001000010001001 |
| 446 | 1001000010010000 |
| 447 | 1001000010010001 |
| 448 | 1001000010010010 |
| 449 | 1001000100000000 |
| 450 | 1001000100000001 |
| 451 | 1001000100000010 |
| 452 | 1001000100000100 |
| 453 | 1001000100001000 |
| 454 | 1001000100001001 |
| 455 | 1001000100010000 |
| 456 | 1001000100010001 |
| 457 | 1001000100010010 |
| 458 | 1001000100100000 |
| 459 | 1001000100100001 |
| 460 | 1001000100100010 |
| 461 | 1001000100100100 |
| 462 | 1001001000000001 |
| 463 | 1001001000000010 |
| 464 | 1001001000000100 |
| 465 | 1001001000001000 |
| 466 | 1001001000001001 |
| 467 | 1001001000010000 |
| 468 | 1001001000010001 |
| 469 | 1001001000010010 |
| 470 | 1001001000100000 |
| 471 | 1001001000100001 |
| 472 | 1001001000100010 |
| 473 | 1001001000100100 |
| 474 | 1001001001000000 |
| 475 | 1001001001000001 |
| 476 | 1001001001000010 |
| 477 | 1001001001000100 |
| 478 | 1001001001001000 |
| 479 | 1001001001001001 |

TABLE 41

| NUMBER | 16-BIT CODE |
|---|---|
| 1 | 0001000000000010 |

TABLE 41-continued

| NUMBER | 16-BIT CODE |
|---|---|
| 2 | 0001000000000100 |
| 3 | 0001000000001000 |
| 4 | 0001000000001001 |
| 5 | 0001000000010000 |
| 6 | 0001000000010001 |
| 7 | 0001000000010010 |
| 8 | 0001000000100000 |
| 9 | 0001000000100001 |
| 10 | 0001000000100010 |
| 11 | 0001000000100100 |
| 12 | 0001000001000000 |
| 13 | 0001000001000001 |
| 14 | 0001000001000010 |
| 15 | 0001000001000100 |
| 16 | 0001000001001000 |
| 17 | 0001000001001001 |
| 18 | 0001000010000000 |
| 19 | 0001000010000001 |
| 20 | 0001000010000010 |
| 21 | 0001000010000100 |
| 22 | 0001000010001000 |
| 23 | 0001000010001001 |
| 24 | 0001000010010000 |
| 25 | 0001000010010001 |
| 26 | 0001000010010010 |
| 27 | 0001000100000000 |
| 28 | 0001000100000001 |
| 29 | 0001000100000010 |
| 30 | 0001000100000100 |
| 31 | 0001000100001000 |
| 32 | 0001000100001001 |
| 33 | 0001000100010000 |
| 34 | 0001000100010001 |
| 35 | 0001000100010010 |
| 36 | 0001000100100000 |
| 37 | 0001000100100001 |
| 38 | 0001000100100010 |
| 39 | 0001000100100100 |
| 40 | 0001001000000001 |
| 41 | 0001001000000010 |
| 42 | 0001001000000100 |
| 43 | 0001001000001000 |
| 44 | 0001001000001001 |
| 45 | 0001001000010000 |
| 46 | 0001001000010001 |
| 47 | 0001001000010010 |
| 48 | 0001001000100000 |
| 49 | 0001001000100001 |
| 50 | 0001001000100010 |
| 51 | 0001001000100100 |
| 52 | 0001001001000000 |
| 53 | 0001001001000001 |
| 54 | 0001001001000010 |
| 55 | 0001001001000100 |
| 56 | 0001001001001000 |
| 57 | 0001001001001001 |
| 58 | 0001000000000100 |
| 59 | 0010000000001000 |
| 60 | 0010000000001001 |
| 61 | 0010000000010000 |
| 62 | 0010000000010001 |
| 63 | 0010000000010010 |
| 64 | 0010000000100000 |
| 65 | 0010000000100001 |
| 66 | 0010000000100010 |
| 67 | 0010000000100100 |
| 68 | 0010000001000000 |
| 69 | 0010000001000001 |
| 70 | 0010000001000010 |
| 71 | 0010000001000100 |
| 72 | 0010000001001000 |
| 73 | 0010000001001001 |
| 74 | 0010000010000000 |
| 75 | 0010000010000001 |
| 76 | 0010000010000010 |
| 77 | 0010000010000100 |
| 78 | 0010000010001000 |
| 79 | 0010000010001001 |
| 80 | 0010000010010000 |
| 81 | 0010000010010001 |
| 82 | 0010000010010010 |

TABLE 41-continued

| NUMBER | 16-BIT CODE |
|---|---|
| 83 | 0010000100000000 |
| 84 | 0010000100000001 |
| 85 | 0010000100000010 |
| 86 | 0010000100000100 |
| 87 | 0010000100001000 |
| 88 | 0010000100001001 |
| 89 | 0010000100010000 |
| 90 | 0010000100010001 |
| 91 | 0010000100010010 |
| 92 | 0010000100100000 |
| 93 | 0010000100100001 |
| 94 | 0010000100100010 |
| 95 | 0010000100100100 |
| 96 | 0010001000000001 |
| 97 | 0010001000000010 |
| 98 | 0010001000000100 |
| 99 | 0010001000001000 |
| 100 | 0010001000001001 |
| 101 | 0010001000010000 |
| 102 | 0010001000010001 |
| 103 | 0010001000010010 |
| 104 | 0010001000100000 |
| 105 | 0010001000100001 |
| 106 | 0010001000100010 |
| 107 | 0010001000100100 |
| 108 | 0010001001000000 |
| 109 | 0010001001000001 |
| 110 | 0010001001000010 |
| 111 | 0010001001000100 |
| 112 | 0010001001001000 |
| 113 | 0010001001001001 |
| 114 | 0010010000000001 |
| 115 | 0010010000000010 |
| 116 | 0010010000000100 |
| 117 | 0010010000001000 |
| 118 | 0010010000001001 |
| 119 | 0010010000010000 |
| 120 | 0010010000010001 |
| 121 | 0010010000010010 |
| 122 | 0010010000100000 |
| 123 | 0010010000100001 |
| 124 | 0010010000100010 |
| 125 | 0010010000100100 |
| 126 | 0010010001000000 |
| 127 | 0010010001000001 |
| 128 | 0010010001000010 |
| 129 | 0010010001000100 |
| 130 | 0010010001001000 |
| 131 | 0010010001001001 |
| 132 | 0010010010000000 |
| 133 | 0010010010000001 |
| 134 | 0010010010000010 |
| 135 | 0010010010000100 |
| 136 | 0010010010001000 |
| 137 | 0010010010001001 |
| 138 | 0010010010010000 |
| 139 | 0010010010010001 |
| 140 | 0010010010010010 |
| 141 | 0100000000001000 |
| 142 | 0100000000001001 |
| 143 | 0100000000010000 |
| 144 | 0100000000010001 |
| 145 | 0100000000010010 |
| 146 | 0100000000100000 |
| 147 | 0100000000100001 |
| 148 | 0100000000100010 |
| 149 | 0100000000100100 |
| 150 | 0100000001000000 |
| 151 | 0100000001000001 |
| 152 | 0100000001000010 |
| 153 | 0100000001000100 |
| 154 | 0100000001001000 |
| 155 | 0100000001001001 |
| 156 | 0100000010000000 |
| 157 | 0100000010000001 |
| 158 | 0100000010000010 |
| 159 | 0100000010000100 |
| 160 | 0100000010001000 |
| 161 | 0100000010001001 |
| 162 | 0100000010010000 |
| 163 | 0100000010010001 |

TABLE 41-continued

| NUMBER | 16-BIT CODE |
|---|---|
| 164 | 0100000010010010 |
| 165 | 0100000100000000 |
| 166 | 0100000100000001 |
| 167 | 0100000100000010 |
| 168 | 0100000100000100 |
| 169 | 0100000100001000 |
| 170 | 0100000100001001 |
| 171 | 0100000100010000 |
| 172 | 0100000100010001 |
| 173 | 0100000100010010 |
| 174 | 0100000100100000 |
| 175 | 0100000100100001 |
| 176 | 0100000100100010 |
| 177 | 0100000100100100 |
| 178 | 0100001000000001 |
| 179 | 0100001000000010 |
| 180 | 0100001000000100 |
| 181 | 0100001000001000 |
| 182 | 0100001000001001 |
| 183 | 0100001000010000 |
| 184 | 0100001000010001 |
| 185 | 0100001000010010 |
| 186 | 0100001000100000 |
| 187 | 0100001000100001 |
| 188 | 0100001000100010 |
| 189 | 0100001000100100 |
| 190 | 0100001001000000 |
| 191 | 0100001001000001 |
| 192 | 0100001001000010 |
| 193 | 0100001001000100 |
| 194 | 0100001001001000 |
| 195 | 0100001001001001 |
| 196 | 0100010000000001 |
| 197 | 0100010000000010 |
| 198 | 0100010000000100 |
| 199 | 0100010000001000 |
| 200 | 0100010000001001 |
| 201 | 0100010000010000 |
| 202 | 0100010000010001 |
| 203 | 0100010000010010 |
| 204 | 0100010000100000 |
| 205 | 0100010000100001 |
| 206 | 0100010000100010 |
| 207 | 0100010000100100 |
| 208 | 0100010001000000 |
| 209 | 0100010001000001 |
| 210 | 0100010001000010 |
| 211 | 0100010001000100 |
| 212 | 0100010001001000 |
| 213 | 0100010001001001 |
| 214 | 0100010010000000 |
| 215 | 0100010010000001 |
| 216 | 0100010010000010 |
| 217 | 0100010010000100 |
| 218 | 0100010010001000 |
| 219 | 0100010010001001 |
| 220 | 0100010010010000 |
| 221 | 0100010010010001 |
| 222 | 0100010010010010 |
| 223 | 0100100000000001 |
| 224 | 0100100000000010 |
| 225 | 0100100000000100 |
| 226 | 0100100000001000 |
| 227 | 0100100000001001 |
| 228 | 0100100000010000 |
| 229 | 0100100000010001 |
| 230 | 0100100000010010 |
| 231 | 0100100000100000 |
| 232 | 0100100000100001 |
| 233 | 0100100000100010 |
| 234 | 0100100000100100 |
| 235 | 0100100001000000 |
| 236 | 0100100001000001 |
| 237 | 0100100001000010 |
| 238 | 0100100001000100 |
| 239 | 0100100001001000 |
| 240 | 0100100001001001 |
| 241 | 0100100010000000 |
| 242 | 0100100010000001 |
| 243 | 0100100010000010 |
| 244 | 0100100010000100 |

TABLE 41-continued

| NUMBER | 16-BIT CODE |
|---|---|
| 245 | 0100100010001000 |
| 246 | 0100100010001001 |
| 247 | 0100100010010000 |
| 248 | 0100100010010001 |
| 249 | 0100100010010010 |
| 250 | 0100100100000000 |
| 251 | 0100100100000001 |
| 252 | 0100100100000010 |
| 253 | 0100100100000100 |
| 254 | 0100100100001000 |
| 255 | 0100100100001001 |
| 256 | 0100100100010000 |
| 257 | 0100100100010001 |
| 258 | 0100100100010010 |
| 259 | 0100100100100000 |
| 260 | 0100100100100001 |
| 261 | 0100100100100010 |
| 262 | 0100100100100100 |
| 263 | 1000000000010000 |
| 264 | 1000000000010001 |
| 265 | 1000000000010010 |
| 266 | 1000000000100000 |
| 267 | 1000000000100001 |
| 268 | 1000000000100010 |
| 269 | 1000000000100100 |
| 270 | 1000000001000000 |
| 271 | 1000000001000001 |
| 272 | 1000000001000010 |
| 273 | 1000000001000100 |
| 274 | 1000000001001000 |
| 275 | 1000000001001001 |
| 276 | 1000000010000000 |
| 277 | 1000000010000001 |
| 278 | 1000000010000010 |
| 279 | 1000000010000100 |
| 280 | 1000000010001000 |
| 281 | 1000000010001001 |
| 282 | 1000000010010000 |
| 283 | 1000000010010001 |
| 284 | 1000000010010010 |
| 285 | 1000000100000000 |
| 286 | 1000000100000001 |
| 287 | 1000000100000010 |
| 288 | 1000000100000100 |
| 289 | 1000000100001000 |
| 290 | 1000000100001001 |
| 291 | 1000000100010000 |
| 292 | 1000000100010001 |
| 293 | 1000000100010010 |
| 294 | 1000000100100000 |
| 295 | 1000000100100001 |
| 296 | 1000000100100010 |
| 297 | 1000000100100100 |
| 298 | 1000001000000001 |
| 299 | 1000001000000010 |
| 300 | 1000001000000100 |
| 301 | 1000001000001000 |
| 302 | 1000001000001001 |
| 303 | 1000001000010000 |
| 304 | 1000001000010001 |
| 305 | 1000001000010010 |
| 306 | 1000001000100000 |
| 307 | 1000001000100001 |
| 308 | 1000001000100010 |
| 309 | 1000001000100100 |
| 310 | 1000001001000000 |
| 311 | 1000001001000001 |
| 312 | 1000001001000010 |
| 313 | 1000001001000100 |
| 314 | 1000001001001000 |
| 315 | 1000001001001001 |
| 316 | 1000010000000001 |
| 317 | 1000010000000010 |
| 318 | 1000010000000100 |
| 319 | 1000010000001000 |
| 320 | 1000010000001001 |
| 321 | 1000010000010000 |
| 322 | 1000010000010001 |
| 323 | 1000010000010010 |
| 324 | 1000010000100000 |
| 325 | 1000010000100001 |

TABLE 41-continued

| NUMBER | 16-BIT CODE |
|---|---|
| 326 | 1000010000100010 |
| 327 | 1000010000100100 |
| 328 | 1000010001000000 |
| 329 | 1000010001000001 |
| 330 | 1000010001000010 |
| 331 | 1000010001000100 |
| 332 | 1000010001001000 |
| 333 | 1000010001001001 |
| 334 | 1000010010000000 |
| 335 | 1000010010000001 |
| 336 | 1000010010000010 |
| 337 | 1000010010000100 |
| 338 | 1000010010001000 |
| 339 | 1000010010001001 |
| 340 | 1000010010010000 |
| 341 | 1000010010010001 |
| 342 | 1000010010010010 |
| 343 | 1000100000000001 |
| 344 | 1000100000000010 |
| 345 | 1000100000000100 |
| 346 | 1000100000001000 |
| 347 | 1000100000001001 |
| 348 | 1000100000010000 |
| 349 | 1000100000010001 |
| 350 | 1000100000010010 |
| 351 | 1000100000100000 |
| 352 | 1000100000100001 |
| 353 | 1000100000100010 |
| 354 | 1000100000100100 |
| 355 | 1000100001000000 |
| 356 | 1000100001000001 |
| 357 | 1000100001000010 |
| 358 | 1000100001000100 |
| 359 | 1000100001001000 |
| 360 | 1000100001001001 |
| 361 | 1000100010000000 |
| 362 | 1000100010000001 |
| 363 | 1000100010000010 |
| 364 | 1000100010000100 |
| 365 | 1000100010001000 |
| 366 | 1000100010001001 |
| 367 | 1000100010010000 |
| 368 | 1000100010010001 |
| 369 | 1000100010010010 |
| 370 | 1000100100000000 |
| 371 | 1000100100000001 |
| 372 | 1000100100000010 |
| 373 | 1000100100000100 |
| 374 | 1000100100001000 |
| 375 | 1000100100001001 |
| 376 | 1000100100010000 |
| 377 | 1000100100010001 |
| 378 | 1000100100010010 |
| 379 | 1000100100100000 |
| 380 | 1000100100100001 |
| 381 | 1000100100100010 |
| 382 | 1000100100100100 |
| 383 | 1001000000000010 |
| 384 | 1001000000000100 |
| 385 | 1001000000001000 |
| 386 | 1001000000001001 |
| 387 | 1001000000010000 |
| 388 | 1001000000010001 |
| 389 | 1001000000010010 |
| 390 | 1001000000100000 |
| 391 | 1001000000100001 |
| 392 | 1001000000100010 |
| 393 | 1001000000100100 |
| 394 | 1001000001000000 |
| 395 | 1001000001000001 |
| 396 | 1001000001000010 |
| 397 | 1001000001000100 |
| 398 | 1001000001001000 |
| 399 | 1001000001001001 |
| 400 | 1001000010000000 |
| 401 | 1001000010000001 |
| 402 | 1001000010000010 |
| 403 | 1001000010000100 |
| 404 | 1001000010001000 |
| 405 | 1001000010001001 |
| 406 | 1001000010010000 |

TABLE 41-continued

| NUMBER | 16-BIT CODE |
|---|---|
| 407 | 1001000010010001 |
| 408 | 1001000010010010 |
| 409 | 1001000100000000 |
| 410 | 1001000100000001 |
| 411 | 1001000100000010 |
| 412 | 1001000100000100 |
| 413 | 1001000100001000 |
| 414 | 1001000100001001 |
| 415 | 1001000100010000 |
| 416 | 1001000100010001 |
| 417 | 1001000100010010 |
| 418 | 1001000100100000 |
| 419 | 1001000100100001 |
| 420 | 1001000100100010 |
| 421 | 1001000100100100 |
| 422 | 1001001000000001 |
| 423 | 1001001000000010 |
| 424 | 1001001000000100 |
| 425 | 1001001000001000 |
| 426 | 1001001000001001 |
| 427 | 1001001000010000 |
| 428 | 1001001000010001 |
| 429 | 1001001000010010 |
| 430 | 1001001000100000 |
| 431 | 1001001000100001 |
| 432 | 1001001000100010 |
| 433 | 1001001000100100 |
| 434 | 1001001001000000 |
| 435 | 1001001001000001 |
| 436 | 1001001001000010 |
| 437 | 1001001001000100 |
| 438 | 1001001001001000 |
| 439 | 1001001001001001 |

TABLE 42

| NUMBER | 16-BIT CODE |
|---|---|
| 1 | 0010000000000100 |
| 2 | 0010000000001000 |
| 3 | 0010000000001001 |
| 4 | 0010000000010000 |
| 5 | 0010000000010001 |
| 6 | 0010000000010010 |
| 7 | 0010000000100000 |
| 8 | 0010000000100001 |
| 9 | 0010000000100010 |
| 10 | 0010000000100100 |
| 11 | 0010000001000000 |
| 12 | 0010000001000001 |
| 13 | 0010000001000010 |
| 14 | 0010000001000100 |
| 15 | 0010000001001000 |
| 16 | 0010000001001001 |
| 17 | 0010000010000000 |
| 18 | 0010000010000001 |
| 19 | 0010000010000010 |
| 20 | 0010000010000100 |
| 21 | 0010000010001000 |
| 22 | 0010000010001001 |
| 23 | 0010000010010000 |
| 24 | 0010000010010001 |
| 25 | 0010000010010010 |
| 26 | 0010000100000000 |
| 27 | 0010000100000001 |
| 28 | 0010000100000010 |
| 29 | 0010000100000100 |
| 30 | 0010000100001000 |
| 31 | 0010000100001001 |
| 32 | 0010000100010000 |
| 33 | 0010000100010001 |
| 34 | 0010000100010010 |
| 35 | 0010000100100000 |
| 36 | 0010000100100001 |
| 37 | 0010000100100010 |
| 38 | 0010000100100100 |
| 39 | 0010001000000001 |
| 40 | 0010001000000010 |
| 41 | 0010001000000100 |
| 42 | 0010001000001000 |

TABLE 42 -continued

| NUMBER | 16-BIT CODE |
|---|---|
| 43 | 0010001000001001 |
| 44 | 0010001000010000 |
| 45 | 0010001000010001 |
| 46 | 0010001000010010 |
| 47 | 0010001000100000 |
| 48 | 0010001000100001 |
| 49 | 0010001000100010 |
| 50 | 0010001000100100 |
| 51 | 0010001001000000 |
| 52 | 0010001001000001 |
| 53 | 0010001001000010 |
| 54 | 0010001001000100 |
| 55 | 0010001001001000 |
| 56 | 0010001001001001 |
| 57 | 0010010000000001 |
| 58 | 0010010000000010 |
| 59 | 0010010000000100 |
| 60 | 0010010000001000 |
| 61 | 0010010000001001 |
| 62 | 0010010000010000 |
| 63 | 0010010000010001 |
| 64 | 0010010000010010 |
| 65 | 0010010000100000 |
| 66 | 0010010000100001 |
| 67 | 0010010000100010 |
| 68 | 0010010000100100 |
| 69 | 0010010001000000 |
| 70 | 0010010001000001 |
| 71 | 0010010001000010 |
| 72 | 0010010001000100 |
| 73 | 0010010001001000 |
| 74 | 0010010001001001 |
| 75 | 0010010010000000 |
| 76 | 0010010010000001 |
| 77 | 0010010010000010 |
| 78 | 0010010010000100 |
| 79 | 0010010010001000 |
| 80 | 0010010010001001 |
| 81 | 0010010010010000 |
| 82 | 0010010010010001 |
| 83 | 0010010010010010 |
| 84 | 0100000000001000 |
| 85 | 0100000000001001 |
| 86 | 0100000000010000 |
| 87 | 0100000000010001 |
| 88 | 0100000000010010 |
| 89 | 0100000000100000 |
| 90 | 0100000000100001 |
| 91 | 0100000000100010 |
| 92 | 0100000000100100 |
| 93 | 0100000001000000 |
| 94 | 0100000001000001 |
| 95 | 0100000001000010 |
| 96 | 0100000001000100 |
| 97 | 0100000001001000 |
| 98 | 0100000001001001 |
| 99 | 0100000010000000 |
| 100 | 0100000010000001 |
| 101 | 0100000010000010 |
| 102 | 0100000010000100 |
| 103 | 0100000010001000 |
| 104 | 0100000010001001 |
| 105 | 0100000010010000 |
| 106 | 0100000010010001 |
| 107 | 0100000010010010 |
| 108 | 0100000100000000 |
| 109 | 0100000100000001 |
| 110 | 0100000100000010 |
| 111 | 0100000100000100 |
| 112 | 0100000100001000 |
| 113 | 0100000100001001 |
| 114 | 0100000100010000 |
| 115 | 0100000100010001 |
| 116 | 0100000100010010 |
| 117 | 0100000100100000 |
| 118 | 0100000100100001 |
| 119 | 0100000100100010 |
| 120 | 0100000100100100 |
| 121 | 0100001000000001 |
| 122 | 0100001000000010 |
| 123 | 0100001000000100 |

TABLE 42 -continued

| NUMBER | 16-BIT CODE |
|---|---|
| 124 | 0 1 0 0 0 0 1 0 0 0 0 0 1 0 0 0 |
| 125 | 0 1 0 0 0 0 1 0 0 0 0 0 1 0 0 1 |
| 126 | 0 1 0 0 0 0 1 0 0 0 0 1 0 0 0 0 |
| 127 | 0 1 0 0 0 0 1 0 0 0 0 1 0 0 0 1 |
| 128 | 0 1 0 0 0 0 1 0 0 0 0 1 0 0 1 0 |
| 129 | 0 1 0 0 0 0 1 0 0 0 1 0 0 0 0 0 |
| 130 | 0 1 0 0 0 0 1 0 0 0 1 0 0 0 0 1 |
| 131 | 0 1 0 0 0 0 1 0 0 0 1 0 0 0 1 0 |
| 132 | 0 1 0 0 0 0 1 0 0 0 1 0 0 1 0 0 |
| 133 | 0 1 0 0 0 0 1 0 0 1 0 0 0 0 0 0 |
| 134 | 0 1 0 0 0 0 1 0 0 1 0 0 0 0 0 1 |
| 135 | 0 1 0 0 0 0 1 0 0 1 0 0 0 0 1 0 |
| 136 | 0 1 0 0 0 0 1 0 0 1 0 0 0 1 0 0 |
| 137 | 0 1 0 0 0 0 1 0 0 1 0 0 1 0 0 0 |
| 138 | 0 1 0 0 0 0 1 0 0 1 0 0 1 0 0 1 |
| 139 | 0 1 0 0 0 1 0 0 0 0 0 0 0 0 0 0 |
| 140 | 0 1 0 0 0 1 0 0 0 0 0 0 0 0 1 0 |
| 141 | 0 1 0 0 0 1 0 0 0 0 0 0 0 1 0 0 |
| 142 | 0 1 0 0 0 1 0 0 0 0 0 0 1 0 0 0 |
| 143 | 0 1 0 0 0 1 0 0 0 0 0 0 1 0 0 1 |
| 144 | 0 1 0 0 0 1 0 0 0 0 0 1 0 0 0 0 |
| 145 | 0 1 0 0 0 1 0 0 0 0 0 1 0 0 0 1 |
| 146 | 0 1 0 0 0 1 0 0 0 0 0 1 0 0 1 0 |
| 147 | 0 1 0 0 0 1 0 0 0 0 1 0 0 0 0 0 |
| 148 | 0 1 0 0 0 1 0 0 0 0 1 0 0 0 0 1 |
| 149 | 0 1 0 0 0 1 0 0 0 0 1 0 0 0 1 0 |
| 150 | 0 1 0 0 0 1 0 0 0 0 1 0 0 1 0 0 |
| 151 | 0 1 0 0 0 1 0 0 0 1 0 0 0 0 0 0 |
| 152 | 0 1 0 0 0 1 0 0 0 1 0 0 0 0 0 1 |
| 153 | 0 1 0 0 0 1 0 0 0 1 0 0 0 0 1 0 |
| 154 | 0 1 0 0 0 1 0 0 0 1 0 0 0 1 0 0 |
| 155 | 0 1 0 0 0 1 0 0 0 1 0 0 1 0 0 0 |
| 156 | 0 1 0 0 0 1 0 0 0 1 0 0 1 0 0 1 |
| 157 | 0 1 0 0 0 1 0 0 1 0 0 0 0 0 0 0 |
| 158 | 0 1 0 0 0 1 0 0 1 0 0 0 0 0 0 1 |
| 159 | 0 1 0 0 0 1 0 0 1 0 0 0 0 0 1 0 |
| 160 | 0 1 0 0 0 1 0 0 1 0 0 0 0 1 0 0 |
| 161 | 0 1 0 0 0 1 0 0 1 0 0 0 1 0 0 0 |
| 162 | 0 1 0 0 0 1 0 0 1 0 0 0 1 0 0 1 |
| 163 | 0 1 0 0 0 1 0 0 1 0 0 1 0 0 0 0 |
| 164 | 0 1 0 0 0 1 0 0 1 0 0 1 0 0 0 1 |
| 165 | 0 1 0 0 0 1 0 0 1 0 0 1 0 0 1 0 |
| 166 | 0 1 0 0 1 0 0 0 0 0 0 0 0 0 0 1 |
| 167 | 0 1 0 0 1 0 0 0 0 0 0 0 0 0 1 0 |
| 168 | 0 1 0 0 1 0 0 0 0 0 0 0 0 1 0 0 |
| 169 | 0 1 0 0 1 0 0 0 0 0 0 0 1 0 0 0 |
| 170 | 0 1 0 0 1 0 0 0 0 0 0 0 1 0 0 1 |
| 171 | 0 1 0 0 1 0 0 0 0 0 0 1 0 0 0 0 |
| 172 | 0 1 0 0 1 0 0 0 0 0 0 1 0 0 0 1 |
| 173 | 0 1 0 0 1 0 0 0 0 0 0 1 0 0 1 0 |
| 174 | 0 1 0 0 1 0 0 0 0 0 1 0 0 0 0 0 |
| 175 | 0 1 0 0 1 0 0 0 0 0 1 0 0 0 0 1 |
| 176 | 0 1 0 0 1 0 0 0 0 0 1 0 0 0 1 0 |
| 177 | 0 1 0 0 1 0 0 0 0 0 1 0 0 1 0 0 |
| 178 | 0 1 0 0 1 0 0 0 0 1 0 0 0 0 0 0 |
| 179 | 0 1 0 0 1 0 0 0 0 1 0 0 0 0 0 1 |
| 180 | 0 1 0 0 1 0 0 0 0 1 0 0 0 0 1 0 |
| 181 | 0 1 0 0 1 0 0 0 0 1 0 0 0 1 0 0 |
| 182 | 0 1 0 0 1 0 0 0 0 1 0 0 1 0 0 0 |
| 183 | 0 1 0 0 1 0 0 0 0 1 0 0 1 0 0 1 |
| 184 | 0 1 0 0 1 0 0 0 1 0 0 0 0 0 0 0 |
| 185 | 0 1 0 0 1 0 0 0 1 0 0 0 0 0 0 1 |
| 186 | 0 1 0 0 1 0 0 0 1 0 0 0 0 0 1 0 |
| 187 | 0 1 0 0 1 0 0 0 1 0 0 0 0 1 0 0 |
| 188 | 0 1 0 0 1 0 0 0 1 0 0 0 1 0 0 0 |
| 189 | 0 1 0 0 1 0 0 0 1 0 0 0 1 0 0 1 |
| 190 | 0 1 0 0 1 0 0 0 1 0 0 1 0 0 0 0 |
| 191 | 0 1 0 0 1 0 0 0 1 0 0 1 0 0 0 1 |
| 192 | 0 1 0 0 1 0 0 0 1 0 0 1 0 0 1 0 |
| 193 | 0 1 0 0 1 0 0 1 0 0 0 0 0 0 0 0 |
| 194 | 0 1 0 0 1 0 0 1 0 0 0 0 0 0 0 1 |
| 195 | 0 1 0 0 1 0 0 1 0 0 0 0 0 0 1 0 |
| 196 | 0 1 0 0 1 0 0 1 0 0 0 0 0 1 0 0 |
| 197 | 0 1 0 0 1 0 0 1 0 0 0 0 1 0 0 0 |
| 198 | 0 1 0 0 1 0 0 1 0 0 0 0 1 0 0 1 |
| 199 | 0 1 0 0 1 0 0 1 0 0 0 1 0 0 0 0 |
| 200 | 0 1 0 0 1 0 0 1 0 0 0 1 0 0 0 1 |
| 201 | 0 1 0 0 1 0 0 1 0 0 0 1 0 0 1 0 |
| 202 | 0 1 0 0 1 0 0 1 0 0 1 0 0 0 0 0 |
| 203 | 0 1 0 0 1 0 0 1 0 0 1 0 0 0 0 1 |
| 204 | 0 1 0 0 1 0 0 1 0 0 1 0 0 0 1 0 |
| 205 | 0 1 0 0 1 0 0 1 0 0 1 0 0 1 0 0 |
| 206 | 1 0 0 0 0 0 0 0 0 0 0 1 0 0 0 0 |
| 207 | 1 0 0 0 0 0 0 0 0 0 0 1 0 0 0 1 |
| 208 | 1 0 0 0 0 0 0 0 0 0 0 1 0 0 1 0 |
| 209 | 1 0 0 0 0 0 0 0 0 0 1 0 0 0 0 0 |
| 210 | 1 0 0 0 0 0 0 0 0 0 1 0 0 0 0 1 |
| 211 | 1 0 0 0 0 0 0 0 0 0 1 0 0 0 1 0 |
| 212 | 1 0 0 0 0 0 0 0 0 0 1 0 0 1 0 0 |
| 213 | 1 0 0 0 0 0 0 0 0 1 0 0 0 0 0 0 |
| 214 | 1 0 0 0 0 0 0 0 0 1 0 0 0 0 0 1 |
| 215 | 1 0 0 0 0 0 0 0 0 1 0 0 0 0 1 0 |
| 216 | 1 0 0 0 0 0 0 0 0 1 0 0 0 1 0 0 |
| 217 | 1 0 0 0 0 0 0 0 0 1 0 0 1 0 0 0 |
| 218 | 1 0 0 0 0 0 0 0 0 1 0 0 1 0 0 1 |
| 219 | 1 0 0 0 0 0 0 0 1 0 0 0 0 0 0 0 |
| 220 | 1 0 0 0 0 0 0 0 1 0 0 0 0 0 0 1 |
| 221 | 1 0 0 0 0 0 0 0 1 0 0 0 0 0 1 0 |
| 222 | 1 0 0 0 0 0 0 0 1 0 0 0 0 1 0 0 |
| 223 | 1 0 0 0 0 0 0 0 1 0 0 0 1 0 0 0 |
| 224 | 1 0 0 0 0 0 0 0 1 0 0 0 1 0 0 1 |
| 225 | 1 0 0 0 0 0 0 0 1 0 0 1 0 0 0 0 |
| 226 | 1 0 0 0 0 0 0 0 1 0 0 1 0 0 0 1 |
| 227 | 1 0 0 0 0 0 0 0 1 0 0 1 0 0 1 0 |
| 228 | 1 0 0 0 0 0 0 1 0 0 0 0 0 0 0 0 |
| 229 | 1 0 0 0 0 0 0 1 0 0 0 0 0 0 0 1 |
| 230 | 1 0 0 0 0 0 0 1 0 0 0 0 0 0 1 0 |
| 231 | 1 0 0 0 0 0 0 1 0 0 0 0 0 1 0 0 |
| 232 | 1 0 0 0 0 0 0 1 0 0 0 0 1 0 0 0 |
| 233 | 1 0 0 0 0 0 0 1 0 0 0 0 1 0 0 1 |
| 234 | 1 0 0 0 0 0 0 1 0 0 0 1 0 0 0 0 |
| 235 | 1 0 0 0 0 0 0 1 0 0 0 1 0 0 0 1 |
| 236 | 1 0 0 0 0 0 0 1 0 0 0 1 0 0 1 0 |
| 237 | 1 0 0 0 0 0 0 1 0 0 1 0 0 0 0 0 |
| 238 | 1 0 0 0 0 0 0 1 0 0 1 0 0 0 0 1 |
| 239 | 1 0 0 0 0 0 0 1 0 0 1 0 0 0 1 0 |
| 240 | 1 0 0 0 0 0 0 1 0 0 1 0 0 1 0 0 |
| 241 | 1 0 0 0 0 0 1 0 0 0 0 0 0 0 0 1 |
| 242 | 1 0 0 0 0 0 1 0 0 0 0 0 0 0 1 0 |
| 243 | 1 0 0 0 0 0 1 0 0 0 0 0 0 1 0 0 |
| 244 | 1 0 0 0 0 0 1 0 0 0 0 0 1 0 0 0 |
| 245 | 1 0 0 0 0 0 1 0 0 0 0 0 1 0 0 1 |
| 246 | 1 0 0 0 0 0 1 0 0 0 0 1 0 0 0 0 |
| 247 | 1 0 0 0 0 0 1 0 0 0 0 1 0 0 0 1 |
| 248 | 1 0 0 0 0 0 1 0 0 0 0 1 0 0 1 0 |
| 249 | 1 0 0 0 0 0 1 0 0 0 1 0 0 0 0 0 |
| 250 | 1 0 0 0 0 0 1 0 0 0 1 0 0 0 0 1 |
| 251 | 1 0 0 0 0 0 1 0 0 0 1 0 0 0 1 0 |
| 252 | 1 0 0 0 0 0 1 0 0 0 1 0 0 1 0 0 |
| 253 | 1 0 0 0 0 0 1 0 0 1 0 0 0 0 0 0 |
| 254 | 1 0 0 0 0 0 1 0 0 1 0 0 0 0 0 1 |
| 255 | 1 0 0 0 0 0 1 0 0 1 0 0 0 0 1 0 |
| 256 | 1 0 0 0 0 0 1 0 0 1 0 0 0 1 0 0 |
| 257 | 1 0 0 0 0 0 1 0 0 1 0 0 1 0 0 0 |
| 258 | 1 0 0 0 0 0 1 0 0 1 0 0 1 0 0 1 |
| 259 | 1 0 0 0 0 1 0 0 0 0 0 0 0 0 0 1 |
| 260 | 1 0 0 0 0 1 0 0 0 0 0 0 0 0 1 0 |
| 261 | 1 0 0 0 0 1 0 0 0 0 0 0 0 1 0 0 |
| 262 | 1 0 0 0 0 1 0 0 0 0 0 0 1 0 0 0 |
| 263 | 1 0 0 0 0 1 0 0 0 0 0 0 1 0 0 1 |
| 264 | 1 0 0 0 0 1 0 0 0 0 0 1 0 0 0 0 |
| 265 | 1 0 0 0 0 1 0 0 0 0 0 1 0 0 0 1 |
| 266 | 1 0 0 0 0 1 0 0 0 0 0 1 0 0 1 0 |
| 267 | 1 0 0 0 0 1 0 0 0 0 1 0 0 0 0 0 |
| 268 | 1 0 0 0 0 1 0 0 0 0 1 0 0 0 0 1 |
| 269 | 1 0 0 0 0 1 0 0 0 0 1 0 0 0 1 0 |
| 270 | 1 0 0 0 0 1 0 0 0 0 1 0 0 1 0 0 |
| 271 | 1 0 0 0 0 1 0 0 0 1 0 0 0 0 0 0 |
| 272 | 1 0 0 0 0 1 0 0 0 1 0 0 0 0 0 1 |
| 273 | 1 0 0 0 0 1 0 0 0 1 0 0 0 0 1 0 |
| 274 | 1 0 0 0 0 1 0 0 0 1 0 0 0 1 0 0 |
| 275 | 1 0 0 0 0 1 0 0 0 1 0 0 1 0 0 0 |
| 276 | 1 0 0 0 0 1 0 0 0 1 0 0 1 0 0 1 |
| 277 | 1 0 0 0 0 1 0 0 1 0 0 0 0 0 0 0 |
| 278 | 1 0 0 0 0 1 0 0 1 0 0 0 0 0 0 1 |
| 279 | 1 0 0 0 0 1 0 0 1 0 0 0 0 0 1 0 |
| 280 | 1 0 0 0 0 1 0 0 1 0 0 0 0 1 0 0 |
| 281 | 1 0 0 0 0 1 0 0 1 0 0 0 1 0 0 0 |
| 282 | 1 0 0 0 0 1 0 0 1 0 0 0 1 0 0 1 |
| 283 | 1 0 0 0 0 1 0 0 1 0 0 1 0 0 0 0 |
| 284 | 1 0 0 0 0 1 0 0 1 0 0 1 0 0 0 1 |
| 285 | 1 0 0 0 0 1 0 0 1 0 0 1 0 0 1 0 |

TABLE 42 -continued

| NUMBER | 16-BIT CODE |
|---|---|
| 286 | 1 0 0 0 1 0 0 0 0 0 0 0 0 0 0 1 |
| 287 | 1 0 0 0 1 0 0 0 0 0 0 0 0 0 1 0 |
| 288 | 1 0 0 0 1 0 0 0 0 0 0 0 0 1 0 0 |
| 289 | 1 0 0 0 1 0 0 0 0 0 0 0 1 0 0 0 |
| 290 | 1 0 0 0 1 0 0 0 0 0 0 0 1 0 0 1 |
| 291 | 1 0 0 0 1 0 0 0 0 0 0 1 0 0 0 0 |
| 292 | 1 0 0 0 1 0 0 0 0 0 0 1 0 0 0 1 |
| 293 | 1 0 0 0 1 0 0 0 0 0 0 1 0 0 1 0 |
| 294 | 1 0 0 0 1 0 0 0 0 0 1 0 0 0 0 0 |
| 295 | 1 0 0 0 1 0 0 0 0 0 1 0 0 0 0 1 |
| 296 | 1 0 0 0 1 0 0 0 0 0 1 0 0 0 1 0 |
| 297 | 1 0 0 0 1 0 0 0 0 0 1 0 0 1 0 0 |
| 298 | 1 0 0 0 1 0 0 0 0 1 0 0 0 0 0 0 |
| 299 | 1 0 0 0 1 0 0 0 0 1 0 0 0 0 0 1 |
| 300 | 1 0 0 0 1 0 0 0 0 1 0 0 0 0 1 0 |
| 301 | 1 0 0 0 1 0 0 0 0 1 0 0 0 1 0 0 |
| 302 | 1 0 0 0 1 0 0 0 0 1 0 0 1 0 0 0 |
| 303 | 1 0 0 0 1 0 0 0 0 1 0 0 1 0 0 1 |
| 304 | 1 0 0 0 1 0 0 0 1 0 0 0 0 0 0 0 |
| 305 | 1 0 0 0 1 0 0 0 1 0 0 0 0 0 0 1 |
| 306 | 1 0 0 0 1 0 0 0 1 0 0 0 0 0 1 0 |
| 307 | 1 0 0 0 1 0 0 0 1 0 0 0 0 1 0 0 |
| 308 | 1 0 0 0 1 0 0 0 1 0 0 0 1 0 0 0 |
| 309 | 1 0 0 0 1 0 0 0 1 0 0 0 1 0 0 1 |
| 310 | 1 0 0 0 1 0 0 0 1 0 0 1 0 0 0 0 |
| 311 | 1 0 0 0 1 0 0 0 1 0 0 1 0 0 0 1 |
| 312 | 1 0 0 0 1 0 0 0 1 0 0 1 0 0 1 0 |
| 313 | 1 0 0 0 1 0 0 1 0 0 0 0 0 0 0 0 |
| 314 | 1 0 0 0 1 0 0 1 0 0 0 0 0 0 0 1 |
| 315 | 1 0 0 0 1 0 0 1 0 0 0 0 0 0 1 0 |
| 316 | 1 0 0 0 1 0 0 1 0 0 0 0 0 1 0 0 |
| 317 | 1 0 0 0 1 0 0 1 0 0 0 0 1 0 0 0 |
| 318 | 1 0 0 0 1 0 0 1 0 0 0 0 1 0 0 1 |
| 319 | 1 0 0 0 1 0 0 1 0 0 0 1 0 0 0 0 |
| 320 | 1 0 0 0 1 0 0 1 0 0 0 1 0 0 0 1 |
| 321 | 1 0 0 0 1 0 0 1 0 0 0 1 0 0 1 0 |
| 322 | 1 0 0 0 1 0 0 1 0 0 1 0 0 0 0 0 |
| 323 | 1 0 0 0 1 0 0 1 0 0 1 0 0 0 0 1 |
| 324 | 1 0 0 0 1 0 0 1 0 0 1 0 0 0 1 0 |
| 325 | 1 0 0 0 1 0 0 1 0 0 1 0 0 1 0 0 |
| 326 | 1 0 0 1 0 0 0 0 0 0 0 0 0 0 1 0 |
| 327 | 1 0 0 1 0 0 0 0 0 0 0 0 0 1 0 0 |
| 328 | 1 0 0 1 0 0 0 0 0 0 0 0 1 0 0 0 |
| 329 | 1 0 0 1 0 0 0 0 0 0 0 0 1 0 0 1 |
| 330 | 1 0 0 1 0 0 0 0 0 0 0 1 0 0 0 0 |
| 331 | 1 0 0 1 0 0 0 0 0 0 0 1 0 0 0 1 |
| 332 | 1 0 0 1 0 0 0 0 0 0 0 1 0 0 1 0 |
| 333 | 1 0 0 1 0 0 0 0 0 0 1 0 0 0 0 0 |
| 334 | 1 0 0 1 0 0 0 0 0 0 1 0 0 0 0 1 |
| 335 | 1 0 0 1 0 0 0 0 0 0 1 0 0 0 1 0 |
| 336 | 1 0 0 1 0 0 0 0 0 0 1 0 0 1 0 0 |
| 337 | 1 0 0 1 0 0 0 0 0 1 0 0 0 0 0 0 |
| 338 | 1 0 0 1 0 0 0 0 0 1 0 0 0 0 0 1 |
| 339 | 1 0 0 1 0 0 0 0 0 1 0 0 0 0 1 0 |
| 340 | 1 0 0 1 0 0 0 0 0 1 0 0 0 1 0 0 |
| 341 | 1 0 0 1 0 0 0 0 0 1 0 0 1 0 0 0 |
| 342 | 1 0 0 1 0 0 0 0 0 1 0 0 1 0 0 1 |
| 343 | 1 0 0 1 0 0 0 0 1 0 0 0 0 0 0 0 |
| 344 | 1 0 0 1 0 0 0 0 1 0 0 0 0 0 0 1 |
| 345 | 1 0 0 1 0 0 0 0 1 0 0 0 0 0 1 0 |
| 346 | 1 0 0 1 0 0 0 0 1 0 0 0 0 1 0 0 |
| 347 | 1 0 0 1 0 0 0 0 1 0 0 0 1 0 0 0 |
| 348 | 1 0 0 1 0 0 0 0 1 0 0 0 1 0 0 1 |
| 349 | 1 0 0 1 0 0 0 0 1 0 0 1 0 0 0 0 |
| 350 | 1 0 0 1 0 0 0 0 1 0 0 1 0 0 0 1 |
| 351 | 1 0 0 1 0 0 0 0 1 0 0 1 0 0 1 0 |
| 352 | 1 0 0 1 0 0 0 1 0 0 0 0 0 0 0 0 |
| 353 | 1 0 0 1 0 0 0 1 0 0 0 0 0 0 0 1 |
| 354 | 1 0 0 1 0 0 0 1 0 0 0 0 0 0 1 0 |
| 355 | 1 0 0 1 0 0 0 1 0 0 0 0 0 1 0 0 |
| 356 | 1 0 0 1 0 0 0 1 0 0 0 0 1 0 0 0 |
| 357 | 1 0 0 1 0 0 0 1 0 0 0 0 1 0 0 1 |
| 358 | 1 0 0 1 0 0 0 1 0 0 0 1 0 0 0 0 |
| 359 | 1 0 0 1 0 0 0 1 0 0 0 1 0 0 0 1 |
| 360 | 1 0 0 1 0 0 0 1 0 0 0 1 0 0 1 0 |
| 361 | 1 0 0 1 0 0 0 1 0 0 1 0 0 0 0 0 |
| 362 | 1 0 0 1 0 0 0 1 0 0 1 0 0 0 0 1 |
| 363 | 1 0 0 1 0 0 0 1 0 0 1 0 0 0 1 0 |
| 364 | 1 0 0 1 0 0 0 1 0 0 1 0 0 1 0 0 |
| 365 | 1 0 0 1 0 0 1 0 0 0 0 0 0 0 0 1 |
| 366 | 1 0 0 1 0 0 1 0 0 0 0 0 0 0 1 0 |
| 367 | 1 0 0 1 0 0 1 0 0 0 0 0 0 1 0 0 |
| 368 | 1 0 0 1 0 0 1 0 0 0 0 0 1 0 0 0 |
| 369 | 1 0 0 1 0 0 1 0 0 0 0 0 1 0 0 1 |
| 370 | 1 0 0 1 0 0 1 0 0 0 0 1 0 0 0 0 |
| 371 | 1 0 0 1 0 0 1 0 0 0 0 1 0 0 0 1 |
| 372 | 1 0 0 1 0 0 1 0 0 0 0 1 0 0 1 0 |
| 373 | 1 0 0 1 0 0 1 0 0 0 1 0 0 0 0 0 |
| 374 | 1 0 0 1 0 0 1 0 0 0 1 0 0 0 0 1 |
| 375 | 1 0 0 1 0 0 1 0 0 0 1 0 0 0 1 0 |
| 376 | 1 0 0 1 0 0 1 0 0 0 1 0 0 1 0 0 |
| 377 | 1 0 0 1 0 0 1 0 0 1 0 0 0 0 0 0 |
| 378 | 1 0 0 1 0 0 1 0 0 1 0 0 0 0 0 1 |
| 379 | 1 0 0 1 0 0 1 0 0 1 0 0 0 0 1 0 |
| 380 | 1 0 0 1 0 0 1 0 0 1 0 0 0 1 0 0 |
| 381 | 1 0 0 1 0 0 1 0 0 1 0 0 1 0 0 0 |
| 382 | 1 0 0 1 0 0 1 0 0 1 0 0 1 0 0 1 |

Figure 28:
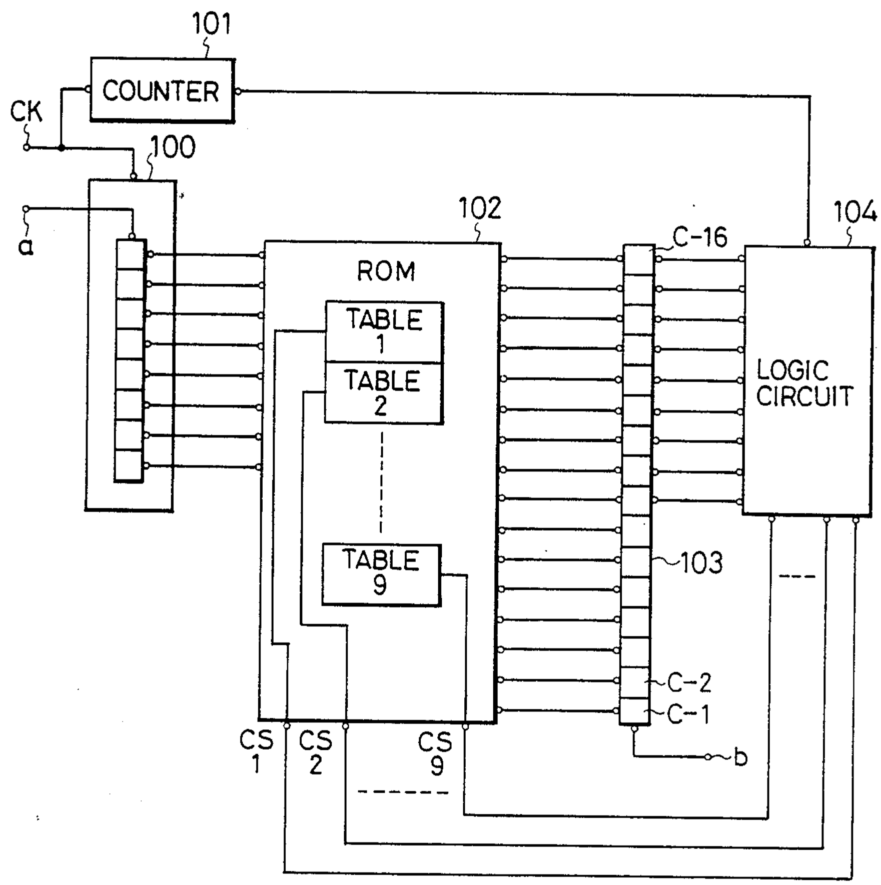
FIG. 28 is an arrangement block diagram of the conversion from 8 bits to 16 bits.

FIG. 28 is an arrangement block diagram for encoding of the present invention. In FIG. 28, a data sequence is inputted from ⓐ. This data sequence is inputted to the 8-bit shift register 100. CK is the input terminal of the clock to drive the shift register 100. This clock signal is also simultaneously inputted to the counter 101. The counter 101 generates a pulse whenever eight clocks are counted and this pulse is inputted to the logic circuit 104.

The last nine bits of the 16-bit code are observed. When the last one bit C-16 is "1", the chip selecting terminal $CS_1$ to select Table 1 in the ROM 102 is set to ON. When the last two bits C-15 and C-16 are "1 0", the chip selecting terminal $CS_2$ to select Table 2 is set to ON. When the last three bits C-14, C-15 and C-16 are "1 0 0", the chip selecting terminal $CS_3$ to select Table 3 is set to ON. Although the descriptions with respect to intermediate Tables 4 to 8 are omitted here, when the last nine bits C-8 to C-16 are "1 0 0 0 0 0 0 0 0", the chip selecting terminal $CS_9$ to select Table 9 is similarly set to ON. In this case, the timing when each chip selecting terminal is set to ON is based on the time when the pulse is inputted from the counter 101 to the logic circuit 104. It is obvious that such a logic circuit 104 can be easily realized.

As described above, either one of Tables 1 to 9 is selected and at this time, the 8-bit data in the 8-bit shift register 100 is taken in the ROM 102. The address in the table corresponding to the data is designated. In Table 1, 256 16-bit codes which were arbitrarily selected from Table 34 are stored. In Table 2, 256 16-bit data which were arbitrarily selected from Table 35 are stored. In Table 3, 256 16-bit codes which were arbitrarily selected from Table 36 are stored. In a similar manner as above, 256 16-bit codes which were arbitrarily selected from Table 42 are stored in Table 9.

When the address in the table corresponding to the data is designated, the 16-bit code stored in that address is inputted to the shift register 103 and is outputted from the code output terminal ⓑ. In this case, the last nine bits of the 16-bit code, namely, C-8 to C-16 are observed by the logic circuit 104, thereby determining the table to be selected next. In this way, the conversion from the data to the code, namely, the encoding is finished. The conversion from the code to the data which is performed on the reproducing side, namely, the decoding may be attained by performing the conversion opposite to the foregoing conversion encoding.

As described above, the coding system of the present invention is the (8, 16, 2, 10) coding system and $T_{min}=1.5T$ $T_{max}=5.5T$ $T_W=0.5T$ Consequently, the present system has an effect such that the $T_W$ and $T_{min}$ are larger than those in the MFM system. Therefore, it is possible to provide an electronic apparatus in which the reciording and/or reproduction can be performed with a high density and a high degree of accuracy.

[8→17]

In case of converting the 8-bit data to the 17-bit code, arbitrary 17-bit codes which are selected from the 17-bit codes shown in Tables 43, 44, 45, 46, and 47 may be made coordinate with the $2^8=256$ data.

TABLE 43

| NUMBER | 17-BIT CODE |
|---|---|
| 1 | 10000000000100100 |
| 2 | 10000000001000100 |
| 3 | 10000000010000100 |
| 4 | 10000000100000100 |
| 5 | 10000000100100100 |
| 6 | 10000001000000100 |
| 7 | 10000001000100100 |
| 8 | 10000001001000100 |
| 9 | 10000010000000100 |
| 10 | 10000010000100100 |
| 11 | 10000010001000100 |
| 12 | 10000010010000100 |
| 13 | 10000100000000100 |
| 14 | 10000100000100100 |
| 15 | 10000100001000100 |
| 16 | 10000100010000100 |
| 17 | 10000100100000100 |
| 18 | 10000100100100100 |
| 19 | 10001000000000100 |
| 20 | 10001000000100100 |
| 21 | 10001000001000100 |
| 22 | 10001000010000100 |
| 23 | 10001000100000100 |
| 24 | 10001000100100100 |
| 25 | 10001001000000100 |
| 26 | 10001001000100100 |
| 27 | 10001001001000100 |
| 28 | 10010000000000100 |
| 29 | 10010000000100100 |
| 30 | 10010000001000100 |
| 31 | 10010000010000100 |
| 32 | 10010000100000100 |
| 33 | 10010000100100100 |
| 34 | 10010001000000100 |
| 35 | 10010001000100100 |
| 36 | 10010001001000100 |
| 37 | 10010010000000100 |
| 38 | 10010010000100100 |
| 39 | 10010010001000100 |
| 40 | 10010010010000100 |
| 41 | 10000000001001000 |
| 42 | 10000000010001000 |
| 43 | 10000000100001000 |
| 44 | 10000001000001000 |
| 45 | 10000001001001000 |
| 46 | 10000010000001000 |
| 47 | 10000010001001000 |
| 48 | 10000010010001000 |
| 49 | 10000100000001000 |
| 50 | 10000100001001000 |
| 51 | 10000100010001000 |
| 52 | 10000100100001000 |
| 53 | 10001000000001000 |
| 54 | 10001000001001000 |
| 55 | 10001000010001000 |
| 56 | 10001000100001000 |
| 57 | 10001001000001000 |
| 58 | 10001001001001000 |
| 59 | 10010000000001000 |

TABLE 43-continued

| NUMBER | 17-BIT CODE |
|---|---|
| 60 | 10010000001001000 |
| 61 | 10010000010001000 |
| 62 | 10010000100001000 |
| 63 | 10010001000001000 |
| 64 | 10010001001001000 |
| 65 | 10010010000001000 |
| 66 | 10010010001001000 |
| 67 | 10010010010001000 |
| 68 | 10000000010010000 |
| 69 | 10000000100010000 |
| 70 | 10000001000010000 |
| 71 | 10000010000010000 |
| 72 | 10000010010010000 |
| 73 | 10000100000010000 |
| 74 | 10000100010010000 |
| 75 | 10000100100010000 |
| 76 | 10001000000010000 |
| 77 | 10001000010010000 |
| 78 | 10001000100010000 |
| 79 | 10001001000010000 |
| 80 | 10010000000010000 |
| 81 | 10010000010010000 |
| 82 | 10010000100010000 |
| 83 | 10010001000010000 |
| 84 | 10010010000010000 |
| 85 | 10010010010010000 |
| 86 | 10000000000100000 |
| 87 | 10000000100100000 |
| 88 | 10000001000100000 |
| 89 | 10000010000100000 |
| 90 | 10000100000100000 |
| 91 | 10000100100100000 |
| 92 | 10001000000100000 |
| 93 | 10001000100100000 |
| 94 | 10001001000100000 |
| 95 | 10010000000100000 |
| 96 | 10010000100100000 |
| 97 | 10010001000100000 |
| 98 | 10010010000100000 |
| 99 | 10000000001000000 |
| 100 | 10000001001000000 |
| 101 | 10000010001000000 |
| 102 | 10000100001000000 |
| 103 | 10001000001000000 |
| 104 | 10001001001000000 |
| 105 | 10010000001000000 |
| 106 | 10010001001000000 |
| 107 | 10010010001000000 |
| 108 | 10000000010000000 |
| 109 | 10000010010000000 |
| 110 | 10000100010000000 |
| 111 | 10001000010000000 |
| 112 | 10010000010000000 |
| 113 | 10010010010000000 |
| 114 | 01000000000100100 |
| 115 | 01000000001000100 |
| 116 | 01000000010000100 |
| 117 | 01000000100000100 |
| 118 | 01000000100100100 |
| 119 | 01000001000000100 |
| 120 | 01000001000100100 |
| 121 | 01000001001000100 |
| 122 | 01000010000000100 |
| 123 | 01000010000100100 |
| 124 | 01000010001000100 |
| 125 | 01000010010000100 |
| 126 | 01000100000000100 |
| 127 | 01000100000100100 |
| 128 | 01000100001000100 |
| 129 | 01000100010000100 |
| 130 | 01000100100000100 |
| 131 | 01000100100100100 |
| 132 | 01001000000000100 |
| 133 | 01001000000100100 |
| 134 | 01001000001000100 |
| 135 | 01001000010000100 |
| 136 | 01001000010000100 |
| 137 | 01001000100100100 |
| 138 | 01001001000000100 |
| 139 | 01001001000100100 |
| 140 | 01001001001000100 |

TABLE 43-continued

| NUMBER | 17-BIT CODE |
|---|---|
| 141 | 0 1 0 0 0 0 0 0 0 0 1 0 0 1 0 0 0 |
| 142 | 0 1 0 0 0 0 0 0 0 1 0 0 0 1 0 0 0 |
| 143 | 0 1 0 0 0 0 0 0 1 0 0 0 0 1 0 0 0 |
| 144 | 0 1 0 0 0 0 0 1 0 0 0 0 0 1 0 0 0 |
| 145 | 0 1 0 0 0 0 0 1 0 0 1 0 0 1 0 0 0 |
| 146 | 0 1 0 0 0 0 1 0 0 0 0 0 0 1 0 0 0 |
| 147 | 0 1 0 0 0 0 1 0 0 0 1 0 0 1 0 0 0 |
| 148 | 0 1 0 0 0 0 1 0 0 1 0 0 0 1 0 0 0 |
| 149 | 0 1 0 0 0 1 0 0 0 0 0 0 0 1 0 0 0 |
| 150 | 0 1 0 0 0 1 0 0 0 0 1 0 0 1 0 0 0 |
| 151 | 0 1 0 0 0 1 0 0 0 1 0 0 0 1 0 0 0 |
| 152 | 0 1 0 0 0 1 0 0 1 0 0 0 0 1 0 0 0 |
| 153 | 0 1 0 0 1 0 0 0 0 0 0 0 0 1 0 0 0 |
| 154 | 0 1 0 0 1 0 0 0 0 0 1 0 0 1 0 0 0 |
| 155 | 0 1 0 0 1 0 0 0 0 1 0 0 0 1 0 0 0 |
| 156 | 0 1 0 0 1 0 0 0 1 0 0 0 0 1 0 0 0 |
| 157 | 0 1 0 0 1 0 0 1 0 0 0 0 0 1 0 0 0 |
| 158 | 0 1 0 0 1 0 0 1 0 0 1 0 0 1 0 0 0 |
| 159 | 0 1 0 0 0 0 0 0 0 0 0 0 1 0 0 0 0 |
| 160 | 0 1 0 0 0 0 0 0 0 1 0 0 1 0 0 0 0 |
| 161 | 0 1 0 0 0 0 0 0 1 0 0 0 1 0 0 0 0 |
| 162 | 0 1 0 0 0 0 0 1 0 0 0 0 1 0 0 0 0 |
| 163 | 0 1 0 0 0 0 1 0 0 0 0 0 1 0 0 0 0 |
| 164 | 0 1 0 0 0 0 1 0 0 1 0 0 1 0 0 0 0 |
| 165 | 0 1 0 0 0 1 0 0 0 0 0 0 1 0 0 0 0 |
| 166 | 0 1 0 0 0 1 0 0 0 1 0 0 1 0 0 0 0 |
| 167 | 0 1 0 0 0 1 0 0 1 0 0 0 1 0 0 0 0 |
| 168 | 0 1 0 0 1 0 0 0 0 0 0 0 1 0 0 0 0 |
| 169 | 0 1 0 0 1 0 0 0 0 1 0 0 1 0 0 0 0 |
| 170 | 0 1 0 0 1 0 0 0 1 0 0 0 1 0 0 0 0 |
| 171 | 0 1 0 0 1 0 0 1 0 0 0 0 1 0 0 0 0 |
| 172 | 0 1 0 0 0 0 0 0 0 0 0 1 0 0 0 0 0 |
| 173 | 0 1 0 0 0 0 0 0 1 0 0 1 0 0 0 0 0 |
| 174 | 0 1 0 0 0 0 0 1 0 0 0 1 0 0 0 0 0 |
| 175 | 0 1 0 0 0 0 1 0 0 0 0 1 0 0 0 0 0 |
| 176 | 0 1 0 0 0 1 0 0 0 0 0 1 0 0 0 0 0 |
| 177 | 0 1 0 0 0 1 0 0 1 0 0 1 0 0 0 0 0 |
| 178 | 0 1 0 0 1 0 0 0 0 0 0 1 0 0 0 0 0 |
| 179 | 0 1 0 0 1 0 0 0 1 0 0 1 0 0 0 0 0 |
| 180 | 0 1 0 0 1 0 0 1 0 0 0 1 0 0 0 0 0 |
| 181 | 0 1 0 0 0 0 0 0 0 0 1 0 0 0 0 0 0 |
| 182 | 0 1 0 0 0 0 0 1 0 0 1 0 0 0 0 0 0 |
| 183 | 0 1 0 0 0 0 1 0 0 0 1 0 0 0 0 0 0 |
| 184 | 0 1 0 0 0 1 0 0 0 0 1 0 0 0 0 0 0 |
| 185 | 0 1 0 0 1 0 0 0 0 0 1 0 0 0 0 0 0 |
| 186 | 0 1 0 0 1 0 0 1 0 0 1 0 0 0 0 0 0 |
| 187 | 0 1 0 0 0 0 0 0 0 1 0 0 0 0 0 0 0 |
| 188 | 0 1 0 0 0 0 1 0 0 1 0 0 0 0 0 0 0 |
| 189 | 0 1 0 0 0 1 0 0 0 1 0 0 0 0 0 0 0 |
| 190 | 0 1 0 0 1 0 0 0 0 1 0 0 0 0 0 0 0 |
| 191 | 0 0 1 0 0 0 0 0 0 0 0 1 0 0 1 0 0 |
| 192 | 0 0 1 0 0 0 0 0 0 0 1 0 0 0 1 0 0 |
| 193 | 0 0 1 0 0 0 0 0 0 1 0 0 0 0 1 0 0 |
| 194 | 0 0 1 0 0 0 0 0 1 0 0 0 0 0 1 0 0 |
| 195 | 0 0 1 0 0 0 0 0 1 0 0 1 0 0 1 0 0 |
| 196 | 0 0 1 0 0 0 0 1 0 0 0 0 0 0 1 0 0 |
| 197 | 0 0 1 0 0 0 0 1 0 0 0 1 0 0 1 0 0 |
| 198 | 0 0 1 0 0 0 0 1 0 0 1 0 0 0 1 0 0 |
| 199 | 0 0 1 0 0 0 1 0 0 0 0 0 0 0 1 0 0 |
| 200 | 0 0 1 0 0 0 1 0 0 0 0 1 0 0 1 0 0 |
| 201 | 0 0 1 0 0 0 1 0 0 0 1 0 0 0 1 0 0 |
| 202 | 0 0 1 0 0 0 1 0 0 1 0 0 0 0 1 0 0 |
| 203 | 0 0 1 0 0 1 0 0 0 0 0 0 0 0 1 0 0 |
| 204 | 0 0 1 0 0 1 0 0 0 0 0 1 0 0 1 0 0 |
| 205 | 0 0 1 0 0 1 0 0 0 0 1 0 0 0 1 0 0 |
| 206 | 0 0 1 0 0 1 0 0 0 1 0 0 0 0 1 0 0 |
| 207 | 0 0 1 0 0 1 0 0 1 0 0 0 0 0 1 0 0 |
| 208 | 0 0 1 0 0 1 0 0 1 0 0 1 0 0 1 0 0 |
| 209 | 0 0 1 0 0 0 0 0 0 0 0 0 0 1 0 0 0 |
| 210 | 0 0 1 0 0 0 0 0 0 0 1 0 0 1 0 0 0 |
| 211 | 0 0 1 0 0 0 0 0 0 1 0 0 0 1 0 0 0 |
| 212 | 0 0 1 0 0 0 0 0 1 0 0 0 0 1 0 0 0 |
| 213 | 0 0 1 0 0 0 0 1 0 0 0 0 0 1 0 0 0 |
| 214 | 0 0 1 0 0 0 0 1 0 0 1 0 0 1 0 0 0 |
| 215 | 0 0 1 0 0 0 1 0 0 0 0 0 0 1 0 0 0 |
| 216 | 0 0 1 0 0 0 1 0 0 0 1 0 0 1 0 0 0 |
| 217 | 0 0 1 0 0 0 1 0 0 1 0 0 0 1 0 0 0 |
| 218 | 0 0 1 0 0 1 0 0 0 0 0 0 0 1 0 0 0 |
| 219 | 0 0 1 0 0 1 0 0 0 0 1 0 0 1 0 0 0 |
| 220 | 0 0 1 0 0 1 0 0 0 1 0 0 0 1 0 0 0 |
| 221 | 0 0 1 0 0 1 0 0 1 0 0 0 0 1 0 0 0 |

TABLE 43-continued

| NUMBER | 17-BIT CODE |
|---|---|
| 222 | 0 0 1 0 0 0 0 0 0 0 0 0 1 0 0 0 0 |
| 223 | 0 0 1 0 0 0 0 0 0 1 0 0 1 0 0 0 0 |
| 224 | 0 0 1 0 0 0 0 0 1 0 0 0 1 0 0 0 0 |
| 225 | 0 0 1 0 0 0 0 1 0 0 0 0 1 0 0 0 0 |
| 226 | 0 0 1 0 0 0 1 0 0 0 0 0 1 0 0 0 0 |
| 227 | 0 0 1 0 0 0 1 0 0 1 0 0 1 0 0 0 0 |
| 228 | 0 0 1 0 0 1 0 0 0 0 0 0 1 0 0 0 0 |
| 229 | 0 0 1 0 0 1 0 0 0 1 0 0 1 0 0 0 0 |
| 230 | 0 0 1 0 0 1 0 0 1 0 0 0 1 0 0 0 0 |
| 231 | 0 0 1 0 0 0 0 0 0 0 0 1 0 0 0 0 0 |
| 232 | 0 0 1 0 0 0 0 0 1 0 0 1 0 0 0 0 0 |
| 233 | 0 0 1 0 0 0 0 1 0 0 0 1 0 0 0 0 0 |
| 234 | 0 0 1 0 0 0 1 0 0 0 0 1 0 0 0 0 0 |
| 235 | 0 0 1 0 0 1 0 0 0 0 0 1 0 0 0 0 0 |
| 236 | 0 0 1 0 0 1 0 0 1 0 0 1 0 0 0 0 0 |
| 237 | 0 0 1 0 0 0 0 0 0 0 1 0 0 0 0 0 0 |
| 238 | 0 0 1 0 0 0 0 1 0 0 1 0 0 0 0 0 0 |
| 239 | 0 0 1 0 0 0 1 0 0 0 1 0 0 0 0 0 0 |
| 240 | 0 0 1 0 0 1 0 0 0 0 1 0 0 0 0 0 0 |
| 241 | 0 0 1 0 0 0 0 0 0 1 0 0 0 0 0 0 0 |
| 242 | 0 0 1 0 0 0 1 0 0 1 0 0 0 0 0 0 0 |
| 243 | 0 0 1 0 0 1 0 0 0 1 0 0 0 0 0 0 0 |
| 244 | 0 0 0 1 0 0 0 0 0 0 0 0 0 0 1 0 0 |
| 245 | 0 0 0 1 0 0 0 0 0 0 0 1 0 0 1 0 0 |
| 246 | 0 0 0 1 0 0 0 0 0 0 1 0 0 0 1 0 0 |
| 247 | 0 0 0 1 0 0 0 0 0 1 0 0 0 0 1 0 0 |
| 248 | 0 0 0 1 0 0 0 0 1 0 0 0 0 0 1 0 0 |
| 249 | 0 0 0 1 0 0 0 0 1 0 0 1 0 0 1 0 0 |
| 250 | 0 0 0 1 0 0 0 1 0 0 0 0 0 0 1 0 0 |
| 251 | 0 0 0 1 0 0 0 1 0 0 0 1 0 0 1 0 0 |
| 252 | 0 0 0 1 0 0 0 1 0 0 1 0 0 0 1 0 0 |
| 253 | 0 0 0 1 0 0 1 0 0 0 0 0 0 0 1 0 0 |
| 254 | 0 0 0 1 0 0 1 0 0 0 0 1 0 0 1 0 0 |
| 255 | 0 0 0 1 0 0 1 0 0 0 1 0 0 0 1 0 0 |
| 256 | 0 0 0 1 0 0 1 0 0 1 0 0 0 0 1 0 0 |
| 257 | 0 0 0 1 0 0 0 0 0 0 0 0 0 1 0 0 0 |
| 258 | 0 0 0 1 0 0 0 0 0 0 1 0 0 1 0 0 0 |
| 259 | 0 0 0 1 0 0 0 0 0 1 0 0 0 1 0 0 0 |
| 260 | 0 0 0 1 0 0 0 0 1 0 0 0 0 1 0 0 0 |
| 261 | 0 0 0 1 0 0 0 1 0 0 0 0 0 1 0 0 0 |
| 262 | 0 0 0 1 0 0 0 1 0 0 1 0 0 1 0 0 0 |
| 263 | 0 0 0 1 0 0 1 0 0 0 0 0 0 1 0 0 0 |
| 264 | 0 0 0 1 0 0 1 0 0 0 1 0 0 1 0 0 0 |
| 265 | 0 0 0 1 0 0 1 0 0 1 0 0 0 1 0 0 0 |
| 266 | 0 0 0 1 0 0 0 0 0 0 0 0 1 0 0 0 0 |
| 267 | 0 0 0 1 0 0 0 0 0 1 0 0 1 0 0 0 0 |
| 268 | 0 0 0 1 0 0 0 0 1 0 0 0 1 0 0 0 0 |
| 269 | 0 0 0 1 0 0 0 1 0 0 0 0 1 0 0 0 0 |
| 270 | 0 0 0 1 0 0 1 0 0 0 0 0 1 0 0 0 0 |
| 271 | 0 0 0 1 0 0 1 0 0 1 0 0 1 0 0 0 0 |
| 272 | 0 0 0 1 0 0 0 0 0 0 0 1 0 0 0 0 0 |
| 273 | 0 0 0 1 0 0 0 0 1 0 0 1 0 0 0 0 0 |
| 274 | 0 0 0 1 0 0 0 1 0 0 0 1 0 0 0 0 0 |
| 275 | 0 0 0 1 0 0 1 0 0 0 0 1 0 0 0 0 0 |
| 276 | 0 0 0 1 0 0 0 0 0 0 1 0 0 0 0 0 0 |
| 277 | 0 0 0 1 0 0 0 1 0 0 1 0 0 0 0 0 0 |
| 278 | 0 0 0 1 0 0 1 0 0 0 1 0 0 0 0 0 0 |
| 279 | 0 0 0 1 0 0 0 0 0 1 0 0 0 0 0 0 0 |
| 280 | 0 0 0 1 0 0 1 0 0 1 0 0 0 0 0 0 0 |

TABLE 44

| NUMBER | 17-BIT CODE |
|---|---|
| 1 | 1 0 0 0 0 0 0 0 0 0 0 1 0 0 1 0 0 |
| 2 | 1 0 0 0 0 0 0 0 0 0 1 0 0 0 1 0 0 |
| 3 | 1 0 0 0 0 0 0 0 0 1 0 0 0 0 1 0 0 |
| 4 | 1 0 0 0 0 0 0 0 1 0 0 0 0 0 1 0 0 |
| 5 | 1 0 0 0 0 0 0 0 1 0 0 1 0 0 1 0 0 |
| 6 | 1 0 0 0 0 0 0 1 0 0 0 0 0 0 1 0 0 |
| 7 | 1 0 0 0 0 0 0 1 0 0 0 1 0 0 1 0 0 |
| 8 | 1 0 0 0 0 0 0 1 0 0 1 0 0 0 1 0 0 |
| 9 | 1 0 0 0 0 0 1 0 0 0 0 0 0 0 1 0 0 |
| 10 | 1 0 0 0 0 0 1 0 0 0 0 1 0 0 1 0 0 |
| 11 | 1 0 0 0 0 0 1 0 0 0 1 0 0 0 1 0 0 |
| 12 | 1 0 0 0 0 0 1 0 0 1 0 0 0 0 1 0 0 |
| 13 | 1 0 0 0 0 1 0 0 0 0 0 0 0 0 1 0 0 |
| 14 | 1 0 0 0 0 1 0 0 0 0 0 1 0 0 1 0 0 |
| 15 | 1 0 0 0 0 1 0 0 0 0 1 0 0 0 1 0 0 |
| 16 | 1 0 0 0 0 1 0 0 0 1 0 0 0 0 1 0 0 |

TABLE 44-continued

| NUMBER | 17-BIT CODE |
|---|---|
| 17 | 1 0 0 0 0 1 0 0 1 0 0 0 0 0 1 0 0 |
| 18 | 1 0 0 0 0 1 0 0 1 0 0 1 0 0 1 0 0 |
| 19 | 1 0 0 0 1 0 0 0 0 0 0 0 0 0 1 0 0 |
| 20 | 1 0 0 0 1 0 0 0 0 0 0 1 0 0 1 0 0 |
| 21 | 1 0 0 0 1 0 0 0 0 0 1 0 0 0 1 0 0 |
| 22 | 1 0 0 0 1 0 0 0 0 1 0 0 0 0 1 0 0 |
| 23 | 1 0 0 0 1 0 0 0 1 0 0 0 0 0 1 0 0 |
| 24 | 1 0 0 0 1 0 0 0 1 0 0 1 0 0 1 0 0 |
| 25 | 1 0 0 0 1 0 0 1 0 0 0 0 0 0 1 0 0 |
| 26 | 1 0 0 0 1 0 0 1 0 0 0 1 0 0 1 0 0 |
| 27 | 1 0 0 0 1 0 0 1 0 0 1 0 0 0 1 0 0 |
| 28 | 1 0 0 1 0 0 0 0 0 0 0 0 0 0 1 0 0 |
| 29 | 1 0 0 1 0 0 0 0 0 0 0 1 0 0 1 0 0 |
| 30 | 1 0 0 1 0 0 0 0 0 0 1 0 0 0 1 0 0 |
| 31 | 1 0 0 1 0 0 0 0 0 1 0 0 0 0 1 0 0 |
| 32 | 1 0 0 1 0 0 0 0 1 0 0 0 0 0 1 0 0 |
| 33 | 1 0 0 1 0 0 0 0 1 0 0 1 0 0 1 0 0 |
| 34 | 1 0 0 1 0 0 0 1 0 0 0 0 0 0 1 0 0 |
| 35 | 1 0 0 1 0 0 0 1 0 0 0 1 0 0 1 0 0 |
| 36 | 1 0 0 1 0 0 0 1 0 0 1 0 0 0 1 0 0 |
| 37 | 1 0 0 1 0 0 1 0 0 0 0 0 0 0 1 0 0 |
| 38 | 1 0 0 1 0 0 1 0 0 0 0 1 0 0 1 0 0 |
| 39 | 1 0 0 1 0 0 1 0 0 0 1 0 0 0 1 0 0 |
| 40 | 1 0 0 1 0 0 1 0 0 1 0 0 0 0 1 0 0 |
| 41 | 1 0 0 0 0 0 0 0 0 0 1 0 0 1 0 0 0 |
| 42 | 1 0 0 0 0 0 0 0 0 1 0 0 0 1 0 0 0 |
| 43 | 1 0 0 0 0 0 0 0 1 0 0 0 0 1 0 0 0 |
| 44 | 1 0 0 0 0 0 0 1 0 0 0 0 0 1 0 0 0 |
| 45 | 1 0 0 0 0 0 0 1 0 0 1 0 0 1 0 0 0 |
| 46 | 1 0 0 0 0 0 1 0 0 0 0 0 0 1 0 0 0 |
| 47 | 1 0 0 0 0 0 1 0 0 0 1 0 0 1 0 0 0 |
| 48 | 1 0 0 0 0 0 1 0 0 1 0 0 0 1 0 0 0 |
| 49 | 1 0 0 0 0 1 0 0 0 0 0 0 0 1 0 0 0 |
| 50 | 1 0 0 0 0 1 0 0 0 0 1 0 0 1 0 0 0 |
| 51 | 1 0 0 0 0 1 0 0 0 1 0 0 0 1 0 0 0 |
| 52 | 1 0 0 0 0 1 0 0 1 0 0 0 0 1 0 0 0 |
| 53 | 1 0 0 0 1 0 0 0 0 0 0 0 0 1 0 0 0 |
| 54 | 1 0 0 0 1 0 0 0 0 0 1 0 0 1 0 0 0 |
| 55 | 1 0 0 0 1 0 0 0 0 1 0 0 0 1 0 0 0 |
| 56 | 1 0 0 0 1 0 0 0 1 0 0 0 0 1 0 0 0 |
| 57 | 1 0 0 0 1 0 0 1 0 0 0 0 0 1 0 0 0 |
| 58 | 1 0 0 0 1 0 0 1 0 0 1 0 0 1 0 0 0 |
| 59 | 1 0 0 1 0 0 0 0 0 0 0 0 0 1 0 0 0 |
| 60 | 1 0 0 1 0 0 0 0 0 0 1 0 0 1 0 0 0 |
| 61 | 1 0 0 1 0 0 0 0 0 1 0 0 0 1 0 0 0 |
| 62 | 1 0 0 1 0 0 0 0 1 0 0 0 0 1 0 0 0 |
| 63 | 1 0 0 1 0 0 0 1 0 0 0 0 0 1 0 0 0 |
| 64 | 1 0 0 1 0 0 0 1 0 0 1 0 0 1 0 0 0 |
| 65 | 1 0 0 1 0 0 1 0 0 0 0 0 0 1 0 0 0 |
| 66 | 1 0 0 1 0 0 1 0 0 0 1 0 0 1 0 0 0 |
| 67 | 1 0 0 1 0 0 1 0 0 1 0 0 0 1 0 0 0 |
| 68 | 1 0 0 0 0 0 0 0 0 1 0 0 1 0 0 0 0 |
| 69 | 1 0 0 0 0 0 0 0 1 0 0 0 1 0 0 0 0 |
| 70 | 1 0 0 0 0 0 0 1 0 0 0 0 1 0 0 0 0 |
| 71 | 1 0 0 0 0 0 1 0 0 0 0 0 1 0 0 0 0 |
| 72 | 1 0 0 0 0 0 1 0 0 1 0 0 1 0 0 0 0 |
| 73 | 1 0 0 0 0 1 0 0 0 0 0 0 1 0 0 0 0 |
| 74 | 1 0 0 0 0 1 0 0 0 1 0 0 1 0 0 0 0 |
| 75 | 1 0 0 0 0 1 0 0 1 0 0 0 1 0 0 0 0 |
| 76 | 1 0 0 0 1 0 0 0 0 0 0 0 1 0 0 0 0 |
| 77 | 1 0 0 0 1 0 0 0 0 1 0 0 1 0 0 0 0 |
| 78 | 1 0 0 0 1 0 0 0 1 0 0 0 1 0 0 0 0 |
| 79 | 1 0 0 0 1 0 0 1 0 0 0 0 1 0 0 0 0 |
| 80 | 1 0 0 1 0 0 0 0 0 0 0 0 1 0 0 0 0 |
| 81 | 1 0 0 1 0 0 0 0 0 1 0 0 1 0 0 0 0 |
| 82 | 1 0 0 1 0 0 0 0 1 0 0 0 1 0 0 0 0 |
| 83 | 1 0 0 1 0 0 0 1 0 0 0 0 1 0 0 0 0 |
| 84 | 1 0 0 1 0 0 1 0 0 0 0 0 1 0 0 0 0 |
| 85 | 1 0 0 1 0 0 1 0 0 1 0 0 1 0 0 0 0 |
| 86 | 1 0 0 0 0 0 0 0 0 0 0 1 0 0 0 0 0 |
| 87 | 1 0 0 0 0 0 0 0 1 0 0 1 0 0 0 0 0 |
| 88 | 1 0 0 0 0 0 0 1 0 0 0 1 0 0 0 0 0 |
| 89 | 1 0 0 0 0 0 1 0 0 0 0 1 0 0 0 0 0 |
| 90 | 1 0 0 0 0 1 0 0 0 0 0 1 0 0 0 0 0 |
| 91 | 1 0 0 0 0 1 0 0 1 0 0 1 0 0 0 0 0 |
| 92 | 1 0 0 0 1 0 0 0 0 0 0 1 0 0 0 0 0 |
| 93 | 1 0 0 0 1 0 0 0 1 0 0 1 0 0 0 0 0 |
| 94 | 1 0 0 0 1 0 0 1 0 0 0 1 0 0 0 0 0 |
| 95 | 1 0 0 1 0 0 0 0 0 0 0 1 0 0 0 0 0 |
| 96 | 1 0 0 1 0 0 0 0 1 0 0 1 0 0 0 0 0 |
| 97 | 1 0 0 1 0 0 0 1 0 0 0 1 0 0 0 0 0 |
| 98 | 1 0 0 1 0 0 1 0 0 0 0 1 0 0 0 0 0 |
| 99 | 1 0 0 0 0 0 0 0 0 0 1 0 0 0 0 0 0 |
| 100 | 1 0 0 0 0 0 0 1 0 0 1 0 0 0 0 0 0 |
| 101 | 1 0 0 0 0 0 1 0 0 0 1 0 0 0 0 0 0 |
| 102 | 1 0 0 0 0 1 0 0 0 0 1 0 0 0 0 0 0 |
| 103 | 1 0 0 0 1 0 0 0 0 0 1 0 0 0 0 0 0 |
| 104 | 1 0 0 0 1 0 0 1 0 0 1 0 0 0 0 0 0 |
| 105 | 1 0 0 1 0 0 0 0 0 0 1 0 0 0 0 0 0 |
| 106 | 1 0 0 1 0 0 0 1 0 0 1 0 0 0 0 0 0 |
| 107 | 1 0 0 1 0 0 1 0 0 0 1 0 0 0 0 0 0 |
| 108 | 0 1 0 0 0 0 0 0 0 0 0 1 0 0 1 0 0 |
| 109 | 0 1 0 0 0 0 0 0 0 0 1 0 0 0 1 0 0 |
| 110 | 0 1 0 0 0 0 0 0 0 1 0 0 0 0 1 0 0 |
| 111 | 0 1 0 0 0 0 0 0 1 0 0 0 0 0 1 0 0 |
| 112 | 0 1 0 0 0 0 0 0 1 0 0 1 0 0 1 0 0 |
| 113 | 0 1 0 0 0 0 0 1 0 0 0 0 0 0 1 0 0 |
| 114 | 0 1 0 0 0 0 0 1 0 0 0 1 0 0 1 0 0 |
| 115 | 0 1 0 0 0 0 0 1 0 0 1 0 0 0 1 0 0 |
| 116 | 0 1 0 0 0 0 1 0 0 0 0 0 0 0 1 0 0 |
| 117 | 0 1 0 0 0 0 1 0 0 0 0 1 0 0 1 0 0 |
| 118 | 0 1 0 0 0 0 1 0 0 0 1 0 0 0 1 0 0 |
| 119 | 0 1 0 0 0 0 1 0 0 1 0 0 0 0 1 0 0 |
| 120 | 0 1 0 0 0 1 0 0 0 0 0 0 0 0 1 0 0 |
| 121 | 0 1 0 0 0 1 0 0 0 0 0 1 0 0 1 0 0 |
| 122 | 0 1 0 0 0 1 0 0 0 0 1 0 0 0 1 0 0 |
| 123 | 0 1 0 0 0 1 0 0 0 1 0 0 0 0 1 0 0 |
| 124 | 0 1 0 0 0 1 0 0 1 0 0 0 0 0 1 0 0 |
| 125 | 0 1 0 0 0 1 0 0 1 0 0 1 0 0 1 0 0 |
| 126 | 0 1 0 0 1 0 0 0 0 0 0 0 0 0 1 0 0 |
| 127 | 0 1 0 0 1 0 0 0 0 0 0 1 0 0 1 0 0 |
| 128 | 0 1 0 0 1 0 0 0 0 0 1 0 0 0 1 0 0 |
| 129 | 0 1 0 0 1 0 0 0 0 1 0 0 0 0 1 0 0 |
| 130 | 0 1 0 0 1 0 0 0 1 0 0 0 0 0 1 0 0 |
| 131 | 0 1 0 0 1 0 0 0 1 0 0 1 0 0 1 0 0 |
| 132 | 0 1 0 0 1 0 0 1 0 0 0 0 0 0 1 0 0 |
| 133 | 0 1 0 0 1 0 0 1 0 0 0 1 0 0 1 0 0 |
| 134 | 0 1 0 0 1 0 0 1 0 0 1 0 0 0 1 0 0 |
| 135 | 0 1 0 0 0 0 0 0 0 0 1 0 0 1 0 0 0 |
| 136 | 0 1 0 0 0 0 0 0 0 1 0 0 0 1 0 0 0 |
| 137 | 0 1 0 0 0 0 0 0 1 0 0 0 0 1 0 0 0 |
| 138 | 0 1 0 0 0 0 0 1 0 0 0 0 0 1 0 0 0 |
| 139 | 0 1 0 0 0 0 0 1 0 0 1 0 0 1 0 0 0 |
| 140 | 0 1 0 0 0 0 1 0 0 0 0 0 0 1 0 0 0 |
| 141 | 0 1 0 0 0 0 1 0 0 0 1 0 0 1 0 0 0 |
| 142 | 0 1 0 0 0 0 1 0 0 1 0 0 0 1 0 0 0 |
| 143 | 0 1 0 0 0 1 0 0 0 0 0 0 0 1 0 0 0 |
| 144 | 0 1 0 0 0 1 0 0 0 0 1 0 0 1 0 0 0 |
| 145 | 0 1 0 0 0 1 0 0 0 1 0 0 0 1 0 0 0 |
| 146 | 0 1 0 0 0 1 0 0 1 0 0 0 0 1 0 0 0 |
| 147 | 0 1 0 0 1 0 0 0 0 0 0 0 0 1 0 0 0 |
| 148 | 0 1 0 0 1 0 0 0 0 0 1 0 0 1 0 0 0 |
| 149 | 0 1 0 0 1 0 0 0 0 1 0 0 0 1 0 0 0 |
| 150 | 0 1 0 0 1 0 0 0 1 0 0 0 0 1 0 0 0 |
| 151 | 0 1 0 0 1 0 0 1 0 0 0 0 0 1 0 0 0 |
| 152 | 0 1 0 0 1 0 0 1 0 0 1 0 0 1 0 0 0 |
| 153 | 0 1 0 0 0 0 0 0 0 0 0 0 1 0 0 0 0 |
| 154 | 0 1 0 0 0 0 0 0 0 1 0 0 1 0 0 0 0 |
| 155 | 0 1 0 0 0 0 0 0 1 0 0 0 1 0 0 0 0 |
| 156 | 0 1 0 0 0 0 0 1 0 0 0 0 1 0 0 0 0 |
| 157 | 0 1 0 0 0 0 1 0 0 0 0 0 1 0 0 0 0 |
| 158 | 0 1 0 0 0 0 1 0 0 1 0 0 1 0 0 0 0 |
| 159 | 0 1 0 0 0 1 0 0 0 0 0 0 1 0 0 0 0 |
| 160 | 0 1 0 0 0 1 0 0 0 1 0 0 1 0 0 0 0 |
| 161 | 0 1 0 0 0 1 0 0 1 0 0 0 1 0 0 0 0 |
| 162 | 0 1 0 0 1 0 0 0 0 0 0 0 1 0 0 0 0 |
| 163 | 0 1 0 0 1 0 0 0 0 1 0 0 1 0 0 0 0 |
| 164 | 0 1 0 0 1 0 0 0 1 0 0 0 1 0 0 0 0 |
| 165 | 0 1 0 0 1 0 0 1 0 0 0 0 1 0 0 0 0 |
| 166 | 0 1 0 0 0 0 0 0 0 0 0 1 0 0 0 0 0 |
| 167 | 0 1 0 0 0 0 0 0 1 0 0 1 0 0 0 0 0 |
| 168 | 0 1 0 0 0 0 0 1 0 0 0 1 0 0 0 0 0 |
| 169 | 0 1 0 0 0 0 1 0 0 0 0 1 0 0 0 0 0 |
| 170 | 0 1 0 0 0 1 0 0 0 0 0 1 0 0 0 0 0 |
| 171 | 0 1 0 0 0 1 0 0 1 0 0 1 0 0 0 0 0 |
| 172 | 0 1 0 0 1 0 0 0 0 0 0 1 0 0 0 0 0 |
| 173 | 0 1 0 0 1 0 0 0 1 0 0 1 0 0 0 0 0 |
| 174 | 0 1 0 0 1 0 0 1 0 0 0 1 0 0 0 0 0 |
| 175 | 0 1 0 0 0 0 0 0 0 0 1 0 0 0 0 0 0 |
| 176 | 0 1 0 0 0 0 0 1 0 0 1 0 0 0 0 0 0 |
| 177 | 0 1 0 0 0 0 1 0 0 0 1 0 0 0 0 0 0 |
| 178 | 0 1 0 0 0 1 0 0 0 0 1 0 0 0 0 0 0 |

TABLE 44-continued

| NUMBER | 17-BIT CODE |
|---|---|
| 179 | 0 1 0 0 1 0 0 0 0 0 1 0 0 0 0 0 0 |
| 180 | 0 1 0 0 1 0 0 1 0 0 1 0 0 0 0 0 0 |
| 181 | 0 0 1 0 0 0 0 0 0 0 0 1 0 0 1 0 0 |
| 182 | 0 0 1 0 0 0 0 0 0 0 1 0 0 0 1 0 0 |
| 183 | 0 0 1 0 0 0 0 0 0 1 0 0 0 0 1 0 0 |
| 184 | 0 0 1 0 0 0 0 0 1 0 0 0 0 0 1 0 0 |
| 185 | 0 0 1 0 0 0 0 0 1 0 0 1 0 0 1 0 0 |
| 186 | 0 0 1 0 0 0 0 1 0 0 0 0 0 0 1 0 0 |
| 187 | 0 0 1 0 0 0 0 1 0 0 0 1 0 0 1 0 0 |
| 188 | 0 0 1 0 0 0 0 1 0 0 1 0 0 0 1 0 0 |
| 189 | 0 0 1 0 0 0 1 0 0 0 0 0 0 0 1 0 0 |
| 190 | 0 0 1 0 0 0 1 0 0 0 0 1 0 0 1 0 0 |
| 191 | 0 0 1 0 0 0 1 0 0 0 1 0 0 0 1 0 0 |
| 192 | 0 0 1 0 0 0 1 0 0 1 0 0 0 0 1 0 0 |
| 193 | 0 0 1 0 0 1 0 0 0 0 0 0 0 0 1 0 0 |
| 194 | 0 0 1 0 0 1 0 0 0 0 0 1 0 0 1 0 0 |
| 195 | 0 0 1 0 0 1 0 0 0 0 1 0 0 0 1 0 0 |
| 196 | 0 0 1 0 0 1 0 0 0 1 0 0 0 0 1 0 0 |
| 197 | 0 0 1 0 0 1 0 0 1 0 0 0 0 0 1 0 0 |
| 198 | 0 0 1 0 0 1 0 0 1 0 0 1 0 0 1 0 0 |
| 199 | 0 0 1 0 0 0 0 0 0 0 0 0 0 1 0 0 0 |
| 200 | 0 0 1 0 0 0 0 0 0 0 1 0 0 1 0 0 0 |
| 201 | 0 0 1 0 0 0 0 0 0 1 0 0 0 1 0 0 0 |
| 202 | 0 0 1 0 0 0 0 0 1 0 0 0 0 1 0 0 0 |
| 203 | 0 0 1 0 0 0 0 1 0 0 0 0 0 1 0 0 0 |
| 204 | 0 0 1 0 0 0 0 1 0 0 1 0 0 1 0 0 0 |
| 205 | 0 0 1 0 0 0 1 0 0 0 0 0 0 1 0 0 0 |
| 206 | 0 0 1 0 0 0 1 0 0 0 1 0 0 1 0 0 0 |
| 207 | 0 0 1 0 0 0 1 0 0 1 0 0 0 1 0 0 0 |
| 208 | 0 0 1 0 0 1 0 0 0 0 0 0 0 1 0 0 0 |
| 209 | 0 0 1 0 0 1 0 0 0 0 1 0 0 1 0 0 0 |
| 210 | 0 0 1 0 0 1 0 0 0 1 0 0 0 1 0 0 0 |
| 211 | 0 0 1 0 0 1 0 0 1 0 0 0 0 1 0 0 0 |
| 212 | 0 0 1 0 0 0 0 0 0 0 0 0 1 0 0 0 0 |
| 213 | 0 0 1 0 0 0 0 0 0 1 0 0 1 0 0 0 0 |
| 214 | 0 0 1 0 0 0 0 0 1 0 0 0 1 0 0 0 0 |
| 215 | 0 0 1 0 0 0 0 1 0 0 0 0 1 0 0 0 0 |
| 216 | 0 0 1 0 0 0 1 0 0 0 0 0 1 0 0 0 0 |
| 217 | 0 0 1 0 0 0 1 0 0 1 0 0 1 0 0 0 0 |
| 218 | 0 0 1 0 0 1 0 0 0 0 0 0 1 0 0 0 0 |
| 219 | 0 0 1 0 0 1 0 0 0 1 0 0 1 0 0 0 0 |
| 220 | 0 0 1 0 0 1 0 0 1 0 0 0 1 0 0 0 0 |
| 221 | 0 0 1 0 0 0 0 0 0 0 0 1 0 0 0 0 0 |
| 222 | 0 0 1 0 0 0 0 0 1 0 0 1 0 0 0 0 0 |
| 223 | 0 0 1 0 0 0 0 1 0 0 0 1 0 0 0 0 0 |
| 224 | 0 0 1 0 0 0 1 0 0 0 0 1 0 0 0 0 0 |
| 225 | 0 0 1 0 0 1 0 0 0 0 0 1 0 0 0 0 0 |
| 226 | 0 0 1 0 0 1 0 0 1 0 0 1 0 0 0 0 0 |
| 227 | 0 0 1 0 0 0 0 0 0 0 1 0 0 0 0 0 0 |
| 228 | 0 0 1 0 0 0 0 1 0 0 1 0 0 0 0 0 0 |
| 229 | 0 0 1 0 0 0 1 0 0 0 1 0 0 0 0 0 0 |
| 230 | 0 0 1 0 0 1 0 0 0 0 1 0 0 0 0 0 0 |
| 231 | 0 0 0 1 0 0 0 0 0 0 0 0 0 0 1 0 0 |
| 232 | 0 0 0 1 0 0 0 0 0 0 0 1 0 0 1 0 0 |
| 233 | 0 0 0 1 0 0 0 0 0 0 1 0 0 0 1 0 0 |
| 234 | 0 0 0 1 0 0 0 0 0 1 0 0 0 0 1 0 0 |
| 235 | 0 0 0 1 0 0 0 0 1 0 0 0 0 0 1 0 0 |
| 236 | 0 0 0 1 0 0 0 0 1 0 0 1 0 0 1 0 0 |
| 237 | 0 0 0 1 0 0 0 1 0 0 0 0 0 0 1 0 0 |
| 238 | 0 0 0 1 0 0 0 1 0 0 0 1 0 0 1 0 0 |
| 239 | 0 0 0 1 0 0 0 1 0 0 1 0 0 0 1 0 0 |
| 240 | 0 0 1 0 0 1 0 0 0 0 0 0 0 0 1 0 0 |
| 241 | 0 0 0 1 0 0 1 0 0 0 0 1 0 0 1 0 0 |
| 242 | 0 0 0 1 0 0 1 0 0 0 1 0 0 0 1 0 0 |
| 243 | 0 0 0 1 0 0 1 0 0 1 0 0 0 0 1 0 0 |
| 244 | 0 0 0 1 0 0 0 0 0 0 0 0 0 1 0 0 0 |
| 245 | 0 0 0 1 0 0 0 0 0 0 1 0 0 1 0 0 0 |
| 246 | 0 0 0 1 0 0 0 0 0 1 0 0 0 1 0 0 0 |
| 247 | 0 0 0 1 0 0 0 0 1 0 0 0 0 1 0 0 0 |
| 248 | 0 0 0 1 0 0 0 1 0 0 0 0 0 1 0 0 0 |
| 249 | 0 0 0 1 0 0 0 1 0 0 1 0 0 1 0 0 0 |
| 250 | 0 0 0 1 0 0 1 0 0 0 0 0 0 1 0 0 0 |
| 251 | 0 0 0 1 0 0 1 0 0 0 1 0 0 1 0 0 0 |
| 252 | 0 0 0 1 0 0 1 0 0 1 0 0 0 1 0 0 0 |
| 253 | 0 0 0 1 0 0 0 0 0 0 0 0 1 0 0 0 0 |
| 254 | 0 0 0 1 0 0 0 0 0 1 0 0 1 0 0 0 0 |
| 255 | 0 0 0 1 0 0 0 0 1 0 0 0 1 0 0 0 0 |
| 256 | 0 0 0 1 0 0 0 1 0 0 0 0 1 0 0 0 0 |
| 257 | 0 0 0 1 0 0 1 0 0 0 0 0 1 0 0 0 0 |
| 258 | 0 0 0 1 0 0 1 0 0 1 0 0 1 0 0 0 0 |
| 259 | 0 0 0 1 0 0 0 0 0 0 0 1 0 0 0 0 0 |
| 260 | 0 0 0 1 0 0 0 0 1 0 0 1 0 0 0 0 0 |
| 261 | 0 0 0 1 0 0 0 1 0 0 0 1 0 0 0 0 0 |
| 262 | 0 0 0 1 0 0 1 0 0 0 0 1 0 0 0 0 0 |
| 263 | 0 0 0 1 0 0 0 0 0 0 1 0 0 0 0 0 0 |
| 264 | 0 0 0 1 0 0 0 1 0 0 1 0 0 0 0 0 0 |
| 265 | 0 0 0 1 0 0 1 0 0 0 1 0 0 0 0 0 0 |
| 266 | 0 0 0 0 1 0 0 0 0 0 0 0 0 0 1 0 0 |
| 267 | 0 0 0 0 1 0 0 0 0 0 0 1 0 0 1 0 0 |
| 268 | 0 0 0 0 1 0 0 0 0 0 1 0 0 0 1 0 0 |
| 269 | 0 0 0 0 1 0 0 0 0 1 0 0 0 0 1 0 0 |
| 270 | 0 0 0 0 1 0 0 0 1 0 0 0 0 0 1 0 0 |
| 271 | 0 0 0 0 1 0 0 0 1 0 0 1 0 0 1 0 0 |
| 272 | 0 0 0 0 1 0 0 1 0 0 0 0 0 0 1 0 0 |
| 273 | 0 0 0 0 1 0 0 1 0 0 0 1 0 0 1 0 0 |
| 274 | 0 0 0 0 1 0 0 1 0 0 1 0 0 0 1 0 0 |
| 275 | 0 0 0 0 1 0 0 0 0 0 0 0 0 1 0 0 0 |
| 276 | 0 0 0 0 1 0 0 0 0 0 1 0 0 1 0 0 0 |
| 277 | 0 0 0 0 1 0 0 0 0 1 0 0 0 1 0 0 0 |
| 278 | 0 0 0 0 1 0 0 0 1 0 0 0 0 1 0 0 0 |
| 279 | 0 0 0 0 1 0 0 1 0 0 0 0 0 1 0 0 0 |
| 280 | 0 0 0 0 1 0 0 1 0 0 1 0 0 1 0 0 0 |
| 281 | 0 0 0 0 1 0 0 0 0 0 0 0 1 0 0 0 0 |
| 282 | 0 0 0 0 1 0 0 0 0 1 0 0 1 0 0 0 0 |
| 283 | 0 0 0 0 1 0 0 0 1 0 0 0 1 0 0 0 0 |
| 284 | 0 0 0 0 1 0 0 1 0 0 0 0 1 0 0 0 0 |
| 285 | 0 0 0 0 1 0 0 0 0 0 0 1 0 0 0 0 0 |
| 286 | 0 0 0 0 1 0 0 0 1 0 0 1 0 0 0 0 0 |
| 287 | 0 0 0 0 1 0 0 1 0 0 0 1 0 0 0 0 0 |
| 288 | 0 0 0 0 1 0 0 0 0 0 1 0 0 0 0 0 0 |
| 289 | 0 0 0 0 1 0 0 1 0 0 1 0 0 0 0 0 0 |

TABLE 45

| NUMBER | 17-BIT CODE |
|---|---|
| 1 | 0 1 0 0 0 0 0 0 0 0 0 0 1 0 0 1 0 |
| 2 | 0 1 0 0 0 0 0 0 0 0 0 1 0 0 0 1 0 |
| 3 | 0 1 0 0 0 0 0 0 0 0 1 0 0 0 0 1 0 |
| 4 | 0 1 0 0 0 0 0 0 0 1 0 0 0 0 0 1 0 |
| 5 | 0 1 0 0 0 0 0 0 0 1 0 0 1 0 0 1 0 |
| 6 | 0 1 0 0 0 0 0 0 1 0 0 0 0 0 0 1 0 |
| 7 | 0 1 0 0 0 0 0 0 1 0 0 0 1 0 0 1 0 |
| 8 | 0 1 0 0 0 0 0 0 1 0 0 1 0 0 0 1 0 |
| 9 | 0 1 0 0 0 0 0 1 0 0 0 0 0 0 0 1 0 |
| 10 | 0 1 0 0 0 0 0 1 0 0 0 0 1 0 0 1 0 |
| 11 | 0 1 0 0 0 0 0 1 0 0 0 1 0 0 0 1 0 |
| 12 | 0 1 0 0 0 0 0 1 0 0 1 0 0 0 0 1 0 |
| 13 | 0 1 0 0 0 0 1 0 0 0 0 0 0 0 0 1 0 |
| 14 | 0 1 0 0 0 0 1 0 0 0 0 0 1 0 0 1 0 |
| 15 | 0 1 0 0 0 0 1 0 0 0 0 1 0 0 0 1 0 |
| 16 | 0 1 0 0 0 0 1 0 0 0 1 0 0 0 0 1 0 |
| 17 | 0 1 0 0 0 0 1 0 0 1 0 0 0 0 0 1 0 |
| 18 | 0 1 0 0 0 0 1 0 0 1 0 0 1 0 0 1 0 |
| 19 | 0 1 0 0 0 1 0 0 0 0 0 0 0 0 0 1 0 |
| 20 | 0 1 0 0 0 1 0 0 0 0 0 0 1 0 0 1 0 |
| 21 | 0 1 0 0 0 1 0 0 0 0 0 1 0 0 0 1 0 |
| 22 | 0 1 0 0 0 1 0 0 0 0 1 0 0 0 0 1 0 |
| 23 | 0 1 0 0 0 1 0 0 0 1 0 0 0 0 0 1 0 |
| 24 | 0 1 0 0 0 1 0 0 0 1 0 0 1 0 0 1 0 |
| 25 | 0 1 0 0 0 1 0 0 1 0 0 0 0 0 0 1 0 |
| 26 | 0 1 0 0 0 1 0 0 1 0 0 0 1 0 0 1 0 |
| 27 | 0 1 0 0 0 1 0 0 1 0 0 1 0 0 0 1 0 |
| 28 | 0 1 0 0 1 0 0 0 0 0 0 0 0 0 0 1 0 |
| 29 | 0 1 0 0 1 0 0 0 0 0 0 0 1 0 0 1 0 |
| 30 | 0 1 0 0 1 0 0 0 0 0 0 1 0 0 0 1 0 |
| 31 | 0 1 0 0 1 0 0 0 0 0 1 0 0 0 0 1 0 |
| 32 | 0 1 0 0 1 0 0 0 0 1 0 0 0 0 0 1 0 |
| 33 | 0 1 0 0 1 0 0 0 0 1 0 0 1 0 0 1 0 |
| 34 | 0 1 0 0 1 0 0 0 1 0 0 0 0 0 0 1 0 |
| 35 | 0 1 0 0 1 0 0 0 1 0 0 0 1 0 0 1 0 |
| 36 | 0 1 0 0 1 0 0 0 1 0 0 1 0 0 0 1 0 |
| 37 | 0 1 0 0 1 0 0 1 0 0 0 0 0 0 0 1 0 |
| 38 | 0 1 0 0 1 0 0 1 0 0 0 0 1 0 0 1 0 |
| 39 | 0 1 0 0 1 0 0 1 0 0 0 1 0 0 0 1 0 |
| 40 | 0 1 0 0 1 0 0 1 0 0 1 0 0 0 0 1 0 |
| 41 | 0 1 0 0 0 0 0 0 0 0 0 1 0 0 1 0 0 |
| 42 | 0 1 0 0 0 0 0 0 0 0 1 0 0 0 1 0 0 |
| 43 | 0 1 0 0 0 0 0 0 0 1 0 0 0 0 1 0 0 |
| 44 | 0 1 0 0 0 0 0 0 1 0 0 0 0 0 1 0 0 |
| 45 | 0 1 0 0 0 0 0 0 1 0 0 1 0 0 1 0 0 |

TABLE 45-continued

| NUMBER | 17-BIT CODE |
|---|---|
| 46 | 0 1 0 0 0 0 0 1 0 0 0 0 0 0 1 0 0 |
| 47 | 0 1 0 0 0 0 0 1 0 0 0 1 0 0 1 0 0 |
| 48 | 0 1 0 0 0 0 0 1 0 0 1 0 0 0 1 0 0 |
| 49 | 0 1 0 0 0 0 1 0 0 0 0 0 0 0 1 0 0 |
| 50 | 0 1 0 0 0 0 1 0 0 0 0 1 0 0 1 0 0 |
| 51 | 0 1 0 0 0 0 1 0 0 0 1 0 0 0 1 0 0 |
| 52 | 0 1 0 0 0 0 1 0 0 1 0 0 0 0 1 0 0 |
| 53 | 0 1 0 0 0 1 0 0 0 0 0 0 0 0 1 0 0 |
| 54 | 0 1 0 0 0 1 0 0 0 0 0 1 0 0 1 0 0 |
| 55 | 0 1 0 0 0 1 0 0 0 0 1 0 0 0 1 0 0 |
| 56 | 0 1 0 0 0 1 0 0 0 1 0 0 0 0 1 0 0 |
| 57 | 0 1 0 0 0 1 0 0 1 0 0 0 0 0 1 0 0 |
| 58 | 0 1 0 0 0 1 0 0 1 0 0 1 0 0 1 0 0 |
| 59 | 0 1 0 0 1 0 0 0 0 0 0 0 0 0 1 0 0 |
| 60 | 0 1 0 0 1 0 0 0 0 0 0 1 0 0 1 0 0 |
| 61 | 0 1 0 0 1 0 0 0 0 0 1 0 0 0 1 0 0 |
| 62 | 0 1 0 0 1 0 0 0 0 1 0 0 0 0 1 0 0 |
| 63 | 0 1 0 0 1 0 0 0 1 0 0 0 0 0 1 0 0 |
| 64 | 0 1 0 0 1 0 0 0 1 0 0 1 0 0 1 0 0 |
| 65 | 0 1 0 0 1 0 0 1 0 0 0 0 0 0 1 0 0 |
| 66 | 0 1 0 0 1 0 0 1 0 0 0 1 0 0 1 0 0 |
| 67 | 0 1 0 0 1 0 0 1 0 0 1 0 0 0 1 0 0 |
| 68 | 0 1 0 0 0 0 0 0 0 0 1 0 0 1 0 0 0 |
| 69 | 0 1 0 0 0 0 0 0 0 1 0 0 0 1 0 0 0 |
| 70 | 0 1 0 0 0 0 0 0 1 0 0 0 0 1 0 0 0 |
| 71 | 0 1 0 0 0 0 0 1 0 0 0 0 0 1 0 0 0 |
| 72 | 0 1 0 0 0 0 0 1 0 0 1 0 0 1 0 0 0 |
| 73 | 0 1 0 0 0 0 1 0 0 0 0 0 0 1 0 0 0 |
| 74 | 0 1 0 0 0 0 1 0 0 0 1 0 0 1 0 0 0 |
| 75 | 0 1 0 0 0 0 1 0 0 1 0 0 0 1 0 0 0 |
| 76 | 0 1 0 0 0 1 0 0 0 0 0 0 0 1 0 0 0 |
| 77 | 0 1 0 0 0 1 0 0 0 0 1 0 0 1 0 0 0 |
| 78 | 0 1 0 0 0 1 0 0 0 1 0 0 0 1 0 0 0 |
| 79 | 0 1 0 0 0 1 0 0 1 0 0 0 0 1 0 0 0 |
| 80 | 0 1 0 0 1 0 0 0 0 0 0 0 0 1 0 0 0 |
| 81 | 0 1 0 0 1 0 0 0 0 0 1 0 0 1 0 0 0 |
| 82 | 0 1 0 0 1 0 0 0 0 1 0 0 0 1 0 0 0 |
| 83 | 0 1 0 0 1 0 0 0 1 0 0 0 0 1 0 0 0 |
| 84 | 0 1 0 0 1 0 0 1 0 0 0 0 0 1 0 0 0 |
| 85 | 0 1 0 0 1 0 0 1 0 0 1 0 0 1 0 0 0 |
| 86 | 0 1 0 0 0 0 0 0 0 0 0 0 1 0 0 0 0 |
| 87 | 0 1 0 0 0 0 0 0 0 1 0 0 1 0 0 0 0 |
| 88 | 0 1 0 0 0 0 0 0 1 0 0 0 1 0 0 0 0 |
| 89 | 0 1 0 0 0 0 0 1 0 0 0 0 1 0 0 0 0 |
| 90 | 0 1 0 0 0 0 1 0 0 0 0 0 1 0 0 0 0 |
| 91 | 0 1 0 0 0 0 1 0 0 1 0 0 1 0 0 0 0 |
| 92 | 0 1 0 0 0 1 0 0 0 0 0 0 1 0 0 0 0 |
| 93 | 0 1 0 0 0 1 0 0 0 1 0 0 1 0 0 0 0 |
| 94 | 0 1 0 0 0 1 0 0 1 0 0 0 1 0 0 0 0 |
| 95 | 0 1 0 0 1 0 0 0 0 0 0 0 1 0 0 0 0 |
| 96 | 0 1 0 0 1 0 0 0 0 1 0 0 1 0 0 0 0 |
| 97 | 0 1 0 0 1 0 0 0 1 0 0 0 1 0 0 0 0 |
| 98 | 0 1 0 0 1 0 0 1 0 0 0 0 1 0 0 0 0 |
| 99 | 0 1 0 0 0 0 0 0 0 0 0 1 0 0 0 0 0 |
| 100 | 0 1 0 0 0 0 0 0 1 0 0 1 0 0 0 0 0 |
| 101 | 0 1 0 0 0 0 0 1 0 0 0 1 0 0 0 0 0 |
| 102 | 0 1 0 0 0 0 1 0 0 0 0 1 0 0 0 0 0 |
| 103 | 0 1 0 0 0 1 0 0 0 0 0 1 0 0 0 0 0 |
| 104 | 0 1 0 0 0 1 0 0 1 0 0 1 0 0 0 0 0 |
| 105 | 0 1 0 0 1 0 0 0 0 0 0 1 0 0 0 0 0 |
| 106 | 0 1 0 0 1 0 0 0 1 0 0 1 0 0 0 0 0 |
| 107 | 0 1 0 0 1 0 0 1 0 0 0 1 0 0 0 0 0 |
| 108 | 0 1 0 0 0 0 0 0 0 0 1 0 0 0 0 0 0 |
| 109 | 0 1 0 0 0 0 0 1 0 0 1 0 0 0 0 0 0 |
| 110 | 0 1 0 0 0 0 1 0 0 0 1 0 0 0 0 0 0 |
| 111 | 0 1 0 0 0 1 0 0 0 0 1 0 0 0 0 0 0 |
| 112 | 0 1 0 0 1 0 0 0 0 0 1 0 0 0 0 0 0 |
| 113 | 0 1 0 0 1 0 0 1 0 0 1 0 0 0 0 0 0 |
| 114 | 0 0 1 0 0 0 0 0 0 0 0 0 1 0 0 1 0 |
| 115 | 0 0 1 0 0 0 0 0 0 0 0 1 0 0 0 1 0 |
| 116 | 0 0 1 0 0 0 0 0 0 0 1 0 0 0 0 1 0 |
| 117 | 0 0 1 0 0 0 0 0 0 1 0 0 0 0 0 1 0 |
| 118 | 0 0 1 0 0 0 0 0 0 1 0 0 1 0 0 1 0 |
| 119 | 0 0 1 0 0 0 0 0 1 0 0 0 0 0 0 1 0 |
| 120 | 0 0 1 0 0 0 0 0 1 0 0 0 1 0 0 1 0 |
| 121 | 0 0 1 0 0 0 0 0 1 0 0 1 0 0 0 1 0 |
| 122 | 0 0 1 0 0 0 0 1 0 0 0 0 0 0 0 1 0 |
| 123 | 0 0 1 0 0 0 0 1 0 0 0 0 1 0 0 1 0 |
| 124 | 0 0 1 0 0 0 0 1 0 0 0 1 0 0 0 1 0 |
| 125 | 0 0 1 0 0 0 0 1 0 0 1 0 0 0 0 1 0 |
| 126 | 0 0 1 0 0 0 1 0 0 0 0 0 0 0 0 1 0 |

TABLE 45-continued

| NUMBER | 17-BIT CODE |
|---|---|
| 127 | 0 0 1 0 0 0 1 0 0 0 0 0 1 0 0 1 0 |
| 128 | 0 0 1 0 0 0 1 0 0 0 0 1 0 0 0 1 0 |
| 129 | 0 0 1 0 0 0 1 0 0 0 1 0 0 0 0 1 0 |
| 130 | 0 0 1 0 0 0 1 0 0 1 0 0 0 0 0 1 0 |
| 131 | 0 0 1 0 0 0 1 0 0 1 0 0 1 0 0 1 0 |
| 132 | 0 0 1 0 0 1 0 0 0 0 0 0 0 0 0 1 0 |
| 133 | 0 0 1 0 0 1 0 0 0 0 0 0 1 0 0 1 0 |
| 134 | 0 0 1 0 0 1 0 0 0 0 0 1 0 0 0 1 0 |
| 135 | 0 0 1 0 0 1 0 0 0 0 1 0 0 0 0 1 0 |
| 136 | 0 0 1 0 0 1 0 0 0 1 0 0 0 0 0 1 0 |
| 137 | 0 0 1 0 0 1 0 0 0 1 0 0 1 0 0 1 0 |
| 138 | 0 0 1 0 0 1 0 0 1 0 0 0 0 0 0 1 0 |
| 139 | 0 0 1 0 0 1 0 0 1 0 0 0 1 0 0 1 0 |
| 140 | 0 0 1 0 0 1 0 0 1 0 0 1 0 0 0 1 0 |
| 141 | 0 0 1 0 0 0 0 0 0 0 0 1 0 0 1 0 0 |
| 142 | 0 0 1 0 0 0 0 0 0 0 1 0 0 0 1 0 0 |
| 143 | 0 0 1 0 0 0 0 0 0 1 0 0 0 0 1 0 0 |
| 144 | 0 0 1 0 0 0 0 0 1 0 0 0 0 0 1 0 0 |
| 145 | 0 0 1 0 0 0 0 0 1 0 0 1 0 0 1 0 0 |
| 146 | 0 0 1 0 0 0 0 1 0 0 0 0 0 0 1 0 0 |
| 147 | 0 0 1 0 0 0 0 1 0 0 0 1 0 0 1 0 0 |
| 148 | 0 0 1 0 0 0 0 1 0 0 1 0 0 0 1 0 0 |
| 149 | 0 0 1 0 0 0 1 0 0 0 0 0 0 0 1 0 0 |
| 150 | 0 0 1 0 0 0 1 0 0 0 0 1 0 0 1 0 0 |
| 151 | 0 0 1 0 0 0 1 0 0 0 1 0 0 0 1 0 0 |
| 152 | 0 0 1 0 0 0 1 0 0 1 0 0 0 0 1 0 0 |
| 153 | 0 0 1 0 0 1 0 0 0 0 0 0 0 0 1 0 0 |
| 154 | 0 0 1 0 0 1 0 0 0 0 0 1 0 0 1 0 0 |
| 155 | 0 0 1 0 0 1 0 0 0 0 1 0 0 0 1 0 0 |
| 156 | 0 0 1 0 0 1 0 0 0 1 0 0 0 0 1 0 0 |
| 157 | 0 0 1 0 0 1 0 0 1 0 0 0 0 0 1 0 0 |
| 158 | 0 0 1 0 0 1 0 0 1 0 0 1 0 0 1 0 0 |
| 159 | 0 0 1 0 0 0 0 0 0 0 0 0 0 1 0 0 0 |
| 160 | 0 0 1 0 0 0 0 0 0 0 1 0 0 1 0 0 0 |
| 161 | 0 0 1 0 0 0 0 0 0 1 0 0 0 1 0 0 0 |
| 162 | 0 0 1 0 0 0 0 0 1 0 0 0 0 1 0 0 0 |
| 163 | 0 0 1 0 0 0 0 1 0 0 0 0 0 1 0 0 0 |
| 164 | 0 0 1 0 0 0 0 1 0 0 1 0 0 1 0 0 0 |
| 165 | 0 0 1 0 0 0 1 0 0 0 0 0 0 1 0 0 0 |
| 166 | 0 0 1 0 0 0 1 0 0 0 1 0 0 1 0 0 0 |
| 167 | 0 0 1 0 0 0 1 0 0 1 0 0 0 1 0 0 0 |
| 168 | 0 0 1 0 0 1 0 0 0 0 0 0 0 1 0 0 0 |
| 169 | 0 0 1 0 0 1 0 0 0 0 1 0 0 1 0 0 0 |
| 170 | 0 0 1 0 0 1 0 0 0 1 0 0 0 1 0 0 0 |
| 171 | 0 0 1 0 0 1 0 0 1 0 0 0 0 1 0 0 0 |
| 172 | 0 0 1 0 0 0 0 0 0 0 0 0 1 0 0 0 0 |
| 173 | 0 0 1 0 0 0 0 0 0 1 0 0 1 0 0 0 0 |
| 174 | 0 0 1 0 0 0 0 0 1 0 0 0 1 0 0 0 0 |
| 175 | 0 0 1 0 0 0 0 1 0 0 0 0 1 0 0 0 0 |
| 176 | 0 0 1 0 0 0 1 0 0 0 0 0 1 0 0 0 0 |
| 177 | 0 0 1 0 0 0 1 0 0 1 0 0 1 0 0 0 0 |
| 178 | 0 0 1 0 0 1 0 0 0 0 0 0 1 0 0 0 0 |
| 179 | 0 0 1 0 0 1 0 0 0 1 0 0 1 0 0 0 0 |
| 180 | 0 0 1 0 0 1 0 0 1 0 0 0 1 0 0 0 0 |
| 181 | 0 0 1 0 0 0 0 0 0 0 0 1 0 0 0 0 0 |
| 182 | 0 0 1 0 0 0 0 0 1 0 0 1 0 0 0 0 0 |
| 183 | 0 0 1 0 0 0 0 1 0 0 0 1 0 0 0 0 0 |
| 184 | 0 0 1 0 0 0 1 0 0 0 0 1 0 0 0 0 0 |
| 185 | 0 0 1 0 0 1 0 0 0 0 0 1 0 0 0 0 0 |
| 186 | 0 0 1 0 0 1 0 0 1 0 0 1 0 0 0 0 0 |
| 187 | 0 0 1 0 0 0 0 0 0 0 1 0 0 0 0 0 0 |
| 188 | 0 0 1 0 0 0 0 1 0 0 1 0 0 0 0 0 0 |
| 189 | 0 0 1 0 0 0 1 0 0 0 1 0 0 0 0 0 0 |
| 190 | 0 0 1 0 0 1 0 0 0 0 1 0 0 0 0 0 0 |
| 191 | 0 0 0 1 0 0 0 0 0 0 0 0 1 0 0 1 0 |
| 192 | 0 0 0 1 0 0 0 0 0 0 0 1 0 0 0 1 0 |
| 193 | 0 0 0 1 0 0 0 0 0 0 1 0 0 0 0 1 0 |
| 194 | 0 0 0 1 0 0 0 0 0 1 0 0 0 0 0 1 0 |
| 195 | 0 0 0 1 0 0 0 0 0 1 0 0 1 0 0 1 0 |
| 196 | 0 0 0 1 0 0 0 0 1 0 0 0 0 0 0 1 0 |
| 197 | 0 0 0 1 0 0 0 0 1 0 0 0 1 0 0 1 0 |
| 198 | 0 0 0 1 0 0 0 0 1 0 0 1 0 0 0 1 0 |
| 199 | 0 0 0 1 0 0 0 1 0 0 0 0 0 0 0 1 0 |
| 200 | 0 0 0 1 0 0 0 1 0 0 0 0 1 0 0 1 0 |
| 201 | 0 0 0 1 0 0 0 1 0 0 0 1 0 0 0 1 0 |
| 202 | 0 0 0 1 0 0 0 1 0 0 1 0 0 0 0 1 0 |
| 203 | 0 0 0 1 0 0 1 0 0 0 0 0 0 0 0 1 0 |
| 204 | 0 0 0 1 0 0 1 0 0 0 0 0 1 0 0 1 0 |
| 205 | 0 0 0 1 0 0 1 0 0 0 0 1 0 0 0 1 0 |
| 206 | 0 0 0 1 0 0 1 0 0 0 1 0 0 0 0 1 0 |
| 207 | 0 0 0 1 0 0 1 0 0 1 0 0 0 0 0 1 0 |

TABLE 45-continued

| NUMBER | 17-BIT CODE |
|---|---|
| 208 | 00010010010010010 |
| 209 | 00010000000000100 |
| 210 | 00010000000100100 |
| 211 | 00010000001000100 |
| 212 | 00010000010000100 |
| 213 | 00010000100000100 |
| 214 | 00010000100100100 |
| 215 | 00010001000000100 |
| 216 | 00010001000100100 |
| 217 | 00010001001000100 |
| 218 | 00010010000000100 |
| 219 | 00010010000100100 |
| 220 | 00010010001000100 |
| 221 | 00010010010000100 |
| 222 | 00010000000001000 |
| 223 | 00010000001001000 |
| 224 | 00010000010001000 |
| 225 | 00010000100001000 |
| 226 | 00010001000001000 |
| 227 | 00010001001001000 |
| 228 | 00010010000001000 |
| 229 | 00010010001001000 |
| 230 | 00010010010001000 |
| 231 | 00010000000010000 |
| 232 | 00010000010010000 |
| 233 | 00010000100010000 |
| 234 | 00010001000010000 |
| 235 | 00010010000010000 |
| 236 | 00010010010010000 |
| 237 | 00010000000100000 |
| 238 | 00010000100100000 |
| 239 | 00010001000100000 |
| 240 | 00010010000100000 |
| 241 | 00010000001000000 |
| 242 | 00010001001000000 |
| 243 | 00010010001000000 |
| 244 | 00001000000000010 |
| 245 | 00001000000010010 |
| 246 | 00001000000100010 |
| 247 | 00001000001000010 |
| 248 | 00001000010000010 |
| 249 | 00001000010010010 |
| 250 | 00001000100000010 |
| 251 | 00001000100010010 |
| 252 | 00001000100100010 |
| 253 | 00001001000000010 |
| 254 | 00001001000010010 |
| 255 | 00001001000100010 |
| 256 | 00001001001000010 |
| 257 | 00001000000000100 |
| 258 | 00001000000100100 |
| 259 | 00001000001000100 |
| 260 | 00001000010000100 |
| 261 | 00001000100000100 |
| 262 | 00001000100100100 |
| 263 | 00001001000000100 |
| 264 | 00001001000100100 |
| 265 | 00001001001000100 |
| 266 | 00001000000001000 |
| 267 | 00001000001001000 |
| 268 | 00001000010001000 |
| 269 | 00001000100001000 |
| 270 | 00001001000001000 |
| 271 | 00001001001001000 |
| 272 | 00001000000010000 |
| 273 | 00001000010010000 |
| 274 | 00001000100010000 |
| 275 | 00001001000010000 |
| 276 | 00001000000100000 |
| 277 | 00001000100100000 |
| 278 | 00001001000100000 |
| 279 | 00001000001000000 |
| 280 | 00001001001000000 |

TABLE 46

| NUMBER | 17-BIT CODE |
|---|---|
| 1 | 10000000000100100 |
| 2 | 10000000001000100 |
| 3 | 10000000010000100 |
| 4 | 10000000100000100 |
| 5 | 10000000100100100 |
| 6 | 10000001000000100 |
| 7 | 10000001000100100 |
| 8 | 10000001001000100 |
| 9 | 10000010000000100 |
| 10 | 10000010000100100 |
| 11 | 10000010001000100 |
| 12 | 10000010010000100 |
| 13 | 10000100000000100 |
| 14 | 10000100000100100 |
| 15 | 10000100001000100 |
| 16 | 10000100010000100 |
| 17 | 10000100100000100 |
| 18 | 10000100100100100 |
| 19 | 10001000000000100 |
| 20 | 10001000000100100 |
| 21 | 10001000001000100 |
| 22 | 10001000010000100 |
| 23 | 10001000100000100 |
| 24 | 10001000100100100 |
| 25 | 10001001000000100 |
| 26 | 10001001000100100 |
| 27 | 10001001001000100 |
| 28 | 10010000000000100 |
| 29 | 10010000000100100 |
| 30 | 10010000001000100 |
| 31 | 10010000010000100 |
| 32 | 10010000100000100 |
| 33 | 10010000100100100 |
| 34 | 10010001000000100 |
| 35 | 10010001000100100 |
| 36 | 10010001001000100 |
| 37 | 10010010000000100 |
| 38 | 10010010000100100 |
| 39 | 10010010001000100 |
| 40 | 10010010010000100 |
| 41 | 10000000001001000 |
| 42 | 10000000010001000 |
| 43 | 10000000100001000 |
| 44 | 10000001000001000 |
| 45 | 10000001001001000 |
| 46 | 10000010000001000 |
| 47 | 10000010001001000 |
| 48 | 10000010010001000 |
| 49 | 10000100000001000 |
| 50 | 10000100001001000 |
| 51 | 10000100010001000 |
| 52 | 10000100100001000 |
| 53 | 10001000000001000 |
| 54 | 10001000001001000 |
| 55 | 10001000010001000 |
| 56 | 10001000100001000 |
| 57 | 10001001000001000 |
| 58 | 10001001001001000 |
| 59 | 10010000000001000 |
| 60 | 10010000001001000 |
| 61 | 10010000010001000 |
| 62 | 10010000100001000 |
| 63 | 10010001000001000 |
| 64 | 10010001001001000 |
| 65 | 10010010000001000 |
| 66 | 10010010001001000 |
| 67 | 10010010010001000 |
| 68 | 10000000010010000 |
| 69 | 10000000100010000 |
| 70 | 10000001000010000 |
| 71 | 10000010000010000 |
| 72 | 10000010010010000 |
| 73 | 10000100000010000 |
| 74 | 10000100010010000 |
| 75 | 10000100100010000 |
| 76 | 10001000000010000 |
| 77 | 10001000010010000 |
| 78 | 10001000100010000 |
| 79 | 10001001000010000 |
| 80 | 10010000000010000 |
| 81 | 10010000010010000 |
| 82 | 10010000100010000 |
| 83 | 10010001000010000 |

TABLE 46-continued

| NUMBER | 17-BIT CODE |
|---|---|
| 84 | 1 0 0 1 0 0 1 0 0 0 0 0 1 0 0 0 0 |
| 85 | 1 0 0 1 0 0 1 0 0 1 0 0 1 0 0 0 0 |
| 86 | 1 0 0 0 0 0 0 0 0 0 0 1 0 0 0 0 0 |
| 87 | 1 0 0 0 0 0 0 0 1 0 0 1 0 0 0 0 0 |
| 88 | 1 0 0 0 0 0 0 1 0 0 0 1 0 0 0 0 0 |
| 89 | 1 0 0 0 0 0 1 0 0 0 0 1 0 0 0 0 0 |
| 90 | 1 0 0 0 0 1 0 0 0 0 0 1 0 0 0 0 0 |
| 91 | 1 0 0 0 0 1 0 0 1 0 0 1 0 0 0 0 0 |
| 92 | 1 0 0 0 1 0 0 0 0 0 0 1 0 0 0 0 0 |
| 93 | 1 0 0 0 1 0 0 0 1 0 0 1 0 0 0 0 0 |
| 94 | 1 0 0 0 1 0 0 1 0 0 0 1 0 0 0 0 0 |
| 95 | 1 0 0 1 0 0 0 0 0 0 0 1 0 0 0 0 0 |
| 96 | 1 0 0 1 0 0 0 0 1 0 0 1 0 0 0 0 0 |
| 97 | 1 0 0 1 0 0 0 1 0 0 0 1 0 0 0 0 0 |
| 98 | 1 0 0 1 0 0 1 0 0 0 0 1 0 0 0 0 0 |
| 99 | 0 1 0 0 0 0 0 0 0 0 0 1 0 0 1 0 0 |
| 100 | 0 1 0 0 0 0 0 0 0 0 1 0 0 0 1 0 0 |
| 101 | 0 1 0 0 0 0 0 0 0 1 0 0 0 0 1 0 0 |
| 102 | 0 1 0 0 0 0 0 0 1 0 0 0 0 0 1 0 0 |
| 103 | 0 1 0 0 0 0 0 0 1 0 0 1 0 0 1 0 0 |
| 104 | 0 1 0 0 0 0 0 1 0 0 0 0 0 0 1 0 0 |
| 105 | 0 1 0 0 0 0 0 1 0 0 0 1 0 0 1 0 0 |
| 106 | 0 1 0 0 0 0 0 1 0 0 1 0 0 0 1 0 0 |
| 107 | 0 1 0 0 0 0 1 0 0 0 0 0 0 0 1 0 0 |
| 108 | 0 1 0 0 0 0 1 0 0 0 0 1 0 0 1 0 0 |
| 109 | 0 1 0 0 0 0 1 0 0 0 1 0 0 0 1 0 0 |
| 110 | 0 1 0 0 0 0 1 0 0 1 0 0 0 0 1 0 0 |
| 111 | 0 1 0 0 0 1 0 0 0 0 0 0 0 0 1 0 0 |
| 112 | 0 1 0 0 0 1 0 0 0 0 0 1 0 0 1 0 0 |
| 113 | 0 1 0 0 0 1 0 0 0 0 1 0 0 0 1 0 0 |
| 114 | 0 1 0 0 0 1 0 0 0 1 0 0 0 0 1 0 0 |
| 115 | 0 1 0 0 0 1 0 0 1 0 0 0 0 0 1 0 0 |
| 116 | 0 1 0 0 0 1 0 0 1 0 0 1 0 0 1 0 0 |
| 117 | 0 1 0 0 1 0 0 0 0 0 0 0 0 0 1 0 0 |
| 118 | 0 1 0 0 1 0 0 0 0 0 0 1 0 0 1 0 0 |
| 119 | 0 1 0 0 1 0 0 0 0 0 1 0 0 0 1 0 0 |
| 120 | 0 1 0 0 1 0 0 0 0 1 0 0 0 0 1 0 0 |
| 121 | 0 1 0 0 1 0 0 0 1 0 0 0 0 0 1 0 0 |
| 122 | 0 1 0 0 1 0 0 0 1 0 0 1 0 0 1 0 0 |
| 123 | 0 1 0 0 1 0 0 1 0 0 0 0 0 0 1 0 0 |
| 124 | 0 1 0 0 1 0 0 1 0 0 0 1 0 0 1 0 0 |
| 125 | 0 1 0 0 1 0 0 1 0 0 1 0 0 0 1 0 0 |
| 126 | 0 1 0 0 0 0 0 0 0 0 1 0 0 1 0 0 0 |
| 127 | 0 1 0 0 0 0 0 0 0 1 0 0 0 1 0 0 0 |
| 128 | 0 1 0 0 0 0 0 0 1 0 0 0 0 1 0 0 0 |
| 129 | 0 1 0 0 0 0 0 1 0 0 0 0 0 1 0 0 0 |
| 130 | 0 1 0 0 0 0 0 1 0 0 1 0 0 1 0 0 0 |
| 131 | 0 1 0 0 0 0 1 0 0 0 0 0 0 1 0 0 0 |
| 132 | 0 1 0 0 0 0 1 0 0 0 1 0 0 1 0 0 0 |
| 133 | 0 1 0 0 0 0 1 0 0 1 0 0 0 1 0 0 0 |
| 134 | 0 1 0 0 0 1 0 0 0 0 0 0 0 1 0 0 0 |
| 135 | 0 1 0 0 0 1 0 0 0 0 1 0 0 1 0 0 0 |
| 136 | 0 1 0 0 0 1 0 0 0 1 0 0 0 1 0 0 0 |
| 137 | 0 1 0 0 0 1 0 0 1 0 0 0 0 1 0 0 0 |
| 138 | 0 1 0 0 1 0 0 0 0 0 0 0 0 1 0 0 0 |
| 139 | 0 1 0 0 1 0 0 0 0 0 1 0 0 1 0 0 0 |
| 140 | 0 1 0 0 1 0 0 0 0 1 0 0 0 1 0 0 0 |
| 141 | 0 1 0 0 1 0 0 0 1 0 0 0 0 1 0 0 0 |
| 142 | 0 1 0 0 1 0 0 1 0 0 0 0 0 1 0 0 0 |
| 143 | 0 1 0 0 1 0 0 1 0 0 1 0 0 1 0 0 0 |
| 144 | 0 1 0 0 0 0 0 0 0 0 0 0 1 0 0 0 0 |
| 145 | 0 1 0 0 0 0 0 0 0 1 0 0 1 0 0 0 0 |
| 146 | 0 1 0 0 0 0 0 0 1 0 0 0 1 0 0 0 0 |
| 147 | 0 1 0 0 0 0 0 1 0 0 0 0 1 0 0 0 0 |
| 148 | 0 1 0 0 0 0 1 0 0 0 0 0 1 0 0 0 0 |
| 149 | 0 1 0 0 0 0 1 0 0 1 0 0 1 0 0 0 0 |
| 150 | 0 1 0 0 0 1 0 0 0 0 0 0 1 0 0 0 0 |
| 151 | 0 1 0 0 0 1 0 0 0 1 0 0 1 0 0 0 0 |
| 152 | 0 1 0 0 0 1 0 0 1 0 0 0 1 0 0 0 0 |
| 153 | 0 1 0 0 1 0 0 0 0 0 0 0 1 0 0 0 0 |
| 154 | 0 1 0 0 1 0 0 0 0 1 0 0 1 0 0 0 0 |
| 155 | 0 1 0 0 1 0 0 0 1 0 0 0 1 0 0 0 0 |
| 156 | 0 1 0 0 1 0 0 1 0 0 0 0 1 0 0 0 0 |
| 157 | 0 1 0 0 0 0 0 0 0 0 0 1 0 0 0 0 0 |
| 158 | 0 1 0 0 0 0 0 0 1 0 0 1 0 0 0 0 0 |
| 159 | 0 1 0 0 0 0 0 1 0 0 0 1 0 0 0 0 0 |
| 160 | 0 1 0 0 0 0 1 0 0 0 0 1 0 0 0 0 0 |
| 161 | 0 1 0 0 0 1 0 0 0 0 0 1 0 0 0 0 0 |
| 162 | 0 1 0 0 0 1 0 0 1 0 0 1 0 0 0 0 0 |
| 163 | 0 1 0 0 1 0 0 0 0 0 0 1 0 0 0 0 0 |
| 164 | 0 1 0 0 1 0 0 0 1 0 0 1 0 0 0 0 0 |

TABLE 46-continued

| NUMBER | 17-BIT CODE |
|---|---|
| 165 | 0 1 0 0 1 0 0 1 0 0 0 1 0 0 0 0 0 |
| 166 | 0 0 1 0 0 0 0 0 0 0 0 1 0 0 1 0 0 |
| 167 | 0 0 1 0 0 0 0 0 0 0 1 0 0 0 1 0 0 |
| 168 | 0 0 1 0 0 0 0 0 0 1 0 0 0 0 1 0 0 |
| 169 | 0 0 1 0 0 0 0 0 1 0 0 0 0 0 1 0 0 |
| 170 | 0 0 1 0 0 0 0 0 1 0 0 1 0 0 1 0 0 |
| 171 | 0 0 1 0 0 0 0 1 0 0 0 0 0 0 1 0 0 |
| 172 | 0 0 1 0 0 0 0 1 0 0 0 1 0 0 1 0 0 |
| 173 | 0 0 1 0 0 0 0 1 0 0 1 0 0 0 1 0 0 |
| 174 | 0 0 1 0 0 0 1 0 0 0 0 0 0 0 1 0 0 |
| 175 | 0 0 1 0 0 0 1 0 0 0 0 1 0 0 1 0 0 |
| 176 | 0 0 1 0 0 0 1 0 0 0 1 0 0 0 1 0 0 |
| 177 | 0 0 1 0 0 0 1 0 0 1 0 0 0 0 1 0 0 |
| 178 | 0 0 1 0 0 1 0 0 0 0 0 0 0 0 1 0 0 |
| 179 | 0 0 1 0 0 1 0 0 0 0 0 1 0 0 1 0 0 |
| 180 | 0 0 1 0 0 1 0 0 0 0 1 0 0 0 1 0 0 |
| 181 | 0 0 1 0 0 1 0 0 0 1 0 0 0 0 1 0 0 |
| 182 | 0 0 1 0 0 1 0 0 1 0 0 0 0 0 1 0 0 |
| 183 | 0 0 1 0 0 1 0 0 1 0 0 1 0 0 1 0 0 |
| 184 | 0 0 1 0 0 0 0 0 0 0 0 0 0 1 0 0 0 |
| 185 | 0 0 1 0 0 0 0 0 0 0 1 0 0 1 0 0 0 |
| 186 | 0 0 1 0 0 0 0 0 0 1 0 0 0 1 0 0 0 |
| 187 | 0 0 1 0 0 0 0 0 1 0 0 0 0 1 0 0 0 |
| 188 | 0 0 1 0 0 0 0 1 0 0 0 0 0 1 0 0 0 |
| 189 | 0 0 1 0 0 0 0 1 0 0 1 0 0 1 0 0 0 |
| 190 | 0 0 1 0 0 0 1 0 0 0 0 0 0 1 0 0 0 |
| 191 | 0 0 1 0 0 0 1 0 0 0 1 0 0 1 0 0 0 |
| 192 | 0 0 1 0 0 0 1 0 0 1 0 0 0 1 0 0 0 |
| 193 | 0 0 1 0 0 1 0 0 0 0 0 0 0 1 0 0 0 |
| 194 | 0 0 1 0 0 1 0 0 0 0 1 0 0 1 0 0 0 |
| 195 | 0 0 1 0 0 1 0 0 0 1 0 0 0 1 0 0 0 |
| 196 | 0 0 1 0 0 1 0 0 1 0 0 0 0 1 0 0 0 |
| 197 | 0 0 1 0 0 0 0 0 0 0 0 0 1 0 0 0 0 |
| 198 | 0 0 1 0 0 0 0 0 0 1 0 0 1 0 0 0 0 |
| 199 | 0 0 1 0 0 0 0 0 1 0 0 0 1 0 0 0 0 |
| 200 | 0 0 1 0 0 0 0 1 0 0 0 0 1 0 0 0 0 |
| 201 | 0 0 1 0 0 0 1 0 0 0 0 0 1 0 0 0 0 |
| 202 | 0 0 1 0 0 0 1 0 0 1 0 0 1 0 0 0 0 |
| 203 | 0 0 1 0 0 1 0 0 0 0 0 0 1 0 0 0 0 |
| 204 | 0 0 1 0 0 1 0 0 0 1 0 0 1 0 0 0 0 |
| 205 | 0 0 1 0 0 1 0 0 1 0 0 0 1 0 0 0 0 |
| 206 | 0 0 1 0 0 0 0 0 0 0 0 1 0 0 0 0 0 |
| 207 | 0 0 1 0 0 0 0 0 1 0 0 1 0 0 0 0 0 |
| 208 | 0 0 1 0 0 0 0 1 0 0 0 1 0 0 0 0 0 |
| 209 | 0 0 1 0 0 0 1 0 0 0 0 1 0 0 0 0 0 |
| 210 | 0 0 1 0 0 1 0 0 0 0 0 1 0 0 0 0 0 |
| 211 | 0 0 1 0 0 1 0 0 1 0 0 1 0 0 0 0 0 |
| 212 | 0 0 0 1 0 0 0 0 0 0 0 0 0 0 1 0 0 |
| 213 | 0 0 0 1 0 0 0 0 0 0 0 1 0 0 1 0 0 |
| 214 | 0 0 0 1 0 0 0 0 0 0 1 0 0 0 1 0 0 |
| 215 | 0 0 0 1 0 0 0 0 0 1 0 0 0 0 1 0 0 |
| 216 | 0 0 0 1 0 0 0 0 1 0 0 0 0 0 1 0 0 |
| 217 | 0 0 0 1 0 0 0 0 1 0 0 1 0 0 1 0 0 |
| 218 | 0 0 0 1 0 0 0 1 0 0 0 0 0 0 1 0 0 |
| 219 | 0 0 0 1 0 0 0 1 0 0 0 1 0 0 1 0 0 |
| 220 | 0 0 0 1 0 0 0 1 0 0 1 0 0 0 1 0 0 |
| 221 | 0 0 0 1 0 0 1 0 0 0 0 0 0 0 1 0 0 |
| 222 | 0 0 0 1 0 0 1 0 0 0 0 1 0 0 1 0 0 |
| 223 | 0 0 0 1 0 0 1 0 0 0 1 0 0 0 1 0 0 |
| 224 | 0 0 0 1 0 0 1 0 0 1 0 0 0 0 1 0 0 |
| 225 | 0 0 0 1 0 0 0 0 0 0 0 0 0 1 0 0 0 |
| 226 | 0 0 0 1 0 0 0 0 0 0 1 0 0 1 0 0 0 |
| 227 | 0 0 0 1 0 0 0 0 0 1 0 0 0 1 0 0 0 |
| 228 | 0 0 0 1 0 0 0 0 1 0 0 0 0 1 0 0 0 |
| 229 | 0 0 0 1 0 0 0 1 0 0 0 0 0 1 0 0 0 |
| 230 | 0 0 0 1 0 0 0 1 0 0 1 0 0 1 0 0 0 |
| 231 | 0 0 0 1 0 0 1 0 0 0 0 0 0 1 0 0 0 |
| 232 | 0 0 0 1 0 0 1 0 0 0 1 0 0 1 0 0 0 |
| 233 | 0 0 0 1 0 0 1 0 0 1 0 0 0 1 0 0 0 |
| 234 | 0 0 0 1 0 0 0 0 0 0 0 0 1 0 0 0 0 |
| 235 | 0 0 0 1 0 0 0 0 0 1 0 0 1 0 0 0 0 |
| 236 | 0 0 0 1 0 0 0 0 1 0 0 0 1 0 0 0 0 |
| 237 | 0 0 0 1 0 0 0 1 0 0 0 0 1 0 0 0 0 |
| 238 | 0 0 0 1 0 0 1 0 0 0 0 0 1 0 0 0 0 |
| 239 | 0 0 0 1 0 0 1 0 0 1 0 0 1 0 0 0 0 |
| 240 | 0 0 0 1 0 0 0 0 0 0 0 1 0 0 0 0 0 |
| 241 | 0 0 0 1 0 0 0 0 1 0 0 1 0 0 0 0 0 |
| 242 | 0 0 0 1 0 0 0 1 0 0 0 1 0 0 0 0 0 |
| 243 | 0 0 0 1 0 0 1 0 0 0 0 1 0 0 0 0 0 |
| 244 | 0 0 0 0 1 0 0 0 0 0 0 0 0 0 1 0 0 |
| 245 | 0 0 0 0 1 0 0 0 0 0 0 1 0 0 1 0 0 |

TABLE 46-continued

| NUMBER | 17-BIT CODE |
|---|---|
| 246 | 0 0 0 0 1 0 0 0 0 0 1 0 0 0 1 0 0 |
| 247 | 0 0 0 0 1 0 0 0 0 1 0 0 0 0 1 0 0 |
| 248 | 0 0 0 0 1 0 0 0 1 0 0 0 0 0 1 0 0 |
| 249 | 0 0 0 0 1 0 0 0 1 0 0 1 0 0 1 0 0 |
| 250 | 0 0 0 0 1 0 0 1 0 0 0 0 0 0 1 0 0 |
| 251 | 0 0 0 0 1 0 0 1 0 0 0 1 0 0 1 0 0 |
| 252 | 0 0 0 0 1 0 0 1 0 0 1 0 0 0 1 0 0 |
| 253 | 0 0 0 0 1 0 0 0 0 0 0 0 0 1 0 0 0 |
| 254 | 0 0 0 0 1 0 0 0 0 0 1 0 0 1 0 0 0 |
| 255 | 0 0 0 0 1 0 0 0 0 1 0 0 0 1 0 0 0 |
| 256 | 0 0 0 0 1 0 0 0 1 0 0 0 0 1 0 0 0 |
| 257 | 0 0 0 0 1 0 0 1 0 0 0 0 0 1 0 0 0 |
| 258 | 0 0 0 0 1 0 0 1 0 0 1 0 0 1 0 0 0 |
| 259 | 0 0 0 0 1 0 0 0 0 0 0 0 1 0 0 0 0 |
| 260 | 0 0 0 0 1 0 0 0 0 1 0 0 1 0 0 0 0 |
| 261 | 0 0 0 0 1 0 0 0 1 0 0 0 1 0 0 0 0 |
| 262 | 0 0 0 0 1 0 0 1 0 0 0 0 1 0 0 0 0 |
| 263 | 0 0 0 0 1 0 0 0 0 0 0 1 0 0 0 0 0 |
| 264 | 0 0 0 0 1 0 0 0 1 0 0 1 0 0 0 0 0 |
| 265 | 0 0 0 0 1 0 0 1 0 0 0 1 0 0 0 0 0 |
| 266 | 0 0 0 0 0 1 0 0 0 0 0 0 0 0 1 0 0 |
| 267 | 0 0 0 0 0 1 0 0 0 0 0 1 0 0 1 0 0 |
| 268 | 0 0 0 0 0 1 0 0 0 0 1 0 0 0 1 0 0 |
| 269 | 0 0 0 0 0 1 0 0 0 1 0 0 0 0 1 0 0 |
| 270 | 0 0 0 0 0 1 0 0 1 0 0 0 0 0 1 0 0 |
| 271 | 0 0 0 0 0 1 0 0 1 0 0 1 0 0 1 0 0 |
| 272 | 0 0 0 0 0 1 0 0 0 0 0 0 0 1 0 0 0 |
| 273 | 0 0 0 0 0 1 0 0 0 0 1 0 0 1 0 0 0 |
| 274 | 0 0 0 0 0 1 0 0 0 1 0 0 0 1 0 0 0 |
| 275 | 0 0 0 0 0 1 0 0 1 0 0 0 0 1 0 0 0 |
| 276 | 0 0 0 0 0 1 0 0 0 0 0 0 1 0 0 0 0 |
| 277 | 0 0 0 0 0 1 0 0 0 1 0 0 1 0 0 0 0 |
| 278 | 0 0 0 0 0 1 0 0 1 0 0 0 1 0 0 0 0 |
| 279 | 0 0 0 0 0 1 0 0 0 0 0 1 0 0 0 0 0 |
| 280 | 0 0 0 0 0 1 0 0 1 0 0 1 0 0 0 0 0 |

TABLE 47

| NUMBER | 17-BIT CODE |
|---|---|
| 1 | 0 1 0 0 0 0 0 0 0 0 0 0 1 0 0 1 0 |
| 2 | 0 1 0 0 0 0 0 0 0 0 0 1 0 0 0 1 0 |
| 3 | 0 1 0 0 0 0 0 0 0 0 1 0 0 0 0 1 0 |
| 4 | 0 1 0 0 0 0 0 0 0 1 0 0 0 0 0 1 0 |
| 5 | 0 1 0 0 0 0 0 0 0 1 0 0 1 0 0 1 0 |
| 6 | 0 1 0 0 0 0 0 0 1 0 0 0 0 0 0 1 0 |
| 7 | 0 1 0 0 0 0 0 0 1 0 0 0 1 0 0 1 0 |
| 8 | 0 1 0 0 0 0 0 0 1 0 0 1 0 0 0 1 0 |
| 9 | 0 1 0 0 0 0 0 1 0 0 0 0 0 0 0 1 0 |
| 10 | 0 1 0 0 0 0 0 1 0 0 0 0 1 0 0 1 0 |
| 11 | 0 1 0 0 0 0 0 1 0 0 0 1 0 0 0 1 0 |
| 12 | 0 1 0 0 0 0 0 1 0 0 1 0 0 0 0 1 0 |
| 13 | 0 1 0 0 0 0 1 0 0 0 0 0 0 0 0 1 0 |
| 14 | 0 1 0 0 0 0 1 0 0 0 0 0 1 0 0 1 0 |
| 15 | 0 1 0 0 0 0 1 0 0 0 0 1 0 0 0 1 0 |
| 16 | 0 1 0 0 0 0 1 0 0 0 1 0 0 0 0 1 0 |
| 17 | 0 1 0 0 0 0 1 0 0 1 0 0 0 0 0 1 0 |
| 18 | 0 1 0 0 0 0 1 0 0 1 0 0 1 0 0 1 0 |
| 19 | 0 1 0 0 0 1 0 0 0 0 0 0 0 0 0 1 0 |
| 20 | 0 1 0 0 0 1 0 0 0 0 0 0 1 0 0 1 0 |
| 21 | 0 1 0 0 0 1 0 0 0 0 0 1 0 0 0 1 0 |
| 22 | 0 1 0 0 0 1 0 0 0 0 1 0 0 0 0 1 0 |
| 23 | 0 1 0 0 0 1 0 0 0 1 0 0 0 0 0 1 0 |
| 24 | 0 1 0 0 0 1 0 0 0 1 0 0 1 0 0 1 0 |
| 25 | 0 1 0 0 0 1 0 0 1 0 0 0 0 0 0 1 0 |
| 26 | 0 1 0 0 0 1 0 0 1 0 0 0 1 0 0 1 0 |
| 27 | 0 1 0 0 0 1 0 0 1 0 0 1 0 0 0 1 0 |
| 28 | 0 1 0 0 1 0 0 0 0 0 0 0 0 0 0 1 0 |
| 29 | 0 1 0 0 1 0 0 0 0 0 0 0 1 0 0 1 0 |
| 30 | 0 1 0 0 1 0 0 0 0 0 0 1 0 0 0 1 0 |
| 31 | 0 1 0 0 1 0 0 0 0 0 1 0 0 0 0 1 0 |
| 32 | 0 1 0 0 1 0 0 0 0 1 0 0 0 0 0 1 0 |
| 33 | 0 1 0 0 1 0 0 0 0 1 0 0 1 0 0 1 0 |
| 34 | 0 1 0 0 1 0 0 0 1 0 0 0 0 0 0 1 0 |
| 35 | 0 1 0 0 1 0 0 0 1 0 0 0 1 0 0 1 0 |
| 36 | 0 1 0 0 1 0 0 0 1 0 0 1 0 0 0 1 0 |
| 37 | 0 1 0 0 1 0 0 1 0 0 0 0 0 0 0 1 0 |
| 38 | 0 1 0 0 1 0 0 1 0 0 0 0 1 0 0 1 0 |
| 39 | 0 1 0 0 1 0 0 1 0 0 0 1 0 0 0 1 0 |
| 40 | 0 1 0 0 1 0 0 1 0 0 1 0 0 0 0 1 0 |

TABLE 47-continued

| NUMBER | 17-BIT CODE |
|---|---|
| 41 | 0 1 0 0 0 0 0 0 0 0 0 1 0 0 1 0 0 |
| 42 | 0 1 0 0 0 0 0 0 0 0 1 0 0 0 1 0 0 |
| 43 | 0 1 0 0 0 0 0 0 0 1 0 0 0 0 1 0 0 |
| 44 | 0 1 0 0 0 0 0 0 1 0 0 0 0 0 1 0 0 |
| 45 | 0 1 0 0 0 0 0 0 1 0 0 1 0 0 1 0 0 |
| 46 | 0 1 0 0 0 0 0 1 0 0 0 0 0 0 1 0 0 |
| 47 | 0 1 0 0 0 0 0 1 0 0 0 1 0 0 1 0 0 |
| 48 | 0 1 0 0 0 0 0 1 0 0 1 0 0 0 1 0 0 |
| 49 | 0 1 0 0 0 0 1 0 0 0 0 0 0 0 1 0 0 |
| 50 | 0 1 0 0 0 0 1 0 0 0 0 1 0 0 1 0 0 |
| 51 | 0 1 0 0 0 0 1 0 0 0 1 0 0 0 1 0 0 |
| 52 | 0 1 0 0 0 0 1 0 0 1 0 0 0 0 1 0 0 |
| 53 | 0 1 0 0 0 1 0 0 0 0 0 0 0 0 1 0 0 |
| 54 | 0 1 0 0 0 1 0 0 0 0 0 1 0 0 1 0 0 |
| 55 | 0 1 0 0 0 1 0 0 0 0 1 0 0 0 1 0 0 |
| 56 | 0 1 0 0 0 1 0 0 0 1 0 0 0 0 1 0 0 |
| 57 | 0 1 0 0 0 1 0 0 1 0 0 0 0 0 1 0 0 |
| 58 | 0 1 0 0 0 1 0 0 1 0 0 1 0 0 1 0 0 |
| 59 | 0 1 0 0 1 0 0 0 0 0 0 0 0 0 1 0 0 |
| 60 | 0 1 0 0 1 0 0 0 0 0 0 1 0 0 1 0 0 |
| 61 | 0 1 0 0 1 0 0 0 0 0 1 0 0 0 1 0 0 |
| 62 | 0 1 0 0 1 0 0 0 0 1 0 0 0 0 1 0 0 |
| 63 | 0 1 0 0 1 0 0 0 1 0 0 0 0 0 1 0 0 |
| 64 | 0 1 0 0 1 0 0 0 1 0 0 1 0 0 1 0 0 |
| 65 | 0 1 0 0 1 0 0 1 0 0 0 0 0 0 1 0 0 |
| 66 | 0 1 0 0 1 0 0 1 0 0 0 1 0 0 1 0 0 |
| 67 | 0 1 0 0 1 0 0 1 0 0 1 0 0 0 1 0 0 |
| 68 | 0 1 0 0 0 0 0 0 0 0 1 0 0 1 0 0 0 |
| 69 | 0 1 0 0 0 0 0 0 0 1 0 0 0 1 0 0 0 |
| 70 | 0 1 0 0 0 0 0 0 1 0 0 0 0 1 0 0 0 |
| 71 | 0 1 0 0 0 0 0 1 0 0 0 0 0 1 0 0 0 |
| 72 | 0 1 0 0 0 0 0 1 0 0 1 0 0 1 0 0 0 |
| 73 | 0 1 0 0 0 0 1 0 0 0 0 0 0 1 0 0 0 |
| 74 | 0 1 0 0 0 0 1 0 0 0 1 0 0 1 0 0 0 |
| 75 | 0 1 0 0 0 0 1 0 0 1 0 0 0 1 0 0 0 |
| 76 | 0 1 0 0 0 1 0 0 0 0 0 0 0 1 0 0 0 |
| 77 | 0 1 0 0 0 1 0 0 0 0 1 0 0 1 0 0 0 |
| 78 | 0 1 0 0 0 1 0 0 0 1 0 0 0 1 0 0 0 |
| 79 | 0 1 0 0 0 1 0 0 1 0 0 0 0 1 0 0 0 |
| 80 | 0 1 0 0 1 0 0 0 0 0 0 0 0 1 0 0 0 |
| 81 | 0 1 0 0 1 0 0 0 0 0 1 0 0 1 0 0 0 |
| 82 | 0 1 0 0 1 0 0 0 0 1 0 0 0 1 0 0 0 |
| 83 | 0 1 0 0 1 0 0 0 1 0 0 0 0 1 0 0 0 |
| 84 | 0 1 0 0 1 0 0 1 0 0 0 0 0 1 0 0 0 |
| 85 | 0 1 0 0 1 0 0 1 0 0 1 0 0 1 0 0 0 |
| 86 | 0 1 0 0 0 0 0 0 0 0 0 0 1 0 0 0 0 |
| 87 | 0 1 0 0 0 0 0 0 0 1 0 0 1 0 0 0 0 |
| 88 | 0 1 0 0 0 0 0 0 1 0 0 0 1 0 0 0 0 |
| 89 | 0 1 0 0 0 0 0 1 0 0 0 0 1 0 0 0 0 |
| 90 | 0 1 0 0 0 0 1 0 0 0 0 0 1 0 0 0 0 |
| 91 | 0 1 0 0 0 0 1 0 0 1 0 0 1 0 0 0 0 |
| 92 | 0 1 0 0 0 1 0 0 0 0 0 0 1 0 0 0 0 |
| 93 | 0 1 0 0 0 1 0 0 0 1 0 0 1 0 0 0 0 |
| 94 | 0 1 0 0 0 1 0 0 1 0 0 0 1 0 0 0 0 |
| 95 | 0 1 0 0 1 0 0 0 0 0 0 0 1 0 0 0 0 |
| 96 | 0 1 0 0 1 0 0 0 0 1 0 0 1 0 0 0 0 |
| 97 | 0 1 0 0 1 0 0 0 1 0 0 0 1 0 0 0 0 |
| 98 | 0 1 0 0 1 0 0 1 0 0 0 0 1 0 0 0 0 |
| 99 | 0 1 0 0 0 0 0 0 0 0 0 1 0 0 0 0 0 |
| 100 | 0 1 0 0 0 0 0 0 1 0 0 1 0 0 0 0 0 |
| 101 | 0 1 0 0 0 0 0 1 0 0 0 1 0 0 0 0 0 |
| 102 | 0 1 0 0 0 0 1 0 0 0 0 1 0 0 0 0 0 |
| 103 | 0 1 0 0 0 1 0 0 0 0 0 1 0 0 0 0 0 |
| 104 | 0 1 0 0 0 1 0 0 1 0 0 1 0 0 0 0 0 |
| 105 | 0 1 0 0 1 0 0 0 0 0 0 1 0 0 0 0 0 |
| 106 | 0 1 0 0 1 0 0 0 1 0 0 1 0 0 0 0 0 |
| 107 | 0 1 0 0 1 0 0 1 0 0 0 1 0 0 0 0 0 |
| 108 | 0 0 1 0 0 0 0 0 0 0 0 0 1 0 0 1 0 |
| 109 | 0 0 1 0 0 0 0 0 0 0 0 1 0 0 0 1 0 |
| 110 | 0 0 1 0 0 0 0 0 0 0 1 0 0 0 0 1 0 |
| 111 | 0 0 1 0 0 0 0 0 0 1 0 0 0 0 0 1 0 |
| 112 | 0 0 1 0 0 0 0 0 0 1 0 0 1 0 0 1 0 |
| 113 | 0 0 1 0 0 0 0 0 1 0 0 0 0 0 0 1 0 |
| 114 | 0 0 1 0 0 0 0 0 1 0 0 0 1 0 0 1 0 |
| 115 | 0 0 1 0 0 0 0 0 1 0 0 1 0 0 0 1 0 |
| 116 | 0 0 1 0 0 0 0 1 0 0 0 0 0 0 0 1 0 |
| 117 | 0 0 1 0 0 0 0 1 0 0 0 0 1 0 0 1 0 |
| 118 | 0 0 1 0 0 0 0 1 0 0 0 1 0 0 0 1 0 |
| 119 | 0 0 1 0 0 0 0 1 0 0 1 0 0 0 0 1 0 |
| 120 | 0 0 1 0 0 0 1 0 0 0 0 0 0 0 0 1 0 |
| 121 | 0 0 1 0 0 0 1 0 0 0 0 0 1 0 0 1 0 |

TABLE 47-continued

| NUMBER | 17-BIT CODE |
|---|---|
| 122 | 0 0 1 0 0 0 1 0 0 0 0 1 0 0 0 1 0 |
| 123 | 0 0 1 0 0 0 1 0 0 0 1 0 0 0 0 1 0 |
| 124 | 0 0 1 0 0 0 1 0 0 1 0 0 0 0 0 1 0 |
| 125 | 0 0 1 0 0 0 1 0 0 1 0 0 1 0 0 1 0 |
| 126 | 0 0 1 0 0 1 0 0 0 0 0 0 0 0 0 1 0 |
| 127 | 0 0 1 0 0 1 0 0 0 0 0 0 1 0 0 1 0 |
| 128 | 0 0 1 0 0 1 0 0 0 0 0 1 0 0 0 1 0 |
| 129 | 0 0 1 0 0 1 0 0 0 0 1 0 0 0 0 1 0 |
| 130 | 0 0 1 0 0 1 0 0 0 1 0 0 0 0 0 1 0 |
| 131 | 0 0 1 0 0 1 0 0 0 1 0 0 1 0 0 1 0 |
| 132 | 0 0 1 0 0 1 0 0 1 0 0 0 0 0 0 1 0 |
| 133 | 0 0 1 0 0 1 0 0 1 0 0 0 1 0 0 1 0 |
| 134 | 0 0 1 0 0 1 0 0 1 0 0 1 0 0 0 1 0 |
| 135 | 0 0 1 0 0 0 0 0 0 0 0 1 0 0 1 0 0 |
| 136 | 0 0 1 0 0 0 0 0 0 0 1 0 0 0 1 0 0 |
| 137 | 0 0 1 0 0 0 0 0 0 1 0 0 0 0 1 0 0 |
| 138 | 0 0 1 0 0 0 0 0 1 0 0 0 0 0 1 0 0 |
| 139 | 0 0 1 0 0 0 0 0 1 0 0 1 0 0 1 0 0 |
| 140 | 0 0 1 0 0 0 0 1 0 0 0 0 0 0 1 0 0 |
| 141 | 0 0 1 0 0 0 0 1 0 0 0 1 0 0 1 0 0 |
| 142 | 0 0 1 0 0 0 0 1 0 0 1 0 0 0 1 0 0 |
| 143 | 0 0 1 0 0 0 1 0 0 0 0 0 0 0 1 0 0 |
| 144 | 0 0 1 0 0 0 1 0 0 0 0 1 0 0 1 0 0 |
| 145 | 0 0 1 0 0 0 1 0 0 0 1 0 0 0 1 0 0 |
| 146 | 0 0 1 0 0 0 1 0 0 1 0 0 0 0 1 0 0 |
| 147 | 0 0 1 0 0 1 0 0 0 0 0 0 0 0 1 0 0 |
| 148 | 0 0 1 0 0 1 0 0 0 0 0 1 0 0 1 0 0 |
| 149 | 0 0 1 0 0 1 0 0 0 0 1 0 0 0 1 0 0 |
| 150 | 0 0 1 0 0 1 0 0 0 1 0 0 0 0 1 0 0 |
| 151 | 0 0 1 0 0 1 0 0 1 0 0 0 0 0 1 0 0 |
| 152 | 0 0 1 0 0 1 0 0 1 0 0 1 0 0 1 0 0 |
| 153 | 0 0 1 0 0 0 0 0 0 0 0 0 0 1 0 0 0 |
| 154 | 0 0 1 0 0 0 0 0 0 0 1 0 0 1 0 0 0 |
| 155 | 0 0 1 0 0 0 0 0 0 1 0 0 0 1 0 0 0 |
| 156 | 0 0 1 0 0 0 0 0 1 0 0 0 0 1 0 0 0 |
| 157 | 0 0 1 0 0 0 0 1 0 0 0 0 0 1 0 0 0 |
| 158 | 0 0 1 0 0 0 0 1 0 0 1 0 0 1 0 0 0 |
| 159 | 0 0 1 0 0 0 1 0 0 0 0 0 0 1 0 0 0 |
| 160 | 0 0 1 0 0 0 1 0 0 0 1 0 0 1 0 0 0 |
| 161 | 0 0 1 0 0 0 1 0 0 1 0 0 0 1 0 0 0 |
| 162 | 0 0 1 0 0 1 0 0 0 0 0 0 0 1 0 0 0 |
| 163 | 0 0 1 0 0 1 0 0 0 0 1 0 0 1 0 0 0 |
| 164 | 0 0 1 0 0 1 0 0 0 1 0 0 0 1 0 0 0 |
| 165 | 0 0 1 0 0 1 0 0 1 0 0 0 0 1 0 0 0 |
| 166 | 0 0 1 0 0 0 0 0 0 0 0 0 1 0 0 0 0 |
| 167 | 0 0 1 0 0 0 0 0 0 1 0 0 1 0 0 0 0 |
| 168 | 0 0 1 0 0 0 0 0 1 0 0 0 1 0 0 0 0 |
| 169 | 0 0 1 0 0 0 0 1 0 0 0 0 1 0 0 0 0 |
| 170 | 0 0 1 0 0 0 1 0 0 0 0 0 1 0 0 0 0 |
| 171 | 0 0 1 0 0 0 1 0 0 1 0 0 1 0 0 0 0 |
| 172 | 0 0 1 0 0 1 0 0 0 0 0 0 1 0 0 0 0 |
| 173 | 0 0 1 0 0 1 0 0 0 1 0 0 1 0 0 0 0 |
| 174 | 0 0 1 0 0 1 0 0 1 0 0 0 1 0 0 0 0 |
| 175 | 0 0 1 0 0 0 0 0 0 0 0 1 0 0 0 0 0 |
| 176 | 0 0 1 0 0 0 0 0 1 0 0 1 0 0 0 0 0 |
| 177 | 0 0 1 0 0 0 0 1 0 0 0 1 0 0 0 0 0 |
| 178 | 0 0 1 0 0 0 1 0 0 0 0 1 0 0 0 0 0 |
| 179 | 0 0 1 0 0 1 0 0 0 0 0 1 0 0 0 0 0 |
| 180 | 0 0 1 0 0 1 0 0 1 0 0 1 0 0 0 0 0 |
| 181 | 0 0 0 1 0 0 0 0 0 0 0 0 1 0 0 1 0 |
| 182 | 0 0 0 1 0 0 0 0 0 0 0 1 0 0 0 1 0 |
| 183 | 0 0 0 1 0 0 0 0 0 0 1 0 0 0 0 1 0 |
| 184 | 0 0 0 1 0 0 0 0 0 1 0 0 0 0 0 1 0 |
| 185 | 0 0 0 1 0 0 0 0 0 1 0 0 1 0 0 1 0 |
| 186 | 0 0 0 1 0 0 0 0 1 0 0 0 0 0 0 1 0 |
| 187 | 0 0 0 1 0 0 0 0 1 0 0 0 1 0 0 1 0 |
| 188 | 0 0 0 1 0 0 0 0 1 0 0 1 0 0 0 1 0 |
| 189 | 0 0 0 1 0 0 0 1 0 0 0 0 0 0 0 1 0 |
| 190 | 0 0 0 1 0 0 0 1 0 0 0 0 1 0 0 1 0 |
| 191 | 0 0 0 1 0 0 0 1 0 0 0 1 0 0 0 1 0 |
| 192 | 0 0 0 1 0 0 0 1 0 0 1 0 0 0 0 1 0 |
| 193 | 0 0 0 1 0 0 1 0 0 0 0 0 0 0 0 1 0 |
| 194 | 0 0 0 1 0 0 1 0 0 0 0 0 1 0 0 1 0 |
| 195 | 0 0 0 1 0 0 1 0 0 0 0 1 0 0 0 1 0 |
| 196 | 0 0 0 1 0 0 1 0 0 0 1 0 0 0 0 1 0 |
| 197 | 0 0 0 1 0 0 1 0 0 1 0 0 0 0 0 1 0 |
| 198 | 0 0 0 1 0 0 1 0 0 1 0 0 1 0 0 1 0 |
| 199 | 0 0 0 1 0 0 0 0 0 0 0 0 0 0 1 0 0 |
| 200 | 0 0 0 1 0 0 0 0 0 0 0 1 0 0 1 0 0 |
| 201 | 0 0 0 1 0 0 0 0 0 0 1 0 0 0 1 0 0 |
| 202 | 0 0 0 1 0 0 0 0 0 1 0 0 0 0 1 0 0 |

TABLE 47-continued

| NUMBER | 17-BIT CODE |
|---|---|
| 203 | 0 0 0 1 0 0 0 0 1 0 0 0 0 0 1 0 0 |
| 204 | 0 0 0 1 0 0 0 0 1 0 0 1 0 0 1 0 0 |
| 205 | 0 0 0 1 0 0 0 1 0 0 0 0 0 0 1 0 0 |
| 206 | 0 0 0 1 0 0 0 1 0 0 0 1 0 0 1 0 0 |
| 207 | 0 0 0 1 0 0 0 1 0 0 1 0 0 0 1 0 0 |
| 208 | 0 0 0 1 0 0 1 0 0 0 0 0 0 0 1 0 0 |
| 209 | 0 0 0 1 0 0 1 0 0 0 0 1 0 0 1 0 0 |
| 210 | 0 0 0 1 0 0 1 0 0 0 1 0 0 0 1 0 0 |
| 211 | 0 0 0 1 0 0 1 0 0 1 0 0 0 0 1 0 0 |
| 212 | 0 0 0 1 0 0 0 0 0 0 0 0 0 1 0 0 0 |
| 213 | 0 0 0 1 0 0 0 0 0 0 1 0 0 1 0 0 0 |
| 214 | 0 0 0 1 0 0 0 0 0 1 0 0 0 1 0 0 0 |
| 215 | 0 0 0 1 0 0 0 0 1 0 0 0 0 1 0 0 0 |
| 216 | 0 0 0 1 0 0 0 1 0 0 0 0 0 1 0 0 0 |
| 217 | 0 0 0 1 0 0 0 1 0 0 1 0 0 1 0 0 0 |
| 218 | 0 0 0 1 0 0 1 0 0 0 0 0 0 1 0 0 0 |
| 219 | 0 0 0 1 0 0 1 0 0 0 1 0 0 1 0 0 0 |
| 220 | 0 0 0 1 0 0 1 0 0 1 0 0 0 1 0 0 0 |
| 221 | 0 0 0 1 0 0 0 0 0 0 0 0 1 0 0 0 0 |
| 222 | 0 0 0 1 0 0 0 0 0 1 0 0 1 0 0 0 0 |
| 223 | 0 0 0 1 0 0 0 0 1 0 0 0 1 0 0 0 0 |
| 224 | 0 0 0 1 0 0 0 1 0 0 0 0 1 0 0 0 0 |
| 225 | 0 0 0 1 0 0 1 0 0 0 0 0 1 0 0 0 0 |
| 226 | 0 0 0 1 0 0 1 0 0 1 0 0 1 0 0 0 0 |
| 227 | 0 0 0 1 0 0 0 0 0 0 0 1 0 0 0 0 0 |
| 228 | 0 0 0 1 0 0 0 0 1 0 0 1 0 0 0 0 0 |
| 229 | 0 0 0 1 0 0 0 1 0 0 0 1 0 0 0 0 0 |
| 230 | 0 0 0 1 0 0 1 0 0 0 0 1 0 0 0 0 0 |
| 231 | 0 0 0 0 1 0 0 0 0 0 0 0 0 0 0 1 0 |
| 232 | 0 0 0 0 1 0 0 0 0 0 0 0 1 0 0 1 0 |
| 233 | 0 0 0 0 1 0 0 0 0 0 0 1 0 0 0 1 0 |
| 234 | 0 0 0 0 1 0 0 0 0 0 1 0 0 0 0 1 0 |
| 235 | 0 0 0 0 1 0 0 0 0 1 0 0 0 0 0 1 0 |
| 236 | 0 0 0 0 1 0 0 0 0 1 0 0 1 0 0 1 0 |
| 237 | 0 0 0 0 1 0 0 0 1 0 0 0 0 0 0 1 0 |
| 238 | 0 0 0 0 1 0 0 0 1 0 0 0 1 0 0 1 0 |
| 239 | 0 0 0 0 1 0 0 0 1 0 0 1 0 0 0 1 0 |
| 240 | 0 0 0 0 1 0 0 1 0 0 0 0 0 0 0 1 0 |
| 241 | 0 0 0 0 1 0 0 1 0 0 0 0 1 0 0 1 0 |
| 242 | 0 0 0 0 1 0 0 1 0 0 0 1 0 0 0 1 0 |
| 243 | 0 0 0 0 1 0 0 1 0 0 1 0 0 0 0 1 0 |
| 244 | 0 0 0 0 1 0 0 0 0 0 0 0 0 0 1 0 0 |
| 245 | 0 0 0 0 1 0 0 0 0 0 0 1 0 0 1 0 0 |
| 246 | 0 0 0 0 1 0 0 0 0 0 1 0 0 0 1 0 0 |
| 247 | 0 0 0 0 1 0 0 0 0 1 0 0 0 0 1 0 0 |
| 248 | 0 0 0 0 1 0 0 0 1 0 0 0 0 0 1 0 0 |

Figure 29:
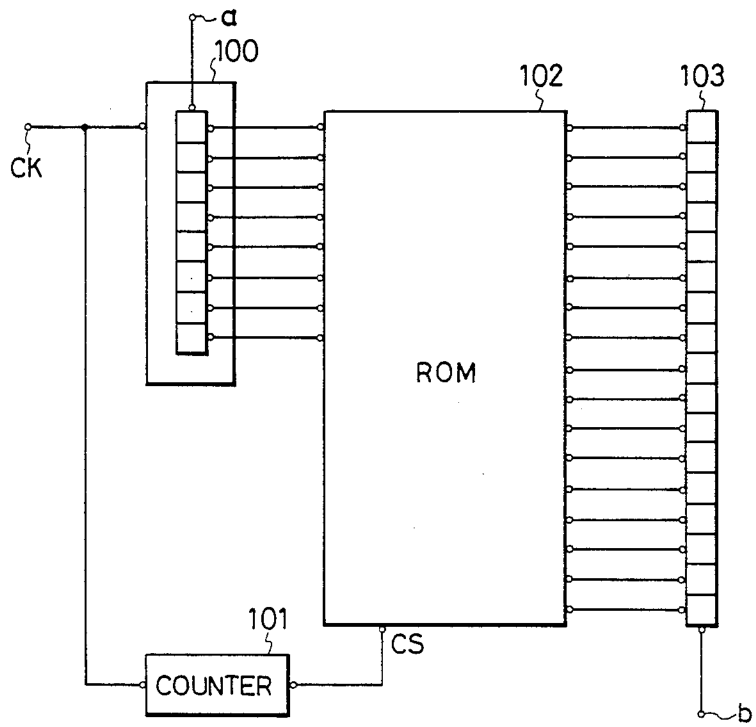
FIG. 29 is an arrangement block diagram of the conversion from 8 bits to 17 bits.

FIG. 29 is an arrangement block diagram for encoding of the present invention. In FIG. 29, a data sequence is inputted from Ⓐ. This data sequence is inputted to the 8-bit shift register 100. CK is the input terminal of the clock to drive the shift register 100. This clock signal is also simultaneously inputted to the counter 101. The counter 101 generates a pulse whenever eight clocks are counted and this pulse is inputted to the chip selecting (CS) terminal.

When the pulse is inputted to the chip selecting (CS) terminal, the data in the shift register 100 is taken in the ROM 102, so that the address in the ROM corresponding to the data is designated. in the 0th to 255th addresses in the ROM, 256 17-bit codes which were arbitrarily selected from Tables 43 to 47 are stored. When the address in the ROM corresponding to the data is designated, the 17-bit code stored in that address is inputted to the shift register 103 and is outputted from the code output terminal Ⓑ.

In this way, the conversion from the data to the code, namely, the encoding is finished.

The conversion from the code to the data which is performed on the reproducing side, namely, the decoding may be attained by performing the conversion opposite to the foregoing conversion for encoding.

As described above, the 17-bit codes shown in Tables 43 to 47 are the codes which are restricted such that the minimum number of bits "0" which exist between the adjacent bits "1" is two and the maximum number is ten. There is an effect such that this limitation is not broken even by coupling the 17-bit codes.

Therefore, $$T_{min}=1.41T$$

$$T_{max}=5.18T$$

$$T_W=0.47T$$

On the other hand, there is an EFM system which has been developed cooperatively by Sony Corporation and Phillips Co., Ltd. and this EFM system has been adopted to a compact disc or digital audio. The system of the present invention is much simpler than this (8, 17, 2, 10) system and it is possible to provide an electronic apparatus in which the recording and/or reproduction can be performed with a high density and a high degree of accuracy.

What we claim is:

1. Data processing apparatus for converting m-bit input data into n-bit output data, comprising:

input means for inputting m-bit data of a binary data sequence;

converting means for converting the m-bit data into n-bit data, said converting means including:

(i) first means for judging whether a polarity of accumulated charges of a code row comprising at least one n-bit code coincides with a polarity of accumulated charges of another n-bit code to be connected to said code row, wherein one bit on each extremity of each n-bit code is fixed and said n-bit code is obtained in response to the m-bit data where (m<n);

(ii) second means for controlling inversion and non-inversion of said extremity bits of said other n-bit code in response to the judgement made by said first means and a parity of said code row;

(iii) third means for calculating accumulated charges of a new code row including said code row and said other n-bit code in response to said accumulated charges of said code row, charges of said other n-bit code and the judgement made by said first means; and (iv) fourth means for deriving parity of said new code row in response to parity of said other n-bit code controlled by said second means and said parity of said code row wherein operations of said four means are repeated in response to the polarity of accumulated charges of said new code row obtained by said third means and said parity of said new code row obtained by said fourth means; and (v) output means for outputting a sequence of said n-bit codes corresponding to said binary data sequence.

2. Data processing apparatus according to claim 1, wherein a head bit of said n-bit code is fixed.

3. Data processing apparatus according to claim 1, wherein operations of said four converting means are repeated in response to the number of said input m-bit data.

4. Data processing apparatus according to claim 1, wherein said code row is DC-freed.

5. A data processing device for converting 8-bit input data into 10-bit output data, comprising:

input means for inputting 8-bit data of a binary data sequence;

converting means for converting the 8-bit data into 10-bit data, said converting means including:

(i) first means for judging whether or not a polarity of accumulated charges of a code row comprising at least one 10-bit code coincides with a polarity of accumulated charges of a next 10-bit code to be connected to said code row, wherein a first bit of each 10-bit code is fixed and each 10-bit code is obtained in response to the 8-bit data;

(ii) second means for controlling inversion/non-inversion of said first bit of said next 10-bit code in response to the judgement made by said first means and a parity of said code row; and (iii) third means for calculating accumulated charges of a new code now including said code row and said next 10-bit code in response to said accumulated charges of said code row, charges of the next 10-bit code and the judgement made by said first means whereby operations of said three converting means are repeated as necessary; and output means for outputting a sequence of said 10-bit codes corresponding to said binary data sequence.

6. A data processing device according to claim 5, wherein said operations of said three converting means are repeated in response to the number of said input 8-bit data.

7. A data processing device according to claim 5, wherein said code row is DC-freed.

8. A data processing device according to claim 5, wherein a number of successive 0's in said 10-bit code is equal to or less than 2 and even if 1 at the first bit of said 10-bit code is executed inversion/non-inversion, the number of successive 0's in said code row is equal to or less than 5.

9. A data processing apparatus for converting m-bit input data into n-bit output data, comprising:

input means for inputting m-bit data of a binary data sequence;

converting means for converting the m-bit data into n-bit codes where (n>m), said converting means including a converting table for storing a plurality of n-bit codes, and for converting each of the m-bit data into a different one of the n-bit codes, wherein the first bit of each of said n-bit codes stored in said converting table is fixed;

control means for controlling inversion/non-inversion of said first bit in order to utilize said first bit of said n-bit codes as a connecting bit, by judging each of accumulated charges of at least a code row and a next n-bit code, when said next n-bit code is added to said code row, said code row comprising one or more of said n-bit codes which are converted by said converting means and correspond to each of a plurality of said input m-bit data to form a new code row; and output means for outputting a sequence of said n-bit codes corresponding to said binary data sequence.

10. A data processing apparatus according to claim 9, wherein said control means is repeatedly operated such that a new n-bit code row including said n-bit code row and said next n-bit code is added to a further next n-bit code.

11. A data processing apparatus according to claim 9, wherein said code row is DC-freed.

12. A data processing apparatus according to claim 9, wherein said converting table is stored in an ROM and the first bit of each of said n-bit codes is 1.

13. A data processing apparatus for converting a plurality of m-bit input data into a code row comprising a plurality of n-bit codes where (n>m), each of the n-bit codes corresponding to a different one of said m-bit data, a first bit of each of said n-bit codes being fixed, comprising:

input means for inputting the m-bit input data in a binary data sequence;

converting means for converting the input m-bit data into n-bit output data, said converting means including:

(i) first means for judging accumulated charges of said code row, said code row comprising at least one n-bit code;

(ii) second means for judging accumulated charges of a next n-bit code to be connected to said code row;

(iii) third means for judging a parity of said code row;

(iv) control means for controlling inversion/non-inversion of a first bit of said next n-bit code in response to the judgements made by said first, second, and third means in order to utilize said first bit as a connecting bit; and (v) transmit means for transmitting in parallel (n−1) bits in said next n-bit code, which follow said first bit controlled by said control means in order to connect said (n−1) bits to said code row; and output means for outputting a sequence of said n-bit codes corresponding to said binary data sequence.

14. A data processing apparatus according to claim 13, wherein said control means controls inversion/non-inversion of the first bit of said next n-bit code in response to whether the judgements made by said first means and of said second means are coincident with each other and in response to the judgement made by said third means.

15. A data processing apparatus according to claim 13, wherein said code row is DC-freed.

* * * * *

UNITED STATES PATENT AND TRADEMARK OFFICE

CERTIFICATE OF CORRECTION

PATENT NO. : 4,833,471

Page 1 of 10

DATED : May 23, 1989

INVENTOR(S) : YOSHIHIRO TOKUUME, ET AL.

It is certified that error appears in the above-identified patent and that said Letters Patent is hereby corrected as shown below:

Title page:

At [30] Foreign Application Priority Data: "March 26, 1984 [JP] Japan...59-59197" should read --March 27, 1984 [JP] Japan...59-59197--.

At [57]. ABSTRACT, line 5, delete "a".

At FIGURE 2, "SOURSE" should read --SOURCE--.

At column 2, line 63, delete 2nd left large bracket in equation (5);

At column 2, line 63, change "K" to --k-- in equation (5); and

At column 2, line 67, change "j" to --d-- in equation (6).

At column 7, line 65, change "then" to --now--.

UNITED STATES PATENT AND TRADEMARK OFFICE
CERTIFICATE OF CORRECTION

PATENT NO. : 4,833,471 Page 2 of 10

DATED : May 23, 1989

INVENTOR(S) : YOSHIHIRO TOKUUME, ET AL.

It is certified that error appears in the above-identified patent and that said Letters Patent is hereby corrected as shown below:

At column 9, line 14, $$" \quad Nk(n) = \sum_{1=1}^{k+1} Nk(n-i) \qquad (n > k) \quad "$$

should read $$-- \quad Nk(n) = \sum_{i=1}^{k+1} Nk(n-i) \qquad (n > k) \quad --$$

At column 10, line 5, "correspond" should read --to correspond--.

At column 17, line 56, delete "then".

At column 18, line 65, "then" should read --now--.

UNITED STATES PATENT AND TRADEMARK OFFICE
CERTIFICATE OF CORRECTION

PATENT NO. : 4,833,471 Page 3 of 10

DATED : May 23, 1989

INVENTOR(S) : YOSHIHIRO TOKUUME, ET AL.

It is certified that error appears in the above-identified patent and that said Letters Patent is hereby corrected as shown below:

At column 19, lines 24-29,

"

$$\overline{P}\,\overline{(C_q \oplus d_q)}=1 \qquad (i)$$

$$\overline{P}(C_q \oplus d_q)=1 \qquad (ii)$$

$$P\,\overline{(C_q \oplus d_q)}=1 \qquad (iii)$$

$$P(C_q \oplus d_q)=1 \qquad (iv)$$

"

should read,

--

$$(i) \Leftrightarrow \overline{P}\,\overline{(C_q \oplus d_q)}=1$$

$$(ii) \Leftrightarrow \overline{P}(C_q \oplus d_q)=1$$

$$(iii) \Leftrightarrow P\,\overline{(C_q \oplus d_q)}=1$$

$$(iv) \Leftrightarrow P(C_q \oplus d_q)=1$$

--

UNITED STATES PATENT AND TRADEMARK OFFICE

CERTIFICATE OF CORRECTION

PATENT NO. : 4,833,471 Page 4 of 10

DATED : May 23, 1989

INVENTOR(S) : YOSHIHIRO TOKUUME, ET AL.

It is certified that error appears in the above-identified patent and that said Letters Patent is hereby corrected as shown below:

At column 19, line 59, "In" should read --An--.

At column 20, line 25, "194" should read --149--;

At column 20, line 26, change "code" to --44 codes--; and

At column 20, line 35, "fewer" should read --less--.

At column 21, line 1, "Numeral" should read --Numerals--;

At column 21, line 7, "parallelserial" should read --parallel-serial--; and

At column 21, line 50, "then" should read --now.

At column 24, line 29, "signal DSV ≠ sign CDS" should read --sign DSV ≠ sign CDS--.

At column 30, line 32, "few;" should read --less;--; and

At column 30, line 62, " "1", " should read --"1";--.

UNITED STATES PATENT AND TRADEMARK OFFICE
CERTIFICATE OF CORRECTION

PATENT NO. : 4,833,471

DATED : May 23, 1989

INVENTOR(S) : YOSHIHIRO TOKUUME, ET AL.

It is certified that error appears in the above-identified patent and that said Letters Patent is hereby corrected as shown below:

At column 48, line 62, "then" should read --now--;

At column 48, line 13, "17b-bit codes" should read --17 5-bit codes--; and

At column 48, line 36, "4-bit shift resistor" should read --4-bit shift register--.

At column 49, line 9, "few;" should read --less;--; and

At column 49, Table 15-1,

" AB = 1 "
AB = 1
AB = 1
AB = 1 should read,

-- AB = 1 --

$\overline{A}B = 1$ $A\overline{B} = 1$ $\overline{AB} = 1$

UNITED STATES PATENT AND TRADEMARK OFFICE
CERTIFICATE OF CORRECTION

PATENT NO. : 4,833,471

DATED : May 23, 1989

INVENTOR(S) : YOSHIHIRO TOKUUME, ET AL.

It is certified that error appears in the above-identified patent and that said Letters Patent is hereby corrected as shown below:

At column 52, Table 17, "DSV=DSV=CDS+1" should read --DSV=DSV-CDS+1--;

At column 52, line 30, close up right margin--;

At column 52, Table 18, $$" \frac{T_{max}/}{CLK} "$$

should read, $$-- \frac{T_{max}/}{C_{LK}} --$$

At column 52, line 61, "almost" should read --almost all--.

At column 53, line 5, "codds" should read --codes--;

At column 53, line 21, "from a." should read --from ⓐ .--;

UNITED STATES PATENT AND TRADEMARK OFFICE

CERTIFICATE OF CORRECTION

PATENT NO. : 4,833,471

DATED : May 23, 1989

INVENTOR(S) : YOSHIHIRO TOKUUME, ET AL.

It is certified that error appears in the above-identified patent and that said Letters Patent is hereby corrected as shown below:

At column 53, line 38, "minal b." should read --minal (b) .--; and

At column 53, line 65, "few;" should read --less;--.

At column 54, line 48, "t" should read --to--.

At column 55, line 6, "few;" should read --less; and

At column 55, line 25, "are" should read --were--; At column 55, line 30, "terminal b." should read --terminal (b) .--; and At column 55, line 56, "few;" should read --less;--.

UNITED STATES PATENT AND TRADEMARK OFFICE
CERTIFICATE OF CORRECTION

PATENT NO. : 4,833,471

DATED : May 23, 1989

INVENTOR(S) : YOSHIHIRO TOKUUME, ET AL.

It is certified that error appears in the above-identified patent and that said Letters Patent is hereby corrected as shown below:

At column 58, line 42, "few;" should read --less;--.

At column 60, line 32, "few;" should read --less;--.

At column 63, line 49, "few;" should read --less;--.

At column 66, line 30, "few;" should read --less;--.

At column 67, line 16, "few;" should read --less;--.

At column 72, line 26, "few;" should read --less;--.

At column 75, Table 30, "227 011010011" should read --228 011010011--.

At column 76, line 27, "abovementioned" should read --above-mentioned--.

At column 90, line 33, "minal b." should read --minal ⓑ .--.

UNITED STATES PATENT AND TRADEMARK OFFICE
CERTIFICATE OF CORRECTION

PATENT NO. : 4,833,471

DATED : May 23, 1989

INVENTOR(S) : YOSHIHIRO TOKUUME, ET AL.

It is certified that error appears in the above-identified patent and that said Letters Patent is hereby corrected as shown below:

At column 91, line 2, "one-to one" should read --one-to-one--;

At column 91, line 8, "256 16-bit" should read --256 16-bit codes--;.

At column 91, line 12, " "100000", " should read --"10000",--;

At column 91, line 32, "in" (first occurrence) should read --In--; and

At column 91, line 40, "O: the" should read --O"; the--.

At column 107, Table 37, please delete "62 0000100000000100"; and

At column 107, Table 37, "103 0010000000010000" should read --103 0001000000010000--.

UNITED STATES PATENT AND TRADEMARK OFFICE
CERTIFICATE OF CORRECTION

PATENT NO. : 4,833,471

DATED : May 23, 1989

INVENTOR(S) : YOSHIHIRO TOKUUME, ET AL.

It is certified that error appears in the above-identified patent and that said Letters Patent is hereby corrected as shown below:

At column 149, Table 44, "240 0010010000000100" should read --240 0001001000000100--.

At column 160, line 55, "in" should read --In--.

At Claim 5, line 19, "new code now" should read --new code row--; and

At Claim 5, line 23, "whereby" should read --wherein--.

At Claim 14, line 5, delete "of".

Signed and Sealed this

Nineteenth Day of March, 1991

*Attest:*

HARRY F. MANBECK, JR.

*Attesting Officer* *Commissioner of Patents and Trademarks*